US008781197B2

(12) United States Patent
Wang et al.

(10) Patent No.: US 8,781,197 B2
(45) Date of Patent: Jul. 15, 2014

(54) TOOL FOR ACCURATE QUANTIFICATION IN MOLECULAR MRI

(75) Inventors: Yi Wang, New York, NY (US); Ludovic de Rochefort, Montrouge (FR); Bryan Kressler, Santa Barbara, CA (US); Tian Liu, New York, NY (US); Pascal Spincemaille, New York, NY (US)

(73) Assignee: Cornell University, Ithaca, NY (US)

( * ) Notice: Subject to any disclaimer, the term of this patent is extended or adjusted under 35 U.S.C. 154(b) by 699 days.

(21) Appl. No.: 12/990,148

(22) PCT Filed: Apr. 28, 2009

(86) PCT No.: PCT/US2009/042005
§ 371 (c)(1),
(2), (4) Date: Oct. 28, 2010

(87) PCT Pub. No.: WO2009/134820
PCT Pub. Date: Nov. 5, 2009

(65) Prior Publication Data
US 2011/0044524 A1    Feb. 24, 2011

Related U.S. Application Data

(60) Provisional application No. 61/125,704, filed on Apr. 28, 2008, provisional application No. 61/125,709, filed on Apr. 28, 2008, provisional application No. 61/125,710, filed on Apr. 28, 2008, provisional application No. 61/125,713, filed on Apr. 28, 2008, provisional application No. 61/125,727, filed on Apr. 28, 2008, provisional application No. 61/125,752, filed on Apr. 28, 2008.

(51) Int. Cl.
*G06K 9/00*    (2006.01)
(52) U.S. Cl.
USPC .......................................... 382/131

(58) Field of Classification Search
None
See application file for complete search history.

(56) References Cited

U.S. PATENT DOCUMENTS 5,352,979 A * 10/1994 Conturo .................. 324/307
6,501,272 B1   12/2002 Haacke et al.
(Continued)

FOREIGN PATENT DOCUMENTS

| CN | 1626032 A | 6/2005 |
| CN | 1775172 A | 5/2006 |
| CN | 1831806 A | 9/2006 |

OTHER PUBLICATIONS

English Translation of first Office Action issued in Chinese Patent Application No. 200970124813.9 on Dec. 21, 2012, by the State Intellectual Property Office of the People's Republic of China.

(Continued)

*Primary Examiner* — Nancy Bitar
(74) *Attorney, Agent, or Firm* — Leydig, Voit & Mayer, Ltd.

(57) ABSTRACT

A method and apparatus is provided for magnetic source magnetic resonance imaging. The method includes collecting energy signals from an object, providing additional information of characteristics of the object, and generating the image of the object from the energy signals and from the additional information such that the image includes a representation of a quantitative estimation of the characteristics, e.g a quantitative estimation of magnetic susceptibility. The additional information may comprise predetermined characteristics of the object, a magnitude image generated from the object, or magnetic signals collected from different relative orientations between the object and the imaging system. The image is generated by an inversion operation based on the collected signals and the additional information. The inversion operation minimizes a cost function obtained by combining the data extracted from the collected signals and the additional information of the object. Additionally, the image is used to detect a number of diagnostic features including microbleeds, contract agents and the like.

8 Claims, 64 Drawing Sheets

(56) References Cited

U.S. PATENT DOCUMENTS

| | | | |
|---|---|---|---|
| 6,560,353 B1 | 5/2003 | Haacke et al. | |
| 6,658,280 B1 | 12/2003 | Haacke et al. | |
| 6,697,660 B1 | 2/2004 | Robinson | |
| 7,154,269 B1 | 12/2006 | Haacke et al. | |
| 7,466,850 B2* | 12/2008 | Guhring et al. | 382/131 |
| 8,369,590 B2* | 2/2013 | Wang et al. | 382/128 |
| 2007/0247153 A1* | 10/2007 | Yu et al. | 324/307 |

OTHER PUBLICATIONS

Abi-Abdallah et al., "Cardiac and Respiratory MRI Gating Using Combined Wavelet Sub-Band Decomposition and Adaptive Filtering," 2007, 35(5): 733-743, *Annals of Biomedical Engineering*.

Akbudak et al., "Contrast-Agent Phase Effects: An Experimental System for Analysis of Susceptibility, Concentration, and Bolus Input Function Kinetics," 1997, 38(6): 990-1002, *Magnetic Resonance in Medicine*.

Alafara et al., "Quantitative Leaching of a Nigerian Iron Ore in Hydrochloric Acid," 2005, 9(3): 15-20, *Journal of Applied Sciences and Environmental Management*.

Albert et al., "Susceptibility Changes Following Bolus Injections," 1993, 29(5): 700-708, *Magnetic Resonance in Medicine*.

Arbab et al., "Cellular Magnetic Resonance Imaging: Current Status and Future Prospects," 2006;3(4):427-439, *Expert Review of Medical Devices*.

Bakker et al., "Concerning the Preparation and Use of Substances with a Magnetic Susceptibility Equal to the Magnetic Susceptibility of Air," 2006; 56(5): 1107-1113, *Magnetic Resonance in Medicine*.

Barbier, C.E. et al., "The Exactness of Left Ventricular Segmentation in Cine Magnetic Resonance Imaging and Its Impact on Systolic Function Values," 2007, 48(3): 285-291, *Acta Radiologica*.

Ben-Hur et al., "Serial in Vivo MR Tracking of Magnetically Labeled Neural Spheres Transplanted in Chronic EAE Mice," 2007;57(1):164-171, *Magnetic Resonance in Medicine*.

Berestetskii et al., "Quantum Electrodynamics," *ourse of Theoretical Physics*, 2(4); 1982; 336-343.

Bernstein et al., *Handbook of MRI Pulse Sequences*, Elsevier academic press; 2004.

Beuf et al., "Magnetic Resonance Imaging for the Determination of Magnetic Susceptibility of Materials," *Journal of Magnetic Resonance*, Series B 1996;112(2):111-118.

Beutler et al., "Iron Deficiency and Overload," *Hematology Am Soc Hematol Educ Program* 2003:40-61.

Bieri et al., "Analysis and Compensation of Eddy Currents in Balanced SSFP," 2005, 54(1): 129-137, *Magn Reson Med*.

Bland et al., "Statistical Methods for Assessing Agreement Between Two Methods of Clinical Measurements," 1986, 1(8476): 307-310, *Lancet*.

Bowen et al., "Application of the Static Dephasing Regime Theory to Superparamagnetic Iron-Oxide Loaded Cells," 2002;48(1):52-61, *Magn Reson Med*.

Box et al., *Time Series Analysis: Forecasting and Control*, 1994, xiii, Prentice Hall, Englewood Cliffs, N.J.

Brau et al., "Generalized Self-Navigated Motion Detection Technique: Preliminary Investigation in Abdominal Imaging," 2006, 55(2): 263-270, *Magn Reson Med*.

Calamante et al., "Contrast Agent Concentration Measurements Affecting Quantification of Bolus-Tracking Perfusion MRI," 2007, 58(3): 544-553, *Magn Reson Med*.

Candes et al., "Stable Signal Recovery From Incomplete and Inaccurate Measurements," 2006, 59(8): 1207-1223, *Communications on Pure and Applied Mathematics*.

Carneiro et al., "Liver Iron Concentration Evaluated by Two Magnetic Methods: Magnetic Resonance Imaging and Magnetic Susceptometry," 2005;54(1):122-128, *Magn Reson Med*.

Chat et al., "How we Perform Cardiovascular Magnetic Resonance Flow Assessment Using Phase-Contract Velocity Mapping," 2005, 7(4): 705-716, *Journal of Cardiovascular Magnetic Resonance*.

Chastukhin et al., "Analysis of Fe2O3 and Fe3O4 Dissolution Kinetics in Terms of the Chain Mechanism Model," 2003, 37(4): 398-406. *Theoretical Foundations of Chemical Engineering*.

Chu et al., "MRI Measurement of Hepatic Magnetic Susceptibility—Phantom Validation and Normal Subject Studies," 2004, 52(6): 1318-1327, *Magn Reson Med*.

Cohen et al., "Dipolar Sums in the Primitive Cubic Lattices," 1955;99(4):1128-1134, *Phys Rev*.

Conturo et al., "Signal-to-Noise in Phase Angle Reconstruction: Dynamic Range Extension Using Phase Reference Offsets," 1990, 15(3):420-37, *Magn Reson Med*.

Corot et al., "Recent Advances in Iron Nanocrystal Technology for Medical Imaging," 2006, 58(14): 1471-1504, *Advanced Drug Delivery Reviews*.

Cron et al., "A Comparison of T2*-Weighted Magnitude and Phase Imaging for Measuring the Arterial Input Function in the Rat Aorta Following Intravenous Injection of Gadolinium Contrast Agent," 2005, 23(5): 619-627, *Magn Reson Imaging*.

Crowe et al., "Automated Rectilinear Self-Gated Cardiac Cine Imaging," 2004, 52 4 : 782-788, *Magn Reson Med*.

Cunningham et al., "Positive Contrast Magnetic Resonance Imaging of Cells Labeled with Magnetic Nanoparticles," 2005;53(5):999-1005, *Magn Reson Med*.

Danias et al, "Prospective Navigator Correction of Image Position for Coronary MR Angiography," 1997, 203(3): 733-736, *Radiology*.

De Munck et al., "The Computation of MR Image Distortions Caused by Tissue Susceptibility Using the Boundary Element Method," 1996, 15(5):620-627, *IEEE Transactions on Medical Imaging*.

De Munck, J.C., "A Linear Discretization of the Volume Conductor Boundary Integral-Equation Using Analytically Integrated Elements," 1992;39(9):986-990, *IEEE T Bio-Med Eng*.

Desmond et al., "Motion Robust Magnetic Susceptibility and Field Inhomogeneity Estimation Using Regularized Image Restoration Techniques for fMRI," Berlin, 2008, 5241(6): 991-998, *Medical Image Computing and Computer Assisted Intervention*.

Dimicoli et al, "On the Use of Ri and R2* for Measurement of Contrast Agent Concentration in Isolated Perfused Rat Liver," 2003, 16(5): 276-285, *NMR in Biomedicine*.

Du et al., "A Comparison of Prospective and Retrospective Respiratory Navigator Gating in 3D MR Coronary Angiography," 2001, 17(4): 287-296, *International Journal of Cardiovascular Imaging*.

Duhamel et al., "Measurement of Arterial Input Functions for Dynamic Susceptibility Contrast Magnetic Resonance Imaging Using Echoplanar Images: Comparison of Physical Simulations with in Vivo Results," 2006, 55(3): 514-523, *Magn Reson Med*.

Durrant et al., "Magnetic Susceptibility: Further Insights Into Macroscopic and Microscopic Fields and the Sphere of Lorentz," Part A 2003;18A(1):72-95, *Concepts in Magnetic Resonance*.

Edelman et al., "Gadolinium-Enhanced Off-Resonance Contrast Angiography," 2007, 57(3): 475-484, *Magn Reson Med*.

Ehman et al., "Adaptive Technique for High-Definition MR Imaging of Moving Structures," 1989, 173(1): 255-263, *Radiology*.

Farrell et al., "Magnetic Measurement of Liver Iron Stores: Engineering Aspects of a New Scanning Susceptometer Based on High-Temperature Superconductivity," 2007, 43(11) 4030-4036, *IEEE Transactions on Magnetics*.

Fernandez-Seara et al., "MR Susceptometry for Measuring Global Brain Oxygen Extraction," 2006, 55(5): 967-973, *Magn Reson Med*.

Fletcher et al., "Function Minimization by Conjugate Gradients," 1964, 7: 149-154, *Computer J*.

Forsyth et al., *Computer Vision: A Modern Approach*, 2003, xxv, Prentice Hall, Upper Saddle River, N.J.

Fortin-Ripoche et al., "Magnetic Targeting of Magnetoliposomes to Solid Tumors with MR Imaging Monitoring in Mice: Feasibility," 2006;239(2):415-424, *Radiology*.

Fujii et al., "In Vivo Fate of Superparamagnetic Iron Oxides During Sepsis," 2002, 20(3): 271-276, *Magn Reson Imaging*.

Ginefri et al., "High-Temperature Superconducting Surface Coil for in Vivo Microimaging of the Human Skin," 2001, 45(3): 376, *Magn Reson Imaging*.

Haacke et al., "Imaging Iron Stores in the Brain Using Magnetic Resonance Imagine," 2005, 23:1-25, *Magn Reson Imaging*.

(56) References Cited

OTHER PUBLICATIONS

Haacke et al., *Magnetic Resonance Imaging: Physical Principles & Sequence Design*, 1999, Wiley-Liss, Hoboken, NJ.
Haacke et al., "Susceptibility Weighted Imaging (SWI)," 2004;52(3):612-618, *Magn Reson Med*.
Hackstein et al., "Measurement of Single-Kidney Glomerular Filtration Rate Using a Contrast-Enhanced Dynamic Gradient-Echo Sequence and the Rutland-Patlak Plot Technique," 2003, 18(6): 714-725, *J. Magn Reson Med*.
Hamalainen et al., "Magnetoencephalography-Theory, Instrumentation, and Applications to Noninvasive Studies of the Working Human Brain," 1992, 65(2): 413-497, *Review of Modern Physics*.
Hiba et al, "Cardiac and Respiratory Double Self-Gated Cine MRI in the Mouse at 7 T," 2006, 55(3): 506-513, *Magn Reson Med*.
Hoffman, R.E. "Measurement of Magnetic Susceptibility and Calculation of Shape Factor of NMR Samples," 2006;178(2):237-247, *J Magn Reson*.
Holt et al., "MR Susceptometry: An External-Phantom Method for Measuring Bulk Susceptibility from Field-Echo Phase Reconstructions Maps," 1994, 4(6): 809-818, *Journal of Magnetic Resonance Imaging*.
House et al., "Correlation of Proton Transverse Relaxation Rates (R2) with Iron Concentrations in Postmortem Brain Tissue from Alzheimer's Disease Patients," 2007;57(1):172-180, *Magn Reson Med*.
Hughes et al., "Application of a New Discreet Form of Gauss' Theorem for Measuring Volume," 1996;41(9):1809-1821, *Phys Med Biol*.
Hundley et al., "Quantitation of Cardiac Output with Velocity-Encoded, Phase-Difference Magnetic Resonance Imaging," 1995, 75(17): 1250-1255, *American Journal of Cardiology*.
Hyen et al., "Detection Threshold of Single SPIO-Labeled Cells with FIESTA," 2005, 53: 312-320, *Magn Reson Med*.
"IEEE Transactions on Automatic Control, Special Issue on Applications of Kalman Filtering," 1983, 28(3).
Jackson, J.D., Classical Electrodynamics, Third Edition, 1999; 429-432, John Wiley and Sons, Inc., Hoboken, N.J.
Jesmanowicz et al., "Local Ferroshims Using Office Copier Toner," 2001, 124: 617, $9^{th}$ *Proceedings of the International Society of Magnetic Resonance in Medicine*.
Jhooti, P. et al., "Phase ordering with automatic window selection (PAWS): a novel motion-resistant technique for 3D coronary imaging," 2000, 403, 8th *Proceedings of the International Society of Magnetic Resonance in Medicine*.
Jung, C.W. "Surface Properties of Superparamagnetic Iron Oxide MR Contrast Agents: Ferumoxides, Ferumoxtran, Ferumoxsil," 1995;13(5):675-691, *Magn Reson Imaging*.
Jung et al., "Physical and Chemical Properties of Superparamagnetic Iron Oxide MR Contrast Agents: Ferumoxides, Ferumoxtran, Ferumoxsil," 1995;13(5):661-674, *Magn Reson Imaging*.
Kailath et al., "View of 3 Decades of Linear Filtering Theory," 1974, 20(2): 146-181, *IEEE Translations on Information Theory*.
Kahn, O., *Molecular Magnetism*, 1993; 9-10, Wiley-VHC, Weinheim, Germany.
Kalman, R.E., "A New Approach to Linear Filtering and Prediction Problems," 1960, 82(Series D): 35-45, *Transactions of the ASME Journal of Basic Engineering*.
Kim, D., "Influence of the K-Space Trajectory on the Dynamic T(1)-Weighted Signal in Quantitative First-Pass Cardiac Perfusion MRI at 3T," 2008, 59(1): 202-208, *Magn Reson Med*.
Kiselev et al., "Transverse Relaxation Effect of MRI Contrast Agents: A Crucial Issue for Quantitative Measurements of Cerebral Perfusion," 2005, 22(6): 693-696, *Journal of Magnetic Resonance Imaging*.
Koch et al., "Rapid Calculations of Susceptibility-Induced Magnetostatic Field Perturbations for in Vivo Magnetic Resonance," 2006;51(24):6381-6402, *Phys Med Biol*.
Larson et al., "Preliminary Investigation of Respiratory Self-Gating for Free-Breathing Segmented Cine MRI," 2005, 53(1): 159-168, *Magn Reson Med*.

Larson et al., "Self-Gated Cardiac Cine MRI," 2004, 51(1): 93-102, *Magn Reson Med*.
Lee et al., "Renal Function Measurements from MR Renography and a Simplified Multicompartmental Model," 2007, 292(5): F1548-1559, *American Journal of Physiology-Renal Physiology*.
Li et al., "Coronary Arteries: Three-Dimensional MR Imaging with Retrospective Respiratory Gating," 1996, 201(3):857-863, *Radiology*.
Li et al., "Quantifying Arbitrary Magnetic Susceptibility Distributions with MR," 2004, 51(5):1077-82, *Magn Reson Med*.
Li et al.. "Magnetic Susceptibility Quantitation with MRI by Solving Boundary Value Problems," 2003;30(3):449-453, *Med Phys*.
Lorensen et al., "Marching Cubes: A High Resolution 3D Surface Construction Algorithm," ACM Press; 1987: 163-169, *Proceedings of the 14th Annual Conference on Computer Graphics and Interactive Techniques*.
Lotz et al., "Cardiovascular Flow Measurement with Phase-Contrast MR Imaging: Basic Facts and Implementations," 2002, 22(3): 651-671, *Radiographics*.
Mahdi et al, "Quantative Mapping of Magnetic Fluid Distributions by Means of MR Susceptometry," Glasgow, Scotland, 2001: 797, $9^{th}$ *Proceedings of the International Society of Magnetic Resonance in Medicine*.
Maybeck, P.S., *Stochastic Models, Estimation and Control*, 1982: 129-130, Academic Press, New York, New York.
Meyer, C.H., "Simultaneous Spatial and Spectral Selective Excitation," 1990, 15(2): 287-304, *Magn Reson Med*.
Millard, R.K., "Indicator-Dilution Dispersion Models and Cardiac Output Computing Methods," 1997, 272(4 Pt. 2): H2004-2012, *American Journal of Physiology*.
Miraux et al., *Chemical Shift Angiography (CSA) with Dysprosium-DOTA*, 2003, Rotterdam. (abstract only).
Morgan et al., "Positive Default-Mode Activiation in Epilepsy using 2dTCA," 2007, 15: 2230, *Proceedings of the International Society for Magnetic Resonance in Medicine*.
Nguyen et al., "Direct Monitoring of Coronary Artery Motion with Cardiac Fat Navigator Echoes," 2003, 50(2): 235-241, *Magn Reson Med*.
Nguyen et al., "k-Space Weighted Least-Squares Algorithm for Accurate and Fast Motion Extraction from Magnetic Resonance Navigator Echoes," 2001, 46(5): 1037-1040, *Magn Reson Med*.
O'Handley, R.C. *Modern Magnetic Materials Principles and Applications*: John Wiley and Sons, inc.; 2000; 439-46, 448-9.
Ogawa et al., "The Sensitivity of Magnetic Resonance Image Signals of a Rat Brain to Changes in the Cerebral Venous Blood Oxygenation," 1993;29(2):205-210, Magn Reson Med.
Oshinski et al., "Two-Dimensional Coronary MR Angiography Without Breath Holding," 1996, 201(3): 737-743, *Radiology*.
Pauly et al., "A k-Space Analysis of Small-Tip-Angle Excitation," 1989, 81: 43-56, *J of Magn Reson*.
Prince et al., *3D Contrast MR Angiography*, 2003; 26-39, Springer, Berlin, Germany.
Proakis et al., *Digital signal processing : principles, algorithms, and applications*, 1996; 948, Prentice Hall, Englewood Cliffs, N.J.
Pruessmann et al., "Sense: Sensitivity Encoding for Fast MRI," 1999, 42(5): 952-962, *Magn Reson Med*.
Risse et al, "Dual-bolus approach to quantitative measurement of pulmonary perfusion by contrast-enhanced MRI," 2006, 24(6): 1284-1290, *Journal of Magnetic Resonance Imaging*.
Salomir et al., "A Fast Calculation Method for Magnetic Field Inhomogeneity Due to an Arbitrary Distribution of Bulk Susceptibility," 2003, 19B(1): 26-34, *Concept Magnetic Res*.
Schick et al., "Highly Selective Water and Fat Imaging Applying Multislice Sequences Without Sensitivity to B1 Field Inhomogeneities," 1997, 38(2): 269-274, *Magn Reson Med*.
Setser et al., "Cine Delayed-Enhancement MR Imaging of the Heart: Initial Experience," 2006, 239(3): 856-862, *Radiology*.
Sheppard et al., "Stochastic Models for Tracer Experiments in the Circulation: II. Serial Random Walks," 1969, 22(1): 188-207, *Journal of Theoretical Biology*.
Smirnov et al., "Single-Cell Detection by Gradient Echo 9.4 T MRI: a Parametric Study," 2006, 1(4):165-174, *Contrast Media and Molecular Imaging*.

(56) References Cited

OTHER PUBLICATIONS

Smith et al., "Application of Statistical Filter Theory to the Optimal Estimation of Position and Velocity on Board a Circumlunar Vehicle," 1962, NASA Ames Research Center, Moffet Field, CA.

Spraggins, T.A., "Wireless Retrospective Gating: Application to Cine Cardiac Imaging," 1990, 8(6): 675-681, *Magn Reson Imaging*.

Spuentrup et al., "Impact of Navigator Timing on Free-Breathing Submillimeter 3D Coronary Magnetic Resonance Angiography," 2002, 47(1): 196-201, *Magn Reson Med*.

Thorek et al., "Superparamagnetic Iron Oxide Nanoparticle Probes for Molecular Imaging," 2006;34(1):23-38, *Ann Biomed Eng*.

Van Osch et al, "Measuring the Arterial Input Function with Gradient Echo Sequences," 2003, 49(6): 1067-1079, *Magn Reson Med*.

Van Osch et al., "Partial Volume Effects on Arterial Input Functions: Shape and Amplitude Distortions and Their Correction," 2005, 22(6): 704-709, *Journal Magnetic Resonance Imaging*.

Wang al., "Algorithms for Extracting Motion Information from Navigator Echoes," 1996, 36(1):117-123, *Magn Reson Med*.

Wang et al., "Artery and Vein Separation Using Susceptibility-Dependent Phase in Contrast-Enhanced MRA," 2000, 12(5): 661-670, *Journal of Magn Reson Imaging*.

Wang et al., "Navigator-Echo-Based Real-Time Respiratory Gating and Triggering for Reduction of Respiration Effects in Three-Dimensional Coronary MR Angiography," 1996, 198(1): 55-60, *Radiology*.

Wang et al., "Magnetic Resonance Imaging Measurement of Volume Magnetic Susceptibility Using a Boundary Condition," 1999;140(2):477-481, *J Magn Reson*.

Weisskoff et al., "MRI susceptometry: Image-Based Measurement of Absolute Susceptibility of MR Contrast Agents and Human Blood," 1992, 24(2): 375-383, *Magn Reson Med*.

Weizenecker et al., "A Simulation on the Resolution and Sensitivity of Magnetic Particle Imaging," 2007, 52: 6363-6374, *Phys. Med. Biol.*

Weizenecker et al., "Three-Dimensional Real-Time in vivo Magnetic Particle Imaging," 2009, 54: L1-L10, *Phys. Med. Biol.*

Wilhelm et al., "Magnetophoresis and Ferromagnetic Resonance of Magnetically Labeled Cells," 2002, 31: 118, *Eur. Biophys. J.*

Won et al., "A Magnetic Nanoprobe Technology for Detecting Molecular Interactions in Live Cells," 2005;309(5731):121-125, *Science*.

Yeo et al., "Motion Robust Magnetic Susceptibility and Field Inhomgeneity Estimation Using Regularized Image Restoration Techiniques for fMRI," 2008, 5428: 991-998, *Medical Image Computing and Computer-Assisted Intervenetion*.

Zur et al., "Design of improved Spectral-Spatial Pulses for Routine Clinical Use," 2000, 43(3): 410-420, *Magn Reson Med*.

International Search Report from the European Patent Office in corresponding PCT Application No. PCT/US2009/042005 (Oct. 15, 2009).

\* cited by examiner

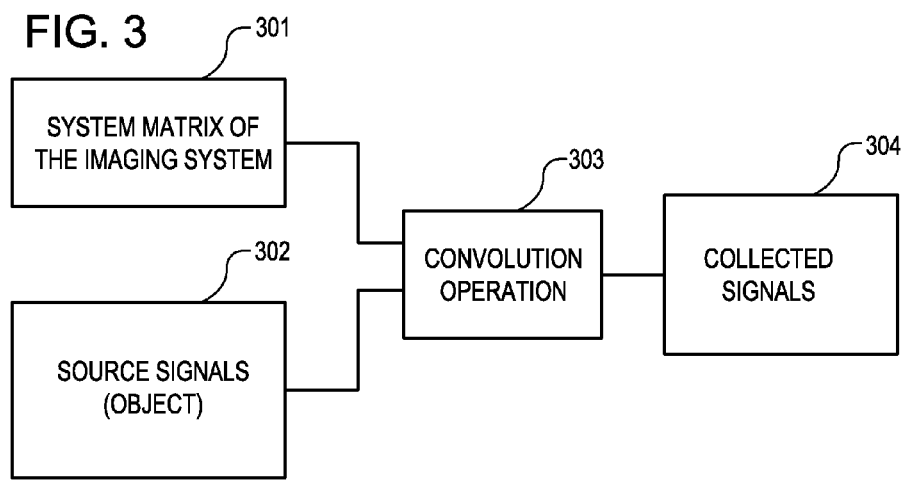
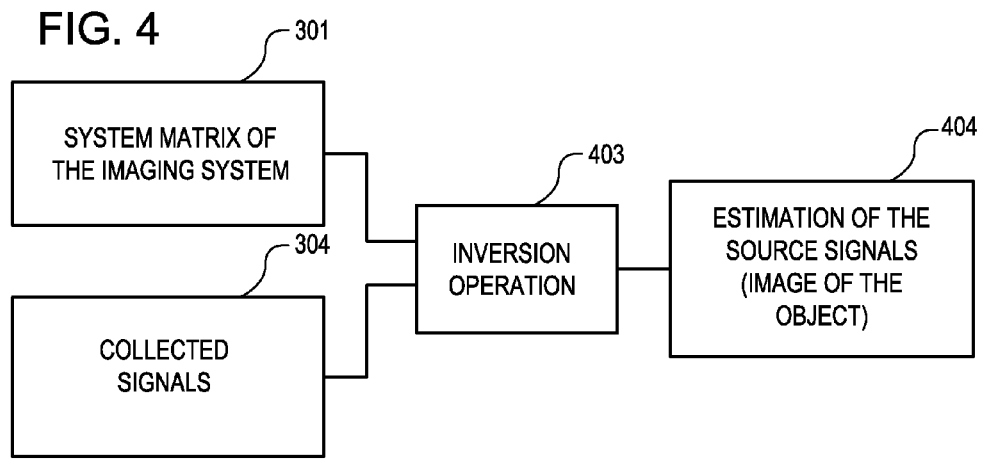

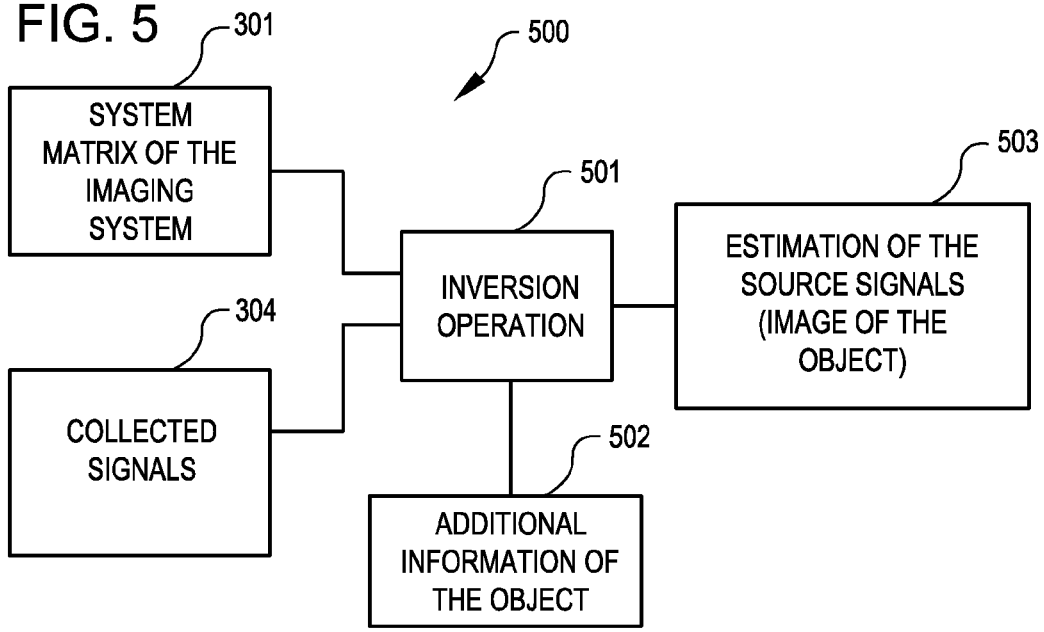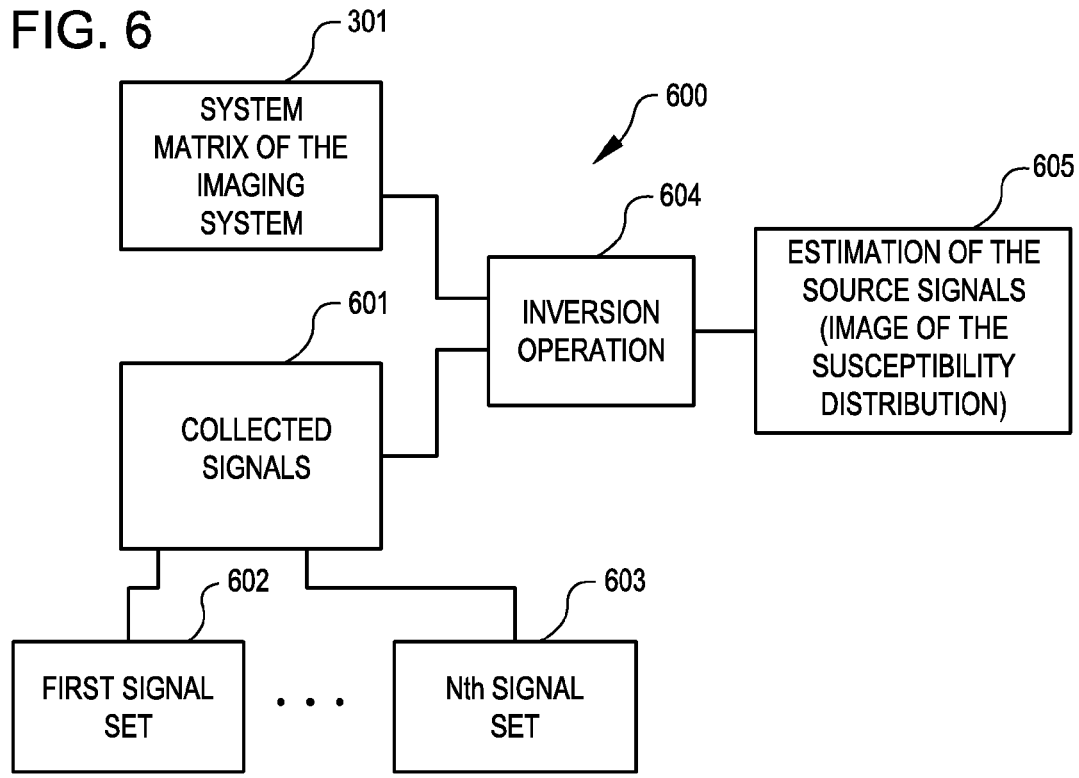

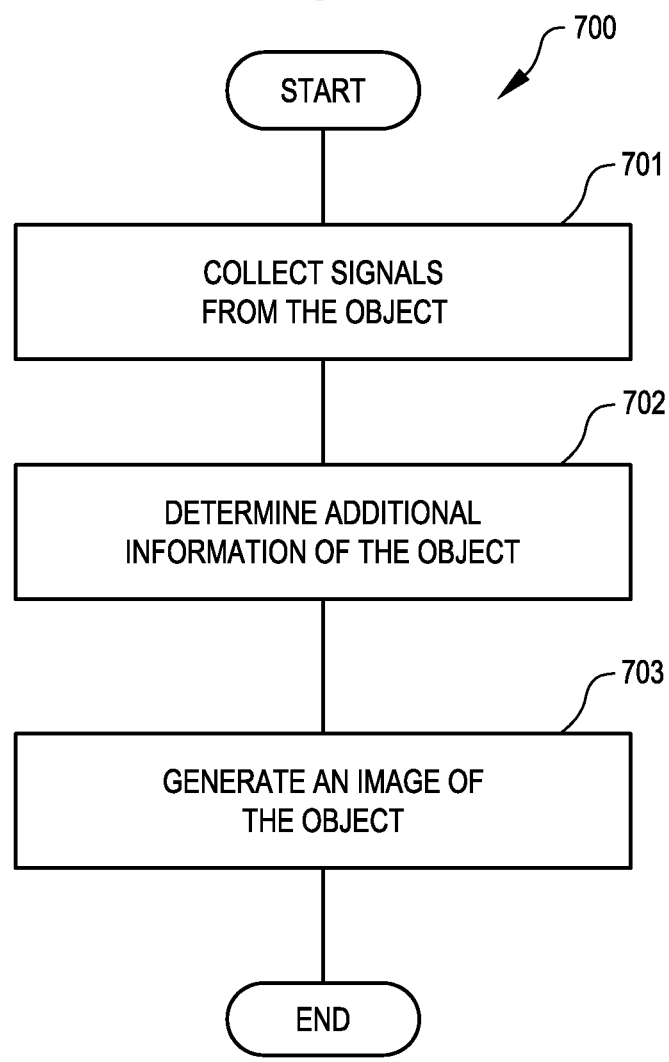

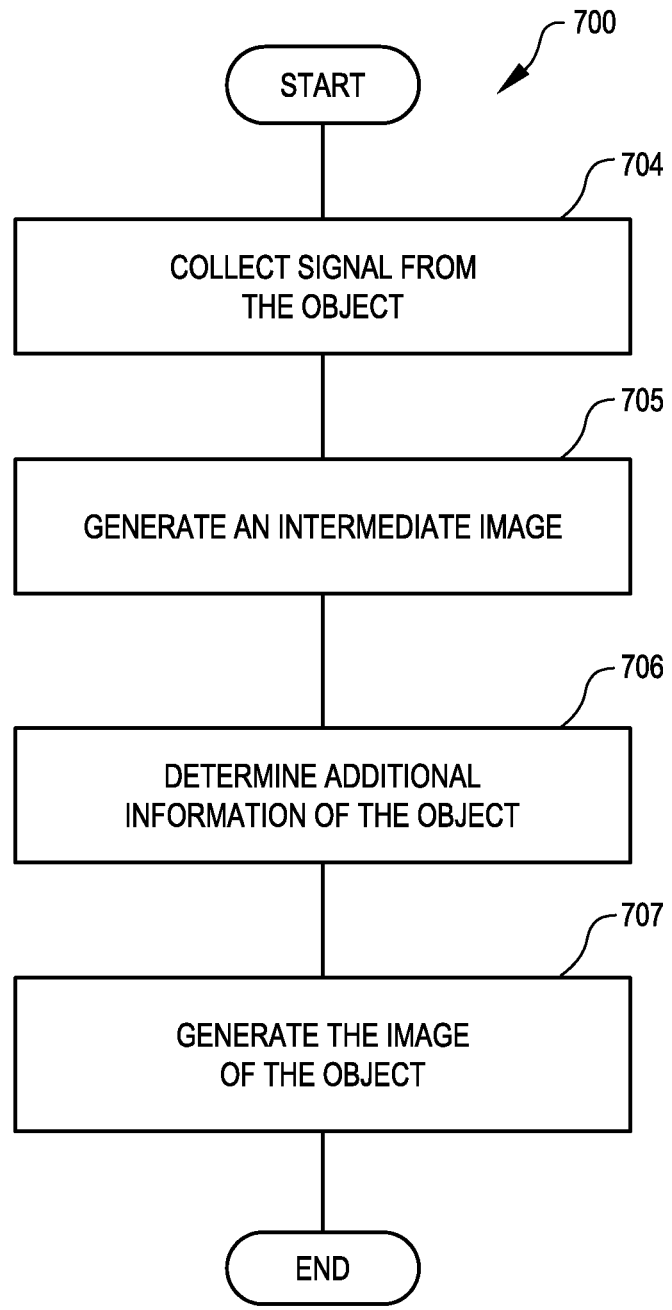

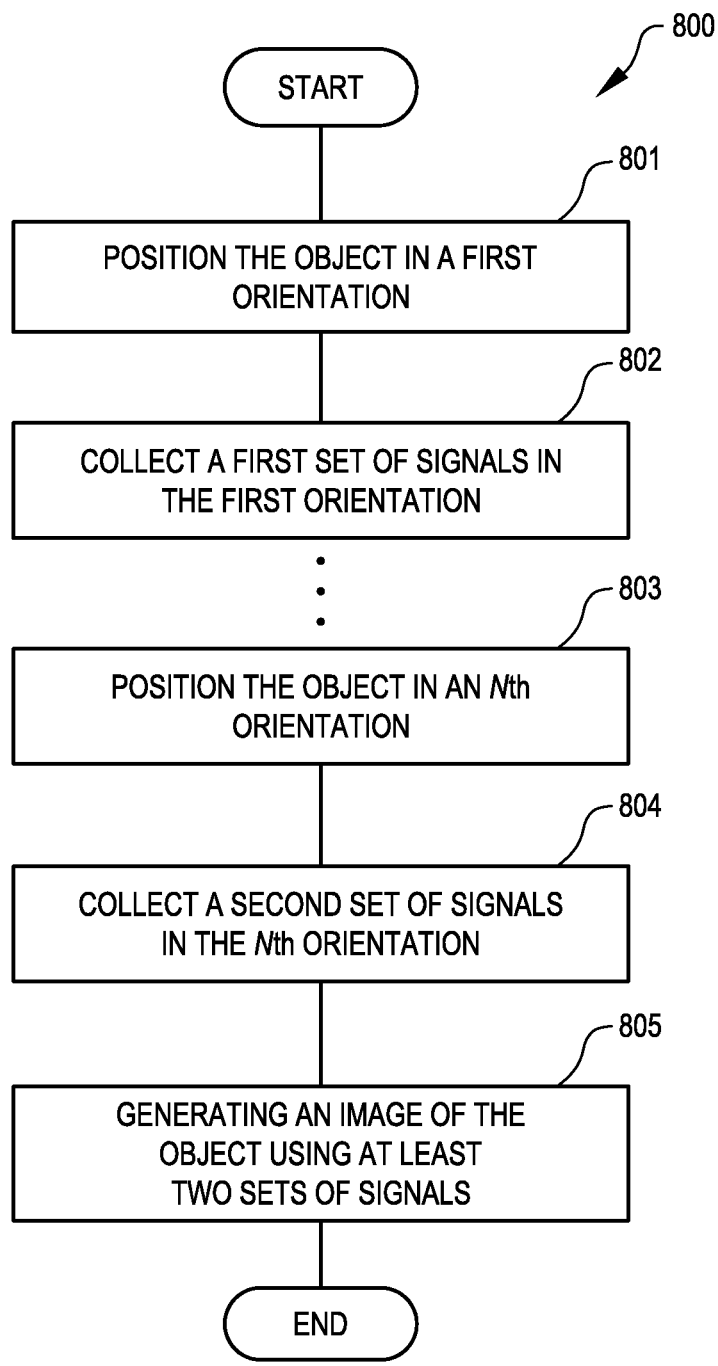

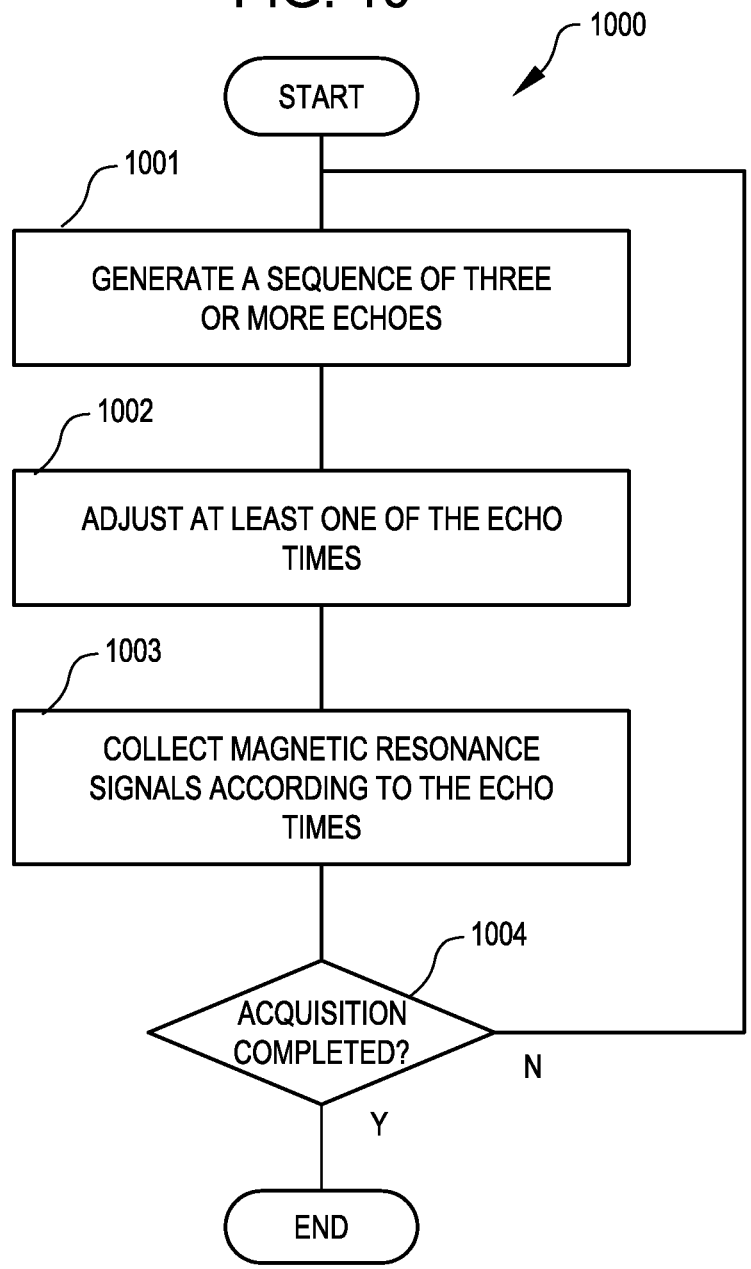

FIG. 17
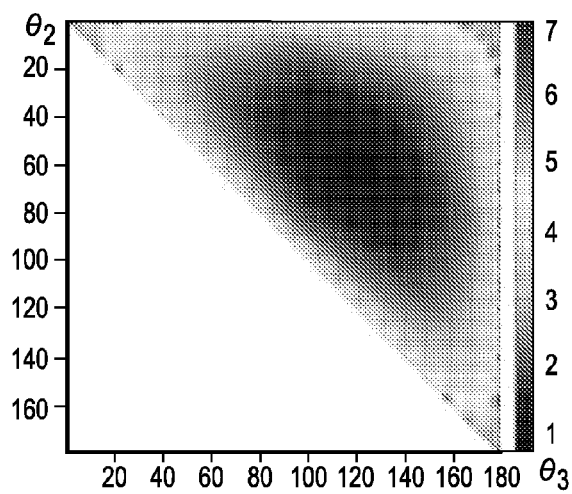
FIG. 18A  FIG. 18B  FIG. 18C
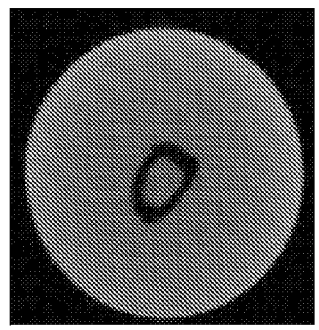 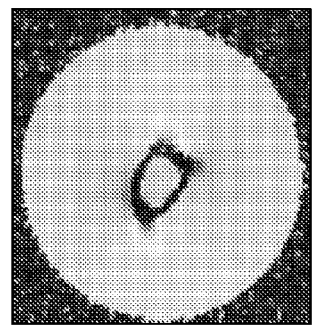 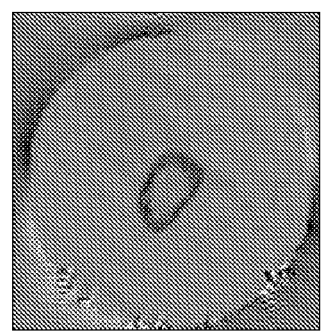

FIG. 19A
FIG. 19B
FIG. 19C
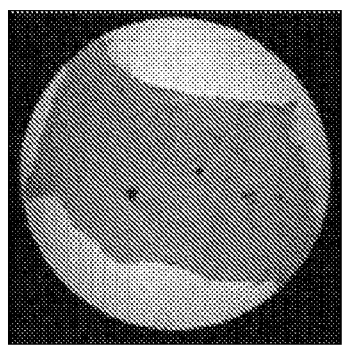 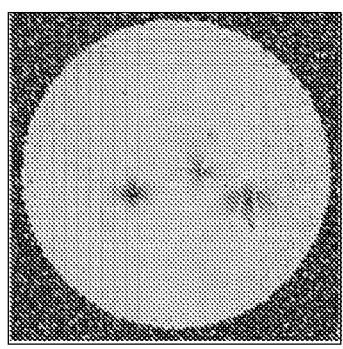 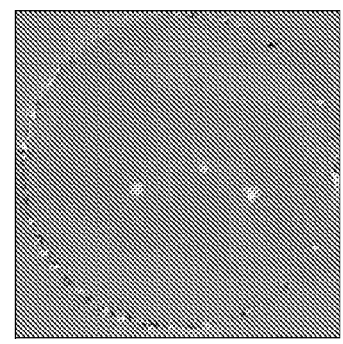
FIG. 20
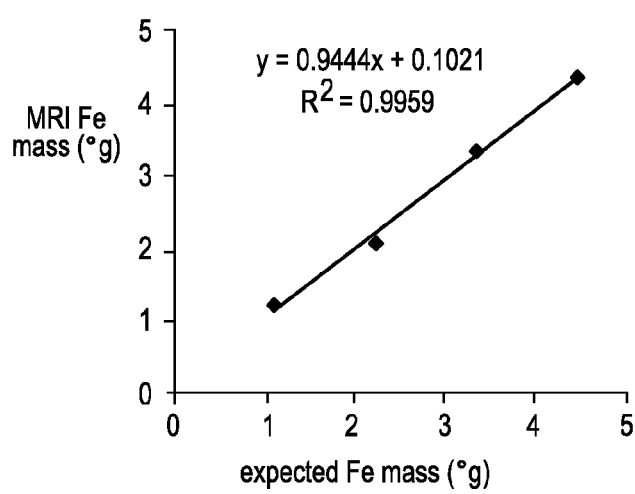

FIG. 24A
FIG. 24B
FIG. 24C
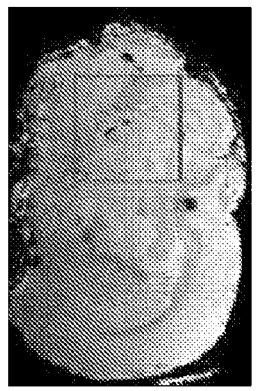
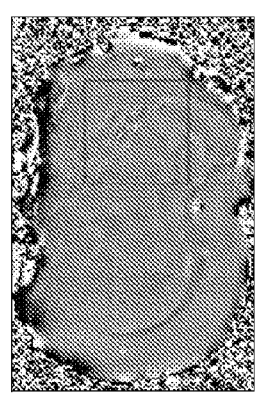
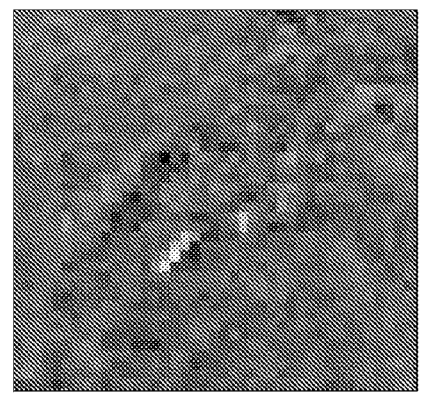
FIG. 24D
FIG. 24E
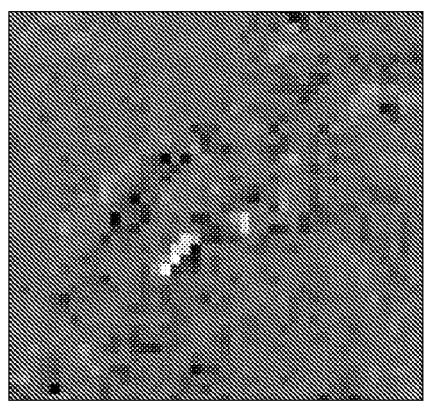
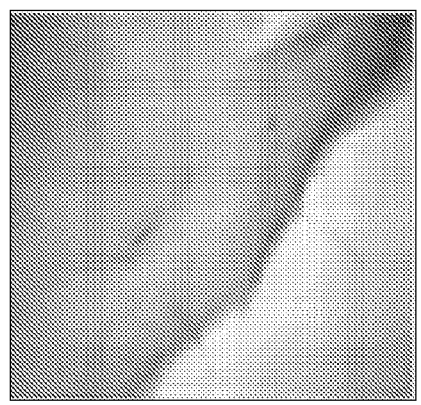

FIG. 35A
FIG. 35B
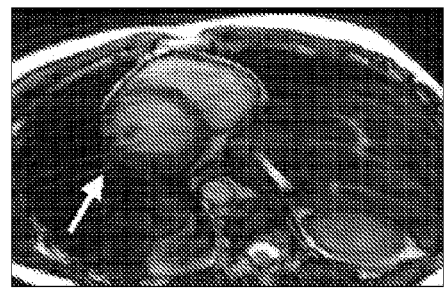
FIG. 36A
FIG. 36B
FIG. 36C
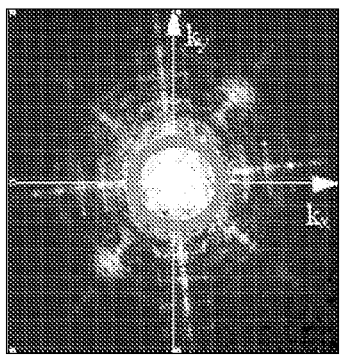
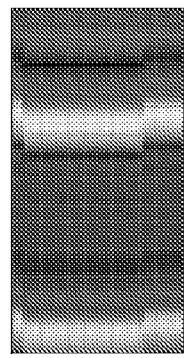
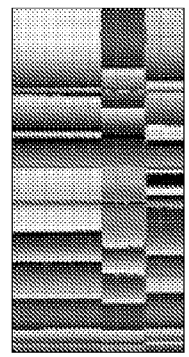
FIG. 37A
FIG. 37B
FIG. 37C
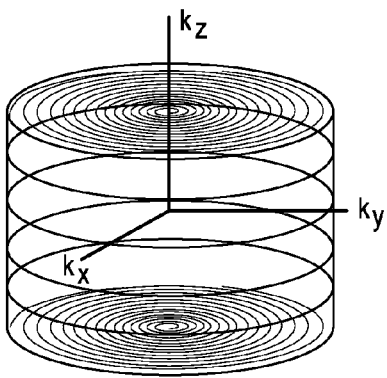
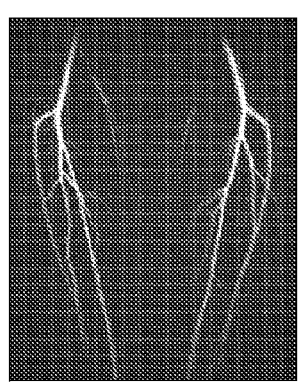
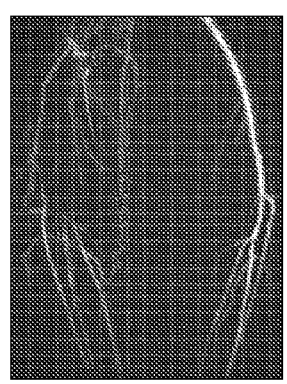

FIG. 55A  FIG. 55B  FIG. 55C
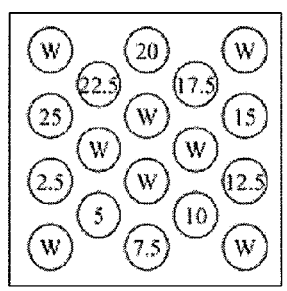 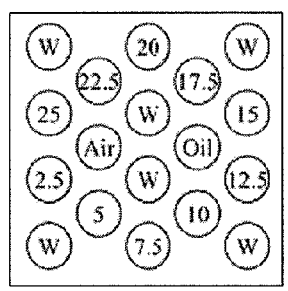 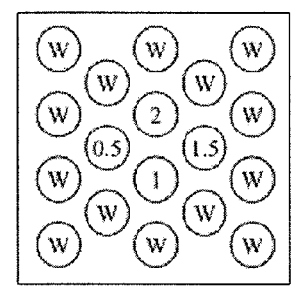
FIG. 55D  FIG. 55E  FIG. 55F
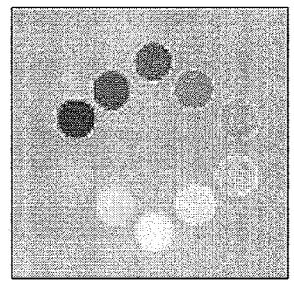 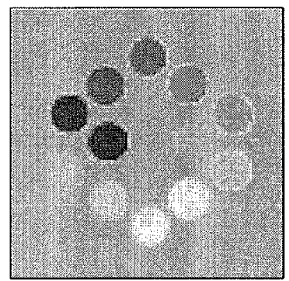 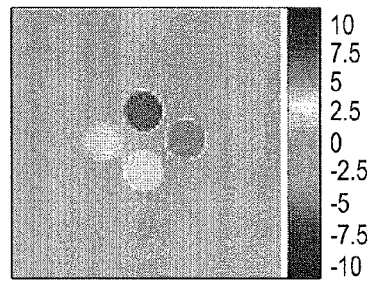

FIG. 57A
FIG. 57B
FIG. 57C
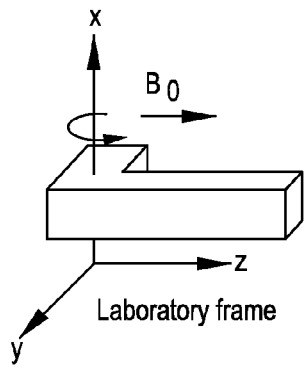
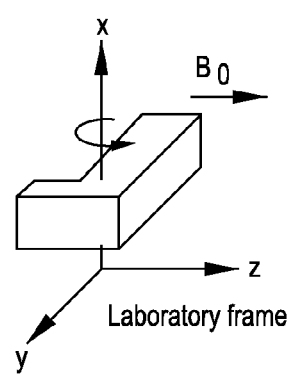
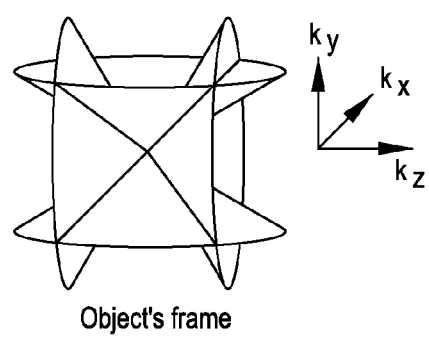
FIG. 58A
FIG. 58B
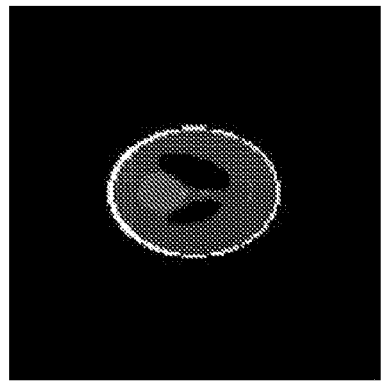
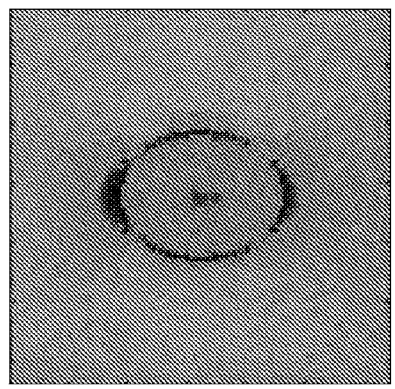
FIG. 58C
FIG. 58D
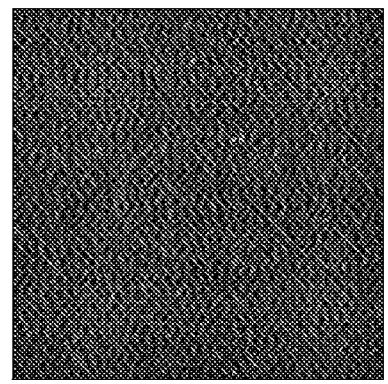
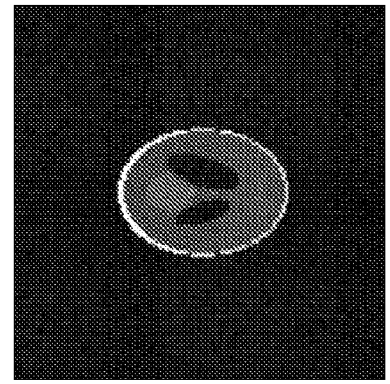

FIG. 61A
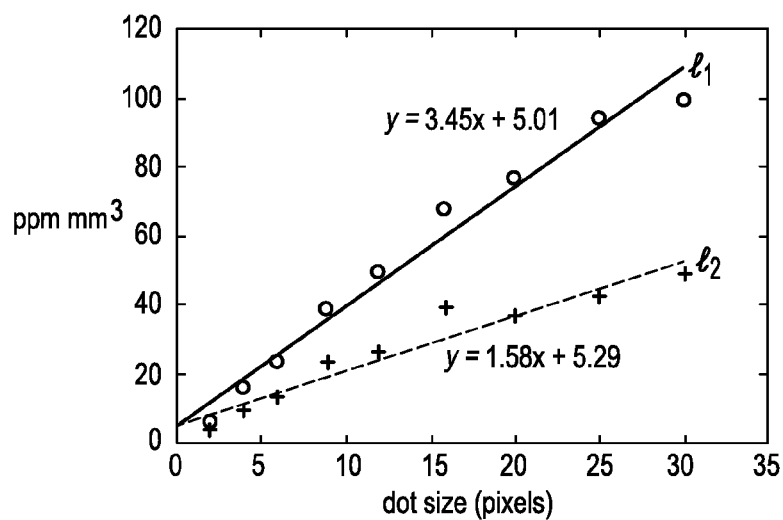
FIG. 61B        FIG. 61C        FIG. 61D
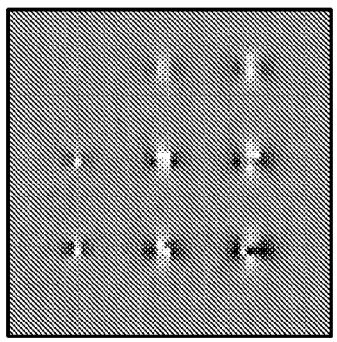 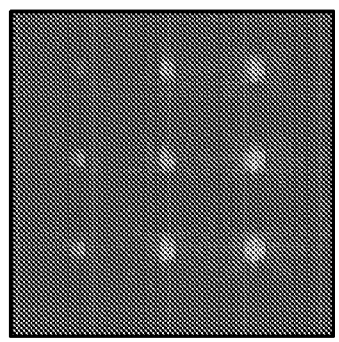 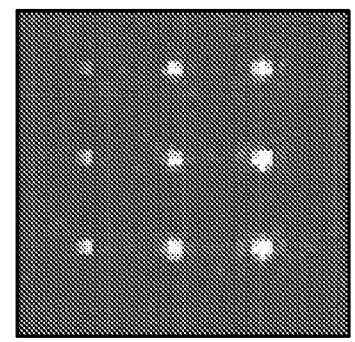

FIG. 63

$\ell_1$ regularized solver

```
1:  function L1SOL((χ⁽⁰⁾, u⁽⁰⁾), τ⁽⁰⁾, μ, ε, λ, α, β, N_barrier)
2:      for i ← 1, N_barrier do
3:          (χ⁽ⁱ⁾, u⁽ⁱ⁾) ← NEWT((χ⁽ⁱ⁻¹⁾, u⁽ⁱ⁻¹⁾), ε, λ, α, β)
4:          τ⁽ⁱ⁾ ← μτ⁽ⁱ⁻¹⁾
5:      end for
6:      return (χ⁽N_barrier⁾, u⁽N_barrier⁾)
7:  end function 8:  function NEWT((χ, u), ε, λ, α, β)
9:      repeat
10:         Σ₁₁ ← diag(χ − u)⁻² + diag(−χ − u)⁻²
11:         Σ₁₂ ← −diag(χ − u)⁻² + diag(−χ − u)⁻²
12:         w₁ ← 2τCᵀWᵀr − (χ − u)⁻¹ + (−χ − u)⁻¹
13:         w₂ ← τλ + (χ − u)⁻¹ + (−χ − u)⁻¹
14:         A ← 2τCᵀWᵀWC + Σ₁₁ − Σ₁₂²Σ₁₁⁻¹
15:         b ← w₁ − Σ₁₂Σ₁₁⁻¹w₂
16:         Δχ ← ConjugateGradients(A, b)
17:         Δu ← Σ₁₁⁻¹w₂ − Σ₁₁⁻¹Σ₁₂Δχ
18:         (χ, u) ← LineSearch((χ, u), (Δχ, Δu), α, β)
19:     until −∇G(χ, u)ᵀ[Δχᵀ Δuᵀ]ᵀ < 2ε
20:     return (χ, u)
21: end function 22: function LineSearch((χ, u), (Δχ, Δu), α, β)
23:     t ← 1
24:     χ̂ ← χ + tΔχ
25:     û ← u + tΔu
26:     while max_i(|χ̂_i| − û_i) > 0 do
27:         t ← βt
28:         χ̂ ← χ + tΔχ
29:         û ← u + tΔu
30:     end while
31:     while G(χ, u) + αt∇G(χ, u)ᵀ[Δχᵀ Δuᵀ]ᵀ > G(χ̂, û) do
32:         t ← βt
33:         χ̂ ← χ + tΔχ
34:         û ← u + tΔu
35:     end while
36:     return (χ̂, û)
37: end function
```

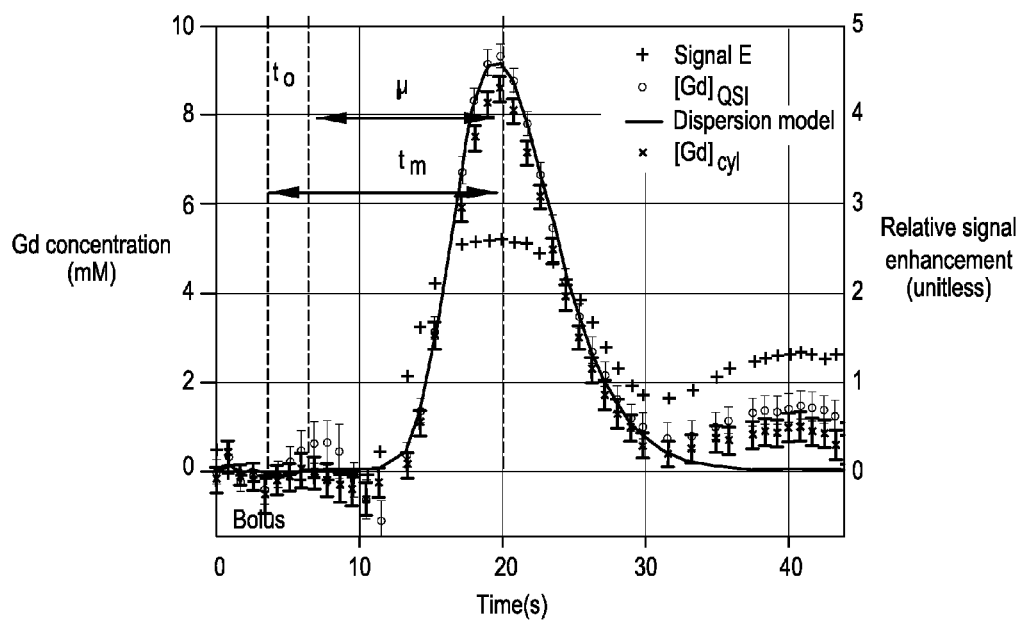

TOOL FOR ACCURATE QUANTIFICATION IN MOLECULAR MRI

CROSS-REFERENCE TO RELATED APPLICATIONS

This patent application is a U.S. National Phase application under 35 U.S.C. §371 of International Application No. PCT/US2009/042005, filed on Apr. 28, 2009, and claims the benefit of U.S. Provisional Patent Application No. 61/125,752, U.S. Provisional Patent Application No. 61/125,709, U.S. Provisional Patent Application No. 61/125,710, U.S. Provisional Patent Application No. 61/125,713, U.S. Provisional Patent Application No. 61/125,727 and U.S. Provisional Patent Application No. 61/125,704, all of which were filed on Apr. 28, 2008. The International Application was published in English on Nov. 5, 2009, as WO 2009/134820 A2 under PCT Article 21(2). Each of these patent applications is hereby incorporated by reference for everything they describe without exception.

STATEMENT REGARDING FEDERALLY SPONSORED RESEARCH AND DEVELOPMENT

This invention was made with Government support under Grant Numbers R01HL062994 awarded by the National Institutes of Health. The Government has certain rights in this invention.

FIELD OF THE INVENTION

The invention relates generally to the analysis of image data and more particularly to extracting attributes of objects represented in image data from the image data.

This patent application is also related to the following publications:
1. de Rochefort L, at al (2009) In vivo quantification of contrast agent concentration using the induced magnetic field for time-resolved arterial input function measurement with MRI. Med. Phys. 2008 December; 35(12):5328-39.
2. Liu T, et al (2009) Calculation of susceptibility through multiple orientation sampling (COSMOS): a method for conditioning the inverse problem from measured magnetic field map to susceptibility source image in MRI. Magn Reson Med. 2009 January; 61(1):196-204.
3. de Rochefort L, et al. (2008) Quantitative MR susceptibility mapping using piece-wise constant regularized inversion of the magnetic field. Magn Reson Med. 2008 October; 60(4):1003-9.
4. Spincemaille P, et al (2008) Kalman filtering for real-time navigator processing. Magn Reson Med. 2008 July; 60(1): 158-68.

Each of these publications is hereby incorporated by reference in its entirety and for everything it describes without exception.

BACKGROUND OF THE INVENTION

Magnetic resonance imaging (MRI) with its lack of ionizing radiation, good sensitivity of deep tissue, rich tissue contrast, and high-resolution capability offers many advantages for anatomical and functional imaging of various organ systems from humans to mice. MRI is highly suited for imaging events at the cellular and subcellular levels.

The phase divided by the imaging echo time and the gyromagnetic constant is the local magnetic field of magnetic biomarkers. The local field is a convolution of a dipole field kernel with the biomarker's magnetization distribution. The inverse solution from field to source quantitatively determines the magnetization distribution or the concentration map for a given magnetic biomarker.

Molecular imaging is a rapidly emerging biomedical research discipline that includes the use of targeted or activatable reporter agents to sense specific molecular targets, cellular processes, or particular pathways. Quantification is essential for measuring and characterizing biological processes. While MRI is an important tool for molecular imaging, current relaxation-based quantification in molecular MRI has been problematic due to the complex relation between the detected MR signal intensity and the magnetic biomarkers.

Molecular imaging refers to in vivo visualization and measurement of biological processes at the molecular and cellular level using endogenous or exogenous biomarkers. Quantification of biomarkers or contrast agents is essential for molecular imaging to stratify disease and gauge therapy. MRI is a very useful modality for molecular imaging because it does not use ionizing radiation and offers unlimited depth penetration and high spatial resolution. However, current quantification of magnetic biomarkers in molecular MRI based on relaxation measurements is well known to be problematic: 1) a calibration is needed for absolute quantification, and 2) the assumption of spatially uniform availability of free water for relaxation (T1 and T2) with contrast agent breaks down when contrast agents become bound to cells and molecules as in molecular imaging. Other approaches for visualizing contrast agents in MRI using the negative susceptibility-relaxation T2* contrast or off-resonance phenomenon have not shown to be capable of quantification.

Quantification is essential in experimental methods used to study biochemical reactions, biomolecular pathways and biological processes in health and disease. The importance of quantifying molecular/cellular events cannot be overemphasized for molecular imaging. For example, the use of nanoparticles as delivery vehicles for diagnostic and therapeutic agents requires accurate counts of nanoparticles accumulated at the diseased tissue to make diagnostic decisions and gauge therapeutic dose. The measurement of drug dose at targeted sites is essential for monitoring therapy. The count of stem cells homing at diseased tissue would be essential in optimizing cell therapy protocols. The goal of in vivo study of biochemistry through imaging necessitates a means to quantify molecular events. Quantitative accuracy and reproducibility have to be established to standardize and cross-validate molecular MRI methods. So far there is no effective tool to quantify molecular/cellular events. Molecular MRI investigations have been only qualitative or semi-quantitative. Estimation of signal changes currently used in MRI, such as hypointensity in detecting SPIO labeled or targeted cells does not provide absolute quantification and may be highly dependent on imaging parameters, pulse sequences and field strengths. Absolute quantification of magnetic biomarkers will enable longitudinal investigations and inter- and intra-scanner evaluations that are essential to molecular imaging based diagnostics and therapeutics.

A specific example is to develop targeted cancer therapeutics that aims to kill tumors without damaging healthy tissue. The many possible drug interactions in a human system make it very difficult to increase the desired site specificity, and a noninvasive quantitative determination of drug biodistribution would be a very useful tool to guide the development of cancer targeting. Recently multifunctional polymeric micelles loaded with SPIO and doxorubicin for cancer targeted delivery have been developed. Current MRI techniques allow visualization but not quantification of SPIO.

Another example is to develop noninvasive MRI of gene expression. In vivo detection of gene expression using optical or radioactive reporters shows great promise in monitoring cell trafficking, gene replacement therapy, protein-protein interactions, neuronal plasticity, and embryonic development; however, overcoming tissue opacity and resolution limitations remains a key challenge. MRI reporters that generate contrast agents have been developed, providing high resolution deep tissue in vivo imaging and anatomic correlation. Current MRI techniques allow good visualization but not accurate quantification of gene expressed contrast agents due to limited free water for relaxation.

To explore biomedical applications, magnetic susceptibility measurements of biomaterials have been investigated using a superconducting quantum interference device (SQUID) and MRI signal phase. The basic approach for estimating an object's susceptibility is to polarize the object with a known primary magnetic field and measure the field associated with the magnetization of the polarized object. Maxwell's equations determine the relation between the measured field and object magnetization. The fields of several objects are added together linearly according to the superposition principle. The volumetric magnetic susceptibilities for biomaterials and contrast agents at practical concentrations are much smaller than one (<<100 ppm), and accordingly their mutual polarization effects may be ignored.

There are difficulties of quantification in molecular MRI using traditional relaxation susceptibility contrast mechanisms. For example, using superconducting detection coils, a superconducting quantum interference device (SQUID) can detect small flux of the magnetic field of an object magnetized by a primary field. Assuming the object is comprised of regions of uniform susceptibility distribution, regional susceptibilities are related to SQUID coil fluxes through numerically calculated geometry factors, allowing estimation by inverting a set of linear equations. It has also been proposed that a 3D susceptibility distribution may be reconstructed by using a composite of multiple SQUID coils in a manner similar to the inversion used in magnetoencephalography (MEG). Because SQUID coils of finite sizes have to be placed outside the human body, the number of flux detectors is limited, the inversion reconstruction is not well behaved, and the spatial resolution of mapping static susceptibility is very poor as demonstrated in MEG. The poor spatial resolution (~1 cm) will make it difficult to resolve magnetic biomarker distribution in molecular imaging. Furthermore, this technology is not widely available and its clinical applicability is therefore limited.

MRI signal phase is proportional to magnetic field times echo time. Therefore, each voxel in MRI is analogous to a self-contained SQUID coil, allowing detection of local magnetic fields associated with the magnetization of susceptible materials polarized by B0 of the MR scanner. Since there are many voxels available for field detections, MRI can be a powerful method for determining susceptibility.

The static dephasing regime theory may be used to estimate susceptibility from signal amplitude temporal variation assuming a voxel containing many identical susceptibility particles and background materials. The application of this assumption in practice remains to be investigated. Furthermore, signal may not be measurable everywhere, for instance near regions of signal void caused by strongly varying susceptibility or low water density.

Currently, dark regions in T2* weighted MRI have been used to identify the presence of iron, by interpreting the observed signal loss as caused by intravoxel dephasing effects of local magnetic fields of iron deposits. This hypointensity depends on voxel size and orientation, may be confused with other signal voids, leading to inaccurate visualization and inadequate quantification of iron deposits.

Brain iron has been investigated substantially for a potential biomarker for many brain diseases including neurodegenerative diseases (Parkinson's disease, Alzheimer's disease, Huntington's disease, and multiple sclerosis), iron overloading disorders, chronic hemorrhage, cerebral infarction and other causes of bleeding and microbleeding. Localized iron in the brain is primarily in the forms of ferritin and its degradation product, hemosiderin. Ferritin has a large spherical protein coat (~12 nm in diameter) that surrounds a crystalline core of hydrous ferric oxide. As much as 4500 iron atoms ($Fe^{3+}$) can be stored in the 8-nm-diameter internal cavity of one ferritin protein. Hemosiderin appears to be associated with iron overload disorders and hemorrhage.

BRIEF SUMMARY OF THE INVENTION

The invention provides an apparatus and method for providing an image from energy signals collected from an object. The collected energy signals include complex signals having phase and magnitude information that are used to determine certain characteristics of the object. The image of the object is generated from the energy signals associated with the imaging modality and from additional information of characteristics of the object such that the image includes a representation of a quantitative estimation of the characteristics. The image is used to extract quantitative information of the characteristics or to generate information for use in computer aided diagnosis.

In one embodiment of the invention, intermediate data is generated using the collected complex signals. The intermediate data are generated from phase data indicative of the local magnetic field and is combined with the additional information to generated the image of the object. The intermediate data includes a phase image determined by a local magnetic field.

In one embodiment, the imaging modality is magnetic resonance imaging and the complex signals are magnetic resonance signals from a nuclear magnetic resonance process. The characteristic is a susceptibility distribution of the object that have a spatial property. In another embodiment, the imaging modality is ultrasound imaging and the complex signals are ultrasound waves. In yet another embodiment, the imaging modality is ionizing radiation imaging such as X-ray imaging, Computed Tomography (CT), Positron Emission Tomography (PET), or Single Photon Emission Computed Tomography (SPECT), where the wave property of the X-ray is used to image the object.

In a magnetic resonance system, a magnetic source magnetic resonance imaging is provided based on an inversion operation describing a relationship between field and source signals. According to the invention, a condition of the inversion operation is improved based on the additional information of the object or by combining the magnetic resonance signal and the additional information. The image of the object is generated using the magnetic resonance signals and the inversion operation, where the image represents a quantitative estimation of the susceptibility distribution of the object.

The invention is preferable realized by computer executable code maintained on one or more computer readable media for instructing one or more digital processors. However, the invention can also be realized by dedicated hardware or a combination of computer executable code and dedicated hardware. Furthermore, the image may be processed to be presented in a form best suited for diagnosis by visual inspection by an expert. Alternatively, the image may be presented to a computer executing computer code for providing an automated diagnosis of the image.

In some embodiments, one or more computer readable media are provided for storing the computer executable code that instructs one or more digital processors to provide magnetic source magnetic resonance imaging. According to these embodiments, the computer executable code includes instructions for collecting magnetic resonance signals emitted by an object and for generating an image of the object from the magnetic resonance signals and additional information describing a relationship between field and source signals.

In some further embodiments, the computer executable code also provides instructions for storing the magnetic resonance signals, receiving user inputs; displaying the image. The invention also provides instructions for determining the additional information independently from the magnetic resonance signals. The additional information may be determined from the user inputs or from the magnetic resonance signals. The image is further transmitted through a computer network.

In the several embodiments of the invention described in detail herein, the additional information is provided by several alternative sources. In one embodiment, the additional information comprises predetermined characteristics of the object. In another embodiment, the additional information includes a magnitude image generated from the object. In a third embodiment, the collected signals include a first set of imaging signals and the additional information includes a second set of imaging signals. In one implementation of this embodiment, the first and second sets of images are obtained from different orientations of the object.

In the embodiment using the predetermined characteristics of the object to generate the image. The image is generated by minimizing a cost function on a digital processor according to an iterative process. The iterative process is based on one of a conjugate gradient method, a dual coordinate ascent method, a cross entropy method, and a homotopy continuation based method. The cost function is a Bayesian formula established based on the magnetic resonance signals and the predetermined characteristics, including at least a first term based on the magnetic resonance signals and a second term based on the predetermined characteristics.

The first term is indicative of a difference of the collected magnetic resonance signals and an estimation of the magnetic resonance signals. The estimation of the magnetic resonance signals includes a convolution of a kernel and a quantitative estimation of the susceptibility distribution. In addition, the first term includes a weighting factor corresponding to a noise signal. In one embodiment, the noise signal is extracted from the magnetic resonance signals and a covariance of the noise signal is calculated. The weighting factor is a covariance matrix of the noise signal determined based on the covariance of the noise signal. Alternatively, the first term includes an l-2 norm of the difference.

The second term regularizes the susceptibility value in a region where susceptibility does not vary or in a region where susceptibility varies. The second term may further includes at least two terms: a term regularizing the susceptibility value in a region where susceptibility does not vary and a term regularizing the susceptibility value in a region where susceptibility varies. In a further embodiment, the second term expressing the predetermined characteristics includes one of an l-2 norm, an l-1 norm, an l-0 norm, an l-1.1 norm, an Lp norm, and wavelet operations. The second term may include at least one of a linear and a non-linear regularization terms. The second term may further includes at least one of a linear operator and a scaling factor. Alternatively, the second term is indicative of at least one boundary condition or is associated with a priori probability of the susceptibility distribution.

In some embodiments, the cost function includes the following terms:

$$\|W(CX-\delta)\|_2^2 + \alpha^2 \|W_0 X\|_2^2 + \beta^2 \|W_1 GX\|_2^2,$$

wherein C is a convolution matrix obtained by discretizing a convolution kernel, X is the image of the object, $\delta$ indicates the normalized local magnetic field obtained from the magnetic resonance signals, W, $W_0$, and $W_1$ are weighting matrices, $\alpha$ and $\beta$ are regularization parameters, G is a gradient operator, and $\|\ \|_2$ is an l-2 norm operator. Alternatively, the cost function includes the following terms:

$$\|w(r)(\delta b(r) - d(r) \otimes \chi(r))\|_2^2 + \alpha \|(S[\chi(r)])\|_p + \beta \|(G[\chi(r)]/G[I(r)])\|_p$$

wherein w(r) are the weights, $\delta$ indicates the normalized local magnetic field obtained from the magnetic resonance signals, $\alpha$ and $\beta$ are regularization parameters, where S[ ] is a segmentation operator as defined from the magnitude T2* image I(r), G[ ] is a gradient operator, and $\|\ \|_p$ is an Lp norm operator. Still alternatively, the cost function includes the following terms:

$$\|w(r)(\delta b(r) - d(r) \otimes \chi(r))\|_2^2 + \alpha \|(S[\chi(r)])\|_p + \beta \|g[\chi(r)]/\chi m - g[I(r)]/Im\|_p$$

wherein w(r) are the weights, $\delta$ indicates the normalized local magnetic field obtained from the magnetic resonance signals, $\alpha$ and $\beta$ are regularization parameters, where S[ ] is a segmentation operator as defined from the magnitude T2* image l(r), G[ ] is a gradient operator, and $\|\ \|_p$ is an Lp norm operator.

In the equation described above, $W_0$ includes priori information of the susceptibility distribution. The priori information is obtained from a magnitude image of the object including gradient information obtained from the magnitude image.

In the embodiments using the magnitude image to generate the image of the object, the magnitude image is used to determined some pre-determined characteristics of the object using a segmentation process. In one embodiment, the invention includes generating the magnitude image of the object based on the signals, segmenting the magnitude image into one or more image regions, and generating the image of the object from the magnetic resonance signals and the segmented magnitude image. The image of the object has one or more image regions corresponding to those of the segmented magnitude image. In another embodiment, the invention includes segmenting the magnitude image into non-overlapping segmented regions. Each of the segmented regions has a substantially uniform characteristic. The inversion operation and the magnetic resonance signals are then divided in accordance with the segmented magnitude image. One or more portions of the image are generated based on the divided inversion operation and the divided magnetic resonance signals. The one or more portions of the image corresponds to the one or more segmented regions of the magnitude image and are combined into the image.

In the embodiments using the first and the second sets of imaging signals to generate the image, the signals are collected in two or more orientations and the image. In one embodiment, the magnetic resonance signals collected from one of the one or more orientations are combined with the magnetic resonance signals collected from another one of the one or more orientations so as to improve a visual quality of the image that enables an attribute of the object to be quantified by its visual appearance. In another embodiment, the method further includes positioning the object in a first orientation of the two or more orientations, collecting a first set of the magnetic resonance signals in the first orientation, positioning the object in a second orientation of the two or more orientations, and collecting a second set of the magnetic resonance signals in the second orientation.

The invention also provides for a system utilizing a magnetic resonance imaging device that collects magnetic resonance signals and provides magnetic source magnetic resonance imaging of an object. In the third embodiment, the system includes means for changing a relative orientation between the object and the polarization field from a first orientation to a second orientation, means for collecting the first set of imaging signals from the object in the first orientation and the second set of imaging signals from the object in the second orientation. The system further includes means for generating a quantitative susceptibility image of the object by combining the second set of magnetic resonance signals with the first set of magnetic resonance signals. The relative orientation may be changed by repositioning the object or by repositioning the magnetic resonance imaging device.

In keeping with the invention, a display device for displaying a magnetic source magnetic resonance image includes a display area for displaying an image of a susceptibility distribution of an object and means for visualizing a quantitative attribute of the image of the susceptibility distribution of the object, wherein the quantitative attribute is based on magnetic resonance signals collected from the object and additional information about the susceptibility distribution. In one embodiment, the display includes means for color-coding the image in accordance with the quantitative attribute. The display may also support means for displaying another image of the object, wherein the other image overlaps the image of the susceptibility distribution. By way of example, the other image may be a magnetic resonance image, a computed tomography image or an ultrasound image. The display may also provide for means to register the image of the susceptibility distribution with the other image of the object.

The image as generated can be used in computer aided diagnosis according to the invention. According to several embodiment, the invention provides instructions for detecting in the image a diagnostic feature or for determining quantitative information of the diagnostic feature. The diagnostic feature includes at least one of a microbleed, a blood movement, a metal deposit, a calcified deposit, a bone tissue, a contrast agent, a therapeutic coupled to the contrast agent, a diagnostic agent coupled to the contrast agent, a chemical reaction, and a particle stability.

The image may be used to detect a chemical reaction based on the image and to determine quantitative information of the chemical reaction. Furthermore, the chemical reaction may be monitored based on a series of images preferably generated by the method described herein. Additionally, the image can also bed used to monitor a particle stability. The image may be used to detect microbleeding or further determine quantitative information of the microbleeding. The image may also be used to determined an age of the microbleeding.

In some embodiments, the image includes quantitative information of a blood movement or of a metallic compound detected using the image. The image is used to quantify the metallic compounds based on the quantitative information. The metallic compounds include at least one of iron copper, and manganese compounds.

In several embodiments, the image includes quantitative information of minerals and the image is used to detect the minerals or quantifying the minerals based on the quantitative information. The minerals include at least one of a calcified deposit and a bone tissue in a patient. The quantitative information is indicative of at least one of calcified deposits in a cardiovascular system, an amount of bone, and a bone density.

In several embodiments, the image includes quantitative information of a contrast agent administered to the patient and the image is used to detect a presence of the contrast agent or to determine the quantitative information of the contrast agent. The contrast agent is one of a gadolinium-based agent, an iron-based agent, a manganese-based agent, a barium-based agent, a perfluorocarbon-based agent, and a clay agent. The image is further used to quantify a movement of the contrast agent.

In some embodiments, the image includes quantitative information of a therapeutic coupled to a contrast agent administered to the patient and the image is used to detect a presence of the therapeutic or to determine the quantitative information of the therapeutic. he therapeutic is one of a cell therapeutic, an antibody, a small molecule, a nucleic acid, and a gene therapy vector.

In some embodiments, the image includes quantitative information of a diagnostic agent coupled to a contrast agent administered to the patient and the image is used to detect a presence of the diagnostic agent or to determine the quantitative information of the diagnostic agent. The diagnostic agent is one of an antibody, a small molecule, and a nucleic acid In still some other embodiments, the image includes some undesirable affects including those caused by noises, a background field, or a chemical shift. The undesirable effects are then removed in accordance with one of a polynomial fitting method, a material padding method, and a Maxwell equation. Alternatively, to remove the undesirable effects, the object is padded using a material having a susceptibility similar to the expected average susceptibility of the object. Alternatively, the material has a susceptibility similar to that of water. In some embodiments, the undesirable effects are removed calculating an integral in accordance with a geometry of the object estimated from the magnitude image. In some other embodiments, the noise signal is removed from the imaging signal by a spatial filter.

In some embodiments, the undesirable effect is caused by a chemical shift. The chemical shift component is determined in accordance with an iterative method where a cost function is minimized. According to a further embodiment, an initial estimation of the chemical shift signal is estimated, an estimation of the spatial characteristics of the object is calculated based on the imaging signal and the initial estimation of the chemical shift signal in accordance with the iterative method, and the susceptibility image and a mask image indicative of the chemical signal are generated. Alternatively, an magnetic resonance signal is generated from the object and is then decomposed into chemically-shifted components and eater components using an iterative algorithm. The iterative algorithm comprises imposing a piecewise smooth prior.

In still some further embodiments, the image is color-coded according to the spatial characteristic of the object. The color-coded image is then combined with another image of the object to form a composite image. The another image of the object includes at least one of a computed tomography image, a magnetic resonance image, and an ultrasound image. Furthermore, the color-coded image is registered to the another image.

In at least one imaging modality, the invention provides a reliable and accurate susceptibility imaging method for quantitative mapping of magnetic biomarkers. Three different approaches for regularizing the inverse problem are disclosed-(1) using a priori knowledge for sparse images, (2) using magnitude information and (3) using sampling from multiple orientations.

A robust inversion method is described, making full use of all information in the T2* gradient echo image data. The phase image, typically neglected in MRI, is used to generate a local magnetic field map. The magnitude image is used to guide the inverse algorithm through a regularization term for generating magnetization/susceptibility maps.

According to the several embodiments, the inverse problem from magnetic field to susceptibility source is solved by improving the condition of the inversion matrix through data acquisition, and/or by regularizing its solution with a priori knowledge. Data acquisition for quantitative susceptibility imaging is gradient echo T2* imaging that uses an echo time with sufficient phase accrual. Magnetic field map $\delta_b(r)$ is derived from image phase. The image magnitude is used as a weighting factor or a regularization term to guide the inversion from field to source. The inversion algorithm outlined in this research provides an effective use of both phase and magnitude information in MRI, where so far phase information has been largely ignored. The accuracy of quantitative susceptibility imaging is determined by the noise level in image phase. For detecting iron presence, this quantitative susceptibility imaging is as sensitive as the T2* magnitude imaging technique, which is the most sensitive method among T1, T2 and T2* relaxivity methods because T2* relaxivity is much higher than T1 and T2 relaxivity.

MRI phase measurement has long been very reliable on modern superconducting magnets with very high field stability. Typically magnet manufactures specify B0 shifts <0.1 ppm/h. Field instability measurements (in frequency) on various scanners were <1 Hz/min. For field mapping using a multi-echo gradient echo sequence (10/50 ms ΔTE/TR) in this research, phase error is ~8.3×10$^{-6}$ rad, much less the phase noise (~1/SNR~0.01). MRI phase data have largely been discarded in current clinical practice, but they may contain very valuable information about diseases. Extracting this information can improve patient diagnosis without adding scan time, which warrants future investigational efforts to be dedicated to MRI phase data. For high resolution imaging of contrast agents, the T2* effects may only represent indirectly the magnetic field variance, while the phase of MR signal from a voxel represents the average magnetic field. Phase divided by echo time and the gyromagnetic constant uniquely determines the magnetic field of susceptibility source without the need for any calibration. This simple relationship between phase and field represents an important and powerful quantification advantage over the complicated dependence signal magnitude on relaxation times. The phase mask used in SWI is an important initial effort to enhance the visibility of contrast agents on T2* weighted images, but the empirical mask also adds to the difficulties of quantification. Recently, phase information has been used to generate high contrast-to-noise ratio high resolution images at high field strength; positive phase is used to identify the presence of calcification. The use of phase information in field inversion as proposed in this research, will lead to accurate susceptibility quantification.

In one embodiment of the invention, an apparatus and method quantifies magnetic biomarkers or contrast agents by mapping their magnetization using both magnitude and phase information in T2* imaging. In MRI, magnetization is the magnetic susceptibility times B0 (the terms magnetization and susceptibility are used interchangeably). Magnetic susceptibility is a fundamental property of a material, characterizing its response to an applied magnetic field. The volume susceptibility mapped in MRI in this research is the concentration times a constant specific to a contrast agent (molar susceptibility/molar mass).

A method for susceptibility imaging is provided, utilizing a generally applicable regularization approach that makes full use of all information in the T2* gradient echo image data. The phase image, commonly discarded in MRI, is used to generate the local field map. The magnitude image is used to guide the inverse algorithm. Experiments are described herein to show accurate mapping of the concentrations of gadolinium and iron contrast agents, indicating that this field source inverse approach is an effective quantification method.

Specifically, in the first embodiment, the approach to the ill-posed inverse problem is regularization using a priori knowledge of the solution. The distribution of magnetic markers such as contrast agents and iron deposits or its spatial gradient may be sparse. A reasonable solution for generating acceptable susceptibility images is obtained by promoting sparsity among possible solutions using for example the L1 norm minimization and iterative convex optimization solvers. However, the convex optimization search for solution may be time consuming. To reduce the search time to a few minutes, we introduce wavelets and differentiability and use dedicated graphics cards.

In the second embodiment, the magnitude image information is employed to constrain the susceptibility image reconstruction, improving reconstruction accuracy and convergence speed, as demonstrated in PET, EEG/MEG and MRI. For example, a simple assumption that the susceptibility is constant over a small local region of uniform signal intensity vastly reduces the number of unknowns, rendering the original inverse problem to an over-determined problem for susceptibility in each region. This approach determines contrast concentration in contrast enhanced MRI and tissue susceptibilities in other applications. We include edge similarity into the regularization. The reconstruction of susceptibility images becomes minimization of a cost function consisting of a data term enforcing consistency with the phase image and a prior term derived from the magnitude image. This kind of minimization formulation provides a powerful way to combine MRI phase and magnitude information for quantitative susceptibility imaging.

In the third embodiment, zero cone surfaces, which are the origin of the ill-posedness, are fixed with respect to the B0 field. By rotating the object relative to the B0 field, the zero cone surfaces can be rotated to a different angle, and the magnetization undeterminable at the old cone surface becomes determinable at the new orientation. Therefore, data sampling at multiple orientations improves the conditioning of the inverse problem as in computed tomography. This method is called Calculation Of Susceptibility using Multiple Orientation Sampling (COSMOS). This approach is robust and accurate in quantitatively mapping susceptibility.

The invention provides an effective and efficient solution to the inverse problem from magnetic field to susceptibility source and leads to a robust, quantitative and accurate method for mapping contrast agents in MRI. This quantitative susceptibility imaging (QSI) approach is an important tool for molecular MRI. For example, iron oxide nanoparticles are used as MRI markers in tracking cell migration, gene expression, angiogenesis, apoptosis and cancer detection. QSI can map and measure local drug dose delivered by magnetic nanovehicles targeting diseased tissue cells. QSI can also map and measure the initial migration and homing density of stem cells labeled magnetically. These QSI measurements are very valuable for optimizing protocols for drug development and delivery and cell therapy. For example, QSI provides a non-invasive and non-radioactive estimation of biodistribution of nanoparticles in time following injection of targeted contrast agents, which is an important goal of molecular MRI.

The QSI techniques described herein have several applications, but their most important are medical applications. For example, it is difficult to have a definitive diagnosis of iron overloading diseases such as hemochromatosis and thalassemia major cardiomyopathy, and generally invasive tissue biopsy is required. QSI techniques described herein can be used for human heart and liver imaging to quantify iron deposition in tissue, providing accurate evaluation of iron overloading diseases. Local iron overloads are also found in neurodegenerative diseases including Parkinson and Alzheimer diseases. Absolute iron mass mapping may allow a definitive assessment of neurodegeneration. QSI is also a useful tool for early evaluation of patients at risk for neurodegenerative diseases and for helping to develop an effective therapy to preserve the patient's neuronal function. Another example of a QSI application is diagnosing bone disease. MRI has been used to assess bone density to avoid the invasive biopsy procedures and exposure to radiation and to assess structure and function of trabecular bone. Bone susceptibility imaging provides an insightful measure of bone mineralization and density.

Another objective of the invention is to optimize the data acquisition sequence. Still another objective is to develop a robust reconstruction method for brain iron mapping. Yet another objective is to validate brain iron mapping using histological correlation. Another objective of the invention is to apply brain iron mapping to the imaging of cerebral microbleeds for assessing the risk of intracerebral hemorrhage in patients treated with warfarin. All studies described in this application are performed on a 3T whole body scanner with an 8-channel head coil. Of course, upon reading this application, one skilled in the art will understand that other scanners are also applicable.

Another objective of invention is to develop a noninvasive MRI method for quantitatively imaging iron deposits in the brain, using a novel approach that solves the inverse problem from the local magnetic field to the magnetic susceptibility source. There is significant scientific and clinical interest in studying iron in the brain. Iron deposits are regarded as an indicative biomarker for neurodegenerative disorders such as Parkinson's and Alzheimer's diseases. Iron deposition in the brain can also result from cerebral microbleeding, which may be associated with an increased risk of the devastating intracerebral hemorrhage (ICH), especially in patients anticoagulated with medicines such as warfarin. Quantification of iron deposition in microbleeds might make it possible to identify patients at high risk for hemorrhagic complications of anticoagulation and to reduce the risk by decreasing the intensity of anticoagulation for them or not anticoagulating them at all. Therefore, quantitative iron mapping in the brain holds great clinical potential for managing diverse clinical neurologic disorders.

An imaging method is provided herein for using a MRI scanner to generate quantitative brain iron mapping for accurate assessment of cerebral microbleeds. The local magnetic fields of iron deposits measured from MRI phase images is a convolution of a dipole field kernel with the iron magnetization, which is the iron mass distribution multiplied by the susceptibility of the iron compounds. Other materials in the brain have susceptibilities 10,000 times weaker than iron compounds, making MRI very sensitive to iron presence. The inversion from field to magnetic source is unfortunately an ill-posed problem; straightforward inversion generates no meaningful mapping of magnetization, because of severe noise propagation near the zero points of the dipole kernel where magnetization is indeterminable.

The invention includes further developments of iron mapping method using histology correlation and assessments of the clinical value of brain iron mapping as applied in assessing the risk of intracerebral hemorrhage (ICH) in warfarin-treated patients.

The invention also includes the followings:

1. Developing data acquisition sequence. A fast multiple gradient echo imaging sequence is developed for effective high resolution mapping of local fields in the brain. Methods and systems for providing compensations for motion artifacts in susceptibility imaging are also developed.

2. Developing a robust inverse approach for mapping magnetic susceptibility sources in the brain. Regularization approaches are provided for imaging an object using non-ionizing signals. In particular, the T2* magnitude images is utilized for formulating a robust regularization.

3. A method for MRI brain iron mapping using histological correlation.

4. A method for Applying MRI brain iron mapping to imaging cerebral microbleeds (CMB) for quantitatively assessing the risk of ICH in warfarin-treated patients compared to a control group of warfarin-treated patients who have not had ICH.

In this application, it is assumed that the CMB iron quantity is a stronger predictor for ICH than CMB presence on the T2* images in warfarin-treated patients.

An objective of the invention is to provide a tool for accurate imaging of susceptibility distribution of an object and for the accurate quantification of images generated by non-ionizing imaging modalities and particularly images in molecular MRI.

BRIEF DESCRIPTION OF THE DRAWINGS

FIG. 3 depicts a model diagram of an imaging system such as that shown in FIG. 1;

FIG. 4 depicts a model diagram of a system for generating an image of the object using signals collected in the imaging system;

FIG. 5 depicts a system diagram for providing magnetic source magnetic resonance image of an object according to one embodiment that utilizes additional information of the object;

FIG. 6 depicts a system diagram for providing magnetic source magnetic resonance images of an object according to another embodiment that utilizes two or more sets of magnetic signals;

FIG. 7 (A) depicts a diagram of a method for providing magnetic source magnetic resonance imaging according to the system shown in FIG. 5;

FIG. 7 (B) depicts a diagram of another method for providing magnetic source magnetic resonance imaging according to the system shown in FIG. 5;

FIG. 8 depicts a diagram of a method for providing magnetic source magnetic resonance imaging according to the system shown in FIG. 6;

FIG. 10 depicts a method for collecting magnetic signals for providing magnetic source magnetic resonance imaging according to one embodiment;

FIG. 14($b$) depicts a magnetic susceptibility source;

FIG. 14($c$) depicts a simulated field map derived at SNR=20;

FIG. 14($d$) depicts an image generated by the direct inversion according to Equation B9;

FIG. 17 depicts a map of matrix condition number for three orientations, where $\theta_2$ is vertical and $\theta_2$ is horizontal;

FIGS. 18 ($a$)-($c$) show (a) a gradient echo image obtained from the bone phantom, (b) a collected field map image, and (c) the corresponding susceptibility reconstruction;

FIGS. 19 ($a$)-($c$) show a magnitude image of an animal tissue, (b) a field map image, and (c) the corresponding susceptibility reconstruction;

FIG. 20 shows the MRI estimated iron-oxide mass versus implanted iron-oxide mass calculated from the images shown in FIG. 19 ($a$)-($c$);

FIGS. 24 ($a$)-($e$) show susceptibility estimation in a rat brain including (a) the intensity (i.e., magnitude) image, (b) the field shift map, (c) the estimated susceptibility distribution using the l2 regularized inversion, (d) the estimated susceptibility distribution using the l1 regularized inversion, and (e) the approximate histological slice with iron staining;

FIG. 26 ($d$) shows the measured $\delta_b(r)$ vs. computed $\Sigma_p \chi_p d_p(r)$ according to Equation C5;

FIGS. 26 ($e$)-($h$) show the background geometric factor including (e) constant and linear terms including (f) x, (g) y and (h) z;

FIGS. 26 ($i$)-($l$) show the geometric factor for (i) the soft tissue, (j) the bone, (k) the marrow, and (l) the marrow chemical shift;

FIGS. 31 ($c$) and ($d$) show (c) the regularized SENSE image and (b) the EPIGRAM image;

FIGS. 35 ($a$) and ($b$) show the self navigation using (a) ZIP and (b) KC, where the ghosting artifacts in KC are markedly reduced in ZIP;

FIG. 36 ($a$)-($c$) shows the orbital navigator echo including (a) the navigator orbit in k-space, (b) the magnitude record for 2 rotations during scanning, where the horizontal axis is time, the vertical axis is the azimuth angle, and the rotation angle is the profile shift, and (c) the phase records for 2 displacements during scanning;

FIG. 37 ($a$) shows the 3D stack spiral trajectories with a variable density;

FIGS. 37 ($b$) and ($c$) show (b) an example MRA showing normal angiograms and (c) an example MRA showing diseased angiograms;

FIG. 48 (b) shows that the MRI results indicating a >50% greater amount of iron aggregation among T2-cells loaded with p53 when treated with 264scTCR-SPIO50, compared with negative controls & background;

FIG. 55 (a)-(c) show Bottle distribution for experiments II.1, II.2, and II.3. W indicates water and numbers correspond to contrast agent concentration in mmol/L. Experiments II.1 and II.2 with Gd-DTPA (Magnevist, Berlex) and experiment II.3 with Ferumoxides (Feridex, Berlex). The precision of the contrast agent concentration was ±1%. (d)-(f) show the corresponding reconstructed susceptibility maps using the surface calculation method;

FIG. 57 (a) shows the object scanned at the first position;

FIG. 57 (b) shows the object is rotated around the x-axis and the scan is repeated at the second orientation. The rotation-scanning process repeats until the required number of rotations is reached. Subsequent rotations are not shown in this figure;

FIG. 57 (c) shows the dipole response kernel function in the Fourier domain (fixed with respect to the object) has zeroes located on a pair of cone surfaces (the green pair for the first sampling and the blue pair for the second sampling). The presence of these zeroes makes the inversion extremely susceptible to noise and they need to be avoided when possible. Sampling from two orientations is insufficient because these two pairs of cone surfaces will still intercept, resulting in lines of common zeroes. Sampling from an appropriate third angle can eliminate all the common zeroes in the dipole kernels except the origin, which only defines a constant offset but does not change the relative susceptibility difference between tissues in the image;

FIG. 58 (a)-(d) show the numerical simulation of susceptibility inversion including (a) the true susceptibility distribution, (b) the simulated $\delta_B(\vec{r})$ with noise, (c) the reconstructed susceptibility map from one orientation with direct Fourier domain division, and (d) the reconstructed susceptibility map from three orientations.

Figure 1:
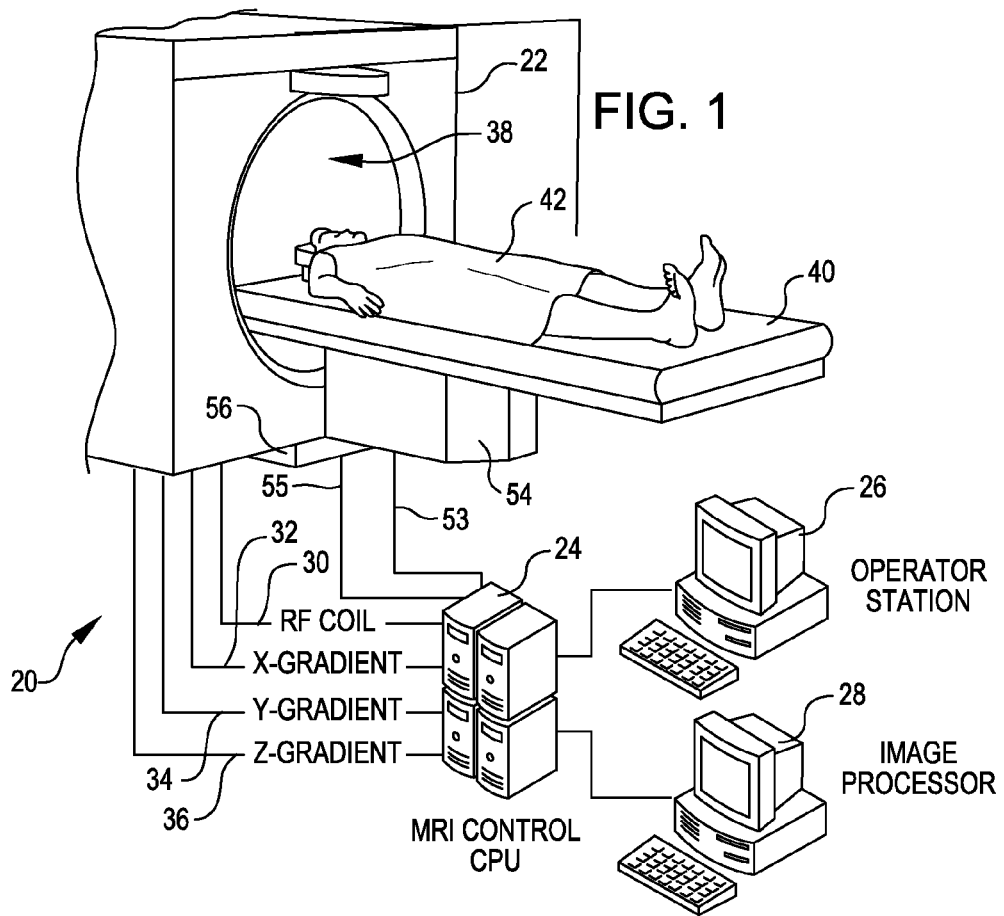
FIG. 1 depicts a magnetic resonance imaging system for providing magnetic resonance images of a patient.

regularization parameter for l2 and l1 regularized inversions; (e) shows the true image, field map, and reconstructed images for a number of regularization parameters. The best regularization parameter (chosen to match the residual to the noise variance) is indicated with a block box. The numbers next to arrows in (a)-(d) indicate the regularization parameter at each point along the curve.

FIG. 61 shows (a) curves showing the integral of susceptibility vs. dot size for the l1 and l2 regularized inversion techniques, (b) field shift map, (c) and (d) the maximum intensity projection image generated using the l2 and l1 regularization techniques. The maximum intensity projection is used for visualization because the printed dots do not fall exactly on a plane. The magnetic field was oriented in the horizontally displayed direction.

FIG. 62 shows results for the Gd doped tube phantom with 3 echoes: (a) plots of estimated susceptibility vs. true susceptibility; (b) first echo, illustrating phantom configuration; (c) field inhomogeneity map; (d) l2 regularization inversion result ($\lambda=10^{-28}$); (e) l1 regularized inversion result ($\lambda=10^{-22}$). The magnetic field was oriented in the vertically displayed direction.

FIG. 63 shows a sudocode for an l1 regularized solver according to one embodiment.

FIG. 64 shows geometrical model of the curved tube and shape factor estimation used for validation, wherein (a) shows the invensity image of the curbed bude, whose straight segments are aligned with B0; (b) shows 3D triangular surface mesh used for shape factor calculation following 2D contouring; (c) shows calculated shape factor in the tube (unitless) that compares well with the measured field map (d, in ppm). Starting from positive shifts in the straight portion of the tube, a spatially varying shift is observed. The field decreases in the curvature down to negative values in the middle of the curvature.

FIG. 65 shows the results of the in vitro experiments. (a) shows temporal evolution of the susceptibility measured [Gd] for the 3 cc/s injection rate experiment and associated signal enhancement E. After a rapid exponential increase due to dispersion in the tube, a plateau was reached for [Gd]. When the Gd injection was flushed with water, an exponential [Gd] decay occurred. (b) shows measure signal enchancement E plateau value as a function of injected [Gd] for the different experiments. Calculated theoretical steady-state signal intensity curves (SS) are plotted for the prescribed an gle (30o) with (SS signal) and without (SS signal, no T2) transverse relaxation, as well as the linear model assumed for low doses (SS signal, linear). (c) shows summary of the concentration obtained at the plateau for several injection rates with susceptibility and signal enchancement analysis using the linear and nonlinear models. Error bars represent the 95% confidence interval on susceptibility measurement.

FIG. 66 shows the field map evolution of the in vivo experiment. The primary field B0 is oriented in the superior-inferior direction. (a)-(f) show the MR amplitude images obtained from a 50 year old female patient and (g)-(l) show the corresponding field maps. The number indicates time from indjection in seconds. Starting from pre-contrast conditions in (a) and (g), where field maps are used as reference, a signal drop (T2* effect) is observed in (b) and (c) due to highly concentrated CA flowing through the superior vena cava, associated with a large induced magnetic field with a typical dipolar pattern in (h) and (i) highlighted by the arrows. A field variation is then observed in the liver resulting from flowing CA in the above right heart in (i) highlighted by arrows. Ventricle blood is enhanced in (j). As the left ventricle and the aorta begin enhancing (d), the field map gets more homogeneous (j) showing that CA through the lungs has limited effects. While signal amplitude remains qualitatively the same in (d) and (e), a smooth spatial variation in field is observed in the aorta that increases in amplitude in (k) before decreasing again in (l) as CA flows out of the volume.

FIG. 67 shows representative AIFs during the first passes together with associated signal enchancement E. The AIF obtained with the QSI technique together with the dispersion model and the AIF obtained assuming the infinite cylinder model closely follow the same trend. Each concentration measurement is plotted with its 95% confidence interval. After bolus injection, a small increase is obtained (5 to 10 s) for which the shape factor does not correctly model the field shift as indicated by the increase in the confidence interval. After the bolus reaches the aorta (~12 s), the shifts were well represented by the single shape model, allowing a good depiction of the first and second passes on the QSI-derived concentration curves. Signal enhancement is shown to saturate with [Gd] (measured with QSI). Neglecting time-of-flight effects, the signal enhancement should be 6 times greater in the steady-state signal model in this case. This indicates that signal enhancement cannot be used to estimate concentration absolutely and accurately here, contrarily to phase-based methods that exhibited a much sharper description of the first pass.

Figure 68A:
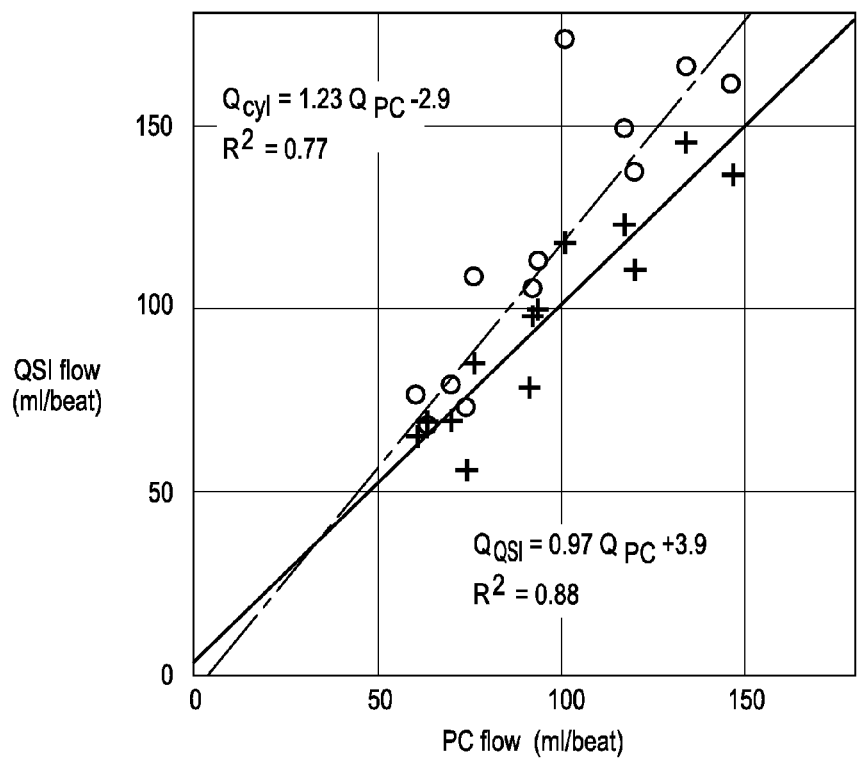
Figure 68B:
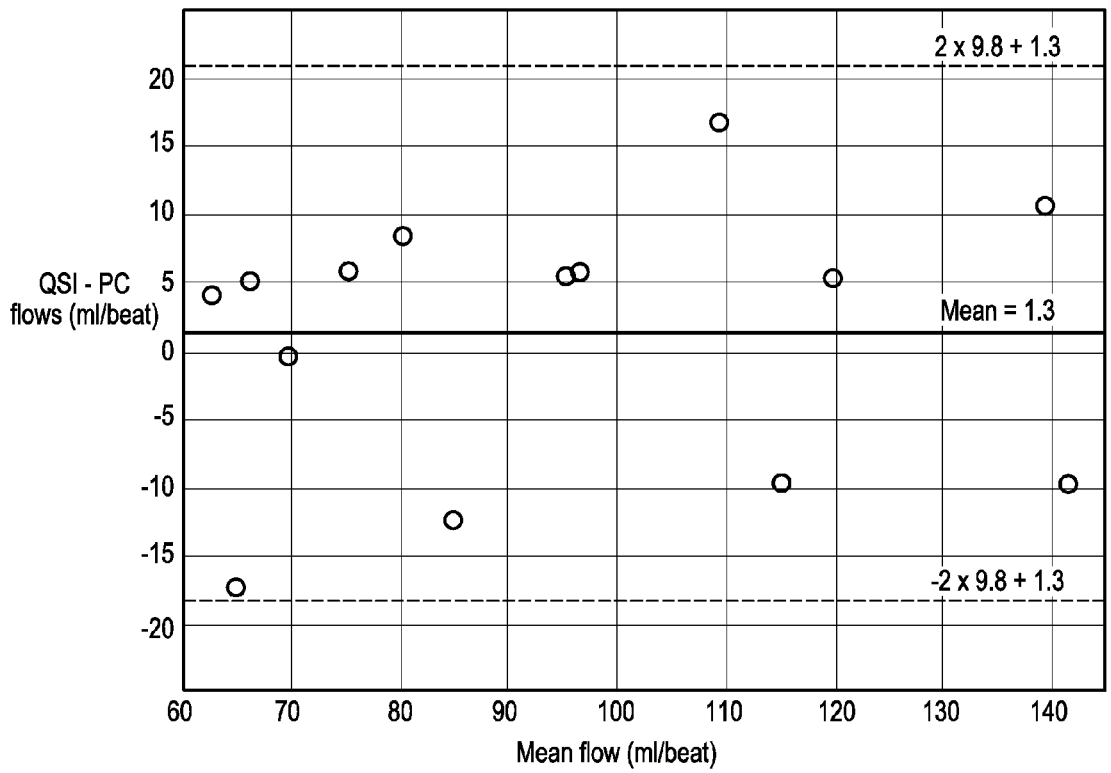

FIG. 68 shows the QSI flow measurement: (a) shows the linear regression between the QSI ($Q_{QSI}$) and PC ($Q_{PC}$) flow measurements (crosses) and between the infinite cylinder model (circles) and $Q_{PC}$. The QSI and PC flows exhibited good correlation with a linear regression coefficient close to unity, whereas the cylinder model had a slightly smaller correlation coefficient and overestimated flow by 23%; (b) shows the Bland-Alman plot comparing the PC and QSI. The agreement was 1.3±9.8 ml/beat.

Figure 69:
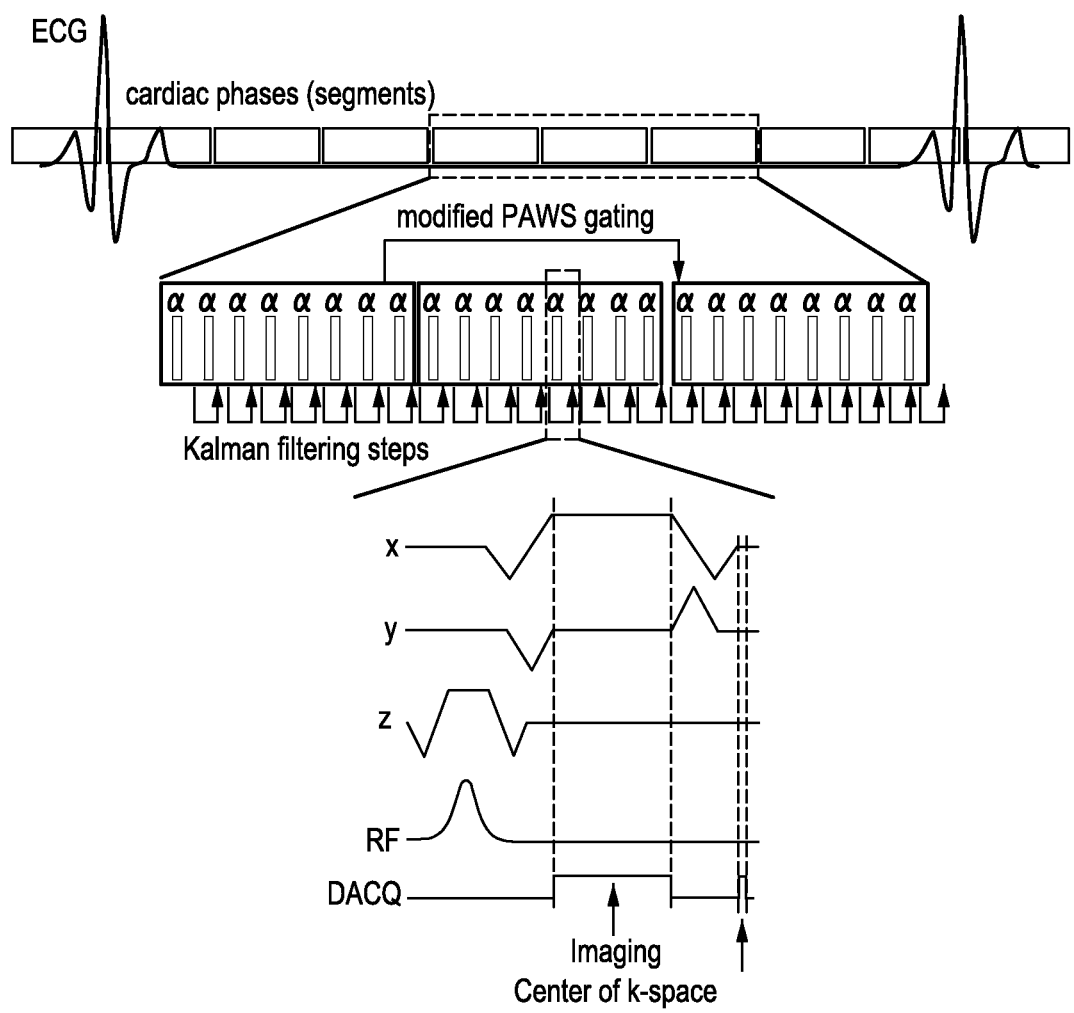

FIG. 69 shows the Pulse sequence diagram for the prospective self-gated CINE SSFP sequence, where each segment (corresponding to one cardiac phase) is gated separately using a modified PAWS gating algorithm that uses the last center-of-k-space signal of each segment and the Kalman filtering is performed continuously for every TR.

Figure 70:
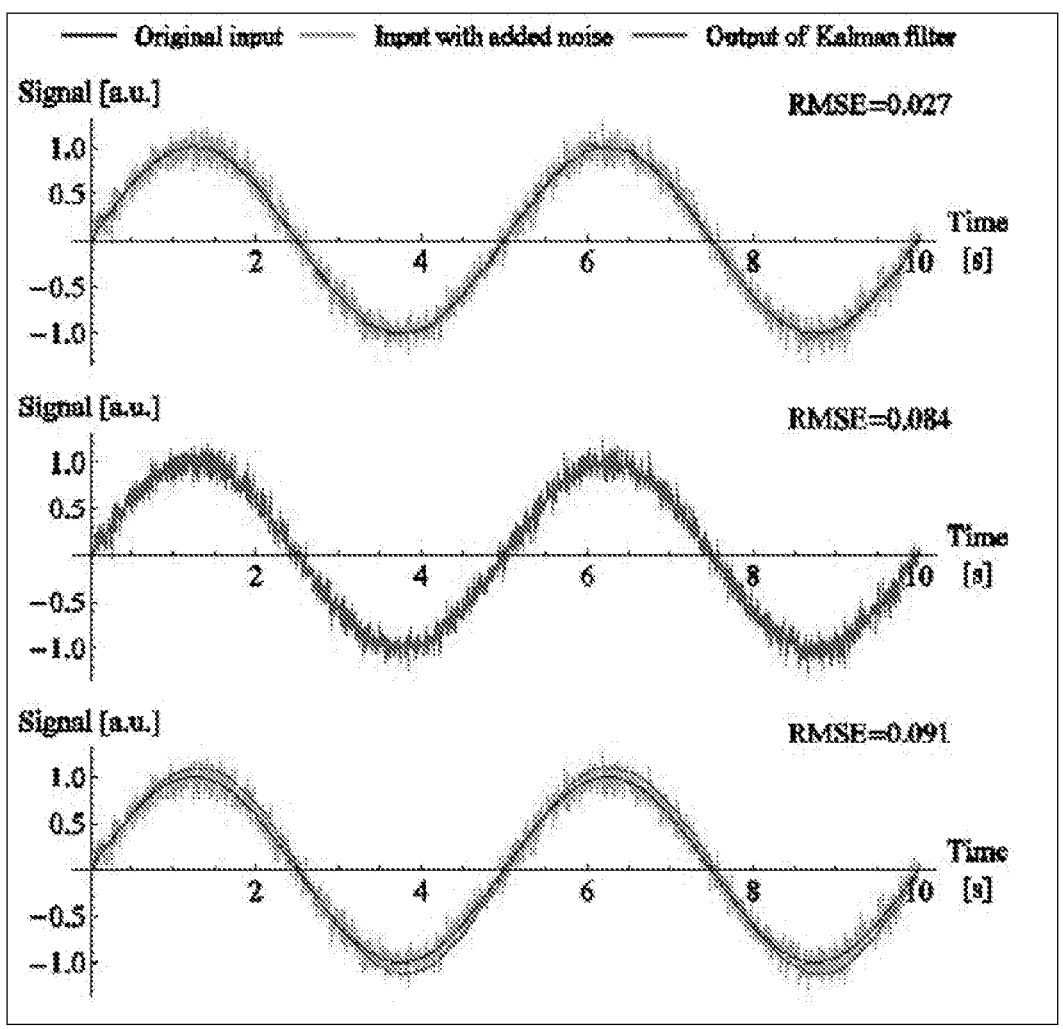

FIG. 70 shows the simulated sinusoid (sampling rate 200 Hz) with frequency 0.2 Hz and added Gaussian noise ($\sigma=0.1$). The measurement noise covariance matrix R is initially taken to be half the variance of all differences between subsequent samples (see text). Q is taken to be a diagonal matrix with identical elements ($Q_{11}=Q_{22}$). (a) shows the signal using the constant velocity model with optimal Q, i.e. minimal RMSE. (b) shows the signal when the model noise covariance Q is too large, too much trust is put in the measurement. (c) shows the signal when the model noise covariance Q is too small, too much smoothing comes at the cost of a large deviation from the original waveform.

FIG. 71 shows the simulated sinusoid (sampling rate 200 Hz) with frequency 0.2 Hz and added Gaussian noise ($\sigma=0.1$). (a) shows the RMSE of the Kalman filter output with respect to the original sinusoid as a function of the ratio Q/R. Points a, b, and c correspond to the respective subplots in FIG. 70. (b) shows the plot of the optimal value of $Q_{11}$ (defined by the minimum in a) as a function of R. (c) shows the RMSE with respect to the original sinusoid of the input waveform and its Kalman filter output as a function of SNR-defined here as $1/\sigma$.

Figure 72:
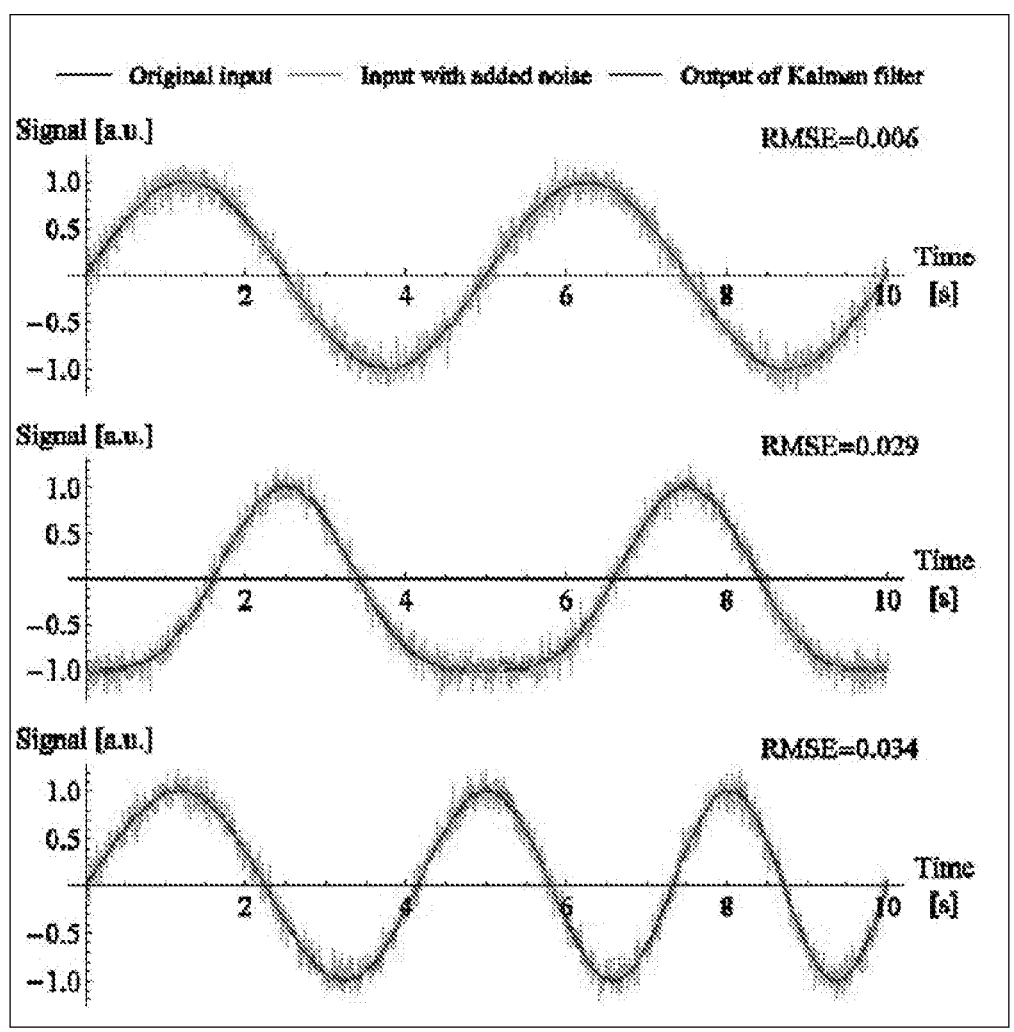

FIG. 72 shows the performance of the periodic motion model (model frequency kept fixed at 0.2 Hz), where (a) shows the sinusoid with frequency 0.2 Hz, where because the model corresponds exactly to the waveform, a low error is achieved; (b) shows the flattened sinusoid (see text), where the optimal Q was higher; and (c) shows the chirp sinusoid with instantaneous frequency changing linearly from 0.2 Hz to 0.3 Hz.

Figure 73:
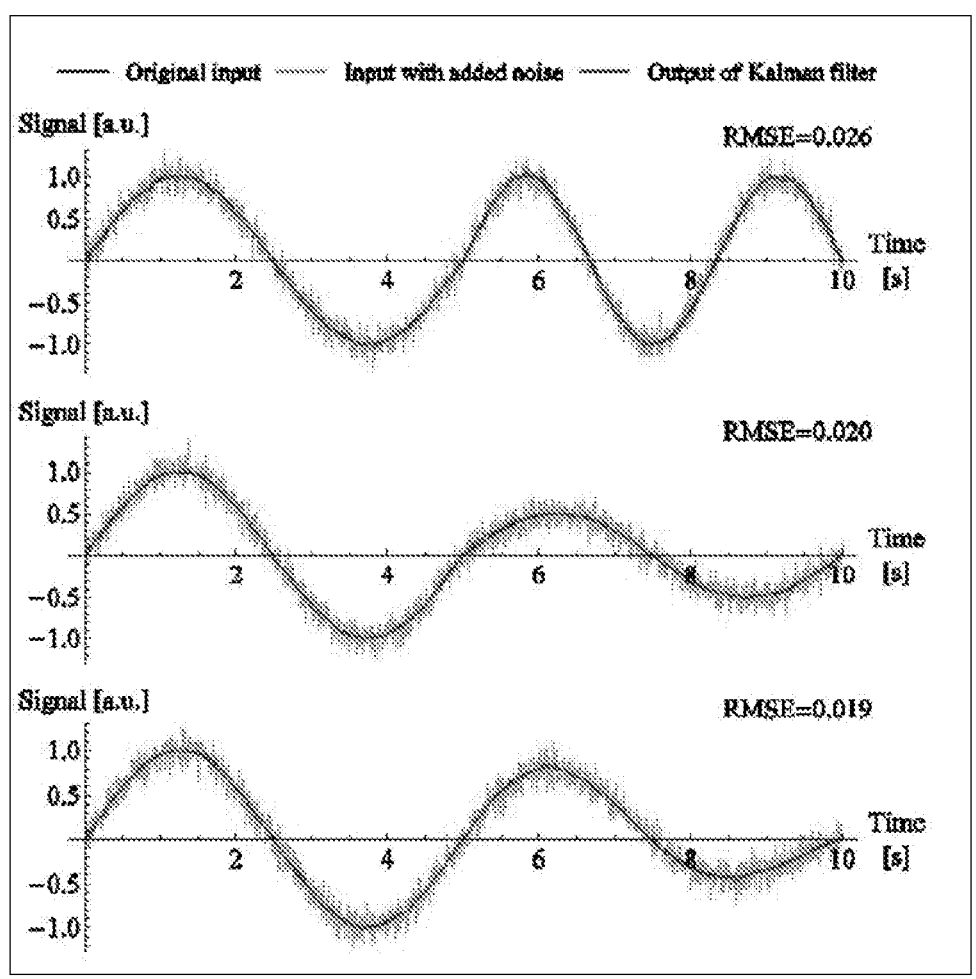

FIG. 73 shows the performance of the periodic motion model (model frequency kept fixed at 0.2 Hz) when the model no longer accurately describe the motion, where (a) shows there is a sudden jump in frequency (from 0.2 Hz to 0.3 Hz); (b) shows that there is a sudden jump in amplitude (from 1.0 to 0.5 [a.u.]) at t=5 s; and (c) shows that there is a linear decrease in amplitude (from 1.0 to 0.2 [a.u.]) starting at t=5 s. In all cases, the Kalman filter output has a low RMSE with respect to the original motion waveform.

Figure 74:
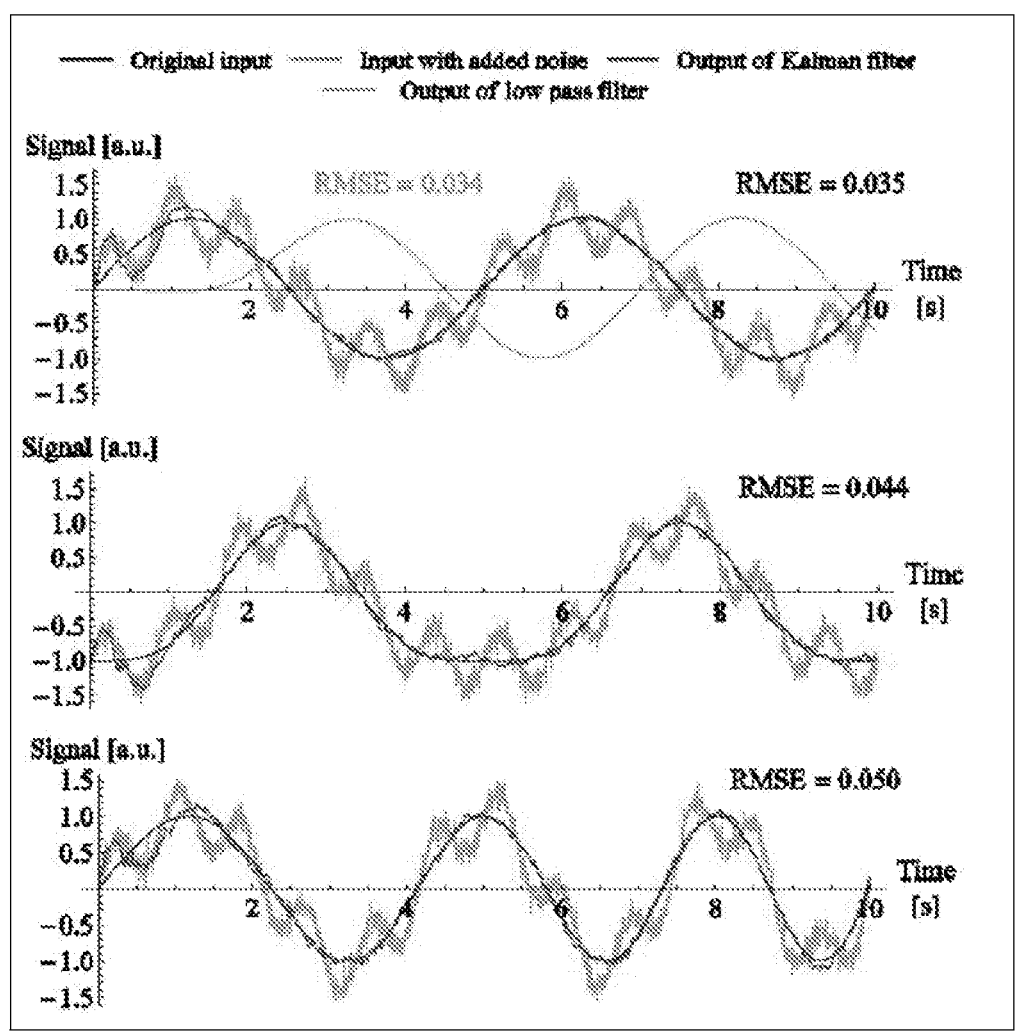

FIG. 74 shows the performance of the double periodic motion Kalman filter-DPM (1.2 Hz, 0.2 Hz) on a simulated waveform (sampling rate 200 Hz) consisting of a high frequency sinusoid (amplitude 0.2-frequency 1.2 Hz) superimposed on a low frequency component: (a) shows the sinusoid (frequency 0.2 Hz), where the low pass filter output (orange) needs 400 samples (or 2 s) to recover this component with a similar RMSE as the Kalman filter; (b) shows the flattened sinusoid waveform; and (c) shows the chirp sinusoid with instantaneous frequency changing linearly from 0.2 Hz to 0.3 Hz.

Figure 75:
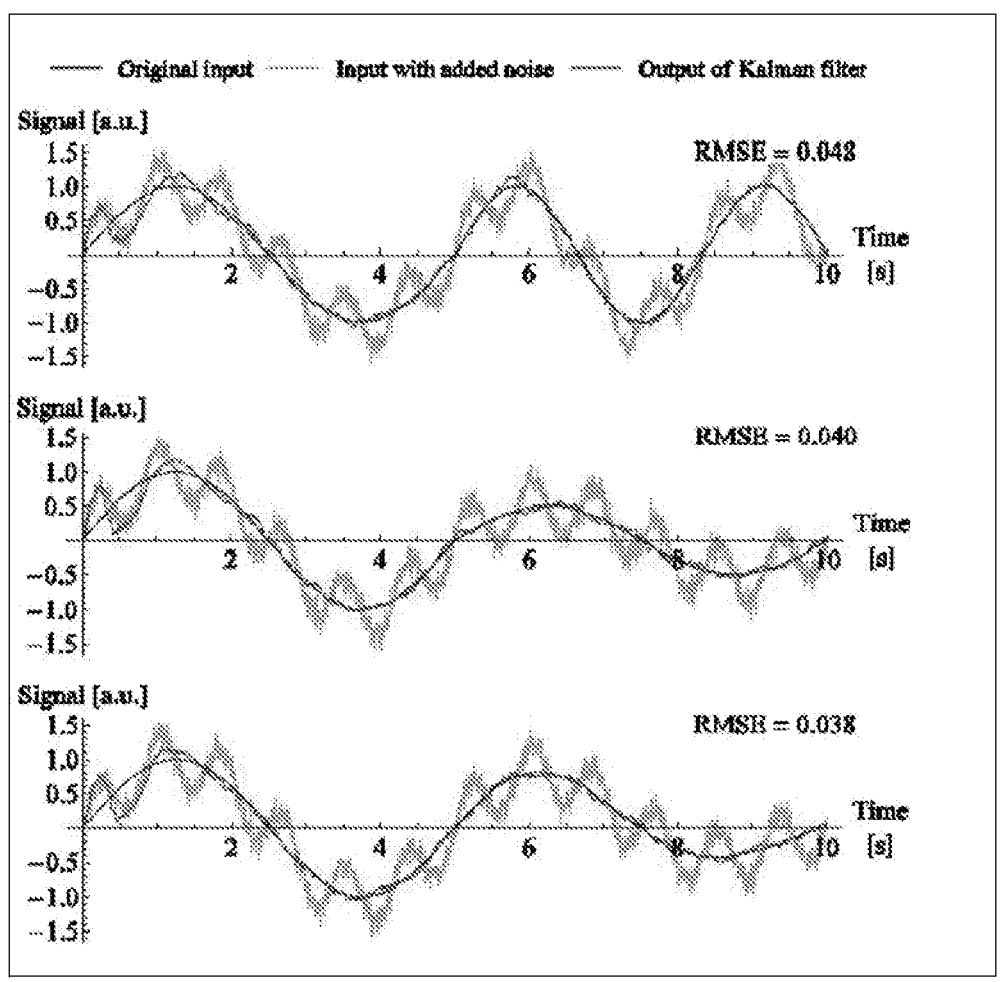

FIG. 75 shows the performance of the double periodic motion Kalman filter-DPM (1.2 Hz, 0.2 Hz) on a high frequency component (1.2 Hz) superimposed on modified sinusoid waveforms: (a) shows the signal when there is a sudden change in frequency (from 0.2 Hz to 0.3 Hz at t=5 s); (b) shows the signal where there is a sudden jump in amplitude (from 1.0 to 0.5 at t=5 s); and (c) shows the signal where there is a gradual linear decrease in amplitude (from 1.0 to 0.2 starting at t=5 s).

Figure 76A:
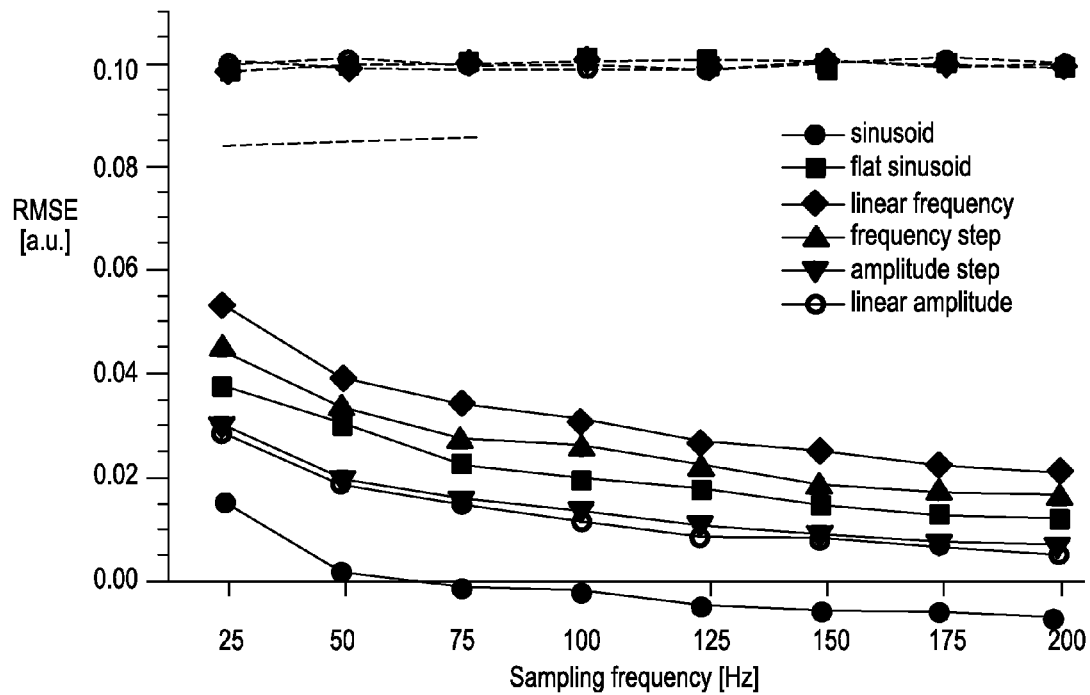
Figure 76B:
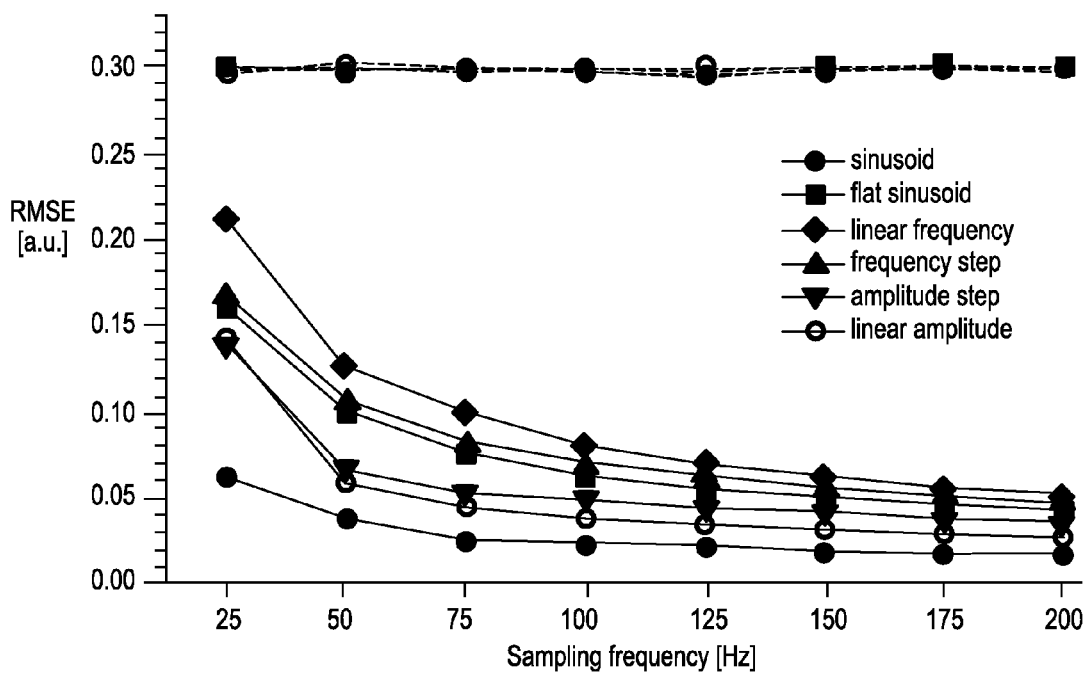

FIG. 76 shows the performance of (a) the single and (b) the double periodic motion model Kalman filter as a function of sampling frequency of the input signal for all motion waveform types (see text). The RMSE is shown before (points connected with the dotted line) and after Kalman filtering (solid line).

Figure 77:
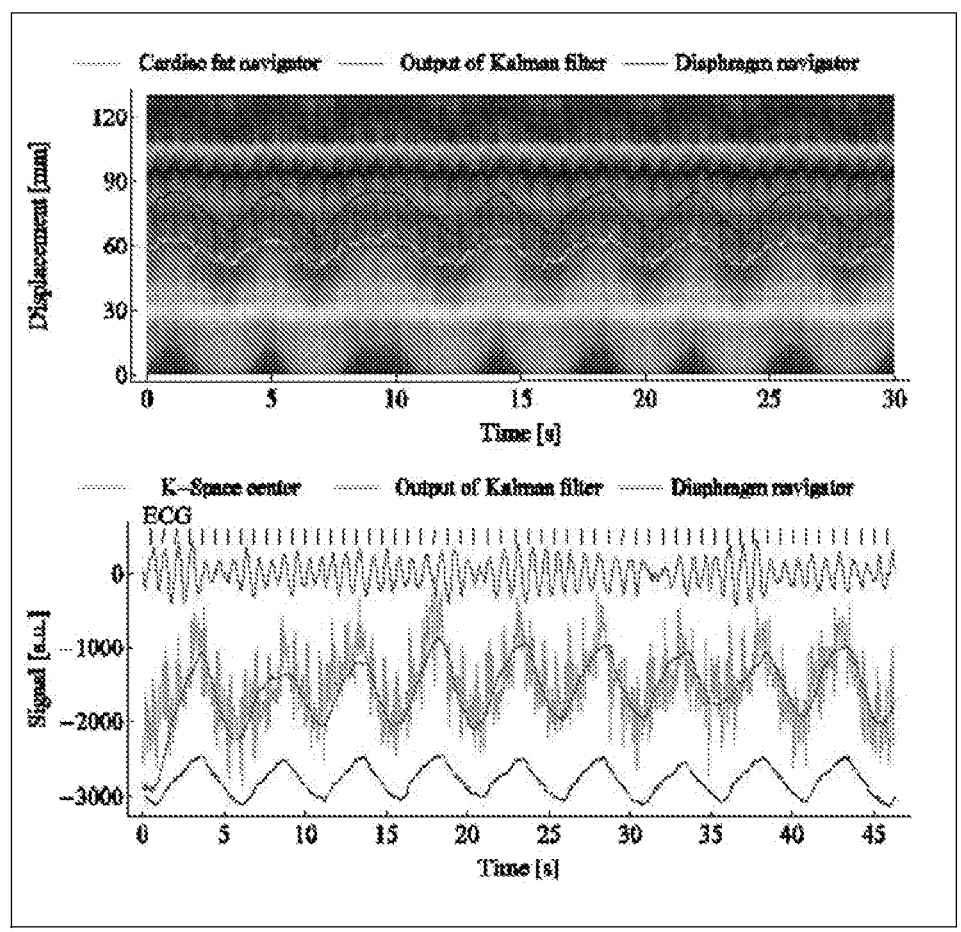

FIG. 77 (a) shows the constant velocity model Kalman filtering of cardiac fat navigator data. Also displayed are navigator echo displacements that were simultaneously acquired with the fat navigator echoes. Correlation $r^2$ between the diaphragm and filtered cardiac fat navigator displacement waveform was 0.96.

FIG. 77 (b) shows the double periodic motion Kalman filter of center of k-space data (real part, green). The filtered data, both the respiratory component (bottom) and the cardiac component (top, fluctuating around zero), are in red. The ECG trigger time points, plotted on top, correlate well with the cardiac component. The diaphragm displacement waveform (derived from interleaved navigator echoes) is displayed as well for comparison (correlation $r^2$=0.92). Both the center-of-k-space and the navigator data have different arbitrary units.

Figure 78:
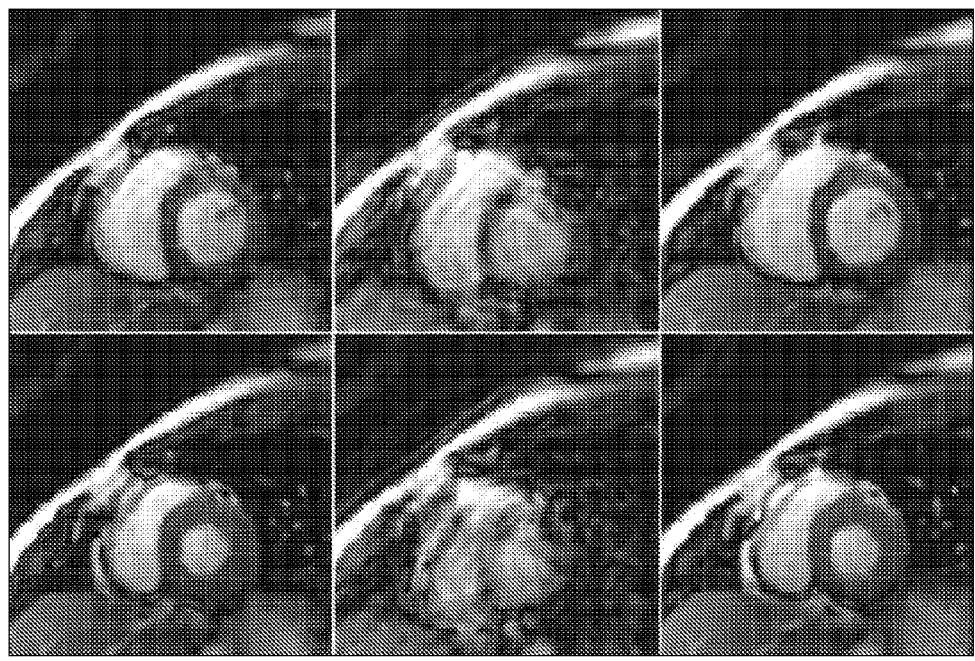

FIG. 78 shows the comparison of the self-gated cine short axis acquisition (left column), free breathing acquisition without respiratory gating (middle column), and breath hold (right column).

DETAILED DESCRIPTION OF THE INVENTION

Table of Contents

I. GENERAL DESCRIPTION OF APPARATUS, SOFTWARE AND METHODS . . . 35
II. SUSCEPTIBILITY IMAGING . . . 43
   A. Mapping arbitrary susceptibility distribution . . . 43
   B. Susceptibility imaging due to the ill-posed inverse problem-The forward problem from magnetization to MRI measured field . . . 43
   C. Solving the inverse problem from magnetic field measured in MRI to magnetization source . . . 45
     1. Susceptibility imaging using sparse regularization . . . 45
       (a) Implementations of solvers for constrained minimization . . . 46
       (b) Regularization parameters . . . 46
       (c) Rat brain studies . . . 47
       (d) Human brain microbleeding imaging using regularization . . . 47
     2. Susceptibility imaging using magnitude image based regularization—Piece-wise constant regularization . . . 48
       (a) In vivo bone susceptibility measurement . . . 49
       (b) In vivo flow measurements using dilution of [Gd] estimated from contrast enhanced MRA by quantitative susceptibility imaging . . . 49
       (c) Mapping susceptibility of brain bleeds and microbleeds using image based regularization . . . 49
     3. Calculation of Susceptibility using Multiple Orientation Sampling (COSMOS) . . . 50
       (a) Imaging a phantom gadolinium vials using COSMOS . . . 51
       (b) In vitro bone susceptibility imaging . . . 51
       (c) In vitro iron quantification in animal tissue . . . 51
       (d) SPIO imaging in mouse . . . 52
       (e) Human brain susceptibility mapping using small-angle COSMOS . . . 52
III. BAYESIAN RECONSTRUCTION AND MOTION COMPENSATION . . . 52
   A. Parallel imaging reconstruction with Bayesian statistical approach . . . 52
   B. Maximum likelihood (ML) SENSE . . . 53
   C. Noise reduced Bayesian parallel imaging using edge-preserving priors and graph cuts for MRI (EPIGRAM) . . . 53
   D. Motion compensation . . . 54
     1. Automatic motion correction using convex projection . . . 54
     2. Real-time motion detection using the Kalman filter . . . 55
     3. Improved self navigation using z intensity-weighted position (ZIP) . . . 55
     4. SMV algorithm . . . 56
     5. ECG ordered k-space sampling . . . 56
IV. EXPERIMENTS USING TARGETED CONTRAST AGENTS . . . 57
V. Developing the Data Acquisition Method for Whole Mouse IMAGING . . . 58
   A. Optimizing echo spacing in multiple echo sequence for field mapping . . . 58
   B. Removal of residual edge fields of the mouse . . . 58
   C. Field map estimation by maximum-likelihood and optimal sampling time points 59
   D. Cardiac and respiratory motion monitoring . . . 59
     1. Single volume method . . . 60
     2. Two volume method . . . 61
     3. Experiments . . . 62
       (a) Accelerate data acquisition using parallel imaging . . . 62
       (b) Parallel imaging . . . 62
     4. Experiments . . . 62

VI. A ROBUST REGULARIZATION SOLUTION FOR ACCURATE ESTIMATION OF BIOMARKER MAGNETIZATION . . . 63
   A. Improve the sparsity calculation for a priori knowledge regularization . . . 63
      1. Wavelet regularization . . . 63
      2. Efficient $L_{1,1}$ norm . . . 64
      3. $L_0$ norm . . . 64
      4. Improving computation speed with parallelization or graphics cards . . . 65
      5. Experiment . . . 66
   B. Anatomical prior based reconstruction of susceptibility images . . . 66
      1. Anatomical region segmentation and edge regularization . . . 66
      2. Experiment . . . 67
   C. Separate chemical shift effects from susceptibility effects in signal phase map . . . 67
      1. IDEAL-type joint determination of chemical shift and field map . . . 68
      2. Joint determination of fat mask and susceptibility imaging by iteratively imposing consistency . . . 69
      3. Experiments . . . 70
      4. Single dipole fitting for quantifying susceptibility material localized in a very small region . . . 70
      5. Single dipole fitting . . . 71
      6. Experiment . . . 71
VII. VALIDATING THE METHOD FOR QUANTIFYING BIODISTRIBUTION OF TARGETED CONTRAST AGENTS . . . 72
   A. Cell Lines . . . 72
   B. SPIO nanopaticles conjugated with Herceptin . . . 73
   C. Multimodal imaging probes . . . 73
   D. Experiment 1 . . . 74
   E. Experiment 2 . . . 74
   F. Experiment 3 . . . 75
VIII. QUANTITATIVE BRAIN IRON MAPPING . . . 76
   A. Solving the inverse problem from magnetic field measured in MRI to magnetization source . . . 79
      1. Stability of Inversion using cosmos . . . 79
   B. MRI Experiments validating COSMOS . . . 80
      1. Gadolinium susceptibility quantification . . . 80
      2. Material susceptibility measurements . . . 81
      3. Orbital navigator echo . . . 81
      4. Spiral imaging experiences . . . 81
      5. General data analysis methods and sample sizes: . . . 82
      6. Optimizing the data acquisition sequence . . . 82
         (a) Optimizing echo spacing in multiple echo sequence for field mapping . . . 82
         (b) Removal of residual edge fields of the brain . . . 83
         (c) Field map estimation by maximum-likelihood and optimal sampling time points . . . 83
         (d) Experiments . . . 84
         (e) Develop an effective motion compensation-Flow-compensation and ECG gating . . . 84
         (f) Orbital navigator for real-time motion correction . . . 85
         (g) Autocorrection . . . 85
         (h) Experiments . . . 86
         (i) Accelerate data acquisition using parallel imaging and spiral trajectories . . . 86
         (i) Parallel imaging . . . 86
         (ii) Spiral trajectories . . . 87
         (j) Experiments . . . 87
   C. Developing robust reconstruction for brain iron mapping . . . 88
      1. Improve the sparsity calculation for a priori knowledge regularization . . . 88
         (a) Efficient $L_{1,1}$ norm . . . 88
         (b) $L_0$ norm . . . 89
      2. Improving computation speed with parallelization or graphics cards . . . 90
      3. Experiment . . . 90
   D. Anatomical prior based reconstruction of susceptibility images . . . 90
      1. Anatomical region segmentation and edge regularization . . . 90
      2. Experiment . . . 91
         (a) In vivo experiment to identify an optimized inverse solution-Human studies . . . 92
         (b) Black dots quantification-imaging isolated dipoles . . . 92
         (c) Single dipole fitting . . . 92
         (d) Experiment . . . 93
   E. The Developed Brain Iron Mapping Using Histological Correlation . . . 93
      1. Materials . . . 93
      2. MRI study . . . 93
      3. Histological study . . . 94
      4. Data analysis . . . 95
   F. Applying The Developed Brain Iron Mapping In Imaging Cerebral Microbleeds . . . 95
      1. Inclusion/exclusion criteria . . . 96
      2. Clinical characterizations . . . 96
      3. MRI data acquisition and image interpretation . . . 97
      4. Statistical analysis . . . 97
      5. Sample size justification . . . 98
      6. Data management . . . 98
IX. DETAILS OF GENERAL REGULARIZATION . . . 99
   A. Linear Regularization . . . 99
      1. Susceptibility and Magnetic Field . . . 99
      2. Problem Formulation . . . 100
      3. Linear Regularized approach . . . 101
      4. Inversion Implementation And Parameter Selection . . . 102
   B. Nonlinear Regularization Approach . . . 103
      1. Magnetic Susceptibility . . . 105
      2. Regularization . . . 106
      3. Tikhonov Regularization . . . 106
      4. l1 Regularization . . . 107
      5. Determination of Regularization Parameters . . . 107
      6. Field Map Computation . . . 108
         (a) Frequency Fitting & Weight Determination . . . 108
         (b) Background Field Removal . . . 109
      7. Solver Implementations . . . 109
      8. Experiments & Results . . . 110
         (a) A. Numerical Phantom . . . 110
         (b) Phantom Images . . . 111
         (c) Rat Brain Studies . . . 112
      9. Discussion . . . 113
      10. Conclusion . . . 115
      11. Appendix . . . 115
X. IMAGE BASED REGULARIZATION . . . 121
XI. COSMOS . . . 123
XII. EXPERIMENT #1-BAYESIAN REGULARIZATION . . . 127
   A. Phantom Experiments . . . 127
   B. In Vivo Brain Hemorrhage Experiment . . . 128
   C. Weights Calculation . . . 128
   D. Results . . . 129
      1. In Vitro Results . . . 129
      2. In Vivo Susceptibility Maps . . . 131

XIII. EXPERIMENT #2-MAGNITUDE REGULARIZATION . . . 131
   A. Methods . . . 131
      1. Data Acquisition . . . 131
   B. Data Reconstruction And Field Mapping . . . 132
   C. Data Segmentation . . . 133
   D. Results . . . 134
XIV. EXPERIMENT #3-COSMOS . . . 136
   A. EXAMPLES . . . 137
      1. Phantom Preparation . . . 137
      2. Data Acquisition . . . 137
      3. Data Processing . . . 138
      4. Results . . . 139
         (a) Optimal Sampling Orientations . . . 139
         (b) Numerical Phantom . . . 139
         (c) Experimental Results . . . 140
         (i) Gadolinium Susceptibility quantification . . . 140
         (ii) In vitro Bone Imaging . . . 140
         (iii) In vitro Iron Quantification in Animal Tissue . . . 140
XV. IN VIVO QUANTIFICATION OF CONTRAST AGENT CONCENTRATION USING THE INDUCED MAGNETIC FIELD FOR TIME-RESOLVED ARTERIAL INPUT FUNCTION MEASUREMENT WITH MRI . . . 140
   A. Introduction . . . 141
   B. Theory . . . 142
      1. Magnetic field variations induced by CAs . . . 142
   C. Relaxation effects on signal intensity induced by CAs . . . 144
   D. Materials and Methods . . . 145
      1. In Vitro Experiments . . . 145
      2. In Vivo Experiments . . . 146
         (a) Field map calculation and CA concentration quantification . . . 146
         (b) Cardiac flow rate quantification . . . 148
   E. Results . . . 149
      1. In Vitro Experiments . . . 149
      2. In Vivo Experiments . . . 149
      3. Discussion . . . 151
      4. Conclusion . . . 155
      5. APPENDIX A-Magnetostatic Approximation of Maxwell Equations . . . 156
      6. APPENDIX B-Field Calculation Based On a Surface Integral . . . 157
XVI. KALMAN FILTERING . . . 161
   A. Theory . . . 163
   B. Materials and Methods . . . 167
      1. Simulation . . . 167
      2. Experiments I . . . 1168
         (a) MRI scans . . . 168
         (i) Motion extraction . . . 169
         (ii) Data filtering . . . 169
      3. Experiments II . . . 170
         (a) MRI scans . . . 170
         (b) Image analysis . . . 171
   C. Results . . . 171
      1. Simulation . . . 171
      2. Experiments . . . 173
   D. Discussion and Conclusion . . . 174
   E. APPENDIX A . . . 177
   F. APPENDIX B . . . 178

In the following description, various embodiments of the present invention will be described. For purposes of explanation, specific configurations and details are set forth in order to provide a thorough understanding of the embodiments. However, it will also be apparent to one skilled in the art that the present invention may be practiced without the specific details. Furthermore, well-known features may be omitted or simplified in order not to obscure the embodiment being described.

Referring now to the drawings, in which like reference numerals represent like parts throughout the several views, FIG. 1 shows an imaging system 20 in accordance with an embodiment. The imaging system 20 includes a scanner 22 in communication with a control CPU 24 for controlling the scanner 22, an operator station 26 for allowing human control of the control CPU 24 and scanner 22, and an image processor 28 for analyzing images of subjects scanned by the scanner 22.

The scanner 22 can be any device capable of measuring data from an object, such as a person, for later processing into images. In an embodiment the scanner 22 is a Magnetic Resonance Imaging (MRI) scanner and includes a radio frequency (RF) coil 30, an x-gradient 32, a y-gradient 34, and a z-gradient 36, all controlled by the control CPU 24. The scanner 22 operates by creating a uniform magnetic field around an object to be scanned and emitting through the RF coil 30 radio waves into the subject. The x-gradient 32, y gradient 34, and z gradient 36 are operated by the control CPU 24 so as to control the location in the subject being scanned.

Figure 2:
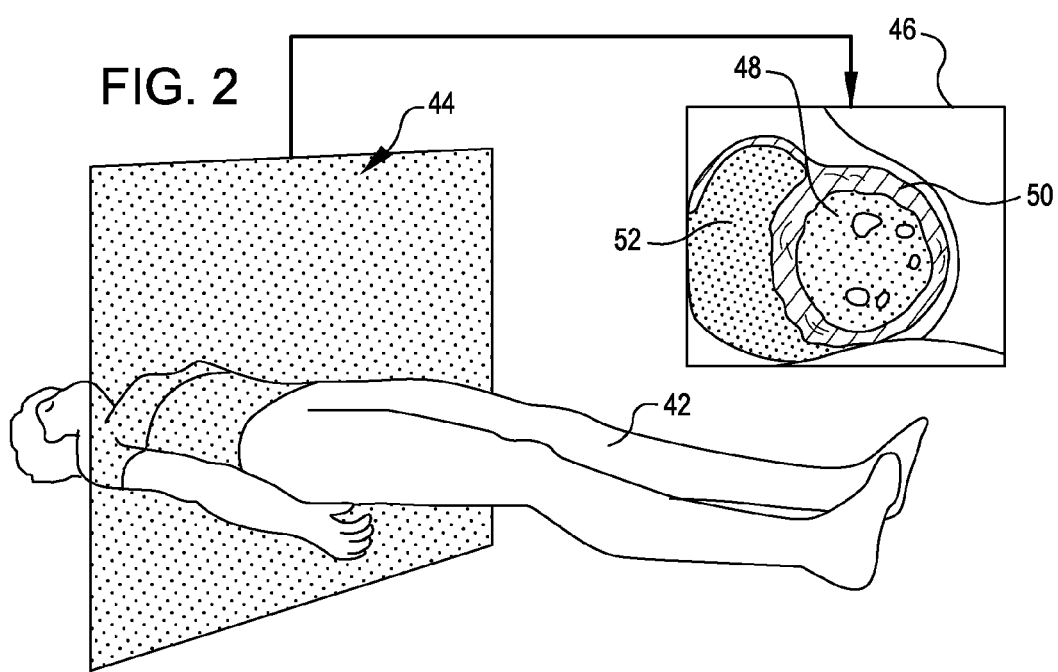
FIG. 2 depicts a magnetic resonance image taken from a patient's body at an image plane.

Generally, scanners such as the scanner 22 include a chamber 38 from which a table 40 extends. Typically, a patient 42 or other subject lies on the table 40 which is mechanically operated so as to place the patient 42 into the chamber 38 for scanning. Looking to FIG. 2, when the patient 42 is being scanned by the scanner 22, the scanner 22 scans the patient 42 about a scanning plane 44 so as to collect data for an image of the patient 42 at an intersection of the scanning plane 44 and the patient 42. For example, as shown in FIG. 2 the plane 44 is normal to the patient's 42 length, intersecting the patient 42 through the patient's chest in order to produce a picture of a cross section of the patient. Generally, the scanning plane 44 can intersect the patient 42 at any orientation, as determined by the x-gradient 32, y-gradient 34, and z-gradient 36. The resulting picture of the scanning shown in FIG. 2 is seen on a slice 46, which shows a left ventricle 48, myocardium 50, right ventricle 52, and other structures located in the patient 42. In an embodiment, the slice 46 is one of many pictures taken at the same location at different times. As noted above, such slices can be referred to as frames.

I. General Description of Apparatus, Software and Methods

Referring to FIG. 3, in order to solve the inverse problem mathematically, it is useful to model the imaging system 20 (e.g., magnetic resonance imaging or ultrasound imaging system) as a convolution operation 303 having a system matrix 301 that represents the characteristics of the scanner 22. During the data acquisition, the collected signals 304 are modeled as convolutions between the system matrix 301 and the source signals 302. In general, the collected signals 304 are complex signals including a phase component and a magnetic component. For example, in magnetic resonance imaging, the source signals 304 include a certain chemical concentration or a spatial distribution of the water molecules, and the collected signals 304 include magnetic waves emitted by the excited molecules. Alternatively, in ultrasound imaging, the source signals 304 include a spatial variation of the internal structures of the object, and the collected signals 304 include the signals reflected by the internal structures.

In general, the source signals 302 represent certain characteristics of the object under investigation, depending on the underlying physical principle of the imaging system 22. For example, in a magnetic resonance imaging system, the source signals 302 can represent the chemical and physical information about the molecules in the object, such as energy states and chemical concentrations. In ultrasound imaging, the source signals 302 can represent the density distribution of the material of the object. Alternatively, in magnetic source magnetic resonance imaging, the source signals 302 represent a magnetic susceptibility distribution of the object that measures the degree of magnetization of the material in response to an applied magnetic field.

Depending on the characteristics of the object under investigation, the collected signals 304 can have different forms. For example, in magnetic resonance imaging, the collected signals 304 include magnetic waves collected from the object by the RF coil 30. The magnetic waves can carries information about the chemical components, the physical structures, or the internal motions of the object. In ultrasound imaging, the collected signals 304 include ultrasound signals bounced back from the object. These ultrasound signals carry information about the internal density distribution of the object.

The purpose of the imaging system 20 is to recover the unknown source signals 302 from the collected signals 304. In other words, the unknown source signals 302 are reproduced as an image of the object by using the collected signals 304. Such a recovery process is usually cast into an inversion operation 403 as shown in FIG. 4. In recovering the source signals 302, the inversion operation 403 is generally formulated to inverse the data acquisition process by combining the system matrix 301 and the collected signals 304. Due to the limitations of the imaging system, the collected signals 304 often do not include information of the source signals 302 sufficient to recover all of the components of the source signals. As described above, such inversion operation is an ill-posted (e.g., ill-conditioned) mathematical problem. Consequently, the inversion operation 403 can not accurately recover the source signals 302; thereby generating estimation 404 of the source signals that not only include information of the source signals but also includes undesired signal components such as noise, errors, and artifacts.

To improve the quality of the estimation and reduce the undesired signal component, a method as depicted in FIG. 5 is provided herein to address the ill-posted inverse problem. In keeping with the illustration in FIG. 5, when generating the estimation 503 of the source signals 302, additional information 502 of the object is determined and combined with the system matrix 301 and the collected signals 304. In one embodiment, the additional information 502 includes signals collected from the object that are independent from the collected signals 304. For example, in magnetic resonance imaging, when the collected signals include phase signals collected from the object, the additional signals include magnitude signals collected independently from those phase signals, and vice versa. Alternatively, when the collected signals are collected from one relative orientation between the object and the data acquisition system, the additional signals include signals collected from another relative orientation or orientations. In another embodiment, the additional information 502 includes known attributes of the object such as knowledge about a general variation of the internal attributes. Mathematically, such known attributes may be modeled by priori information that is enforced onto the estimation 503 during the inversion operation. Greater details about these embodiments are described hereinafter.

As depicted in FIG. 7 (A), a method 700 generates an image of the object using the additional information. As described above, the image represents a quantitative estimation of a spatial characteristic of the object, such as a chemical reaction, a chemical concentration, a physical structure, a magnetic susceptibility, or a density. The method 700 first collects signals from the object (step 701). Depending on the spatial characteristic under investigation, the collected signals and the additional information can take various forms. For example, in magnetic resonance imaging, the signals are magnetic signals emitted by the object after it is excited by an external magnetic field. The signals are collected by one or more RF coils in a conventional manner. In ultrasound imaging, the signals are ultrasound waves reflected from various internal and external structures of the object being images. The ulstrasound waves are then collected by ultrasound transceivers in a conventional manner.

In step 702, additional information of the object is then determined independently from the collected signals. The additional information can take one of the forms described above.

In step 703, method 700 generates an image of the object based on the collected signals and the additional information. Specifically, to generate the image of the object, a direct inversion of the convolution operation can be performed using the system matrix, the collected signals and the additional information. The additional information is used to improve the condition of the system matrix. An inversion of the improved system matrix is then calculated. Alternatively, the inversion operation is cast into an iterative framework, where a forward convolution is calculated based on the system matrix and an initial estimation of the object. The convolution result is compared with the collected data so that a difference is generated. The initial estimation of the object is then updated based on the difference and the additional information.

Referring to FIG. 7 (B), another method for generating an image of the object is provided. According to the method, signals are collected from an object as described above (step 704). An intermediate image is generated using the collected signal. Specifically, in magnetic source magnetic resonance imaging, the intermediate image includes information of the local field shift within the object. The generation of the intermediate image is described in greater details hereinafter. In step 706, additional information of the object is determined as described above. In step 707, an image of the object is generated based on the intermediate image and the additional information. Similarly, the image of the object represents a spatial distribution of certain characteristics within the object as described above.

Referring to the embodiment of the invention that utilizes signals collected from different orientations as the additional information in generating the image of the object, FIG. 6 depicts the inversion operation 604 combining the system matrix 301 with multiple sets of signals collected from different orientations including the first signal set 601 to the Nth signal set 603. Additionally, the imaging system 20 includes a mechanism for repositioning the object from one orientation to another orientation. For example, in FIG. 1, the table 40 supporting the patient 42 is driven by a motor system 54. The motor system 54 is controlled by the control CPU 24 through the control interface 53. The patient 42 may be positioned or oriented with respect to the scanner 22 by rotating or sliding the table 40. An operator or user inputs parameters of the patient positions to the MRI control CPU 24, which in turn controls the motor system 54 to adjust the table 40 according to the parameters. Alternatively, the system includes another mechanism for changing the orientation of the imaging system itself. For example, in magnetic resonance imaging, the magnetic resonance device 22 may be repositioned with respect to the object for collecting data in different orientations. As another example, in ultrasound imaging, the ultrasound transceiver may be repositioned in different orientation with respect to the object.

A method 800 depicted in FIG. 8 generates an image of the object using at least one or more sets of collected signals according to the embodiment shown in FIG. 6. Specifically, the object (e.g., the patient 42) is first positioned in a first orientation with respect to the scanner 22 (step 801). A first set of signals is then collected in the first orientation (step 802). The object is then repositioned to another orientation by moving the table 40 through the motor system 54 according to the user-input parameters. The data acquisition is conducted in a similar fashion in the new orientation. After collecting all the signal sets including the first to the Nth set (steps 801 to 804), an image of the object is then generated using at least two sets of the signals (step 805). Alternatively, the generation of the image is carried out while the additional signal sets are being collected. For example, after the first and second sets of signals are collected, the image generation process is started while the data acquisition system 20 is collecting additional data sets.

Figure 9A:
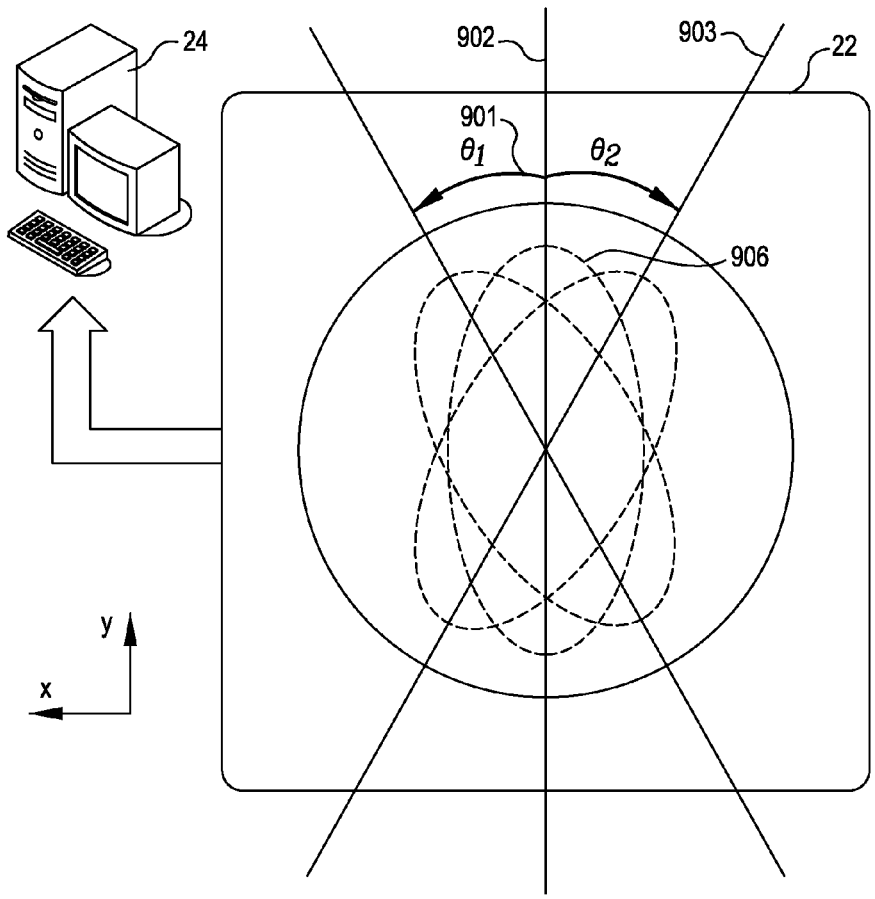
FIG. 9(A) depicts a system for providing magnetic source magnetic resonance imaging using data collected from two or more orientations according to one embodiment.

FIG. 9 shows additional views of the system for generating an estimation of the susceptibility distribution of an object using magnetic signals collected in a plurality of orientations. FIGS. 9(a) and (b) illustrate alternative embodiments for re-orienting the object to be imaged. Detail descriptions of FIG. 9 can be found in Section XII.

A method 1000 depicted in FIG. 10 collects MRI signals using an echo sequence in which a time sequence of three or more echoes is generated (step 1001), where each echo in the sequence has an associated echo time. The method 1000 then adjusts at least one of the echo times (step 1002) for optimizing a sampling time. In step 1003, a set of magnetic resonance signals is then collected according to the echo times of the echo sequence. In step 1004, if it is determined that the data acquisition is not yet completed for the object, the process returns to step 1001 for generating another echo sequence; otherwise, the data acquisition is terminated.

Figure 11:
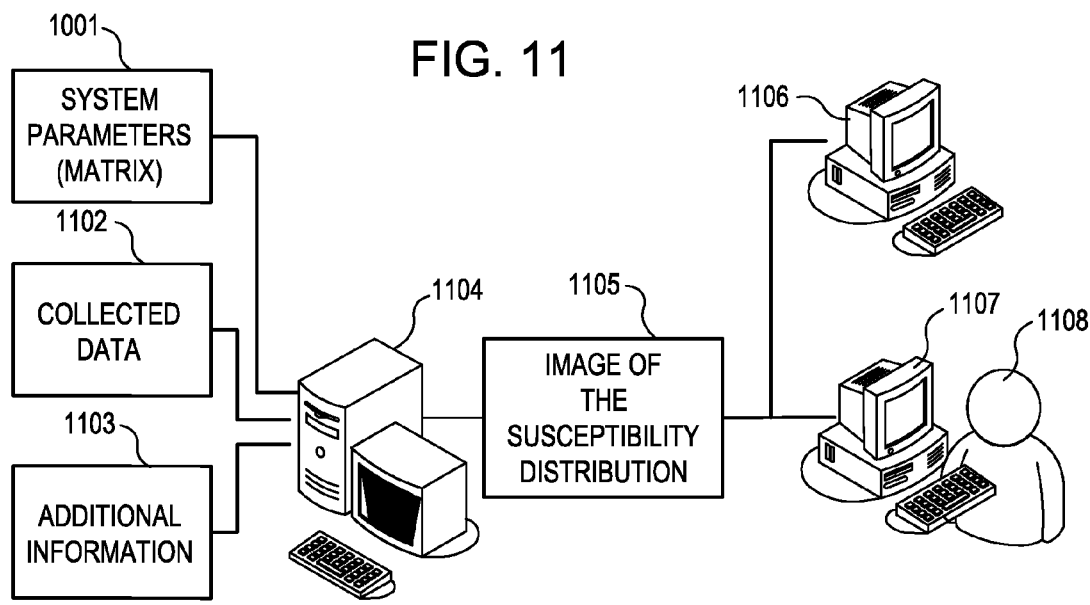
FIG. 11 depicts a system for processing magnetic signals in a providing magnetic source magnetic resonance imaging system according to one embodiment.

In another view of the system 20 illustrated in FIG. 11, the magnetic source magnetic resonance imaging includes an image processor 1104, a user workstation 1107, and a post-processing server 1106. The image processor 1104 receives data for generating an image of a susceptibility distribution of an object. These data include the system parameters 1101 representing the system matrix of the scanner 22, collected data 1102 extracted from the collected signals, and additional information 1103 determined independently from the collected signals. The image processor 1104 then performs an image reconstruction process on the received data according to one of the methods described herein. The resulting image represents a quantitative estimation of the susceptibility distribution. Specifically, the resulting image may be in the form of a three-dimensional data set including a plurality of voxels, where the value associated with each voxel represents a quantitative estimation of the local susceptibility within that voxel. Furthermore, the three-dimensional data set may be an isotropic data set where the data set has the same resolution in the x, y, and z dimensions. Alternatively, the three-dimensional data set may be anisotropic, where each voxel has different resolutions in the x, y, and z dimensions.

As further depicted in FIG. 11, after the image is generated, it is transmitted to a user workstation 1107 and may be viewed or manipulated by a user 1108. Specifically, the user workstation 1107 may be a reading workstation in a radiology department that allows the user (i.e., a doctor or a clinical personnel) to perform diagnostic analysis on the image. Furthermore, the user 1108 may interact with the image data through standard input/output devices such as the keyboard and mouse.

Additionally, as shown in FIG. 11, the resulting image 1105 is further transmitted to a post-processing server 1106 for performing various post-processing operations such as computer-aided diagnosis analysis. For example, the post-processing server 1106 performs an image registration between the susceptibility image 1105 and one or more images of the object generated by other imaging modalities such as a standard MRI image, a computed tomography image, or an ultrasound image. The image registrations are well known methods for aligning the image features in the susceptibility image 1105 with those in the additional image.

The post-processing server 1106 also performs color-coding on the susceptibility image 1105 according to the voxel values. Such color-coding helps a user to better visually identify pathological regions or abnormalities in the image.

In addition, the post-processing server 1106 generates a composite image by combining the susceptibility image 1105 and the images generated by other modalities. For example, the composite image includes a standard MRI image or a CT image overlapping the susceptibility image that is color-coded and registered to those images. This composite image helps the user to better visualize the susceptibility image in the context of other internal structures of the object.

Referring to FIGS. 1 and 11, the function of the image processor 1104 is performed by the control CPU 24. Specifically, the control CPU 24 has a user interface for inputting various parameters representing the system matrix 1101 and the additional information 1103 of the object. Generally, the system matrix indicates a linear relationship between the source signals 302 and the collected signals 304, where each element of the system matrix models the relationship between one component of the source signal 302 and a corresponding component of the collected signals 304 that results from the source signal 302. Alternatively, the function of the image processor 1104 is performed by the image processor 28 or the operator station 26 connected to the control CPU 24. Accordingly, the image processor 28 or the operation station 26 receives data from the control CPU 24 that includes imaging signals 1102. Additionally, these systems also include a user interface for receiving user-input information such as the system parameters 1101 and additional information 1103 of the object.

Figure 12:
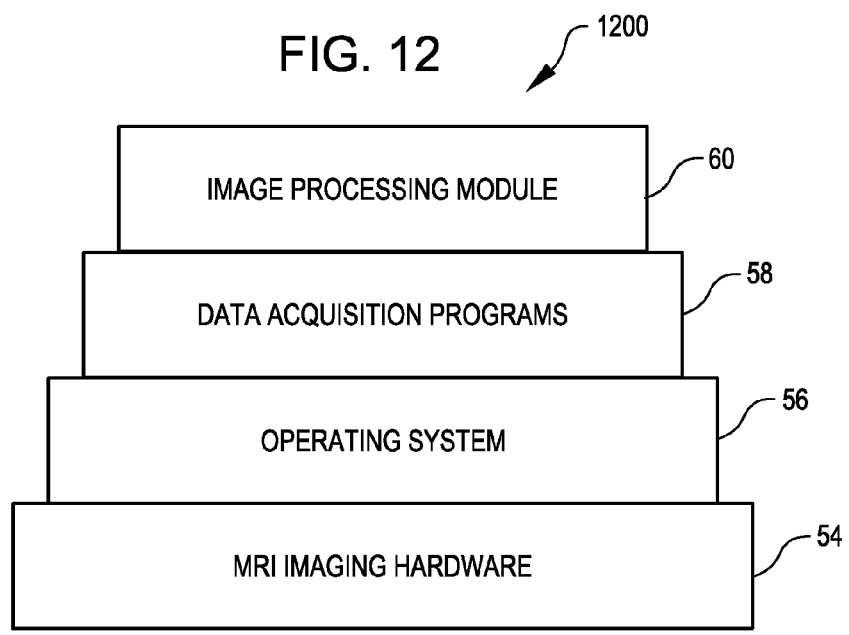
FIG. 12 depicts a diagram of the structure of the system shown in FIG. 11.

Referring to FIG. 12 the imaging system 20 includes imaging hardware 54, such as the scanner 22, control CPU 24, an operating station 26, and image processor 28. The imaging hardware 54 supports an operating system 56, such as a UNIX operating system. Installed in the operating system 56 is imaging and data acquisition programs 58 used to control the scanner 22 and convert measurements of the scanner 22 into image data. An example of the data acquisition programs is the GE Advantage Workstation® available from General Electric. In addition to the data acquisition programs, additional add-on modules can also be included, such as image processing module 60 including a segmentation module and image reconstruction module, which, in an embodiment, is a computer program or other mechanism for analyzing image data.

Figure 13:
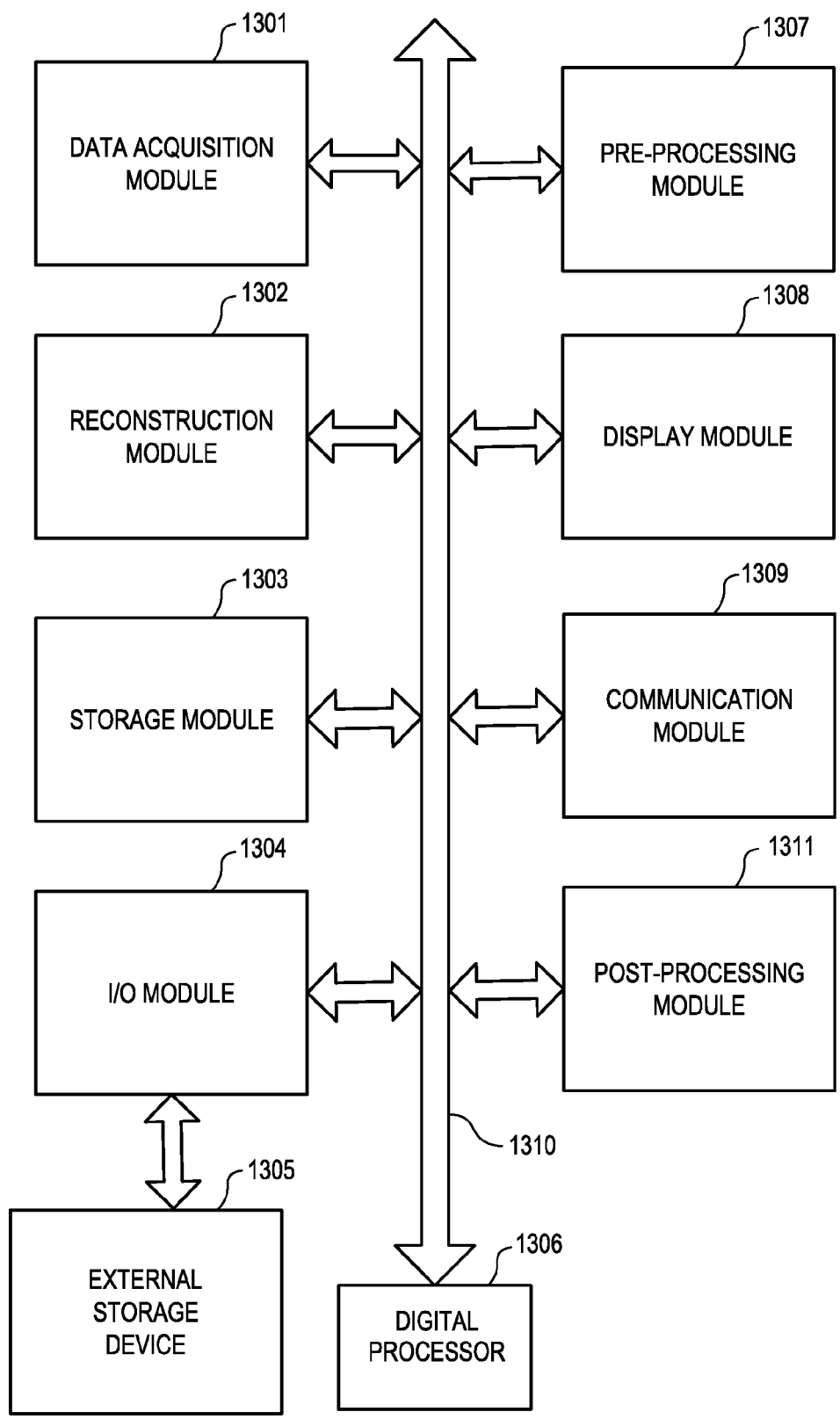
FIG. 13 depicts a diagram of a computer system for providing magnetic source magnetic resonance imaging according to one embodiment.

The detailed structures of the imaging system illustrated in FIG. 1 are shown in FIG. 13 and provide an image of the object based on collected signals and additional information of the object in keeping with the invention. Specifically, the imaging system 20 includes a data acquisition module 1301, a pre-processing module 1307, a reconstruction module 1302, a display module 1308, a storage module 1303, a communication module 1309, an I/O module 1304, a post-processing module 1311, and a processor 1306. In one embodiment, the various modules shown in FIG. 13 reside on a single digital processor such as the control CPU 24 or the image processor 28 in FIG. 1, where the modules are interconnected through a data bus 1310. The I/O module is further connected to an external storage device.

Collectively the modules provide various functionalities and methods described in this application. For example, the data acquisition module 1301 collects magnetic signals from the object. The pre-processing module 1307 extracts the data used for generating the image from the collected signals. Preferably, the pre-processing module 1307 also performs other operations on the collected signals such as filtering, sampling, initial data processing for correcting errors and removing artifacts and undesired signal components. Reconstruction module 1302 then uses the data output from the pre-processing module 1307 to generate an estimation of the spatial characteristic of the object according to various methods described in this application. The generated image data are then stored in the storage module 1303 or transmitted to the display module 1308 for rendering the image that allows a user to visualize the spatial characteristic of the object.

Additionally, the generated image data may be transmitted to the communication module that in turn transmits the image to other systems through a computer network. The image data may also be transmitted to the I/O module that stores the data into the external storage device 1305 such as a compact disc, a flash drive, a hard drive, or other forms of computer readable medium. The image data may also be transmitted to the post-processing module 1311 for performing additional operations on the image data such as registration, segmentation, color-coding, filtering, etc. The digital processor 1306 provides various functionalities for controlling the data transmission over the bus 1310.

The various modules depicted in FIG. 13 are preferably realized by computer executable program code that is read and executed by the digital processor 1306 for providing the various operations described herein. Alternatively, the data acquisition and image processing operations described herein may be performed by a plurality of digital processors connected through a computer network. For example, in FIG. 13, the modules may reside on separate computers or servers that are connected through a computer network 1310 controlled by the processor 1306. Each digital processor connected to the computer network may include computer program codes for instructing the processor to perform various operations and methods described herein.

Each of the modules depicted in FIG. 13 is realized by the execution of software in the imaging system. The software is preferably implemented on the operating system 56 such as the UNIX system using high-level programming languages such as C, C++, C#, Basic, or Java. Each of the modules can be implemented in separate programs executable on the operating system 56. Alternatively, they can also be combined into a single program providing various operations and functions associated with each of the modules.

Furthermore, the modules shown in FIG. 13 can also be implemented on dedicated hardware devices such as the application-specific integrated circuit (ASIC) or the field-programmable gate array (FPGA). Additionally, in order to optimize the performance of the imaging system 20, the reconstruction module can be implemented on a dedicated graphics processing unit (GPU) residing on the control CPU 24 or the image processor 28 that provides high performance computations and graphic rendering.

It will be appreciated that each program, module, and functional computational unit described herein, and each step executed by the automatic system, is implemented in an embodiment by a computer or computing device (generically "computer") reading computer-executable instructions from a computer-readable medium and executing said instructions or causing them to be executed. The computer-readable medium is a physical fixed medium such as a magnetic or optically readable (and potentially writable) disc, circuit, array, or other physically tangible element. In an alternative embodiment, "transient computer-readable media" may be used additionally or alternatively. Such media include radio and optical transmissions (generically "electromagnetic transmissions"), audio transmissions, whether human-perceivable or not, and so on. It will be appreciated that "computer-readable media" are distinct from "transient computer-readable media." In addition, upon reading the disclosure, one of ordinary skill in the art will recognize that the phrases "phase," "local field," and "field shift" are interchangeable in the context of this application. One skilled in the art will also recognize that the phrases "quantitative susceptibility imaging," "QSI," "magnetic source magnetic resonance imaging," and "MS-MRI" are interchangeable in the context of this application.

II. Susceptibility Imaging

A. Mapping Arbitrary Susceptibility Distribution

Susceptibility imaging of an arbitrary distribution is a long sought-after goal. The SQUID approach has difficulties achieving this goal because of the limitations on the number of detectors and the detector positions outside of the objects. The large number of voxels in 3D MRI overcomes these problems specific to SQUID. The ill-posedness of the inverse problem from field to source as illustrated below, remains an obstacle for obtaining usable susceptibility maps in humans. The following section briefly describes the field source inverse problem using its derivations based on the fundamental Maxwell equations.

B. Susceptibility Imaging Due to the Ill-Posed Inverse Problem-the Forward Problem from Magnetization to MRI Measured Field For a given magnetization distribution m(r) of tissue in an MR scanner, the corresponding macroscopic magnetic field b(r) can be derived from the Maxwell Equation of static magnetism, $$\nabla \cdot b = 0, \quad \nabla b = \mu_0 \nabla m. \quad \text{(Equation 1)}$$

It should be noted that MRI phase measures the local field $b_{local}$ experienced by water spins, which is different from the macroscopic field b because of the susceptible materials surrounding the water spin. The Lorentz sphere correction model may be used that gives, $$b_{local} = b - 2/3 \, m. \quad \text{(Equation 2)}$$

The two first order differential equations in Equation (1) can be combined into a single second order differential equation, $$-\nabla^2 b = \mu_0 [\nabla(\nabla \cdot m) - \nabla^2 m], \quad \text{(Equation 3)}$$

The solution to Equation (3) can be derived in Fourier domain $b(r) = \int d^3k B(k) e^{ikr} = FT^{-1}[B(k)]$, where differentiation becomes multiplication by k, the k-space position vector:

$$k^2 B(k) = \mu_0 [k^2 M(k) - (k \cdot M(k))k], \quad \text{(Equation 4)}$$

Therefore, after applying the Lorentz correction, $$B_{local}(k) = B_0 \delta(k) + \mu_0 [M(k)/3 - (k \cdot M(k))k/k^2], \quad \text{(Equation 5)}$$

where the first term is the magnet $B_0$ field at k=0 where Equation (4) is problematic. The magnetization is related to susceptibility defined as $\chi(r) \equiv \mu_0 \, m(r)/B_0$ (for all tissues, $\chi \ll 1$). The equilibrium directions of magnetization and magnetic fields are along z. Let $\delta_b(r) \equiv (b_{local}(r) - B_0)/B_0$ be the relative difference field, whose Fourier transform $\Delta_b(k)$ can be simply expressed as, $$\Delta_b(k) = (1/3 - k_z^2/k^2) X(k), \quad \text{(Equation 6)}$$

Where $X(k)$ is the Fourier domain susceptibility $\chi(r)=FT^{-1}[X(k)]$. Using direct Fourier transformation, the corresponding formulation in image space is:

$$\delta_b(r)=(1/4\pi)\int d^3r'(3\cos^2\theta_{rr'}-1)/|r-r'|^3\chi(r')=d(r)$$
$$\otimes\chi(r), \quad \text{(Equation 7)}$$

where $d(r)=(1/4\pi)(3\cos^2\theta-1)/r^3=FT^{-1}[(1/3-k_z^2/k^2)]$. Alternatively, Equation (7) can be derived directly from the Maxwell equation in image space using the integration form.

Still an alternative image space derivation for Equation (7) is to use the magnetic field formula for a single dipole. The superposition principle gives the field of an arbitrary distribution m(r) as summation over all dipole contributions. The z-component along $B_0$ direction for the macroscopic magnetic field is, $$b(r)-B_0=\int d^3r'm(r')\,\mu_0/4\pi[(3\cos^2\theta_{rr'}-1)/|r-r'|^3+8\pi/3\delta(r-r')], \quad \text{(Equation 8)}$$

which leads to Equation (7) as its second term is canceled by the Lorentz correction in Equation (2).

Difficulty with the inverse problem from measured field to magnetization source. A direct point-wise division of the field map in k-space, $$X(k)=\Delta_b(k)/(1/3-k_z^2/k^2), \quad \text{(Equation 9)}$$

would not generate a meaningful susceptibility map because of the zeroes at $k_z^2=k^2/3$. These zeroes form two opposing cone surfaces at the magic angle (~54.7° from the main magnetic field, FIG. 14A). The susceptibility at these cone surface cannot be determined, i.e., any X(k) will give zero magnetic field at these cone surfaces. This causes the ill-posedness of the inverse problem.

It was suggested that these cone surfaces may be avoided in discretized k-space data acquisition using carefully chosen sampling grids. However, the discrete problem remains ill-conditioned, because k-space points sampled close to the zero cone surfaces will cause severe noise amplifications. The condition number of the system Equation (6), which characterizes the upper bound of noise propagation, is, $$\kappa=\max_k\{(1/3-k_z^2/k^2)\}/\min_k\{(1/3-k_z^2/k^2)\}=k_m/(2\epsilon), \quad \text{(Equation 10)}$$

where $k_m$ is the maximal value of sampled $k_z$ and $\epsilon$ is the closest distance the sampled point to the zero cone surface at maximal $k_z$. Therefore, this condition number is large, resulting in large noise propagation.

This theoretical analysis is exemplified in FIG. 14, where the k-space division in Equation (9) is used to reconstruct a susceptibility map. A little noise added in the phase map (SNR=20) leads to a totally corrupted image of susceptibility that bear no physical resemblance to the true susceptibility source.

C. Solving the Inverse Problem from Magnetic Field Measured in MRI to Magnetization Source Provided herein is a method for quantitative susceptibility imaging using non-ionizing radiation, particularly, using magnetic source magnetic resonance imaging signals.

1. Susceptibility Imaging Using Sparse Regularization

According to one embodiment, a method is provided for susceptibility imaging using additional information determined independently from the signals collected from the object. The method utilized a regularization approach for improving the condition of the invention operation.

According to a further embodiment, the regularization term uses the L1 norm to promote image sparsity and constructing susceptibility images by solving the minimization problem. Alternatively, the regularization term uses the L1 noun as in the standard Tikhonov regularization. Still alternatively, the regularization term uses the L1 norm of the image gradient (approximated by total variance=TV[$\chi$]= $\Sigma_{x,y,z}[(\chi_{(x,y,z)}-\chi_{(x-1,y,z)})^2+(\chi_{(x,y,z)}-\chi_{(x,y-1,z)})^2+\chi_{(x,y,z)}-\chi_{(x,y,z-1)})^2]^{1/2}$). Still alternatively, the regularization term uses the L2 norm of the image gradient. The two latter embodiments provide the benefit of promoting edge sparsity. Regularizations base don other nouns can also be used, such as the L1.1 norm. Furthermore, the regularization term can include a combination of the norms described above. For example, the regularization term can include a sum of the L1 norm of the image and L1 norm of image gradient.

The regularized susceptibility imaging can be summarized by the following equation, $$\chi(r)=\text{argmin}_{\chi(r)}[\lambda\Sigma_r|w(r)(\delta_b(r)-d(r)\otimes\chi(r))|^2+R[\chi(r)]], \quad \text{(Equation 11)}$$

with R can be one or more of L0 norm, L1 norm, L1.1 norm, TV, L2 norm, L2 norm of the gradient, L1 noun of the gradient, and wavelet decomposition. One major challenge for this regularization approach is the computational complexity in solving the minimization problem. A closed form solution may not be available and if it is available, a large memory and long computation times are needed to invert the huge system matrix for even a small 3D data set. The major challenge in this regularized reconstruction of susceptibility maps is the selection of regularization parameter, the value of which affects image quality and susceptibility value. The L-curve method (Boyd S., Convex Optimization, Cambridge, 2004) may be used in identifying the regularization parameter corresponding to reasonable image quality.

(a) Implementations of Solvers for Constrained Minimization

Iterative inversion techniques are used that do not require explicitly forming the matrix. The forward system is repeatedly applied to a residual vector to update an estimated solution. For L2 norms, the problem has a symmetric positive definite, and the conventional conjugate gradients linear system solver can be used with rapid convergence towards a global minimum. For L1 nouns, the problem is nonlinear and nondifferentiable but still convex, and a more complicated log barrier interior point method can be used, which is effective for large scale inversion problems in imaging. Searching for the minimum requires the use of a gradient descent method (Newton's method) (Boyd, supra), which requires differentiability. The log barrier is used to reformulate the original problem in Equation 11 for L1 norm into an equivalent differentiable problem consisting of a constrained part and an unconstrained part. The log barrier is iteratively updated to trade off the accuracy and the convergence of the Newton steps.

(b) Regularization Parameters.

As a first investigation into this regularized inverse problem, a visually comparison is performed on the reconstructed susceptibility images of a known phantom at various regularization parameter values. The best quality images for the four regularization terms (L1 norm, TV, L2 norm, L2 norm of gradient) were obtained and compared (FIG. 23). It is found that: 1) the regularization parameter such that the residual error in the data term was equal to the noise power consistently gave reasonable image quality; 2) the L1 norm had a slightly sharper image definition; and 3) there is linearity between estimated susceptibility and known susceptibility for almost all regularization parameters, though the slope may deviate from unity. The last two properties indicate that: 1) semi-quantitative susceptibility images can be reconstructed using the simple L1 norm minimization, and 2) better regularization terms are needed for accurate susceptibility estimation.

(c) Rat Brain Studies.

To demonstrate the feasibility of the technique in a biological sample, SPIO labeled stem cells were injected into a stroke model rat, and the rat brain was imaged in a Bruker 7 T small animal scanner. A single image was acquired, and phase unwrapping and high pass filtering were performed. The phase unwrapping and filtering algorithms were those described in(de Rochefort et al., *Proc ISMRM*, 2008: 540; de Rochefort et al., *Proc ISMRM*, 2008: 821; de Rochefort et al., *Magn Reson Med*, 2008: 60(4):1003-9; Bagher-Ebadian et al., *Magn Reson Imaging*, 2008: 27:649-652). The imaged resolution was 93.75 μm isotropic, and the image was acquired using an echo time of 10 ms. Susceptibility distributions estimated for the rat brain are shown in FIG. 24. The regions of high susceptibility match closely with the signal voids visible in the magnitude images. The L1 regularization produces better suppression of noise than the L2 regularization. The estimated iron map using susceptibility imaging is in accordance with histological iron staining (FIG. 24E)

(d) Human Brain Microbleeding Imaging Using Regularization

Figure 25A:
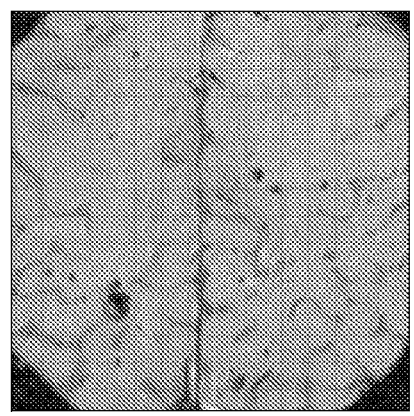
FIGS. 25 ($a$)-($d$) show microbleeds in cavernous hemangioma including (a) the axial T2* image, (b) the local field map in the sagittal, coronal and axial section, (c) axial SWI image, and (d) the axial susceptibility map.
Figure 25B:
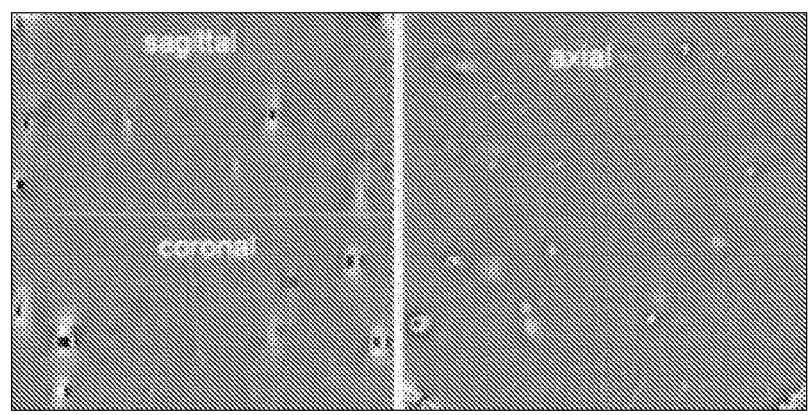
Figure 25C:
Figure 25D:
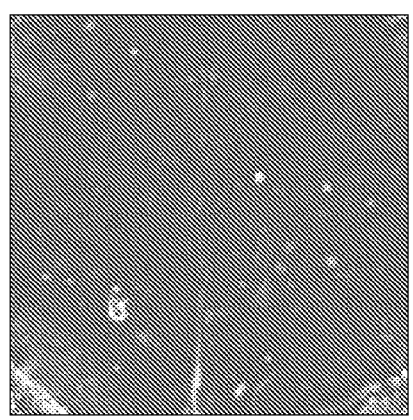

Patients with cavernous hemangioma (n=3) were imaged using a 3D single echo gradient echo sequence on a 1.5T MR scanner. A low pass filter on the phase images was used to remove background phase and to generate a field map. The dipole field patterns can be identified on the field map as star pattern with positive radiations negative foci in the sagittal and coronal view and as ringing pattern in the axial view (FIG. 25B). SWI amplifies the appearance of microbleeds (FIGS. 25C vs. 25A), and the susceptibility map (FIG. 25D) extracts the amount of iron deposits in each microbleed.

2. Susceptibility Imaging Using Magnitude Image Based Regularization-Piece-Wise Constant Regularization According to another embodiment, a quantitative susceptibility imaging method is provided that utilizes a piece-wise constant regularization approach. According to this embodiment, it is assumed that the susceptibility is constant over a local region that has uniform magnitude signal intensity. Let $\chi_p$ be the susceptibility of region p and $d_p$ the dipole kernel convoluted with region p, $d_p(r)=(1/4\pi)\int_p dr'(3\cos^2\theta_{rr'}-1)/|r-r'|^3$ (geometric factor), then the convolution integral in Equation 7 becomes, $$\Sigma_p \chi_p d_p(r) = \delta_b(r).$$ [Equation 12]

Because there are so many voxels with spins to detect the magnetic field, Eq.C5 is an over-determined problem, which can be rapidly solved using the weighted least squares method:

$$\chi = (D^T W D)^{-1} D^T W \delta$$ [Equation 13]

where the vector $\chi$ has elements $\chi_p$, the matrix D has elements $D_{pr}=d_p(r)$, the matrix W has only nonzero diagonal elements w(r), and the vector δ has elements $\delta_b(r)$. The constraint imposed in Equation 12 may be too strong and may be relaxed into a prior that edge information in the susceptibility image is similar to edge information in the magnitude T2* weighted image. The model of Equation 12 can be straightforwardly extended to account for chemical shifts and background.

TABLE 1

Quantitative susceptibility imaging measurement of χ and σ.

| Compound | Susceptibility in ref. H$_2$O (ppm) | | Chem Shift ref. H$_2$O (ppm) | |
|---|---|---|---|---|
| | Literature | MRI measure | Literature | MRI measure |
| Air | 9.41 | 9.45 ± 0.02 | — | — |
| Vegetable Oil | 0.75 | 0.65 ± 0.02 | −3.5 | −3.46 ± 0.001 |
| Gd$^{3+}$ L/mol | 326 | 325.9 ± 2.2 | — | — |
| Feridex L/mol | 3615 | 3733 ± 82 | — | — |
| Lamb leg bone | | −2.46 | | |
| Lamb leg marrow | | 0.90 | | −3.52 |

(a) In vivo Bone Susceptibility Measurement

Figure 26A:
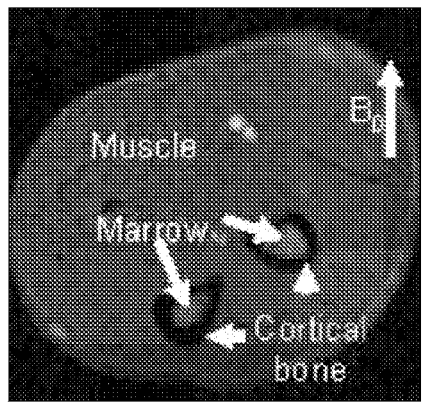
FIGS. 26 ($a$)-($c$) show magnitude image (i.e., one slice from the 3D data) of a forearm section in (a), the segmentation of soft tissue, bones and marrows of the forearm section in (b), and measured field map (c) at the section shown in (a)
Figure 26B:
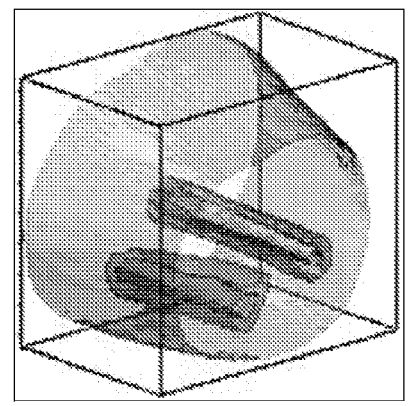
Figure 26C:
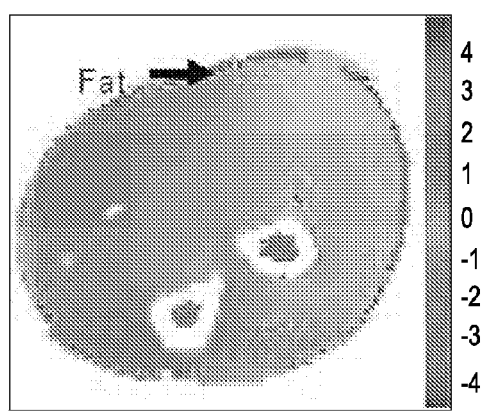
Figure 26D:
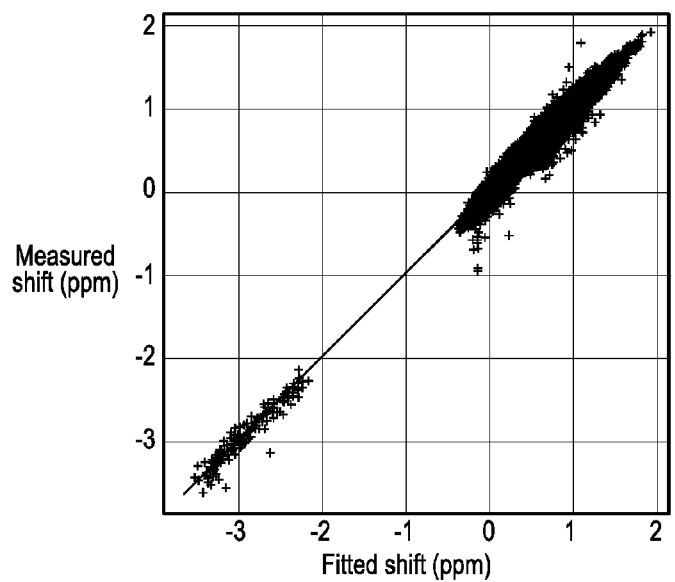
Figure 26E:
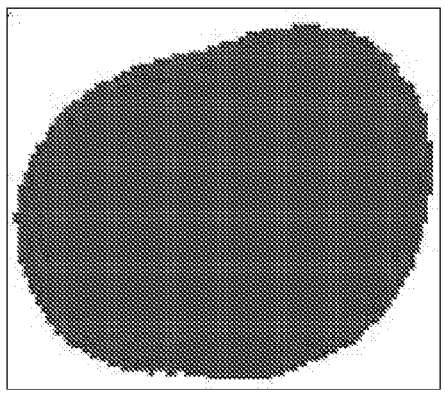
Figure 26F:
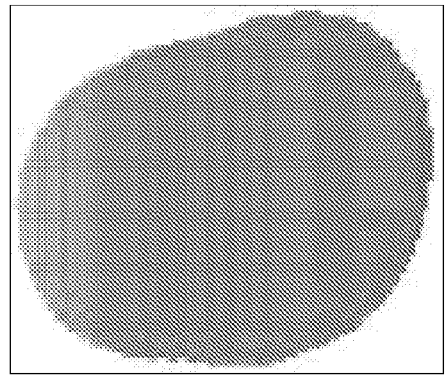
Figure 26G:
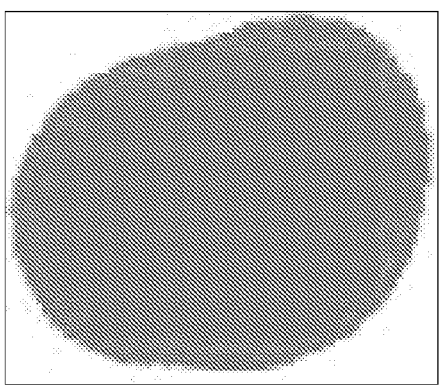
Figure 26H:
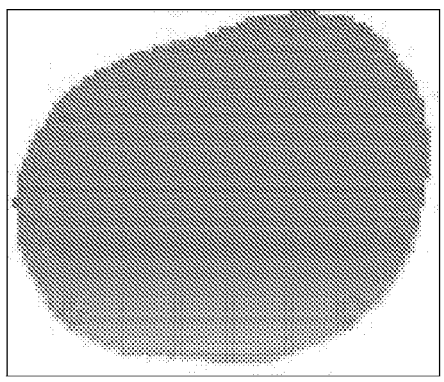
Figure 26I:
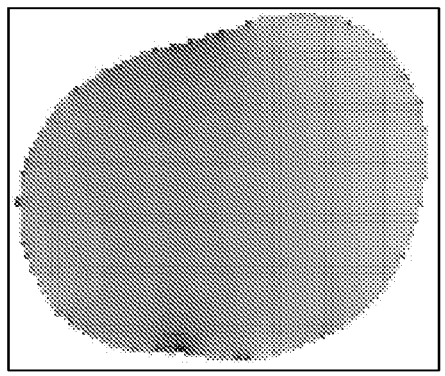
Figure 26J:
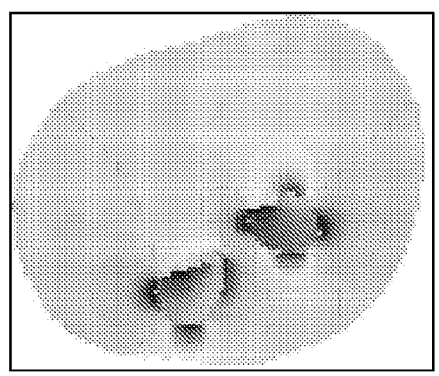
Figure 26K:
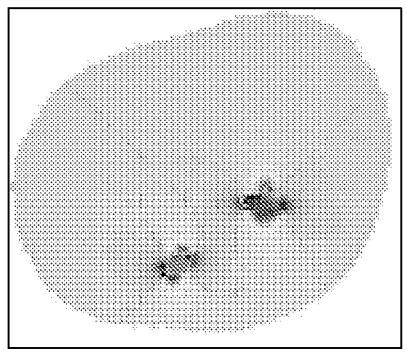
Figure 26L:
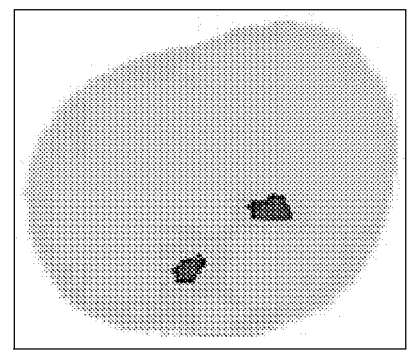

MRI of the forearm (FIG. 26A) shows no signal inside the cortical bone due to its short T2* and low proton density as expected, which allowed adequate segmentation as illustrated by the 3D renderings (FIG. 26B). The bone marrow and subcutaneous fat had a similar phase shift (blue) and the bone generated phase variation in surrounding muscle (FIG. 26C). Linear background terms were used (FIGS. 26E-H). All bones were treated as a uniform tissue, as differentiating bones and bone sections did not change results. Good agreement between the measured shifts and the fitted shifts derived from segmented tissues were observed (FIG. 26D). Fields of segmented regions at unit susceptibility (matrix elements $D_{pr}$) are illustrated in FIGS. 26I-L. Susceptibility of approximately −9.11±0.13 ppm was obtained for soft tissue, close to that for water. The bone was found to be more diamagnetic than tissue (−2.20±0.07 ppm), and the susceptibility of fatty marrow was 0.81±0.25 ppm with a chemical shift of −3.47±0.05 ppm, consistent with literature (Table 1).

Figure 27A:
FIGS. 27 ($a$)-($d$) show (a) the magnitude image with the aorta contour, (b) the aortic arch 3D triangular surface mesh, (c) the calculated shape factor in the aorta (with no unit) agreeing with the measured field map, and (d) the calculated shape factor in the aorta in ppm. (a) shows the manually selected points indicated by the dark circle and interpolated 2D contour of the aorta are displayed on the typical enhanced magnitude image. (b) shows the contour is then used to generate an approximate aortic arch 3D triangular surface mesh used for the shape factor calculation. (c) shows calculated shape factor in the aorta (unitless) that compares well to the measured field map in (d) (in ppm). The B0 field orientation is approximately superior-inferior direction. Starting from positive shift in the ascending aorta, a spatially varying shift is observed. The field decreases in the curvature down to negative values near the carotid arteries and increases again in the descending aorta where the shift gets relatively uniform.
Figure 27B:
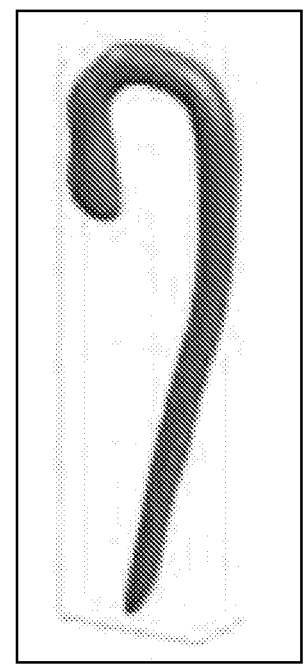
Figure 27C:
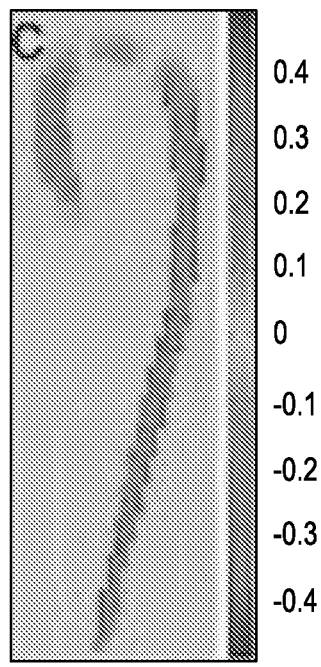
Figure 27D:
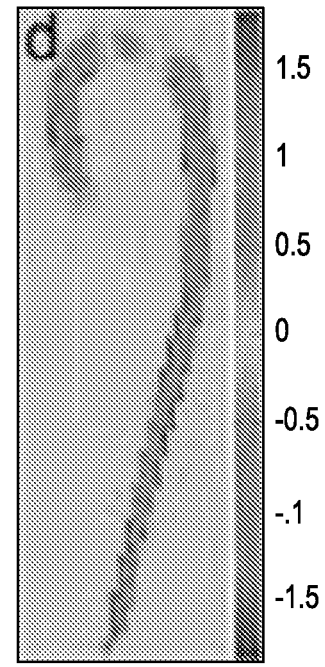
Figure 28:
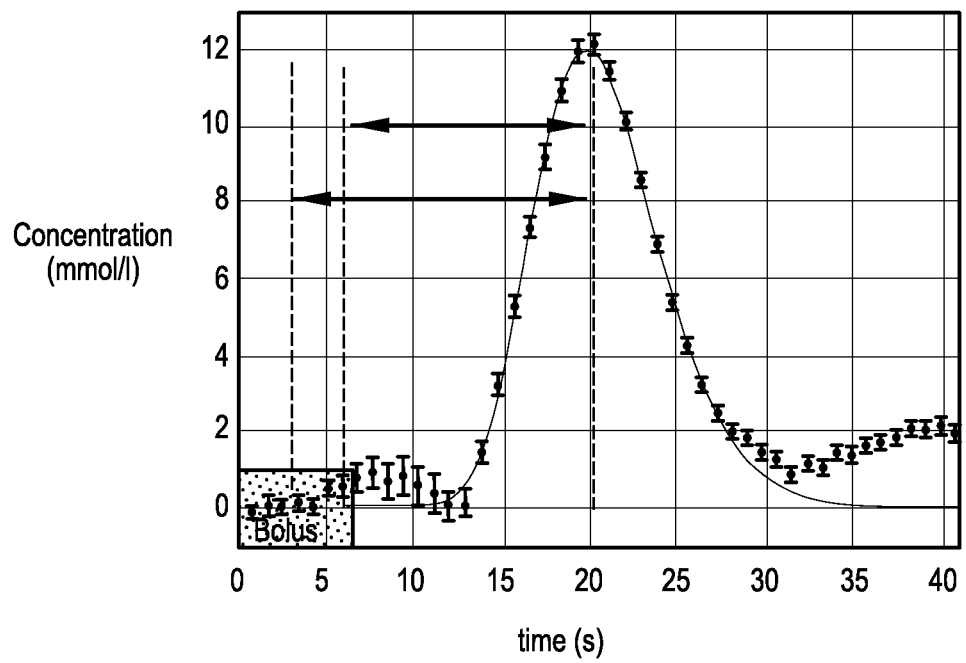
FIG. 28 depicts the QSI estimated [Gd] time course.
Figure 29:
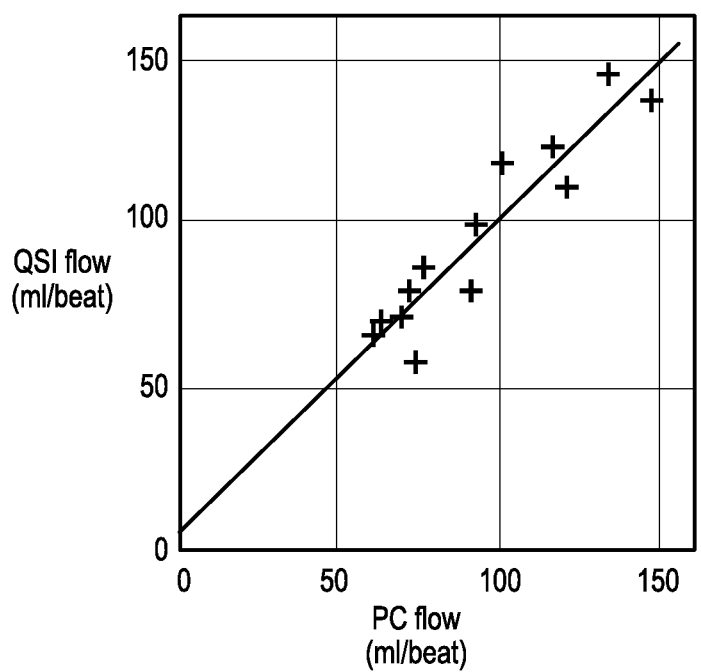
FIG. 29 depicts the flow rate agreeing with the PC measurement corresponding to the result shown in FIG. 28.
Figure 30A:
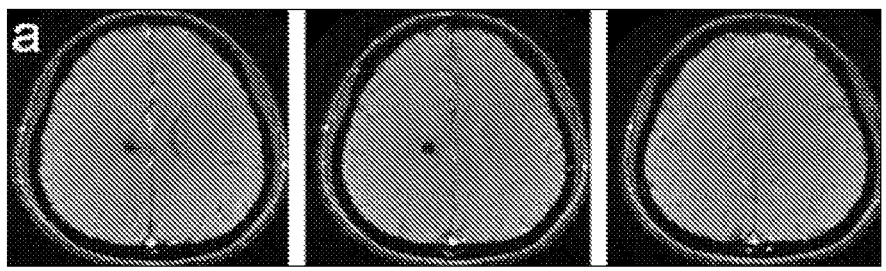
FIG. 30 ($a$)-($d$) show (a) the T2* magnitude image of the brain tissue, b) the phase (i.e. field) map image, (c) the SWI image, and (d) the susceptibility image, where, compared to susceptibility image (d), there is overestimation of iron presence by the "dark area" in T2* (a) and SWI (d) and in phase map (b)
Figure 30B:
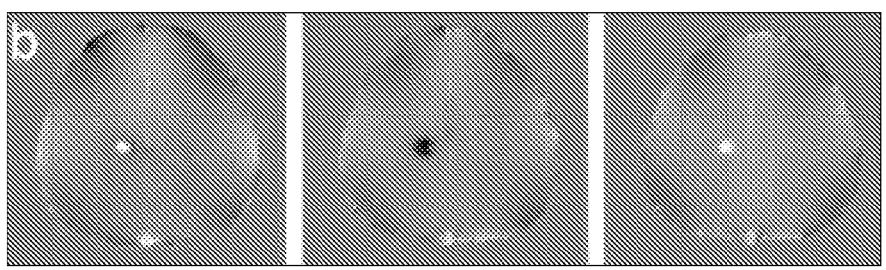
Figure 30C:
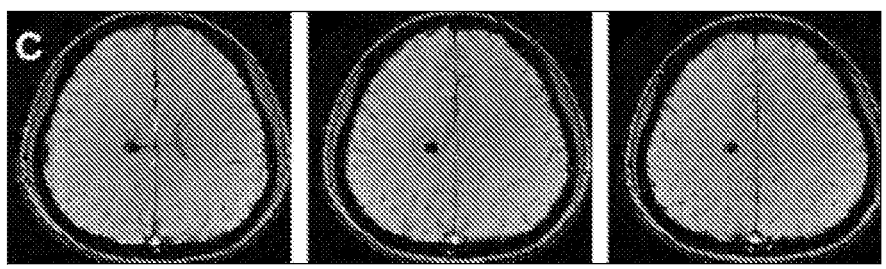
Figure 30D:
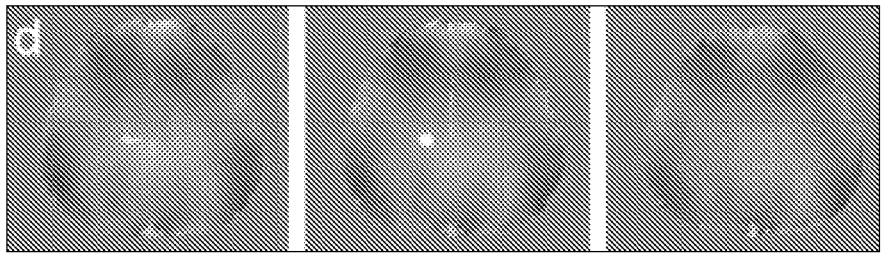
Figure 31A:
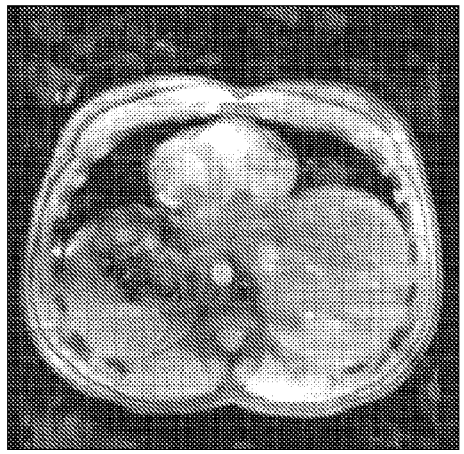
FIGS. 31 ($a$) and ($b$) show (a) the standard SENSE image and (b) the ML-SENSE image.
Figure 31B:
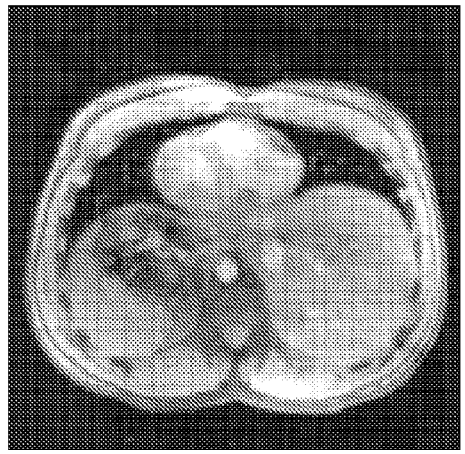
Figure 31C:
Figure 31D:

(b) In Vivo Flow Measurements Using Dilution of [Gd] Estimated from Contrast Enhanced MRA by Quantitative Susceptibility Imaging For vasculature filled with similar [Gd], a simple geometric factor ($d_p(r)$ in Equation 12) may be used. An example of a contoured aortic arch using spline interpolation and corresponding 3D geometrical model are illustrated in FIG. 27A-B. Notably, similarity between the shape factor and measured field (FIG. 27C,D) was observed during contrast agent presence in the aorta following dilution through the pulmonary system. A typical dilution curve resulting from field map inversion (quantitative susceptibility imaging, QSI) in vivo (FIG. 28) allow depiction of the first and second passes. Flow rate measurements using the Stewart-Hamilton dilution principle (Millard R K, *Am J Physiol*. 1997; 272:H2004-2012) were found to be robust for estimating the area under the dilution curve, and were in good agreement with phase contrast (PC) flow measurements over the 14 subjects (FIG. 29).

(c) Mapping Susceptibility of Brain Bleeds and Microbleeds Using Image Based Regularization According to a further embodiment, an image intensity gradient was used to construct a weighting mask $w_g(r)$ for the susceptibility gradient energy term in Equation 11, $$\chi(r) = \mathrm{argmin}_{\chi(r)}[\lambda \Sigma_r |w(r)(\delta_b(r) - d(r) \otimes \chi(r))|^2 + w_g(r)g[\chi(r)]].$$ (Equation 14)

Figure 44:
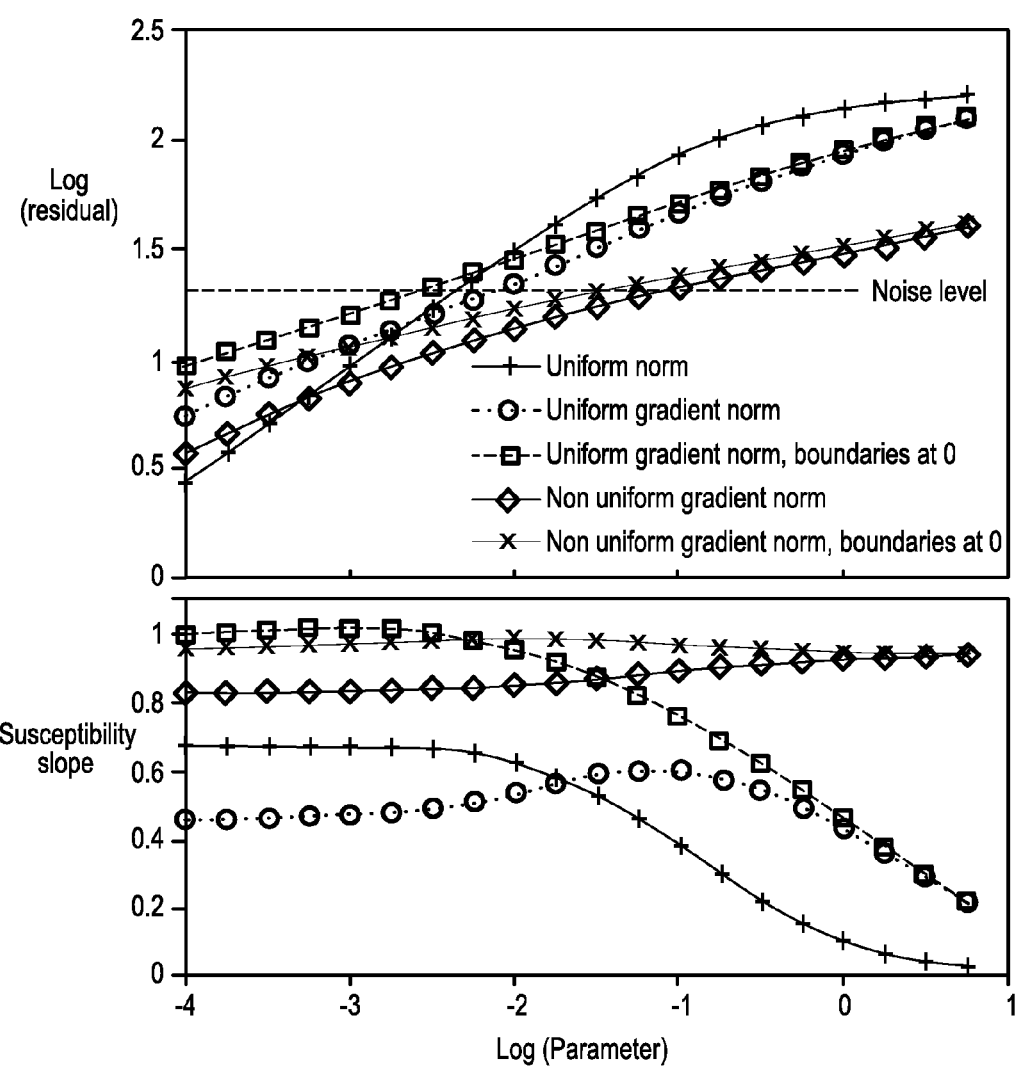
FIG. 44 depicts the regression slope between estimated and known susceptibilities vs. regularization parameter strength.

Here g[ ] is a gradient operator. The gradient mask $w_g(r)$ was chosen to favor smooth susceptibility solution when the image gradient is small and to allow spatial variation in susceptibility when the intensity gradient is large. Phantom validation showed that the reconstructed susceptibility agrees well with that of known gadolinium concentration, with regression slope close to one. Compared to the sparse regularizations on susceptibility or susceptibility gradient where the susceptibility value may depend on the regularization strength (sparse intensity and sparse gradient in FIG. 44), the image based regularization consistently generates correct susceptibility value fairly independent of regularization strength (FIG. 44).

Figure 45:
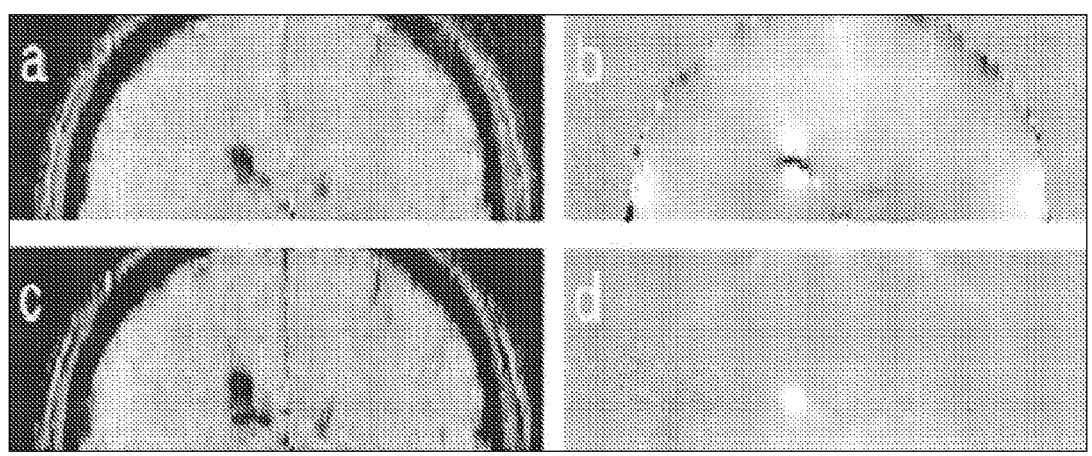
FIGS. 45 (a)-(d) show the coronal section from a 3D data volume including (a) the T2* magnitude image, (b) the phase image, (c) the SWI image, and (d) the susceptibility image, where compared to susceptibility image, there is an overestimation of iron presence by the "dark area" in the T2*, SWI, and phase image.

The inversion algorithm was applied to imaging bleeds and microbleeds in the brain (cavernous hemangioma). FIG. 45 shows an example where the measured field shifts are positive inferior to the iron deposit, negative on the slice containing the iron deposit, and positive again superior to the iron deposit, indicating a paramagnetic dipole-like structure (FIG. 45*b*). On the field map, structured details are visible throughout the brain and tend to follow the distinction between white and gray matter. Assuming the susceptibility map represents true iron distribution (FIG. 45*d*), there is an overestimation by the dark area in T2* image (FIG. 45*a*) and an even greater overestimation by the dark area in SWI (FIG. 45*c*) and by the dark/bright area in phase map (FIG. 45*b*). Better regularization term and removal of fields at brain edge (residual fields at anterior and posterior locations) are desired for further improvement. This feasibility experiment shows the promise of susceptibility imaging assessment of brain microbleeding that is more accurate than T2* imaging or SWI.

3. Calculation of Susceptibility Using Multiple Orientation Sampling (COSMOS)

Figure 14A:
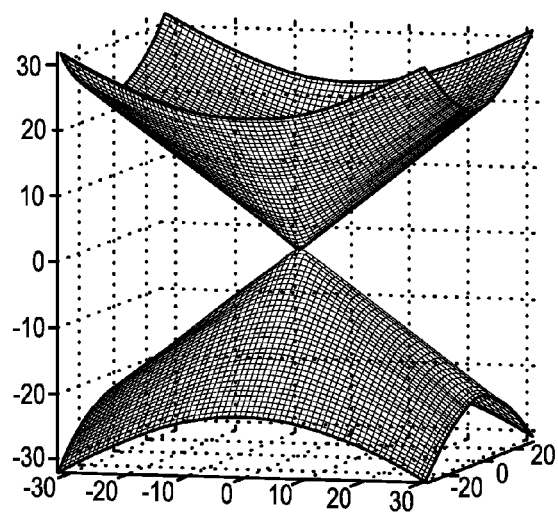
FIG. 14($a$) depicts zero cone surfaces of the dipole kernel in a Fourier domain.
Figure 14B:
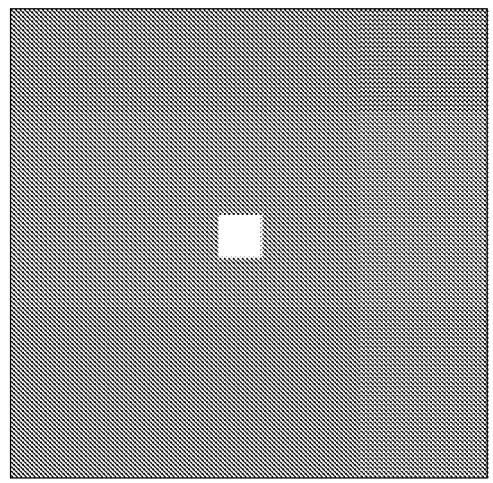
Figure 14C:
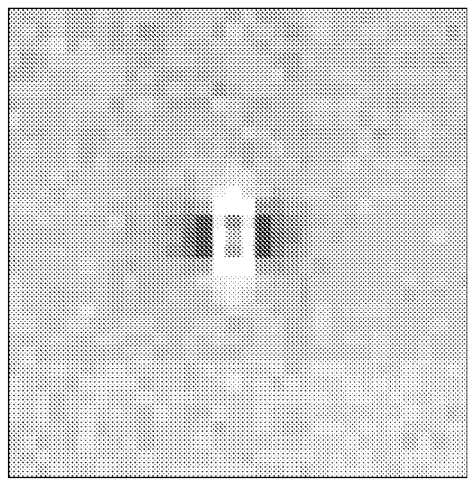
Figure 14D:
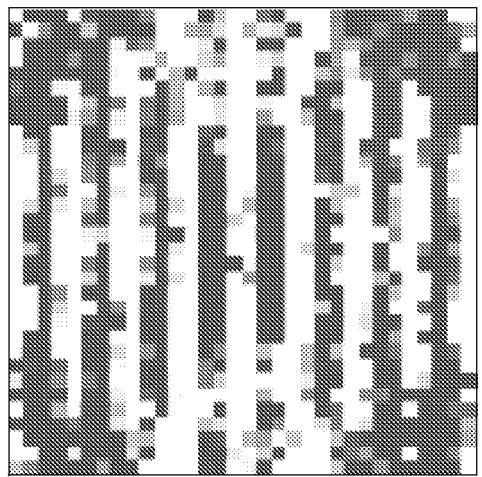
Figure 15:
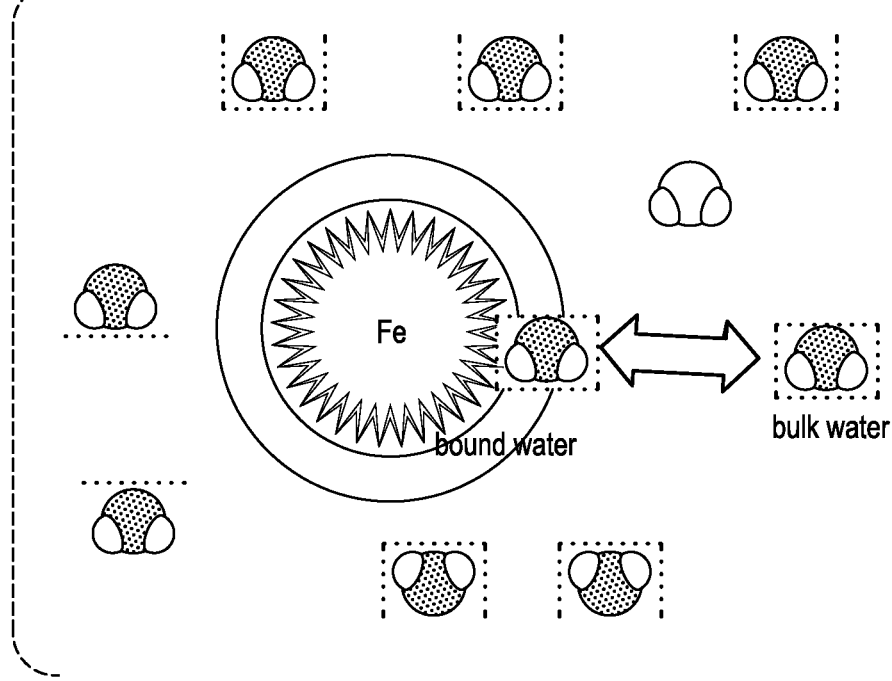
FIG. 15 depicts T1/T2 relaxation enhancement by Fe through Fe—bound H2O and bound H2O and bulk H2O, where the relaxation change depends not only on iron concentration but also on free water concentration.
Figure 16:
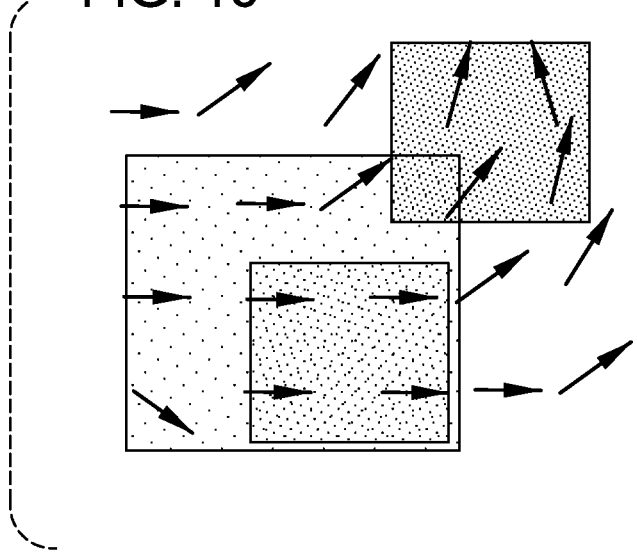
FIG. 16 depicts spin (i.e., isochromat indicated by arrows) phases dispersed in a local field, where the average signal loss due to de-phasing in a voxel (i.e., susceptibility contrast) depends on voxel and voxel location.

According to anther embodiment, a multiple orientation sampling method is used to overcome the susceptibility indeterminacy at the zero cone surfaces of the dipole kernel as shown in FIG. 14A. Let $\delta_{b_p}(r)$ be the field map measured at object orientation angle p, and $k_{zp}$ be the $k_z$ value at angle p, and N be the total number of orientations, then the forward problem Equation (1) becomes:

$$(1/3 - k_{zp}^2/k^2)X(k) = FT[\delta_{b_p}(r)], \text{ for } p=1, \ldots, N. \quad \text{(Equation 15)}$$

This problem can be solved for susceptibility at any k location, as long as one of the coefficients $(1/3 - k_{zp}^2/k^2)$ is sufficiently larger than zero. For most susceptibility values, X(k) is over-determined and can be solved using a weighted least squares solver such as $$X(k) = \operatorname{argmin}_{X(k)} \Sigma_p \Sigma_r |w_p(r)[\delta_{b_p}(r) - FT^{-1}[(1/3 - k_{zp}^2/k^2) X(k)]]|^2, \quad \text{(Equation 16)}$$

where the weighting factor $w_p(r)$ is the signal magnitude at the $p^{th}$ orientation ($\propto$ phase SNR) threshelded at 10% of its maximum intensity, to account for measurement noise. An algorithm for sparse linear equations and sparse least squares (LSQR) can be used to solve Equation (4) iteratively. This iteration converges rapidly (30 iterations in a few minutes in our preliminary 3D data on a Pentium 4 PC using Matlab), because the problem in (Equation 15) is well conditioned. For (Equation 15), the condition number, indicating an upper bound on the relative error propagation in the inversion, is equal to:

$$\kappa(\theta_1 \theta \ldots \theta_n) = \max_k [\Sigma_p (1/3 - (k_z \cos \theta_p + k_y \sin \theta_p)^2/k^2)^2] / \min_k [\Sigma_p (1/3 - (k_z \cos \theta_p + k_y \sin \theta_p)^2/k^2)^2]. \quad \text{(Equation 17)}$$

The optimal set of sampling orientations $(\theta_1 \theta_2 \theta \ldots \theta_n)$ are 0°, 60°, 120° for N=3, corresponding minimal κ=2.03 for a 128×128×64 image and consistent with the intuition that uniformly distributed orientations performs best.

(a) Imaging a Phantom Gadolinium Vials Using COSMOS

Using a 3D multiple-echo gradient echo sequence, the measured field map showed a conspicuous dipole pattern surrounding the vials with different gadolinium concentrations. COSMOS provides satisfactory susceptibility images, clearly resolving different Gd concentrations with no image artifacts. Excellent linear regression between estimated and expected susceptibility ($R^2$=0.9997, slope 0.96) indicated excellent estimation of susceptibility.

(b) In vitro Bone Susceptibility Imaging

FIG. 18A shows a gradient echo image obtained from the bone phantom and FIG. 18C is the corresponding susceptibility reconstruction. Compact bone susceptibility was found to be −2.44±0.89 ppm relative to water. This susceptibility value is in fair agreement with previous in vitro work ($\chi_{bone-water}$=−2.39 ppm).

(c) In vitro Iron Quantification in Animal Tissue

A representative slice is shown in FIG. 19C. The bright regions corresponding to the 2 μL, 3 μL and 4 μL iron-oxide injections are visible on this image (1 uL region not contained in this slice). Measured iron mass are 1.23 2.09 μg, 3.32 μg and 4.34 μg. The relation between estimated and expected total iron oxide mass is plotted in FIG. 19D. (For Ferridex, the conversion between susceptibility and mass is $\chi_{Ferridex}/\rho = \mu_0 M_{Fe}(B_0)/B_0$=64.7 pp μL/μg). Again, this result fits the linear model well ($R^2$=0.996), and indicates that the technique provides a good estimation of iron-oxide mass (slope is 0.94). The small non-zero y-intercept may be explained by noise, error during injection, or temperature change during the scan.

(d) SPIO Imaging in Mouse

Figure 21A:
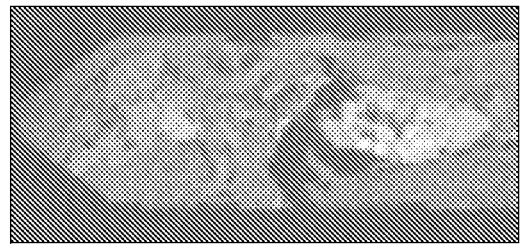
FIGS. 21 ($a$)-($c$) show (a) a gradient echo image obtained from a mouse, (b) a collected field map image, and (c) the corresponding susceptibility reconstruction.
Figure 21B:
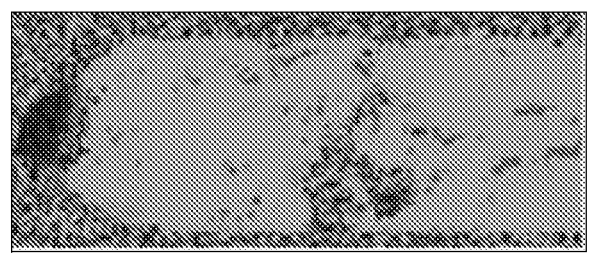

MRI imaging was also performed to demonstrate the feasibility of susceptibility imaging in mice with complex organs using COSMOS. SPIO solution was intravenously administrated, after which the mouse was sacrificed and subsequently housed in a centrifuge tube. As expected, SPIO aggregated in liver (dark area in FIG. 21A and field shifts near liver in FIG. 21B). The reconstructed susceptibility image (FIG. 22C) showed very bright liver. The injected SPIO dose was in agreement with COSMOS measurement (~50 μg Fe).

(e) Human Brain Susceptibility Mapping Using Small-Angle COSMOS

Figure 22A:
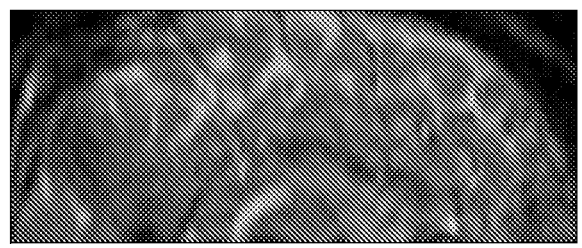
FIGS. 22 ($a$)-($c$) show Human brain imaging using the small-angle COSMOS including (a) the magnitude image, (b) the phase image, and (c) the susceptibility image.
Figure 22B:
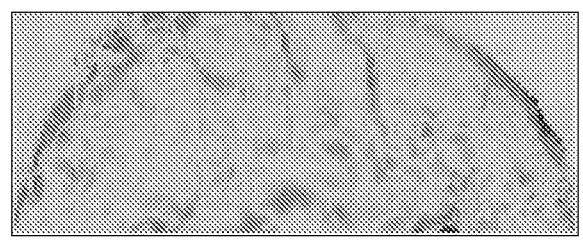
Figure 22C:
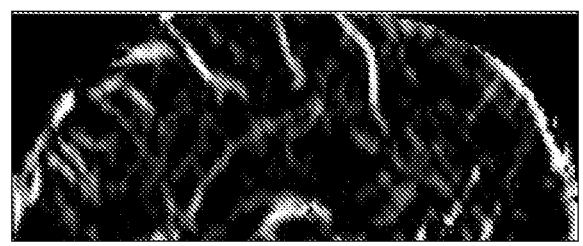
Figure 23A:
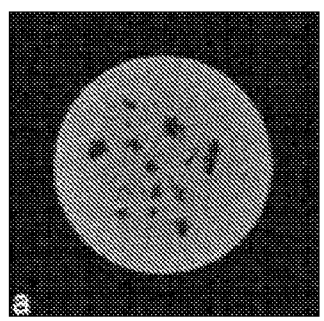
FIGS. 23 ($a$)-($e$) show (a) magnitude gradient echo image of the Gd phantom with [Gd] in mM and Susceptibility distributions estimated using (b) l1, (c) total variation, (d) l2, and (e) l2 of the gradient regularization.
Figure 23B:
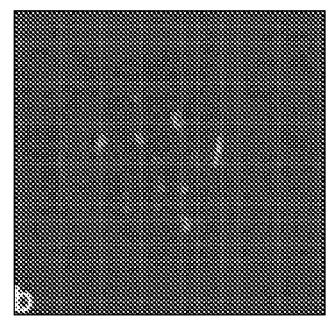
Figure 23C:
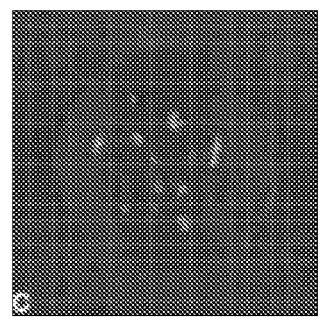
Figure 23D:
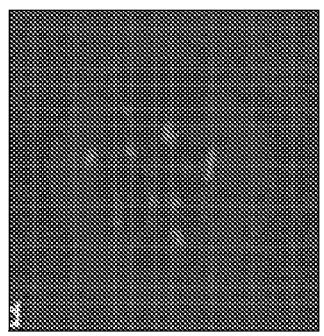
Figure 23E:
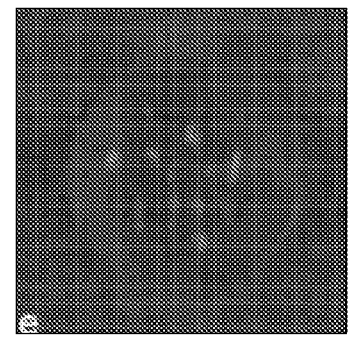

Healthy subjects (n=7) were imaged at three different orientations under the instruction of rotating their heads in the coronal plane by bringing the head towards first the left and then the right shoulder. Typically rotations from −20° to +20° were achieved, together with images acquired in neutral position forming 3-rotation data set for COSMOS processing. A typical result is illustrated in FIG. 22. The susceptibility image (FIG. 22C) demonstrates primary deoxyhemoglobin in veins. In phase image (FIG. 22B), some veins are suppressed by geometry factors in the convolution of (Equation 7).

III. Bayesian Reconstruction and Motion Compensation

Bayesian statistical approach in MRI reconstruction and compensations of motion artifacts in MRI are described in this section:

A. Parallel Imaging Reconstruction with Bayesian Statistical Approach

Various uncertainties in data acquisition (observation y) and prior information about images (Pr(x)) are accounted for in the likelihood function (observation probability), $$L_{prior}(x|y) = L(x|y)Pr(x). \quad \text{(Equation 9-1)}$$

where L(y|x) is the likelihood function without prior information, equal to $\exp(-\tfrac{1}{2}\|y-Ex\|^2)$ in MRI with E the encoding matrix. The prior information can also be expressed as an exponential of a negative energy term. Then the Bayesian estimation takes the form of energy minimization.

B. Maximum Likelihood (ML) SENSE

Both the received signal of each coil and its sensitivity map, which describes its spatial response, are needed during reconstruction. Widely used schemes such as SENSE assume that image reconstruction errors come from detected signal noise, not from the coil sensitivity maps. In practice, however, sensitivity maps are subject to a wide variety of errors. A maximum likelihood approach is utilized to the problem of parallel imaging. The coil sensitivity noise/error is modeled as independent Gaussian noise, in addition to the standard measurement noise. The noise covariance matrix then contains an additional coil sensitivity term that depends on image intensity itself. This results in a quasi-quadratic objective function, which can be efficiently minimized. Let x be the image, y measurements, and E the encoding matrix, $$x \sim \arg\min_x (y-Ex)^H R^{-1}(y-Ex), \quad \text{(Equation 9-2)}$$

here $R=<(\Delta Ex+n)(\Delta Ex+n)^H>=\sigma_n^2 1+\sigma_s^2 B$ where the $1^{st}$ term is the standard noise matrix and the $2^{nd}$ term the coil sensitivity error matrix. Experimental evidence (FIG. 31) suggests that ML SENSE provides substantial gains over conventional SENSE, especially in non-ideal imaging conditions like low SNR, high g-factors/acceleration factors and misaligned sensitivity maps.

C. Noise Reduced Bayesian Parallel Imaging Using Edge-Preserving Priors and Graph Cuts for MRI (EPIGRAM)

Existing regularization methods for parallel imaging are limited by a fundamental tradeoff that noise suppression introduces aliasing artifacts. Bayesian methods with an appropriately chosen image prior offer a promising alternative; however, previous methods with spatial priors assume that intensities vary smoothly over the entire image, and therefore blur edges. We introduce an edge-preserving prior that instead assumes that intensities are piecewise smooth and still allows efficient computation of its Bayesian estimate. The image reconstruction is formulated as an optimization problem, $$x = \arg\min_x (\|y - Ex\|^2 + L(x)), \quad \text{(Equation 9-3)}$$

where L is a cost function associated with an image prior. This is a non-convex objective function that traditional continuous minimization methods cannot be applied to easily. Discrete optimization methods based on graph cuts are utilized to address non-convex optimization problem. Results of several parallel imaging experiments on brain and torso regions show that the graph cut method with piecewise smooth priors (EPIGRAM) provides visually detectable reduction of noise and artifacts compared with regularized SENSE methods (FIG. 31). This EPIGRAM is useful in reducing noise effects in parallel imaging, and a jump move search algorithm can execute graph cuts rapidly (Nguyen et al., *Magn Reson Imaging*, 19: 951-957 (2001).

D. Motion Compensation

Automatic correction, real-time filtering, self navigating and highly efficient multiple volume navigating method are described herein.

1. Automatic Motion Correction Using Convex Projection

Figure 32A:
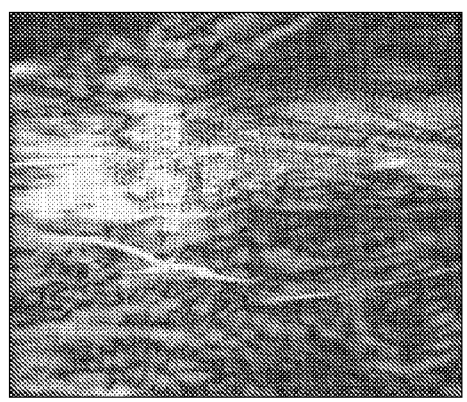
FIGS. 32 ($a$) and ($b$) show (a) the motion corrupted image and (b) the corresponding POCS corrected angiogram.
Figure 32B:
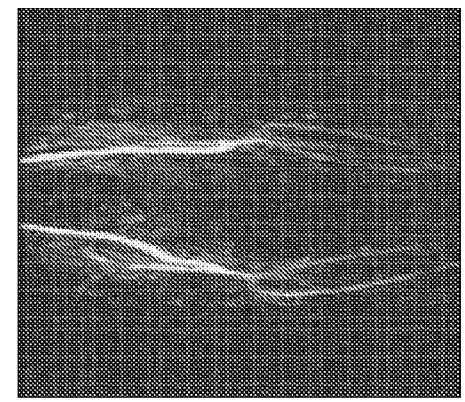

A method is used to remove motion artifacts in MRI by forcing data consistency. This is formulated as a projection onto a convex set (POCS) for time-resolved contrast enhanced MRA, which may suffer from involuntary view-to-view patient motion. It is noted that while MR signal change associated with motion is large in magnitude and has smooth phase variation in k-phase, signal change associated with vascular enhancement is small in magnitude and has rapid phase variation in k-space. Based upon this observation, a novel POCS algorithm is developed as an automatic iterative method to remove motion artifacts using high pass phase filtering and convex projections in both k-space and image space. Without input of detailed motion knowledge, motion effects are filtered out, while vasculature information is preserved (FIG. 32). The proposed method can be effective for a large class of non-rigid motions, including through-plane motion. The algorithm is stable and converges quickly, usually within five iterations. A double-blind evaluation on a set of clinical MRA cases shows that a completely unsupervised version of the algorithm produces significantly better rank scores (p=0.038) when compared to angiograms produced manually by an experienced radiologist.

2. Real-Time Motion Detection Using the Kalman Filter

Figure 33:
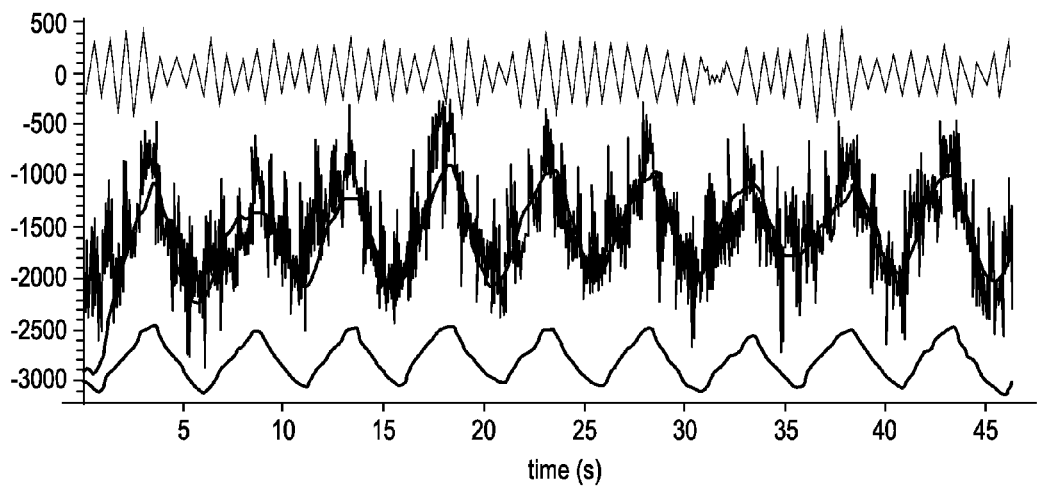
FIG. 33 shows the Kalman filtering of waveform generating both the respiratory component and the cardiac component in real-time, where the diaphragm waveform is shown for reference (correlation $r^2=0.92$)

Navigator echoes are used in high resolution cardiac MRI for tracking physiological motion to suppress motion blurring artifacts. The cardiac fat navigator and the signal from image k-space center (self-navigator) were developed to monitor heart motion directly. These navigator data can be noisy or mixed with different frequency components. Real-time filtering of navigator data without delay, as opposed to the previously used retrospective frequency band filtering for which the response delay is inherent, is required for effective prospective direct cardiac navigator gating. One of the commonly used real-time filtering techniques is the Kalman filter (Kalman R E, *Transactions of the ASME Journal of Basic Engineering*, 1960; 82:35-45, *IEEE Transactions on Automatic Control*, Special Issue on Applications of Kalman Filterign, 1983, which adaptively estimates motion waveform and suppresses noise from measurements using Bayesian statistics and a motion model. It was found that the Kalman filter can improve SNR in motion extraction from navigator records and can separate in real-time respiratory and cardiac components of motion in self-navigators (FIG. 33).

3. Improved Self Navigation Using z Intensity-Weighted Position (ZIP)

Figure 34:
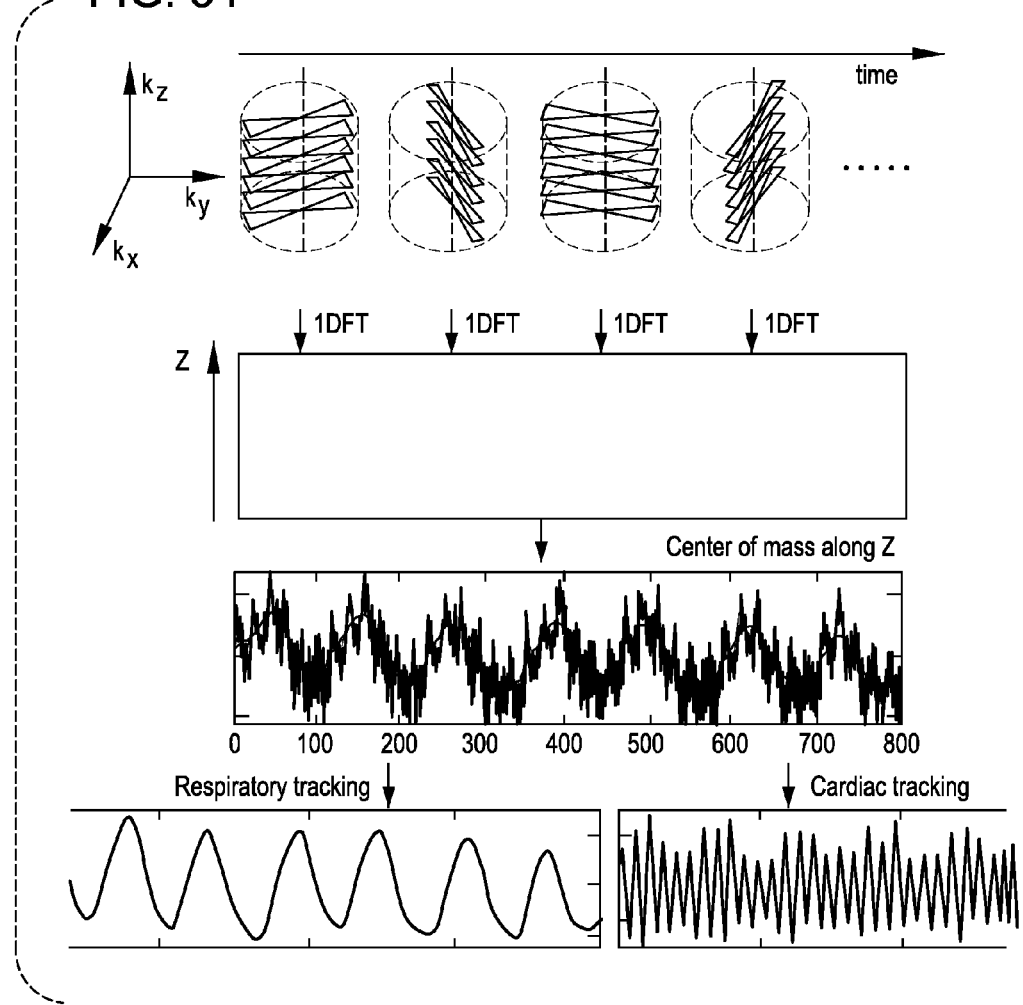
FIG. 34 shows the respiratory and cardiac self navigation in radial 3D cine imaging.

Recently, k-space center signals (KC) have been actively used as for the suppression of motion artifacts in cardiac and abdominal imaging while continuously acquiring image data (Larson, A C., *Proceedings* $11^{th}$ *Scientific Meeting*, International Society for Magnetic Resonance in Medicine, Toronto, 2003; 379; Larson, A C., *Magn Reson Med*, 2005; 53:159-168; Brau, A C., Generalized Self-Navigated Motion Detection Technique,: *Preliminary Investigation*. The KC is the signal sum of the whole image volume, which varies with in-slice global and local motion, slice position and orientation. These KC variations with imaging parameters were observed in experimental data when we compared KCs with direct motion measurements using navigator echoes. Consequently, the KC sensitivity to the respiratory motion of the heart may be decreased for certain locations or be inconsistent among slices, leading to residual image motion artifacts and slice misregistration within the 2D slice stack. We have developed a free-breathing 3D technique that uses the z intensity-weighted position (ZIP) or the center of mass of a projection along the slice direction for respiratory and cardiac gating signal. An example of this ZIP self gating is illustrated in FIG. 34 for 3D radial cine imaging. Preliminary data using the cardiac cine SSFP sequence demonstrated that this ZIP gating method provided superior respiratory motion artifact suppression when compared to the KC gating (FIG. 35).

4. SMV Algorithm

Figure 46A:
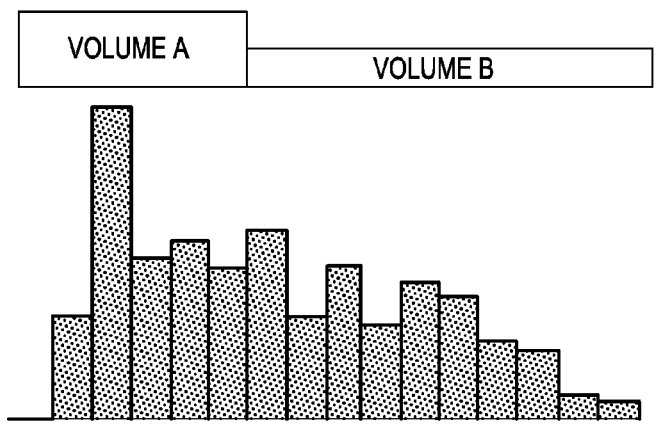
FIGS. 46 (a)-(c) show the histogram of the diaphragm motion acquired on a subject and corresponding 2-volume SMV acquisition scheme including (b) the volume A (LM, LAD) and (c) the volume B (RCA)
Figure 46B:
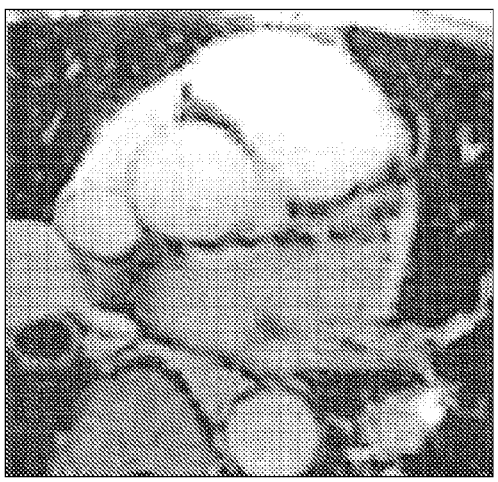
Figure 46C:
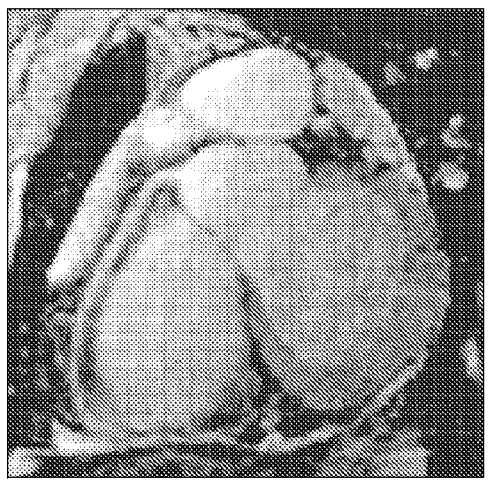

The final image reconstructions for all navigator techniques use only data acquired when the position of the imaged object is within one single gating window. Effective motion suppression requires a narrow gating window, leading to a long scan time. To improve navigator efficiency, we invented the simultaneous multiple volume (SMV) method Kolmogorov, V N., *Magn Reson Imagining*, 2003; 21:696-975) that uses multiple gating windows to simultaneously acquire different volumes at different positions while maintaining the same motion tolerance for all volumes. In 2-volume SMV, as the first large volume is being acquired at end of expiration (FIG. 46A) and a second smaller volume is acquired simultaneously at end of inspiration. For a general n-volume SMV, n volumes with their sizes proportional to the histogram height are acquired simultaneously, and the navigator gating efficiency approaches 100%. Different volumes may be registered through motion correction and each volume can be acquired using the efficient PAWS algorithm (Jhooti, P., *Magn Reson Med*, 2000; 43:470-480). As a feasibility test, we implemented the 2-volume SMV algorithm for navigator SSFP 3D coronary MRA. An axial volume (volume A, 20 slices) was used to cover the LM and the LAD, and a double-oblique volume (volume B, 10 slices) to cover the RCA and LCx. The 2-volume SMV was compared to sequential acquisitions. The scan efficiency was increased by 28%. There were no cross talk artifacts between the two overlapping volumes (FIGS. 46B and C).

5. ECG Ordered k-Space Sampling

Figure 47A:
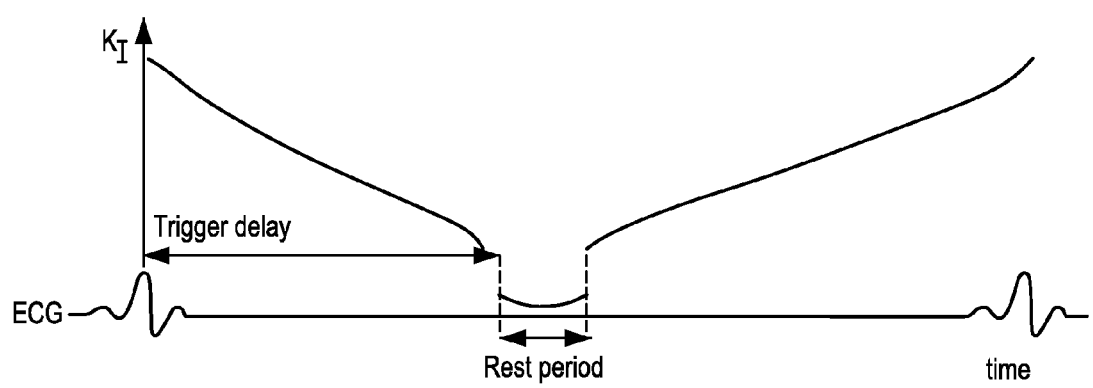
FIGS. 47 (a)-(c) show (a) the schematics of an ECG view ordering, (b) the chest MRA image without the ECG view ordering and (c) the chest MRA image with the ECG view ordering.
Figure 47B:
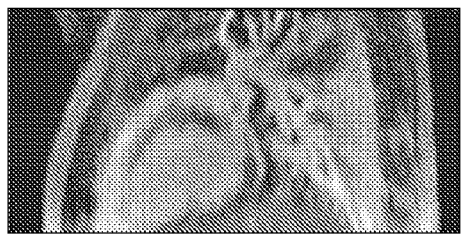
Figure 47C:

Vascular pulsation and cardiac motion compromise image quality in contrast enhanced MRA in the thorax, resulting in blurring and ghosting artifacts. The use of ECG gating to mitigate these artifacts significantly increases scan time because only a fraction of the cardiac cycle was used for image acquisition. We have developed a robust ECG ordering of k-space (FIG. 47A) that acquires the central part of k-space during motion-free mid-diastole and fills in the periphery of k-space at all other times, significantly reducing cardiac blurring (FIGS. 47 B and C).

IV. Experiments Using Targeted Contrast Agents

Two major experiments using targeted contrast agents are described in this section.

Figure 48A:
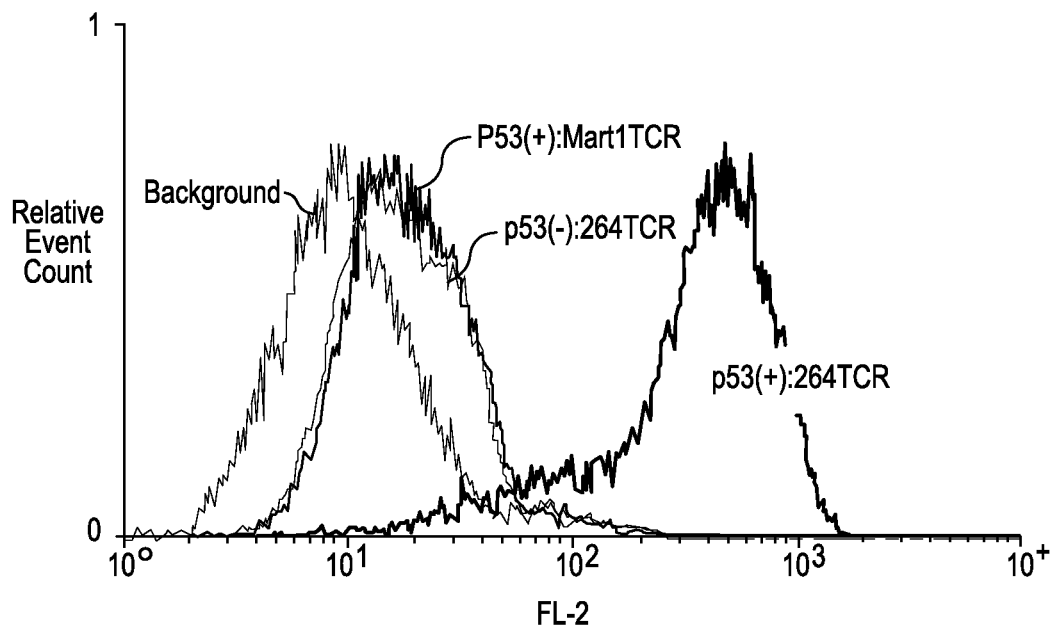
FIG. 48 (a) shows the results from flow cytometry FL-2 indicate 100-200 time greater fluorescent staining with 264scTCR-PE multimeters against p53-loaded T2 cells (p53 (+):264TCR), compared to unpulsed unstained cells (Background) and negative controls: unpulsed T2 cells stained with the multimers (p53(−):264TCR) and p53-loaded T2 cells stained with non-specific MarT1TCR-PE multimers (p53(+): MarT1TCR)
Figure 48B:
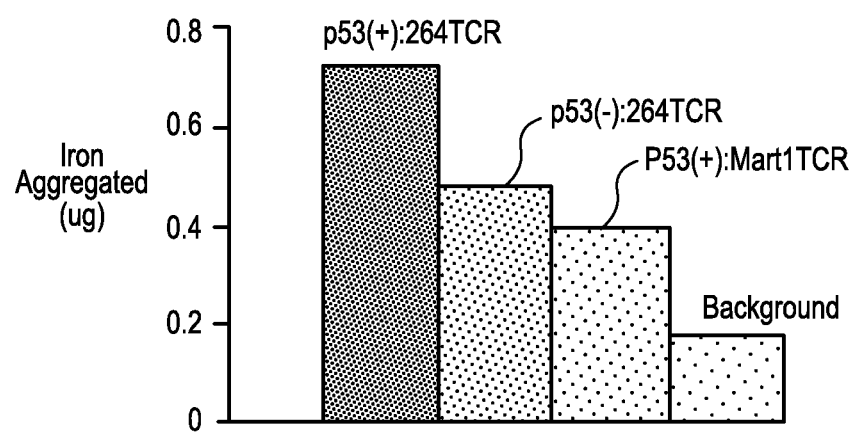

An anti-p53-SPIO nanoparticle was created by conjugating a soluble single-chain TCR-based fusion protein (264scTCR), wherein the TCR portion recognizes a wild type human p53 peptide (aa 264-272) presented in the context of HLA-A2.1, and a streptavidin-coated SPIO 50 nm in diameter (SPIO50, Ocean Nanotech, Inc). Functionality and specificity of the 264scTCR were characterized using flow cytometry; HLA-A2.1-positive T2 lymophoblast hybrid cells were pulsed with p53 peptides at varying concentrations, stained with PE-conjugated 264scTCR-multimeters, and evaluated with a minimum 10,000 events. P53-loaded T2 cells stained with 264scTCR-PE multimers (p53$^{(+)}$:264TCR) exhibited 100 to 200 greater fluorescent staining compared to various controls (FIG. 48A). Degree of 264scTCR-SPIO50 conjugation was characterized using ELISA; BF1-antibody-coated plates were used to capture magnetically-urified 264scTCR-SPIO50 conjugates, developed using W4F-antibody-capturing and streptavidin-conjugated HRP, and evaluated at 405 nm. Results indicate that only 264scTCR-SPIO50 conjugates are successfully captured by the plate and demonstrate successful conjugation as well as the effectiveness of the purification process at removing unconjugated 264scTCR. Preliminary MRI results demonstrate aggregation and retention of 264scTCR-SPIO50 conjugates according to p53 specificity; successfully conjugated 264scTCR-SPIO50 particles were purified using a magnetic cell-separation column, incubated with T2 cells pulsed with p53 peptide, and imaged with a multi gradient echo sequence. Iron amount was quantified using COSMOS, indicating significantly greater iron aggregation in p53-loaded T2 cells treated with 264scTCR-SPIO50 (p53$^{(+)}$:264scTCR) when compared to various controls (FIG. 48B)

SPIO micelles conjugated with proteins through NTA-His interaction was developed as a tumor-targeting contrast agent system aiming for high biocompatibility, affidity and stability. 2.5 mg of the $Fe_3O_4$ nanoparticles was resuspended in 1 mL chloroform with 1 mg of 1,2-dipamitoyl-sn-glycero-3-phosphoethanolamine-N-[methoxy(polyethylene glycol)-2000] (mPEG-200 PE), 1.5 mg 1,2-dipamitoyl-glycero-3-phosphocholine (DPPC) and 2.5 ug 1,2-Dioleoyl-sn-Glycero-3-{[N(5-Amino-1-Carboxypentyl)iminodiAcetic Acid]Succinyl} Nickel Salt (DOGS-NTA-Ni) (Avanti Polar Lipids, Inc). After complete evaporation of the chloroform under nitrogen, the residue was desiccated for 3 hours and 1 mL of water was added to obtain an optically clear suspension containing NTA functionalized SPIO micelles. Micelles that encapsulated more than SPIO particles were filtered out by a 0.45 um filter. Then SPIO micelles were loaded to a magnetic affinity cell sorter (MACS) column, and empty micelles were washed out. The conjugation of the NTA-SPIO micelles was tested by mixing NTA-SPIO micelles with excessive amount of green fluorescent protein (GFP) fused with 6×His tag. The mixture was loaded to a MACS column and the unbound GFP was washed out. The bound GFP was eluted by 250 mM imidazole solution and the total amount of the bound GFP was characterized by fluorescence emission. We found 80 μg of these NTA-SPIO micelles can be coated with about 10 μg of GFP protein.

V. Developing the Data Acquisition Method for Whole Mouse Imaging

In the method for quantifying targeted contrast agents in molecular MRI, the standard mouse model is used. MRI experiments are performed on a 7T 20 cm bore Bruker animal scanner using an 8-channel surface coil.

As a first step to develop quantitative susceptibility imaging (QSI) into a whole mouse molecular MRI tool, we address in vivo mouse imaging issues including optimization of magnetic field mapping, cardiac and respiratory motion artifacts, and increasing scan speed.

A. Optimizing Echo Spacing in Multiple Echo Sequence for Field Mapping

Field map estimation is vital to susceptibility reconstruction accuracy, and a simple constant echo spacing was used in the multiple echo sequence in a preliminary study.

B. Removal of Residual Edge Fields of the Mouse.

Figure 21C:
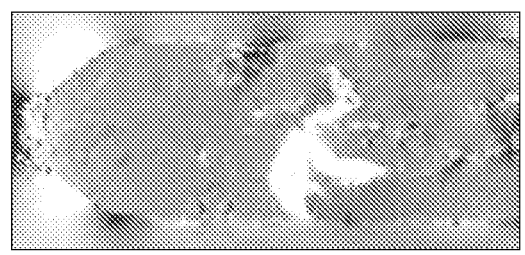

In the study on quantitative susceptibility imaging, a lower order polynomial fitting was used to remove background field effects in the local field map. For whole mouse imaging, the fields due to mouse edges such as the superior brain tip may cause distracting residual artifacts (FIG. 21). The use of a padding material is investigated with a susceptibility matching that of mouse tissue to reduce these mouse edge fields. The use of the Maxwell equations to remove this residual field is also investigated according to the mouse geometry. A simple model for mouse susceptibility can be used. The residual field can be calculated rapidly as a surface integral like the geometry factor in our piecewise constant model in our preliminary study.

C. Field Map Estimation by Maximum-Likelihood and Optimal Sampling Time Points

Figure 49:
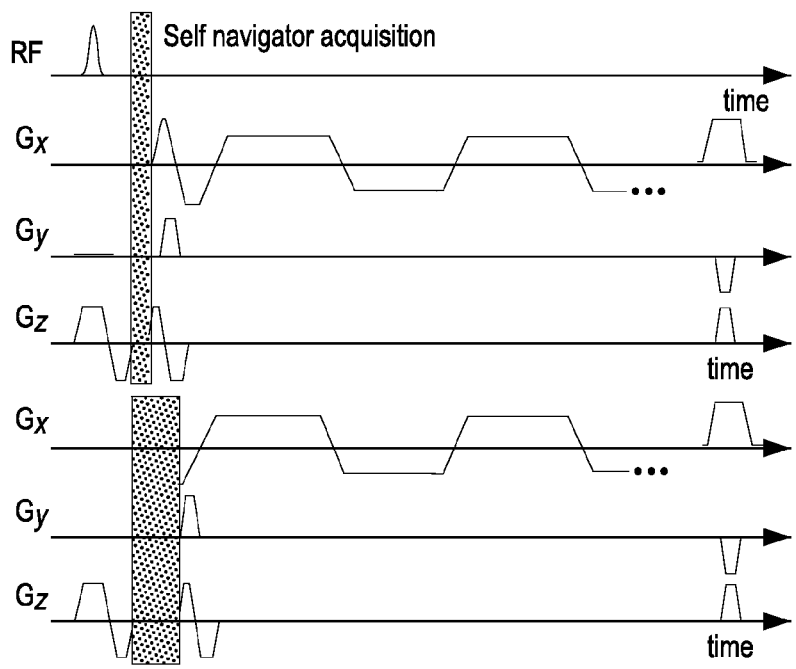
FIGS. 49 (a) and (b) depict the self-navigator acquisition added to the multi-echo pulse sequence to monitor cardiac and respiratory motion including (a) the k-space center and (b) the k-line projection acquisition.

It is well-known that in conventional two-echo field map estimation, selecting the echo time difference involves a trade-off. If the echo time difference is too large, the dynamic range is limited; if the echo time difference is too small, the error on the estimated field map will increase. The optimal choice of echo times and number of echoes can be identified from the signal model: $s(t)=s_0 e^{i\omega t} e^{-R_2^* t}+\epsilon$, where $s_0$ denotes the complex transverse magnetization, $R_2^*$ is the transverse relaxation rate and $\epsilon$ is the known complex independent identically distributed Gaussian noise. A maximum-likelihood (ML) field map estimator is used to solve for the field (frequency $\omega$). In estimation theory and statistics, the Cramér-Rao Bound (CRB), which can be computed numerically, provides the minimal achievable variance for any unbiased ML estimators. Close analytical expression exists for three echoes (Funai et al., *IEEE Trans Med Imaging* 2008; 27:1484-1494). In this case, $TE_1$ and $TE_2$ are chosen for maximal SNR as allowed by receiver bandwidth and frequency encoding. Then the optimization problem is reduced to one variable of determining $TE_3$ from CRB minimization. For a given tissue $R_2^*$, the optimal $TE_3$ can be identified from the beginning of the flat bottom of the CRB curve (FIG. 49). Then the optimized sequence repetition time TR can be determined from $TE_3$. The time interval between the second and third echoes can be used to acquire additional echoes for higher SNR.

D. Cardiac and Respiratory Motion Monitoring

Conventionally, the ECG signal can be recorded using electrodes on mouse paws with paste, tapes or needles, and respiratory signal can be monitored using a pneumatic pillow or filtering of the ECG signal. This kind of ECG signal can be contaminated by rapidly switching imaging gradients and RF pulses that induce electromotive forces on the body and electrodes and by blood flow in the polarization field B0 that generates the magneto-hydrodynamic effect. This problem becomes more severe at high fields. Recently, it was reported that the self-navigator (k-space center signal) is very effective in monitoring the composite cardiac and respiratory motion. Our analysis on human imaging indicates that the self-navigator from a larger volume provides better motion monitoring than that from a smaller volume. For whole body mouse imaging, the self-navigator may be well suited for respiratory and cardiac motion monitoring.

Figure 39:
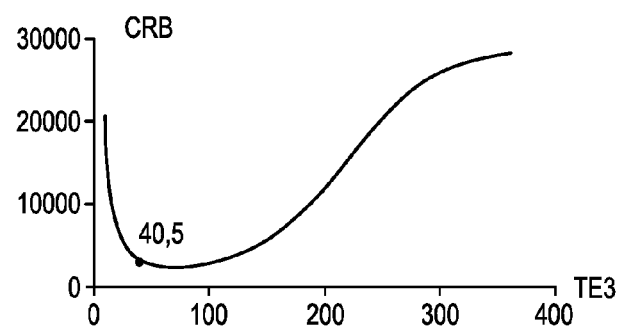
FIG. 39 depicts the Cramer-Rao bound (CRB)

Accordingly we propose using this self-navigator approach for whole mouse imaging. The multi-echo sequence is modified to acquire the self-navigator as illustrated in FIG. 39. The k-space center signal from the whole mouse (FIG. 39) may not be as sensitive as that from a volume localized on the thorax or abdomen. Signal from an anterior coil element sensitizing the heart and abdomen may be used as self navigator signal. An alternative approach is to use spatially resolved navigator along the cranial-caudal longitudinal direction, which will allow selective tracking of the thorax and abdomen motion as in a standard pencil beam diaphragm navigator. This longitudinal resolution can be achieved by acquiring $k_z$-encoded data during the readout preparation (FIG. 49).

1. Single Volume Method

Figure 50:
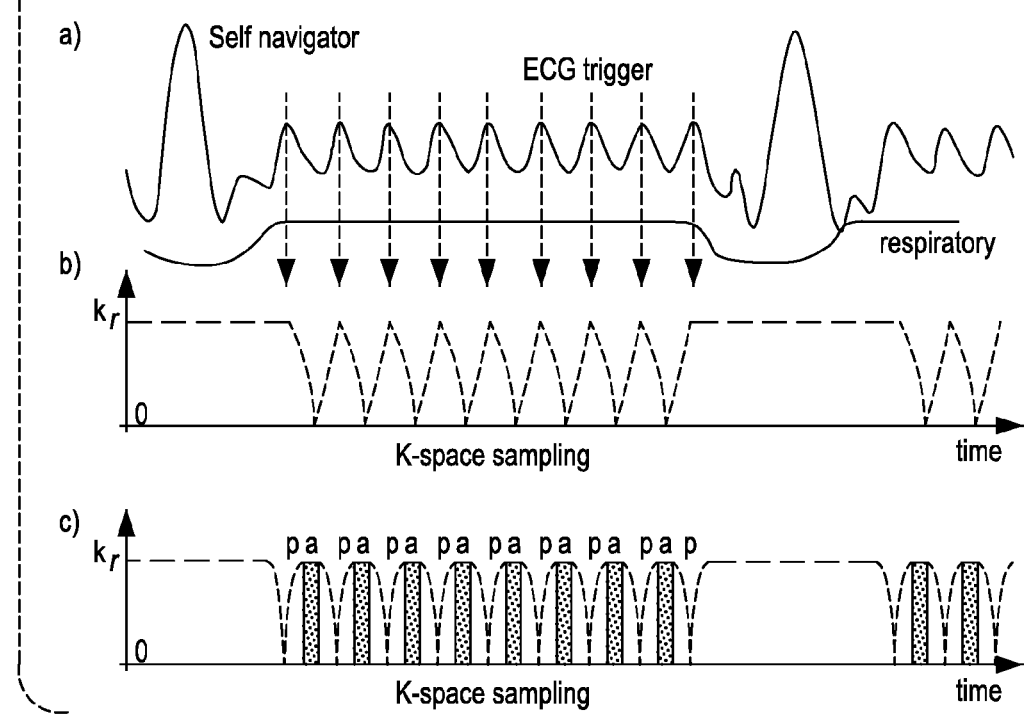
FIGS. 50 (a)-(c) depict the schematic diagrams for motion triggered data sampling including (a) the motion waveform of the self navigator decomposed into a cardiac waveform for ECG trigger detection and a respiratory waveform for respiratory gating, (b) the single volume acquisition method using ECG guided view ordering, and (c) the two-volume acquisition method with the anterior volume "a" acquired during mid diastole and the posterior volume "p" acquired during the rest of the cardiac cycle.

Mice under anesthesia have a respiratory cycle on the order of 1000 msec, and have a pattern of rapid inhalation followed by slow relaxation. The respiratory motion is small during the slow relaxation phase in the respiratory cycle, allowing data acquisition with little respiratory motion artifacts. A motion waveform from self-navigator is illustrated in FIG. 50. Approximately 70% of the respiratory cycle is slow relaxation (Hiba, B., *Magn Reson Med*, 2007; 58:745-753), which can be used to acquire data. We use the whole cardiac cycle for data acquisition and using ECG guided view ordering to minimize cardiac motion artifacts. Because whole mouse (3×3×9 $cm^3$ volume) imaging should set the frequency readout direction (with unlimited FOV) to the longitudinal axis of the mouse to reduce scan time, we propose the following two data acquisition strategies: single coronal volume and two coronal volume methods.

The single volume acquisition method is illustrated in FIG. 50*b* where the ECG guided view ordering is used to sample data. As we have demonstrated in human imaging, this ECG view ordering can reduce cardiac motion artifacts in the thoracic region. The ECG trigger is detected from the self-navigator motion wave form (FIG. 50*a*). The real time Kalman filter that we have developed for human imaging is also used here to extract cardiac and respiratory waveforms. The ECG trigger is detected from the cardiac waveform. The respiratory waveform is used to gate data acquisition in an accept/reject manner while the sequence is played out continuously.

To identify the delay between mid diastole and the detected ECG trigger, a motion prescan is performed in the following manner. The self-navigator sequence in FIG. 50 is modified into a 2D single echo sequence with phase encode incrementing at each ECG trigger. This 2D cine acquisition and the 3D self-navigator acquisition is interleaved to acquire both a self-navigator record and a cine cardiac MRI movie of an axial cardiac slice. The cardiac movie allows identification of minimal motion period (mid diastole) in the cardiac cycle, which is then correlated to the self-navigator waveform for estimating the trigger delay.

2. Two Volume Method

A possible limitation of this single volume method is that detailed cardiac structure may still be blurred using this approach. This problem is addressed in the following way. It is known that the mouse heart is located in the anterior portion of the thoracic trunk, which can be captured in a small coronal volume. This small coronal volume can be acquired in mid diastole, and the remaining posterior body part can be captured in a large coronal volume and be acquired during the rest of the cardiac cycle. The posterior volume overlaps with the anterior volume, capturing a portion of the heart. This two volume method is illustrated in FIG. 50*c*. The self-navigators from both volumes will be recalibrated for ECG trigger detection and respiratory gating by comparing with the self-navigator from the whole mouse, all acquired in an interleaved manner, and with conventional ECG and respiratory signals. The anterior volume of the heart is now acquired at mid diastole with much reduced cardiac motion artifacts compared to the single volume method in FIG. 50*b*.

Again, the ECG view ordering can be used to further minimize residual cardiac motion artifacts, as we have demonstrated in human coronary imaging. Cardiac structures with high resolution are resolved. To minimize cross-talk between the two volumes, data sampling immediately after the switch (at the beginning of each volume) starts at the edge of k-space, where deviation from spin equilibrium causes minimal artifacts. This two volume method is an application of the simultaneous multiple volume (SMV) algorithm that we have developed for human cardiothoracic imaging. The mid diastole duration may be selected such that its percentage in the cardiac cycle is the ratio of the anterior volume over the whole mouse volume (sum of anterior and posterior volume). In this manner, both anterior and posterior volumes are completed at approximately the same time, and the total scan time will be the same as the single volume method. Though the two volume approach has some SNR reduction compared to the single volume method, the cardiac motion blurring reduction with no extra time cost will make this two volume method valuable for whole mouse imaging.

3. Experiments

Both the self-navigator (as in FIG. 50) and the conventional ECG and respiratory signals are used for an anterior coronal volume (heart+abdomen) imaging. The highest image quality will be used to identify the best cardiac and respiratory motion signal (n=10, Wilcoxon).

Using the optimal motion signal (we expect that to be a self-navigator), the single volume approach is compared wth the two volume approach for whole mouse imaging. Then, the mice is euthanized and fixed and MRI will be repeated immediately on the mice for reference (n=10, Wilcoxon). Scan time, SNR, myocardial sharpness and image quality is measured to identify the better approach.

(a) Accelerate Data Acquisition Using Parallel Imaging

To shorten total scan time or to increase resolution and/or volume coverage, parallel imaging based on multi-channel coil is used for signal reception and the use of accelerated sampling trajectories among images of different echo times.

(b) Parallel Imaging

Figure 42:
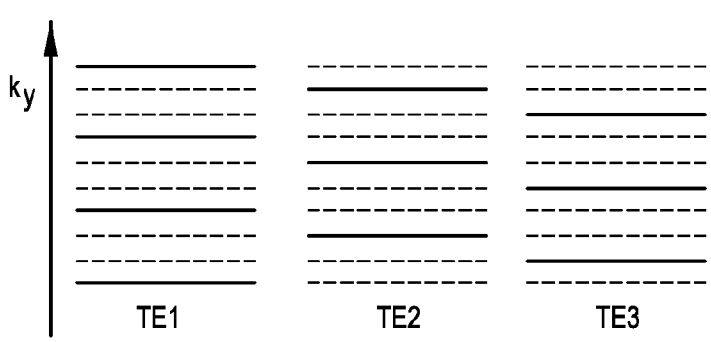
FIG. 42 depicts the echo parallel imaging for 3 echoes and reduction factor R=3 where solid lines indicate acquired views.

Multiple echoes per TR is obtained to acquire different phase encodings from echo to echo within the same TR, similar to TSENSE (Kellman P., *Magn Reson Med,* 2001; 45:846-852) and TGRAPPA (Breuer, F A, *Magn Reson Med,* 2005; 53:981-985) (FIG. 42). By combining the data from all echoes, a fully encoded reference scan can be obtained as automatic calibration for a GRAPPA reconstruction of complex images for each coil (Griswold, M A, *Generalized Autocalibrating Partially Parallel*). To keep the flow-compensating property of the pulse sequence, each readout will now be surrounded by its own set of flow-compensated phase encoding and rewinding gradients.

4. Experiments

The mouse phantom are imaged using the accurate image-based regularization method (Equation 14) for susceptibility mapping. The image data set is undersampled and then reconstructed using the proposed GRAPPA method for various reduction factors (e.g., 2, 3 for 3 echo acquisition). Iron mapping accuracy and image quality (for susceptibility maps and T2* images) is assessed for the GRAPPA method.

The accelerated sequences are used for imaging in mice (n=10, Wilcoxon) to assess the in vivo imaging quality.

VI. A Robust Regularization Solution for Accurate Estimation of Biomarker Magnetization As described above, the susceptibility reconstruction can be achieved by improving the condition of the inverse problem or by regularizing the solution with prior knowledge. The conditioning approach using multiple subject orientations was accurate for susceptibility imaging, but there are difficulties in rotating human in the scanner, and it requires a long scan time. The regularization approach has great potential for a wide range of human imaging. It does not require reorienting the subject in the magnet, making it applicable to general human imaging in a standard closed magnet. The image-based regularization approach is accurate for susceptibility estimation and hence it is particularly promising for general clinical application. Described herein are regularization methods for susceptibility imaging including improvement of regularization term to achieve both high accuracy and image quality and to increase computational speed. Various reasonable regularization terms are described for a robust, accurate and fast susceptibility mapping.

A. Improve the Sparsity Calculation for a Priori Knowledge Regularization

As described above, L1 norm regularization is a reasonable formulation for sparsity in susceptibility images. The solver for L1 norm is usually computationally slow and that the regression slope between estimated susceptibilities and known susceptibilities deviates from unity. The cause of these issues is inadequate sparsity regularization. We propose to following sparsity formulations for better solving the inverse problem using regularizations.

1. Wavelet Regularization.

An efficient alternative to regularization formulation in our preliminary data (Equations 11 and 14) is the wavelet-based regularization. Wavelet encoding has been developed for MRI (Panych, L P., *Magn Reson Imaging,* 1993; 3:649-655, Weaver, J B., *Magn Reson Med,* 1992; 24:275-287). The ability of the wavelet transform to concentrate the essential information on a few coefficients is one of the key reasons for its popularity in medical imaging processing (Laine, A F., *Annu Rev Biomed Eng,* 2000; 2:511-550). Sparsity of the wavelet representation may be a more realistic assumption than sparsity in the spatial domain. Accordingly, we rewrite the formulations for the inverse problem. For example, Equation 11 becomes, $$\chi(r) = \mathrm{argmin}_{\chi(r)}[\lambda\Sigma_r|w(r)\mathcal{W}^c(\delta_b(r)-d(r)\otimes\chi(r))|^2 + R[\mathcal{W}^c\chi(r)]], \quad \text{(Equation 7-1)}$$

where $\mathcal{W}^c$ is the wavelet transform and w(r) are the weights. An important advantage of the wavelet formulation (Equation 7-1) is the availability of efficient computational techniques (Osborne, M R., *IMA J. Numerical Analysis,* 2000; 20:5, Daubechies, I., *Communications on Pure and Applied Mathematics,* 2004; 57:45). The iterative soft thresholding approach optimizes (Equation 7-1) through an iterative update formula that involves just one (fast) wavelet decomposition-reconstruction per iteration. Various methods can be used to compute an approximate sparser solution to (Equation 7-1) for better and faster reconstruction of susceptibility images.

2. Efficient $L_{1.1}$ Norm

The $L_1$ norm as described above is difficult to use well known gradient descent optimization techniques for efficient reconstruction. If the p in the $L_p$ norm is slightly larger than 1, $L_p$ still closely approximates $L_1$ but becomes strictly convex and differentiable and can be solved efficiently using gradient descent methods (Nayakkankuppam, M., http://www.siam.org/meetings/la03/proceedings/nayakkan.pdf, 2003) This differentiability eliminates the need to perform outer iterations to improve the log-barrier in $L_1$, achieving an expected speed up on the order of 10 times compared to the $L_1$ optimization problem. We propose using p=1.1 and construct an iterative algorithm for susceptibility image reconstruction using the dual coordinate ascent method.

3. $L_0$ Norm.

$L_0$ norm (number of nonzero voxels) minimization is a better sparsity formulation than the $L_1$ norm. Indeed, the $L_1$ norm promotes sparsity because it is a convex approximation to the $L_0$ norm. Minimizing the $L_0$ norm directly is an NP (nondeterministic polynomial) hard problem known for lack of efficient algorithms. Recently, approximate techniques have been developed to minimize the $L_0$ norm efficiently. The cross entropy method (Trzasko, J., *IEEE/SP* $14^{th}$ *Workshop on Statistical Signal Processing,* Madison, Wis., 2007; 176-180; Trasko, J., *Med Image Comput Comput Assist Interv Int Conf Med Image Comput Assist Interv,* 2007; 10:809-816) and homotopy continuation based methods (Boyd, supra) can be used for $L_0$ norm minimization in susceptibility regularization.

$L_0$ norm is defined as $|x|_0 = \Sigma 1(x\neq 0)$ and it can be approximated by a function with a parameter tuned close to zero homotopically, i.e. $\lim_{\sigma \to 0} \Sigma\rho(|x|,\sigma) \approx |x|_0$. Functions such as $\rho(|x|,\sigma)=\log(|x|/\sigma+1)$ or $\rho(|x|,\sigma)=1-e^{-|x|/\sigma}$ can be used for the homotopic approximation of $L_0$-norm. The homotopic programming is to update the approximation function $\rho(|x|,\sigma)$ and reduce the parameter σ by a factor (less than 1) from an initial value (for example 1 or 0.5). The forward problem (Equation 7) can be noted in matrix form as $\delta=D\chi$, with the dipole kernel forming elements for the matrix D. The homotopic $L_0$-norm regularization problem can then be formulated as:

$$\mathrm{min}_\chi E(\chi,\sigma,\lambda) = \lambda|D\chi-\delta|_2^2 + \Sigma\rho(|G\chi|,\sigma). \quad \text{(Equation 7-2)}$$

Here G is an operator such as gradient that promotes edge sparsity, and the expression in (Equation 7-2) can be easily extended to include a weighting factor on the fidelity term. The derivative of E(χ, σ, λ) is $$\Delta E = L(\chi,\sigma,\lambda) = 2D^H(D\chi-\delta) + \lambda G^H \Lambda(\chi,\sigma) G\chi, \quad \text{(Equation 7-3)}$$

where $(\cdot)^H$ denotes conjugate transpose and $\Lambda(\chi, \sigma)$ is a diagonal matrix, whose components are calculated as $\rho'(|G\chi|, \sigma)/|G\chi|$. A weak derivative is used here, e.g., $\rho(|x|)=|x|$, $\rho'(|x|)=\text{sign}(x)$ (Trzasko, J., supra, Trzasko, J. *IEEE Trans Med Imaging*, 2009; 28:106-121) Then the solution of $\Delta E=0$ is the solution to the minimization problem with given regularization parameter $\lambda$, which is $$(2D^H D + \lambda G^H \Lambda(\chi,\sigma) G)\chi = 2D^H \delta. \quad \text{(Equation 7-4)}$$

The above problem can be solved with the conjugate gradient method. The tuning parameter $\sigma$ is reduced by a factor ($<1$) during iterations. If $\rho(|x|)=|x|$, $L_0$ problem can be generalized to $L_1$ problem and it is more efficient than the $L_1$ problem solved using log-barrier method. If $\rho(|x|)=|x|_2^2$, the problem becomes an $L_2$ problem.

4. Improving Computation Speed with Parallelization or Graphics Cards.

The regularized optimization problem can be reduced to a semi-definite program that can be parallelized (Hansen, M S., *Magn Reson Med* 2008; 59:463-468). A high-performance computer cluster can be used to reduce reconstruction times to minutes or seconds, short enough for use in practice. The major computation that must be performed is computing Fourier transforms of large data sets. Recently, general purpose computing environments have been developed for graphics cards, providing tremendous speed-ups for computing Fourier transforms, vector-vector multiplications, and other linear algebra computations (Hansen, supra). The optimization code can be generated for a graphics card that will result in tremendous savings in computation time at a low cost. For example, optimization code can be utilized on a graphics cards (NVIDIA Tesla Deskside GPU computing system) in a Dell T7400 workstation to measure achievable reconstruction time 5. Experiment The regularized reconstruction is implemented using the wavelet, efficient $L_{1.1}$ and $L_0$ norm for susceptibility imaging of the mouse phantom. An optimized regularization is identified to provide a regression slope with known susceptibilities close to unity, good image quality, and rapid reconstruction time by comparing with current $L_1$ norm.

The susceptibility reconstruction methods investigated in the above can be tested on a group of mice (n=10, Wilcoxon) with SPIO injected in their brains and lean thigh muscles (after a fat prescan).

B. Anatomical Prior Based Reconstruction of Susceptibility Images

The $L_p$ norm regularization does not account for anatomical information available from magnitude images. Because there is obvious correlation between susceptibility images and T2* weighted magnitude images, this correlation may be used to improve the regularization.

1. Anatomical Region Segmentation and Edge Regularization

The anatomical information from the magnitude image is utilized in the piecewise constant model in our preliminary study to convert the ill-posed inverse problem into an over-determined problem for robust susceptibility estimation (Equation 12). Both intensity values and intensity gradients can be used to segment regions in the mouse to form regions of similar susceptibilities. This would allow estimation of average susceptibility or total amount of magnetic markers in a region. However, detailed image segmentation using many regions may become tedious in practice.

A more reasonable assumption is that edges in the T2* weighted magnitude image are at the same location as those in the susceptibility image. Accordingly, the regularization term can be formulated as the $L_p$ distance between the susceptibility edge image and the T2* weighted image edge. (As in $L_p$ regularization formulation described above p=0, 1, and 1.1 will be investigated for identifying an effective regularization.) This would be a more realistic regularization than simply forcing edges to be sparse, and a fast convergence would be achieved using the iterative solver. Two possible ways to express the similarity are, $$\chi(r) = \text{argmin}_{\chi(r)}[\Sigma_r |w(r)(\delta_b(r) - d(r) \otimes \chi(r))|^2 + \alpha \| (g[\chi(r)]/\chi_m)(I_m/g[I(r)]) \|_p], \quad \text{(Equation 7-5a)}$$

$$\chi(r) = \text{argmin}_{\chi(r)}[\Sigma_r |w(r)(\delta_b(r) - d(r) \otimes \chi(r))|^2 + \alpha \| g[\chi(r)]/\chi_m - g[I(r)]/I_m \|_p], \quad \text{(Equation 7-5b)}$$

where $g[I(r)]$ is the magnitude of the gradient vector of the magnitude image I at location r; $\chi_m$ and $I_m$ are the maximum (or median) of $\chi(r)$ and I(r) used for scaling. Here in Equation 7-5a, a filter is used to assign $1/g[I(r)]$ to a maximum when $g[I(r)]<$a threshold. It is also possible to include both magnitude and gradient information in the regularization teems, for example, $$\chi(r) = \text{argmin}_{\chi(r)}[\Sigma_r |w(r)(\delta_b(r) - d(r) \otimes \chi(r))|^2 + \alpha \| (\mathcal{S}[\chi(r)])\|_p \beta \|(g[\chi(r)]/g[I(r)])\|_p], \quad \text{(Equation 7-6a)}$$

$$\chi(r) = \text{argmin}_{\chi(r)}[\Sigma_r |w(r)(\delta_b(r) - d(r) \otimes \chi(r))|^2 + \alpha \| (\mathcal{S}[\chi(r)])\|_p \beta \| g[\chi(r)]/\chi_m - g[I(r)]/I_m \|_p], \quad \text{(Equation 7-6b)}$$

where $\mathcal{S}[\ ]$ is a segmentation operator as defined from the magnitude T2* image I(r). The preliminary feasibility test with a crude anatomical regularization in FIG. 45 showed the promise of accuracy susceptibility estimation. This anatomic regularization approach leads to an accurate robust inverse solution for susceptibility mapping.

2. Experiment

The anatomical region segmentation, the anatomical edge regularizations and other regularization terms are implemented and compared for quantitative susceptibility imaging of the mouse phantom. Image quality, susceptibility quantification accuracy and computation time are compared to identify the optimal regularization method.

The susceptibility reconstruction methods investigated in the above is tested on mice data discussed above. T2* imaging will be performed using the multiple gradient echo sequence developed and optimized as discussed above. T2*, SWI and susceptibility maps are described above will be compared for image quality.

C. Separate Chemical Shift Effects from Susceptibility Effects in Signal Phase Map Fatty tissue is inevitably encountered in whole body mice imaging, and chemical shift effects adds to the measured phase map. The fat off-resonance frequency $\sigma = 3.4$ ppm may overlap with the off-resonance frequency spectrum caused by magnetic markers and tissue susceptibilities. The major difference between chemical shift effects and susceptibility effects is in their spatial distribution characteristics. Chemical shift is localized within tissue fat, while susceptibility effects spread outside tissue. Accordingly, the chemical shift effects may be separated from susceptibility effects through spatial filtering. The mathematical nature of this spatial filtering to separate fat and water turns out to be quite challenging for molecular MRI where the field map is not smooth, as detailed in the following descriptions. The following methods for obtaining susceptibility field map $\delta_b(r)$ in the presence of chemical shift are described.

1. IDEAL-Type Joint Determination of Chemical Shift and Field Map.

The IDEAL (Iterative Decomposition of water and fat with Echo Asymmetry and Least-squares estimation) algorithm is used that jointly determines chemical shift and susceptibility field maps. The main assumption for IDEAL is that the field map is smooth, which enables separation between chemical shift of fat and inhomogeneous field through low pass filtering. The standard IDEAL algorithm searches for a field map that is close to zero or is fairly smooth. While this may work for certain clinical applications, the strong local fields of magnetic markers in molecular MRI may render a straightforward application of IDEAL ineffective. We propose extending IDEAL using the following Bayesian formulation and Markov Random Field prior to relax the requirement on smoothness. The signal at a given voxel can be modeled as $$s(\tau, w, f, \delta_b) = [w + f \exp(i 2\pi \tau \sigma)] \exp(i 2\pi \tau \delta_b), \quad \text{(Equation 7-7)}$$

where $\tau = \omega_0 TE$, w and f are the water and fat magnetization at the echo center. Maps of the three parameters water w, fat f and field map $\delta_b$ (in ppm) can be estimated by fitting the signal model to the measured multiple echo data at each voxel $m(\tau_i, r)$ using a maximum likelihood estimation under additive Gaussian noise: $\min \Sigma_i |m(\tau_i) - s(\tau_i, w, f, \delta_b))|^2$. This voxel based nonlinear least squares signal model fitting is determinate for 2-species voxels with both fat and water, but it is indeterminable for 1-species voxels containing only water or fat, because water with 3.4 ppm off-resonance is indistinguishable from fat in a single voxel. Accordingly, spatial regularization such as imposing smoothness is required to make the solution physically meaningful, and the voxel based minimization problem becomes a global minimization problem, $$(w(r), f(r), \delta_b(r)) = \mathrm{argmin}_{(w(r), f(r), \delta b(r))} [\Sigma_r \Sigma_i | m(\tau_i, r) - s(\tau_i, w(r), f(r), \delta_b(r)))|^2 + R[\delta_b(r)]] \quad \text{(Equation 7-8)}$$

A physically meaningful regularization R may be the piecewise smooth prior that was used in preliminary work on noise minimized parallel imaging reconstruction (EPIGRAM, Equation 1-3). A truncated linear potential is typically used to construct the piecewise smooth prior (Rai, A., *Magn Reson Med* in press): $R[\delta_b(r)] = \lambda \Sigma_{p,q} \min(|\delta_b(r_p) - \delta_b(r_p)|, V)$, where $\lambda$ is the regularization parameter that may be selected by the L-curve method, summation indices p, q are nearest neighbor voxel pairs in the image $\delta_b(r)$, and V is a truncation value typically set to one tenth of the intensity range. This piecewise smooth prior preserves edges or sharp transitions in the field map. Though this prior makes the minimization problem a non-convex optimization problem, it can still be solved efficiently using the graph cut method developed by our team at Cornell (Rai A., *Magn Reson Med*, 2007; 57:8-21, Kolmogorov, V., *IEEE Trans Pattern Anal Mach Intell*, 2004; 26:147-159). Once the susceptibility field map $\delta_b(r)$ is separated out from the measured field map, then the susceptibility image can be obtained through inversion are described above. The piecewise smooth prior in Equation 7-8 may still be inadequate for very small regions of magnetic markers.

2. Joint Determination of Fat Mask and Susceptibility Imaging by Iteratively Imposing Consistency An alternative approach is joint determination of fat mask and susceptibility imaging by iteratively imposing consistency. When the fat regions are segmented, this fat segmentation does not require many echoes. It can be automated algorithmically by jointly and iteratively determine the fat mask, the field map and susceptibility inversion. The fat mask (f(r)) may be initially estimated as voxels with 3.4 ppm off resonance frequency after background field removal using a polynomial fitting. Dots and thin lines that do not have nearest neighbors in all directions are removed from the initial fat mask using a connectivity search. Then this fat mask f(r) is put into the following chemical shift-field map-susceptibility equation to obtain an initial estimation of susceptibility using regularization R described above:

$$\chi(r) = \mathrm{argmin}_{\chi(r)} \Sigma_r |w(r) \cdot [\delta_b(r) - f(r) \sigma - d(r) \otimes \chi(r)]|^2 + \mathcal{R} \quad \text{(Equation 7-9)}$$

Then the fat mask is updated by removing the field associated with the estimated susceptibility from the measured field, in addition to removing background field. Again, isolated dots and thin lines are removed from the fat mask. This process repeats, making the fat mask more accurate in successive iterations. When the update difference is sufficiently small, the iteration converges to a desired solution, allowing simultaneous determination of fat mask and susceptibility imaging. Robust and fast solution to the minimization problem in (Equation 7-9) requires using the regularization techniques described above. The fat mask arising from the IDEAL type algorithm described above can also be used in Equation 7-3; if the fat mask is accurate, one iteration will be sufficient.

3. Experiments

The above ideas for removing fat effects from the measured field map can be further refined. The mouse phantom with known amount of fat added. Additional SPIO nanopaticles can be implanted in the fat and at the boundary between fat and tissue in the phantom.

The fat removal algorithms for susceptibility reconstruction can be tested on mice (n=10, Wilcoxon) with SPIO intravenously administrated. Additional SPIO can be implanted in the abdominal fatty tissues in the mouse (after a fat prescan) to ensure some SPIO presence within/bordering fat. Comparison among these three methods can identify an effective and efficient method for accurately calculating the field map in the presence of fat and reconstructing the susceptibility map.

4. Single Dipole Fitting for Quantifying Susceptibility Material Localized in a Very Small Region The approaches considered above may require fine-tuning for susceptibility material localized within a small region (~a voxel size). In this case, there may be substantial error in digitizing the region. Very high resolution may be needed to discretize the small region into several voxels for detailed susceptibility mapping. We propose an approach that allows estimation of the total susceptibility in a small region in the following manner. Data is reconstructed at a much lower resolution such that the voxel is sufficiently larger than the targeted small region and the region can be approximated as a single dipole point. The point dipole phase model has been used to locate and quantify magnetic microparticles by phase cross-correlation. We propose a subvoxel treatment of the MR signal equation for precise point source estimation.

5. Single Dipole Fitting

We use a low-order polynomial to account for slowly varying background inhomogeneity. The intravoxel dephasing depends on the dipole location within the source voxel, in addition to the product of the magnetic moment and echo time. Let $\delta_b(r_n, r_s)$ be the signal phase at a voxel centered at $r_n$ due to a dipole $m_s$ at location $r_s$. The dipole $m_s$ may then be found by searching over all $m_s, r_s$:

$$m_s = \mathrm{argmin}_{(ms,rs)} \Sigma_n |w_n [\delta_b(r_n, r_s) \tau - \mathrm{phase}[\int dr \phi(r - r_n) \exp[i(\gamma \mu_0 m_s TE/4\pi)(3\cos^2\theta - 1)/|r - r_s|^3]]]|^2 \quad \text{(Equation 7-10)}$$

where $\phi(r)$ is the voxel basis function in MRI discretization, and $\tau = \omega_0 TE$. The integration in Equation 7-10 and the search step in $r_s$ need to be computed at a resolution much smaller than the scale of dipole field caused phase variation cycle (perhaps at voxel/100 digitization steps (Pintaske, J., *Phys Med Biol*, 2006; 51:47074718, Pintaske, J., *Magma*, 200619: 46-53 (Lee, J H., *Nat Med*, 2007; 13:95-99) or to be evaluated in k-space. Equation 7-10 assumes the phase map is reconstructed with acceptable accuracy. The dipole field falls off rapidly according to $r^{-3}$, so only a small spherical region close to the source voxel contains significant information. In fitting the measured field to a single dipole field, both noise and intravoxel dephasing can be properly accounted for in the weighting factor $w_n$. The algorithm in Equation 7-10 may allow accurate magnetic moment quantification that is insensitive to dephasing non-linearities and the dipole location.

6. Experiment

The algorithm of single dipole fitting can be tested on a gel phantom imbedded with large iron oxide microparticles (10 µm size with known amount of iron per particle) from Bangs Laboratories (Fishers, I N). Care should be taken not to introduce any air bubbles during gel phantom preparation. The magnetic microparticle phantom is imaged using methods described above. Phase maps will be processed using Equation 7-10 to estimate the iron contents in dark dots in the magnitude images. MRI estimation of iron in particles will be compared with the known iron contents in particles using linear regression.

For feasibility test on patient data, the single dipole algorithm can be tested first for feasibility on mice data and c, and can be validated for accuracy by correlating with histology on data acquired in the experiment described hereinafter.

VII. Validating the Method for Quantifying Biodistribution of Targeted Contrast Agents.

The technical developments on quantitative susceptibility imaging (QSI) described in the above will lead to a robust accurate method for mapping contrast agents in molecular MRI. The QSI method is implemented in tracking targeted contrast agents, an important application of molecular MRI. SPIO nanoparticles conjugated to a Herceptin antibody can be used. Herceptin is FDA approved and has specific binding properties against a HER2/neu receptor overexpressed in a subset of breast cancer cells, and conjugation of nanoparticles with Herceptin is well known. Experiments using Herceptin conjugated SPIO nanoparticles to target cancer cells in vitro and in a mouse model can be performed. (Lee, supra) QSI determination of nanoparticles can be compared with reference measurements by ICP-MS (Sun R., *Invest Radiol*, 2005; 40:504-513, Yancy, A D., *J Magn Reson Imaging*, 2005; 21:432-442, Sundstrom, J B., *J. Acquir Immune Defic Syndr*, 2004; 35:56-63, Raynal, I., *Invest Radiol*, 2004; 39:56-63) colorimetry (Raynal I, supra, Kalambur, V S., *Langmuir*, 2007; 23:12329-12336, De Cuyper, M., *Anal Biochem*, 2007; 367:266-273), and µPET with additional $^{64}$Cu labeling (Cai, W., *Eur I Nucl Med Mol Imaging*, 2007; 34:850-858, Smtih, S V., *J Inorg Biochem*, 2004; 98:1874-1901, Voss, S D., *Proc Natl Acad Sci USA*, 2007; 104:17489-17493, Anderson, C J., *Q J Nucl Med Mol Imaging*, 2008; 52:185-192). Our proposed Herceptin-64Cu-DOTA-SPIO as a cancer targeting radioactive nanoparticle has its chemistry well established, which serves well our purpose of validating MRI quantification.

Herceptin (Genetech, San Francisco, Calif.), a trade name for trastuzumab, is a humanized monoclonal antibody that acts on the HER2/neu (erbB2) receptor. Commonly used as a part of anti-cancer therapy for breast and ovarian cancer, Herceptin has also seen use as a targeting mechanism for directed contrast agent delivery in MRI, Ultrasound and PET.

A. Cell Lines

A collection of cancer cell lines with varying levels of HER2/neu overexpression will be used: Bx-PC-3 (human hepatoma cell line), MDA-MB-231, MCF-7 and AU-565 (human breast cancer cell lines). Relative HER2/neu expression levels were reported to be at 1, 3, 28, and 30, respectively. Cells will be harvested at ~70% confluency and prepared for immunofluorescence flow cytometry (FACS) with Herceptin to examine HER2 expression levels. Surface density of HER2 in each cell line can be quantified by comparing the binding of Herceptin to the microbead (Quantum Simply Cellular beads, Bangs lab) labeled with known amounts of anti-Fc IgG, which is specific for the Fc portion of IgG antibodies.

B. SPIO Nanopaticles Conjugated with Herceptin

Standard cross-linked iron oxide (CLIO) and magnetism-engineered iron oxide nanoparticles (MnMEIO) of desired sizes coated with 2,3-dimercaptosuccinic acid (DMSA) ligand can be used to conjugate with Herceptin. Particles can be well characterized using techniques including x-ray diffraction (XRD), transmission electron microscopy (TEM) and superconducting quantum interference device (SQUID). Herceptin (2 mg, Roche Pharma) can be dissolved in 10 mM of sodium phosphate-buffered solution (100 µl, pH 7.2) and mixed with sulfo-succinimidyl-(4-N-maleimidomethyl)cyclohexane-1-carboxylate (sulfo-SMCC) (50 µg, Pierce). After 15 min, the maleimide-activated Herceptin can be purified by applying the reaction mixture to a Sephadex G-25 (Aldrich) desalting column. Collected fractions (~200 µl) containing maleimide-activated Herceptin can be immediately mixed with 100 µl of 12-nm MnMEIO solution (concentration 2 mg Fe/ml), and the reaction can be allowed to proceed for 8 h at 4° C. MnMEIOHerceptin conjugates will be purify through gel filtration. To confirm bioconjugation of magnetic nanoparticles (MnMEIO or CLIO) with Herceptin, protein assay can be performed by using the Bio-Rad DC protein assay kit. We expect that approximately six equivalent Herceptin antibodies can be bound to each magnetic nanoparticle. A nonspecific antibody can be used for negative controls.

C. Multimodal Imaging Probes

Multimodality imaging is an attractive strategy to simultaneously acquire anatomical and functional information, and one application is to quantify magnetic nanoparticles through radioactive labeling and nuclear imaging. The physical properties of $^{64}$Cu ($t_{1/2}$=12.7 h; β+18%, β+max=656 keV) are appropriate for imaging the in vivo kinetics of $^{64}$Cu labeled antibodies and nanoparticles in animal models based on µPET. Attachment of radioactive $^{64}$Cu$^{2+}$ to molecular probes requires the use of a bifunctional chelator, such as DOTA (1,4,7,10-tetraazacyclododecane-N,N',N'',N'''-tetraacetic acid) and TETA (1,4,8,11-tetraazacyclotetradecane-N,N',N'', N'''-tetraacetic acid). Antibodies and nanoparticles labeled with $^{64}$Cu using DOTA as the chelator have been studied extensively to demonstrate the potential clinical utility of $^{64}$Cu for PET imaging studies. As in labeling trastuzumab monoclonal antibody and recombinant affinity ligands (Affibody molecules) with $^{111}$In and $^{68}$Ga, we plan to label MnMEIO nanoparticles with $^{64}$Cu using DOTA conjugated Herceptin antibody for µPET biodistrubtion study.

D. Experiment 1

In vitro SPIO targeting cell MRI. Cells from each cell line can be harvested, incubated and treated with the Herceptin-SPIO conjugate for 30 min. Washed cells will be fixed in 2% paraformaldehyde and embedded in agarose gel in 50 mL conical centrifuge tubes. MRI on these cell tubes and cells treated with control (no Herceptin) will be performed. The quantitative susceptibility imaging method can be used to determine susceptibility values, which can be converted to iron concentration and mass. In addition to the gradient echo imaging, standard T1 and T2 spin echo imaging can also be performed. By comparing with control, Δ(1/T1), Δ(1/T2) and Δ(1/T2*) can be estimated. Inductively coupled plasma mass spectroscopy (ICP-MS, Plasmaquad) can be used to as a reference measure for iron concentration in the cell phantom. MRI measured [Fe], Δ(1/T1), Δ(1/T2) and Δ(1/T2*) can be correlated with ICP-MS measured [Fe] and HER2/neu expression to identify a quantitative and accurate MRI method for measuring targeted contrast agent affinity with cells.

E. Experiment 2

In vivo SPIO targeting cell MRI in a mouse model. The in vitro cellular studies above can be extended to in vivo murine studies (n=11, t-test) using the human breast tumor cell line AU-565. These cancerous cells can be injected into the proximal femur regions of a BALB/c nude mouse. When the xenograph reaches 50 mg (estimated visually and by MRI volume), SPIO-Herceptin conjugates (200 µl) can be intravenously injected into the nude mouse (dosage of 20 mg/kg). High resolution (50 µm) MRI focused on the tumor can be performed pre-injection, 1 h and 2 h post-injection. SPIO with nonspecific antibody (no Herceptin) can be used as negative controls (n=11, t-test). MRI include the gradient echo imaging described herein and the standard T1 and T2 weighted spin echo imaging of the tumor. At the completion of MRI, mice can be euthanized for histochemistry analysis. Prussian blue colorimetric determination (Raynal, I, *Invest Radiol,* 2004; 39:56-63)) can be used as a reference MRI susceptibility imaging determined [Fe], and conventional Δ(1/T1.).Δ(1/T2.).Δ(1/T2*).

F. Experiment 3

Biodistribution study using MnMEIO-Herceptin radioactive labeled with $^{64}$Cu-DOTA and comparing MRI QSI with µPET. Conjugation of Herceptin antibody with DOTA involves the activation of a carboxyl group on DOTA with N-hydroxysulfosuccinimide (sulfo-NHS) ester and 1-ethyl-3 [3-(dimethylamino)propyl]-carbodiimide (EDC) (Cai, W., *Eur J. Nucl Med Mol Imaging,* 2007; 34:850-858). Herceptin (10 mg) can be mixed with the NHS/EDC activated DOTA in an ammonium acetate buffer, pH 8-9 and can be incubated at 4° C. for 6-12 h, which produce a molar ratio of 2-3 DOTAs to antibody. Then, DOTA conjugated Herceptin can be purified by Sephadex G-25 column and can be conjugated to the SPIO as aforementioned. Radiolabeling of DOTA-Herceptin nanoparticles (1 mg) can be performed with [$^{64}$Cu]copper chloride (3-5 mCi) in ammonium acetate buffer (pH 5-6) for 30 min at 40° C. The labeled nanoparticles can be purified using gel filtration.

When the xenograft in a mouse reaches 50 mg, it is intravenously injected with 50-100 µCi of $^{64}$Cu-DOTA-Herceptin-MnMEIO conjugates (~0.4 mg Fe) (n=11, t-test). Whole mouse MRI pre-injection (baseline) and immediately post-injection at 15 min, 30 min, 1 hr, 2 hr and 24 hours are performed. Prior to imaging at each time, blood samples are obtained by retro-orbital collection. Also, at 1, 2, 4, and 24 hours PET images of $^{64}$Cu in vivo distribution and tumor uptake with µPET (Focus 220, Siemens) are obtained. The mouse can be kept in the same position on a holder while acquiring the MRI and µPET/CT images and during transportation between the two imaging rooms (located on the same floor close to each other). The MRI, µPET and CT images can be registered using normalized mutual information(Pluim, J P, *IEEE Trans Med Imaging,* 2003; 22:986-1004, Hill, D L., *Phys Med Biol,* 2001; 46:R1-45, Loi, G., *J Digit Imaging,* 2007). Tumor, liver, spleen, and muscle can be segmented for ROI analysis. Correlation between MRI susceptibility imaging and µPET can be performed on both voxel based regression and ROI based regression. At the end of imaging, mouse can be euthanized and tissues can be obtained for in vitro counting of $^{64}$Cu radioactivity in a gamma well counter (Packard) in order to estimate the percent injected dose/g (% ID/g) of tissue or organ. Since the % ID/g determined based on radioactivity determination provides an absolute measure of regional distribution and tumor uptake of nanoparticles, correlation among the µPET imaging data, % ID/g, and MRI quantitative susceptibility data at 24 hours will provide an estimate of the accuracy for mapping biodistribution of SPIO nanoparticles using quantitative susceptibility imaging developed in this research.

VIII. Quantitative Brain Iron Mapping

In an application of the invention, the general objective is to develop technology for establishing or enhancing MR image marker for brain disorders involving iron deposition. One of the objectives is to develop quantitative brain iron mapping using MRI by solving the inverse problem from magnetic field to magnetization source, which is susceptibility in MRI.

The above studies confirm the feasibility of solving the ill-posed inverse problem by conditioning it through multiple orientation sampling or by regularizing it with a priori knowledge, as shown in (FIGS. 25 and 30). This section describes the implementation of these methods in brain iron mapping and particularly in imaging cerebral microbleeds.

A noninvasive MRI method is developed for quantitatively imaging iron deposits in the brain, using a novel approach that solves the inverse problem from the local magnetic field to the magnetic susceptibility source. There is significant scientific and clinical interest in studying iron in the brain. Iron deposits are regarded as an indicative biomarker for neurodegenerative disorders such as Parkinson's and Alzheimer's diseases. Iron deposition in the brain can also result from cerebral microbleeding, which may be associated with an increased risk of the devastating intracerebral hemorrhage (ICH), especially in patients anticoagulated with medicines such as warfarin. Quantification of iron deposition in microbleeds might make it possible to identify patients at high risk for hemorrhagic complications of anticoagulation and to reduce the risk by decreasing the intensity of anticoagulation for them or not anticoagulating them at all. Therefore, quantitative iron mapping in the brain holds great clinical potential for managing diverse clinical neurologic disorders.

After onset of hemorrhage, the red blood cell dies, and its hemoglobin is released into extracellular space. Macrophages start to phagocytose hemoglobin, degrading it into hemosiderin and ferritin that store iron. Fresh hematomas have no iron deposit and appear bright on T2* magnitude images, and old hemorrhages have lots of iron deposition and appear dark on T2* magnitude image due to iron dephasing. The amount of iron deposit increases with the age of hemorrhage. Magnetic source MRI can be used to quantitatively measure the iron density in hemorrhage, which may be used to characterize the age of hemorrhage.

We propose a MRI approach to generate quantitative brain iron mapping for accurate assessment of cerebral microbleeds. The local magnetic fields of iron deposits measured from MRI phase images is a convolution of a dipole field kernel with the iron magnetization, which is the iron mass distribution multiplied by the susceptibility of the iron compounds. Other materials in the brain have susceptibilities 10,000 times weaker than iron compounds, making MRI very sensitive to iron presence. The inversion from field to magnetic source is unfortunately an ill-posed problem; straightforward inversion generates no meaningful mapping of magnetization, because of severe noise propagation near the zero points of the dipole kernel where magnetization is indeterminable.

We propose to develop a robust inversion method by making full use of all information in the T2* gradient echo image data. The phase image, typically neglected in MRI, is used to generate a local magnetic field map. The magnitude image is used to guide the inverse algorithm through a regularization term for generating magnetization/susceptibility maps.

This section describes the following:

1. Data acquisition sequence. We develop a fast multiple gradient echo imaging sequence for effective high resolution mapping of local fields in the brain. We also develop effective compensation for motion artifacts that were found to be substantial in our preliminary patient study.

2. A robust inverse approach for mapping magnetic susceptibility sources in the brain. We will focus on the regularization approach that does not require reorientation. In particular, the T2* magnitude images will be investigated for formulating a robust regularization.

3. MRI brain iron mapping using histological correlation.

4. Applying MRI brain iron mapping to imaging cerebral microbleeds (CMB) for quantitatively assessing the risk of ICH in warfarin-treated patients compared to a control group of warfarin-treated patients who have not had ICH.

We hypothesize that CMB iron quantity is a stronger predictor for ICH than CMB presence on T2* images in warfarin-treated patients. All imaging experiments in this section can be performed on a 3T whole body scanner with an 8 channel head coil. Other scanner can also be used.

Traditional MR images consist of maps of water concentration (and other elements in spectroscopic imaging) weighted by relaxation times, resonance frequency or motion (flow, perfusion and diffusion). The planned research introduces a new approach to MRI by generating maps of material susceptibilities. The inversion methodology proposed in this research may represent a valuable contribution to MRI signal processing. We focus on targeting the development of susceptibility imaging for brain iron imaging. There has been a great physiological interest in brain iron. It is now believed that quantitative and longitudinal assessment of brain iron will play an important role in understanding pathogenesis and disease progression, in diagnosing disease, and in monitoring treatments.

As an application of our proposed brain iron mapping technology, we study cerebral microbleeds that have been recognized recently as important for managing stroke patients. The underlying pathological processes vary substantially among patients with stroke and transient ischemic attack, particularly in the degree of cerebral small vessel disease. For example, large vessel stroke has a high early stroke recurrence risk, while stroke due to small vessel disease are at higher risk of cerebral hemorrhage. Intracerebral hemorrhage (ICH) has a devastatingly high mortality rate and ICH risk must be carefully managed. Microbleed imaging may substantially contribute to stratifying patients according to their hemorrhagic risk. In particular, cerebral microbleeds (CMB) appear to be associated with an increased risk of warfarin-associated hemorrhage. Recent reports indicate that 79% of patients with warfarin-associated ICH have microbleeds compared to only 23% of control warfarin-treated patients without ICH (p<0.001). This effect was independent of the effects of increased prothrombin time. Other studies have suggested that the presence of microbleeds is =associated with an increased risk of hemorrhage in the case of large amount CMB (Larson, D R., *Science* 2003; 300:1434-1436), in early population (Bulte, J W., *Nat Biotechnol,* 2001; 19:1141-1147) and in moyamoya disease (Kang, H W., *BBioconjug Chem,* 2002; 13:122-127). It is desired to know if quantified iron imaging is a stronger and therefore potentially more useful predictor of ICH in warfarin-treated patients.

The general association of the presence of CMB with increased risk of ICH remains inconclusive. This confusion may be in part caused by the various T2* imaging technology. These technological issues confound the task of a noninvasive investigation of cerebral microbleeds. To overcome these problems, brain iron mapping as proposed herein presents a quantitative measure of microbleeds independent of imaging parameters and can serve a standard MRI method for CMB investigation.

This work provides an effective and efficient solution to the inverse problem from magnetic field to magnetization/susceptibility source, which allows an effective and robust way to extract valuable information from MRI phase data that has been typically discarded. This magnetic source MRI has a wide range of applications. It is an important tool for molecular MRI for mapping contrast agents or magnetic biomarkers. For example, it can be used to map and measure local drug dose delivered by magnetically labeled vehicles targeting diseased tissue cells. It can be used to map and measure the initial migration and homing density of magnetically labeled stem cells or delivery of gene therapy. These measurements are valuable for developing and optimizing protocols for drug delivery, cell therapy and gene therapy.

Brain iron mapping MRI technology may be extended to other organs, which would replace invasive tissue biopsy used in monitoring iron overloading in diseases such as hemochromatosis and thalassemia major. Liver iron has been imaged using relaxation contrast and susceptibility contrast. Myocardial iron has also been imaged similarly. Quantitative iron maps using magnetic source MRI developed in this research may represent a valuable iron quantification tools in these organs for improved patient care.

Quantitative susceptibility imaging or magnetic source MRI may play a valuable role in all other applications where magnetic susceptibility has significant effects on MRI signal. Magnetic source MRI may be applied in diagnosing bone disease. MRI has been used to assess bone density to avoid the invasive biopsy procedures and exposure to radiation and to assess structure and function of trabecular bone. Bone susceptibility imaging would provide insightful measure of bone mineralization and density. Magnetic source MRI may be used to correct errors in converting signal to contrast concentration in MR perfusion studies. It may be used to quantify deoxyhemoglobin in brain fMRI where T2* contrast may be confounded by microvascular orientations.

A. Solving the Inverse Problem from Magnetic Field Measured in MRI to Magnetization Source 1. Stability of Inversion Using Cosmos The condition number, indicating an upper bound on the relative error propagation in the inversion, can be used to measure the stability of the inversion. The inverse problem for Equation 3 can be reformulated using a block diagonal matrix. For N rotations around the x axis, the diagonal block is: $[1/3-(k_z \cos\theta_1+k_y \sin\theta_1)^2/k^2, \ldots, 1/3-(k_z \cos\theta_N+k_y \sin\theta_N)^2/k^2]^T$. The condition number of a matrix is defined as the ratio between the maximum and the minimum singular value of that matrix. Here it is equal to $$\kappa(\theta_1\theta_2\ldots\theta_n)=\max_k[\Sigma_p(1/3-(k_z\cos\theta_p+k_y\sin\theta_p)^2/k^2)^2]/\min_k[\Sigma_p(1/3-(k_z\cos\theta_p+k_y\sin\theta_p)^2/k^2)^2] \quad \text{(Equation 8-1)}$$

The optimal set of sampling orientations $(\theta_1\theta_2\ldots\theta_n)$ is defined as the one achieving minimal condition number $\kappa(\theta_1\theta\ldots\theta_n)$. Without loss of generality and because of symmetry, the first angle $\theta_1$ is set to 0°, the second angle $\theta_2$ increases from $\theta_1$ to 180°, and so forth. In this manner, the optimal sample angles can be identified by a straightforward search (FIG. 17). The optimal sampling orientations are 0°, 60°, 120° for N=3 (corresponding minimal κ=2.03 for a 128×128×64 image). This is consistent with the intuition that uniformly distributed orientations performs best.

B. MRI Experiments Validating COSMOS.

The first experiment is the susceptibility quantification of different concentrations of gadolinium (Magnevist, Berlex Laboratories). The second experiment is in vitro susceptibility mapping of bone. A section of bone was excised from the center part of a swine's thigh and embedded in a 1.5% agarose gel phantom. The third experiment was in vitro iron quantification in animal tissue, where four quantities of 10% concentration of Feridex (Advanced Magnetics Inc.) solutions were injected into chicken breast muscle with volumes of 1 µL, 2 µL, 3 µL and 4 µL using a micro syringe. All experiments were conducted on a 1.5T clinical MRI scanner (General Electric Excite HD) using a 3 inch or a 5 inch surface coil for signal reception. The phantoms were rotated along a vertical axis (⊥B0) in the coronal plane for imaging at 0°, 60°, and 120°. A dedicated fast 3D gradient echo sequence was designed to sample at different TEs in an interleaved manner. Resolutions were 1 mm³/1 mm³/0.5 mm³ for Gd-water phantom, bone and tissue imaging, respectively. Bandwidth was 31.25-62.5 kHz, TR 30-40 msec, flip angle 30°. Four TEs (1.7-14.2 msec) were used for each scan.

1. Gadolinium Susceptibility Quantification

The measured field map showed a conspicuous dipole pattern surrounding the vials with different gadolinium concentrations. COSMOS provided satisfactory susceptibility images, clearly resolving different Gd concentrations with no streaking artifacts. The relation between estimated and expected susceptibility fits well with the linear model ($R^2$=0.9997), and provides good estimation of susceptibility (slope is 0.96, close to unity).

2. Material Susceptibility Measurements

The experimental setup consists of bottles containing materials such as Gd solutions and a section of lamb leg. The measured field shift map represented contributions from all bottles and had no apparent relationship with that of a single bottle of unit susceptibility. Susceptibility chemical shift measurements for various materials are listed in Table C1, presenting good agreement with literature.

3. Orbital Navigator Echo

To detect rotation and translation in all directions, we developed a new type of navigator echo, the orbital navigator echo. It describes a circular ring in 2D k-space and permits simultaneous measurement of in-plane rotation and translation (FIG. 36A). An object f(x) after in-plane motion is f'(x)=f(R(x−t)), where R is the orthogonal rotation matrix, t is the translation vector. The corresponding representation in the Fourier space is $$F'(k)=e^{ikt}\cdot F(Rk).$$ (Equation 8-2)

Based on Equation 1-3, rotation can be determined from the shift in the magnitude profile of the orbital echo with respect to a reference orbital echo using a least squares algorithm (FIG. 18b), and displacements can be calculated from the phase difference between the current echo and a rotated reference echo (FIG. 35):

$$\Delta\psi(\theta) = k_\rho(t_x\cos\theta + t_y\sin\theta),$$ (Equation 8-3)

$$t_x = \frac{1}{\pi k_\rho}\int_0^{2\pi}\Delta\psi(\theta)\cos\theta d\theta,$$

-continued $$t_y = \frac{1}{\pi k_\rho}\int_0^{2\pi}\Delta\psi(\theta)\sin\theta d\theta.$$

4. Spiral Imaging Experiences

Using variable sampling density, we have developed a time resolved high resolution 3D spiral sequence for contrast-enhanced magnetic resonance angiography. We have developed self calibrated parallel imaging for spiral sampling trajectories. A computer cluster has been setup to speed up spiral reconstruction. A cardiac phase resolved 3D coronary MRA SSFP sequence using spiral sampling has also been developed. An example of the time resolved 3D spiral sequence implementation is illustrated in FIG. 36. High quality 3D MRAs were consistently obtained in patients. Background subtraction was employed and there were no streaking artifacts in these angiograms.

5. General Data Analysis Methods and Sample Sizes:

Comparing paired images acquired from two techniques.

First technique-Image pairs are interpreted and scored by three independent radiologists unaware of the acquisition methods. Scores are on a five level scale: 2=markedly better, 1=modestly better, 0=approximately the same, −1=modestly worse, −2=markedly worse. The Wilcoxon paired-sample signed-rank test can be performed on the majority scores (median if needed) to assess the difference. From experience, sample size n=10 is sufficient for a reasonable outcome of 7 better, 2 about the same and 1 worse, p<0.05, (with 0.85 statistical power at 0.10 confidence level). This will be referred to below as n=10, Wilcoxon.

Second technique-Quantitative measurements of signal intensities, volumes of interests and other parameters can also be used to compare two techniques. t-tests can be performed to assess the differences. For testing a two standard deviation difference at significance α=0.05, power 1−β=0.90, sample size is n=11 (Culver, J. *J Nucl Med*, 2008; 49:169-172). This will be referred to below as n=11, t-test. Linear regression can also be performed to assess correlation. Sample size is n=10 for statistical power 0.90 at significance level 0.05 for detecting expected correlation at r~0.8 (Maskali, F., *J Nucl Cardiol*, 2005; 12:229-230, Pichler, B J, *J Nucl Med*, 2006; 47:639-647). This will be referred to as n=10, correlation.

6. Optimizing the Data Acquisition Sequence

We have identified the following improvements on the data acquisition: 1) optimizing the echo spacing in the multiple echo sequence for field mapping. 2) minimizing motion artifacts in a long scan using navigator echo and autocorrelation without increasing scan time. 3) reducing scan time using efficient spiral trajectories and coil array parallel imaging.

(a) Optimizing Echo Spacing in Multiple Echo Sequence for Field Mapping

Field map estimation is vital to susceptibility reconstruction accuracy, and a simple constant echo spacing was used in the multiple echo sequence in the preliminary study. A systematic optimization approach can be performed for determining the field map from multiple gradient echoes based on maximal likelihood estimation. Another benefit of this optimization is to identify spare time between echoes for a navigator acquisition to monitor motion.

(b) Removal of Residual Edge Fields of the Brain

A lower order polynomial fitting was used to remove background field effects in the local field map. This approach is sufficient for a small region in the brain, but for microbleeding mapping of the whole brain, the fields due to brain anterior and posterior edges/boundaries may cause distracting residual artifacts (FIGS. 25 and 30). The Maxwell equations may be used to remove this residual field according the boundary estimated according the brain anatomy. A simple model for brain susceptibility may be used. The residual field can be calculated rapidly as a surface integral like the geometry factor in our piecewise constant model in our preliminary study.

(c) Field Map Estimation by Maximum-Likelihood and Optimal Sampling Time Points

Figure 38:
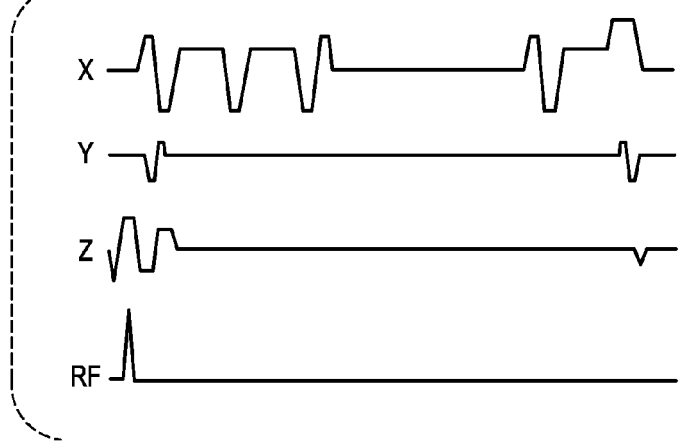
FIG. 38 depicts the 3D multi-echo gradient echo sequence with flow-compensation on all gradients and full echo sampling.

It is well-known that in conventional two-echo field map estimation, selecting the echo time difference involves a trade-off. If the echo time difference is too large, the dynamic range is impaired; if the echo time difference is too small, the error on the estimated field map will be increased. Therefore, a nonuniformly spaced 3-echo sequence is desirable because the first two echoes provide a rough estimation of the frequency and the last long echo improves accuracy (FIG. 38). Since the echo time of the last echo needs to be large enough, $R_2^*$ decay may not be negligible and should be taken into account. Hence, the signal model in a certain voxel at a certain time point is formulated as: $s(t)=s_0 e^{i\omega t}e^{-R2^* t}+\epsilon$, where $s_0$ denotes the complex transverse magnetization, $R_2^*$ is the transverse relaxation time and $\epsilon$ is the known complex Gaussian i.i.d. noise. A maximum-likelihood field map estimator is used to solve for the field. We further extend the field map estimation to the N coil case, in which case the off-resonance frequency of a particular voxel seen by each channel is the same, but the initial phases are different. The goal for optimal sampling time points is to minimize $$\log p(y;f,\omega(r))=\Sigma_k \log 1/((2\pi)^{N/2}|\sigma|^{1/2})\exp(-1/2*(y_k-A_k x)^T \sigma(y_k-A_k x))$$ (Equation 8-4)

where x is the N-dimensional vector containing the initial phase for each coil, $y_k$ is the N-dimensional vector containing the complex signal for echo k for all coils, $A_k$ is $e^{i\omega TEk}E^{-R2*TEk}$ times the N-dimensional identity matrix, $TE_k$ the kth echo time, and $\sigma$ is the inverse of coil noise correlation matrix. We avoid the use of regularization here because noisy regions will be penalized in the subsequent susceptibility calculation process and regularization may bias the field map estimation.

In estimation theory and statistics, the Cramér-Rao Bound (CRB) expresses a lower bound on the variance of estimators of a deterministic parameter. Numerical calculation is needed in general for the CRB of the variance of the estimation. Close analytical expression exists for three echoes. In this case, $TE_1$ and $TE_2$ are chosen for maximal SNR to be minimal as allowed by receiver bandwidth and frequency encoding. Then the optimization problem is reduced to one variable of determining $TE_3$ from CRB minimization. For a given tissue $R_2^*$, the optimal $TE_3$ can be identified from the beginning of the flat bottom of the CRB curve (FIG. 39).

(d) Experiments

Monte Carlo simulations of field mapping accuracy can be performed for a range of R2* values, the TE spacings, and a range of higher echo numbers. The minimal CRB among all echoes will indicate the optimal number of echoes and their spacing.

The multiple gradient echo sequence can be implemented with flow-compensation (FIG. 38), different number of echoes and various echo spacings. A phantom in the shape of a human brain with imbedded iron mimicking cerebral microbleeds is be constructed (brain phantom). Gels with relaxation times and susceptibilities similar to brain gray and white matters can be used as the main composition materials, and cerebrospinal fluid material will also be included. Irons of concentration similar to that in brain bleeds and microbleeds can be deposited in the gel. The brain phantom can be imaged for susceptibility mapping according to the accurate image-based regularization method (Equation 14) established in the preliminary study. The optimal number of echoes and echo spacings will be validated by assessing the accuracy of iron concentrations in the phantom.

(e) Develop an Effective Motion Compensation-Flow-Compensation and ECG Gating

Figure 40:
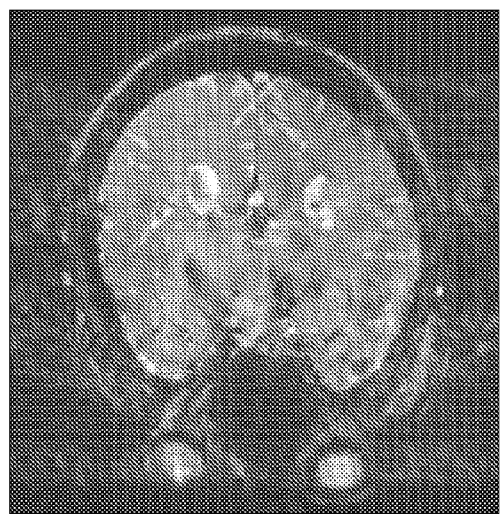
FIG. 40 depicts the motion artifacts in a 5 min 3D GRE imaging of a patient.

Acquiring high resolution field maps necessary for accurate susceptibility quantification takes a long scan time (5 mins in a preliminary study), and image quality becomes more susceptible to patient motion (FIG. 40). Flow-compensation depicted in FIG. 38 may suppress most artifacts of constant flow. Cardiac pulsation effects can be minimized using ECG gating. The ECG-gated cardiac view ordering method that we developed for cardiothoracic MRA allows for continuous data acquisition and may be used for effective pulsation artifacts suppression in the brain without increasing scan time.

Even with conventional immobilization padding, motion still occurs whilst scanning subjects inside an MR scanner. The most important translational motion of the head occurs along the SI direction followed by that in the AP direction and the RL direction; the largest rotation is typically around the RL axis, followed by rotations around the AP and the SI axes. The resulting ghosting and blurring artifacts are a major concern. Two methods are described herein: one prospective method using orbital navigators for real-time detection of translation and rotation and the other method using autocorrection employing the acquired echo data only.

(f) Orbital Navigator for Real-Time Motion Correction

Figure 41:
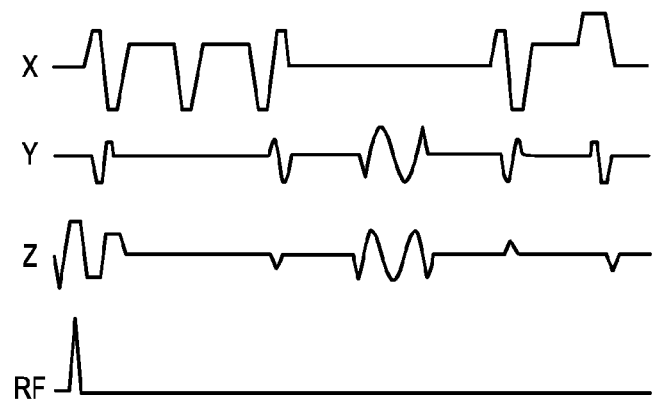
FIG. 41 depicts the orbital navigator multi-echo sequence.

The above optimized multi-echo sequence for field map estimation may be combined with orbital navigators without an increase in scan time. The orbital navigator readout waveform will be placed within the TR between two echoes with sufficiently large spacing (see FIG. 41). The navigator is then sensitized to the excited imaging volume directly. Phase and slice rewinding and encoding gradients can be placed before and after the navigator. The orbital navigator can sensitizes rotation in the sagittal plane. From the same data, SI and AP translation can be derived as well. This motion information can be acquired and processed in real-time and be used to adjust the scanning plane and rotation matrix. The processing time is expected to be around 100 ms. To suppress noise in the translation and rotation parameters, a real-time Kalman filter using a constant velocity state space model can be used. For motion that exceeds a certain threshold, data acquisition c an be discarded and repeated until acquired at a smaller motion parameter. When the subject's head is properly immobilized, the residual translation and rotations are expected to be small enough such that a scan efficiency of nearly 100% can be reached.

(g) Autocorrection

We also investigate in a retrospective motion correction method that estimates the motion corruption of every acquired k-space line by minimizing a chosen metric of the resulting reconstructed image. A search process is used in which an increasing number of k-space lines from the center out can be iteratively corrected for motion. This motion is estimated by exhaustively searching phase modulation of each k-space line that minimizes the image gradient entropy. In order to decrease the processing times, parallel computation and investigate the use of navigator echoes (identical to imaging but without phase encoding) are used to speed up the search process. Within one TR (expected to be around 50 ms), all echoes can be corrupted by similar motion, allowing the optimal phase modulation for the first echo to be applied to all remaining echoes.

(h) Experiments

The brain phantom is placed on a platform undergoing simultaneous translation and rotation for susceptibility imaging according to the accurate image-based regularization method (Equation 14). The multi-echo sequence can be used for imaging the brain phantom 1) without motion (reference), 2) with motion and using the orbital navigator real-time correction and 3) with motion but without real-time correction. On the data affected by motion, the autocorrection method can be applied both with and without using the navigator echoes. Total reconstruction times for both autocorrections are compared. Iron concentration accuracy, image quality (primarily degree of motion artifacts in susceptibility maps, T2* magnitude and phase images) and autocorrection times can be evaluated to assess motion correction effectiveness.

In healthy subjects (n=10, Wilcoxon), the multi-echo sequence can be run twice (in a randomized order) with and without real-time motion correction. Data can be processed with autocorrection. Image quality scoring of blurring and ghosting artifacts are performed to assess the effectiveness of motion correction.

(i) Accelerate Data Acquisition Using Parallel Imaging and Spiral Trajectories

To shorten total scan time or to increase resolution and/or volume coverage, we use parallel imaging using multi-channel coil for signal reception and accelerated sampling trajectories among images of different echo times.

(i) Parallel Imaging

Multiple echoes per TR are used to acquire different phase encodings from echo to echo within the same TR, similar to TSENSE (Kellman P., *Magn Reson Med,* 2001; 45:846-852) and TGRAPPA (FIG. 42). By combining the data from all echoes, a fully encoded reference automatic calibration scan (AC) data set can be used for a GRAPPA (Griswold, M A., *Magn Reson Med,* 2002; 47:1202-1210) reconstruction of complex images for each coil. To keep the flow-compensating property of the pulse sequence, each readout will now surrounded by its own set of flow-compensated phase encoding and rewinding gradients. This parallel MRI technique will be combined with autocorrection as follows. Each trial phase modulation will be applied to the raw undersampled data for each TE. Under the assumption that motion will be constant within one TR, the same modulation will be applied to all TEs, taking into account the different phase encodings. The image metric will be the maximum of the image gradient entropies of all complex coil images for the first TE reconstructed using the usual GRAPPA method. After finding the optimal modulation, complex images for the remaining TEs will be reconstructed. The search process is readily parallelizable and will be implemented on our high performance computer cluster for reconstruction.

(ii) Spiral Trajectories

Figure 43:
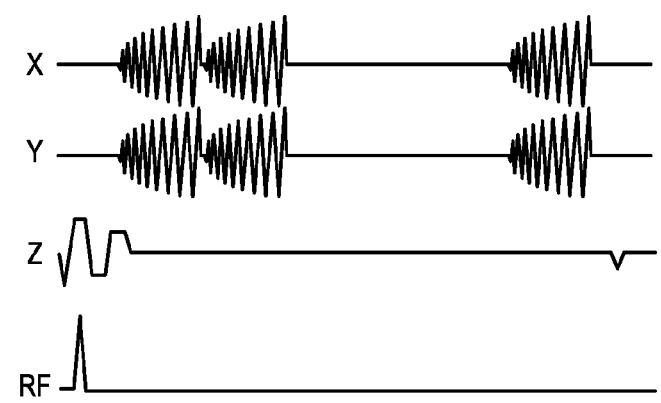
FIG. 43 depicts the multiple echo spiral gradient echo pulse sequence.

The spiral sampling is used to increase the scanning efficiency. We use a 3D stack of spirals (FIG. 43). Each spiral readout is robust against flow artifacts and only the spiral first moment compensation gradients will be employed between successive spiral readouts to ensure consistent phase from echo to echo in the presence of flow. When very short echo spacings are required, the pulse sequence may be modified to acquire only some of the TEs in any given TR. Then, by repeating that TR and shifting the spiral sampling in time, arbitrary echo spacings are possible. The loss of sampling efficiency can be compensated by increasing the length of the spiral readouts. Both the autocorrection as well as the parallel MRI reconstruction will be adapted to the non-uniform sampling.

(j) Experiments

The brain phantom is imaged according to the accurate image-based regularization method (Equation 14) for susceptibility mapping using both Cartesian and spiral sampling trajectories (FIGS. D5 and D6). The Cartesian data set will be undersampled and then reconstructed using the proposed GRAPPA method for various reduction factors (e.g., 2, 3 for 3 echo acquisition). Iron mapping accuracy and image quality (for susceptibility maps and T2* images) will be assessed for both the GRAPPA and spiral methods.

This experiment will be repeated with motion to assess the motion robustness of both Cartesian and spiral sequences. This experiment will allow establishing a rapid motion-robust multiple gradient echo imaging sequence.

Finally both accelerated Cartesian and spiral sequences will be used for imaging in healthy subjects (n=10, Wilcoxon) to assess the in vivo imaging quality.

C. Developing Robust Reconstruction for Brain Iron Mapping

It has been shown that the susceptibility reconstruction can be achieved by improving the condition of the inverse problem or by regularizing the solution with prior knowledge. The conditioning approach using multiple subject orientations was accurate for susceptibility imaging, but it is limited for human imaging because of the difficulties in rotating human in the scanner, and it requires a long scan time. The regularization approach has great potential for a wide range of human imaging. It does not require reorienting the subject in the magnet, making it applicable to general human imaging in a standard closed magnet. The image based regularization approach is accurate for susceptibility estimation and hence it is particularly promising for general clinical application. The regularization approach can be used to develop an optimized reconstruction for brain susceptibility imaging. We focus on the following techniques: including improvement of regularization term to achieve both accuracy and high image quality, and increase in computational speed. We use more reasonable regularization terms for a robust, accurate and fast brain iron mapping.

1. Improve the Sparsity Calculation for a Priori Knowledge Regularization

Our preliminary studies indicate that the L1 norm regularization is a reasonable formulation for sparsity in susceptibility images. We have identified that the solver is computationally slow and that the regression slope between susceptibility estimated using sparse regularization and known susceptibility deviates from unity. The cause of these issues is sparsity regularization. Here we propose to seek a better sparsity formulation.

(a) Efficient $L_{1.1}$ Norm

The $L_1$ norm is non-differentiable, making it difficult to use well known gradient descent optimization techniques for efficient reconstruction. If the p in the $L_p$ norm is slightly larger than 1, $L_p$ still closely approximates $L_1$ but becomes strictly convex and differentiable and can be solved efficiently using gradient descent methods. This differentiability eliminates the need to perform outer iterations to improve the log-barrier in $L_1$, achieving an expected speed up on the order of 10 times compared to the $L_1$ optimization problem. We propose to use p=1.1 and construct an iterative algorithm for susceptibility image reconstruction using the dual coordinate ascent method.

(b) $L_0$ Norm $L_0$ norm (number of nonzero voxels) minimization is a better sparsity formulation than the $L_1$ norm (Rubinstein, R Y., Methology and Computing in Applied Probability, 1999; 1:127-190). Indeed, the $L_1$ norm promotes sparsity because it is a convex approximation to the $L_0$ norm. Minimizing the $L_0$ norm directly is an NP (nondeterministic polynomial) hard problem known for lack of efficient algorithms. Recently, approximate techniques have been developed to minimize the $L_0$ norm efficiently. We use the cross entropy method and homotopy continuation based methods for $L_0$ norm minimization in susceptibility regularization.

$L_0$ norm is defined as $|x|_0 = \Sigma 1$ $(x \neq 0)$ and it can be approximated by a function with a parameter tuned close to zero homotopically, i.e. $\lim_{\sigma \to 0} \Sigma \rho(|x|, \sigma) \approx |x|_0$. Functions such as $\rho(|x|, \sigma) = \log(|x|/\sigma + 1)$ or $\rho(|x|, \sigma) = 1 - e^{-|x|/\sigma}$ can be used for the homotopic approximation of $L_0$-norm. The homotopic programming is to update the approximation function $\rho(|x|, \sigma)$ and reduce the parameter $\sigma$ by a factor (less than 1) from an initial value (for example 1 or 0.5). The forward problem (Equation 7) can be noted in matrix form as $\delta = D\chi$, with the dipole kernel forming elements for the matrix D. The homotopic $L_0$-norm regularization problem can then be formulated as:

$$\min_\chi E(\chi, \sigma, \lambda) = \lambda \|D\chi - \delta\|_2^2 + \Sigma \rho(|G\chi|, \sigma). \quad \text{(Equation 8-5)}$$

Here G is an operator such as gradient that promotes edge sparsity, and the expression in Equation 8-8 can be easily extended to include a weighting factor on the fidelity term. The derivative of E ( , $\sigma$, $\lambda$) is $$\Delta E = L(\chi, \sigma, \lambda) = 2D^H(D\chi - \delta) + \lambda G^H \Lambda(\chi, \sigma) G\chi, \quad \text{(Equation 8-6)}$$

where $(\bullet)^H$ denotes conjugate transpose and $\Lambda(\chi, \sigma)$ is a diagonal matrix, whose components are calculated as $\rho'(|G\chi|, \sigma)/|G\chi|$. A weak derivative is used here, e.g., $\rho(|x|) = |x|$, $\rho'(|x|) = \text{sign}(x)$. Then the solution of $\Delta E = 0$ is the solution to the minimization problem with given regularization parameter $\lambda$, which is $$(2D^H D + \lambda G^H \Lambda(\chi, \sigma) G)\chi = 2D^H \delta. \quad \text{(Equation 8-7)}$$

The above problem can be solved with the conjugate gradient method. The tuning parameter $\sigma$ is reduced by a factor (<1) during iterations. If $\rho(|x|) = |x|$, $L_0$ problem can be generalized to $L_1$ problem and it is more efficient than the $L_1$ problem solved using log-barrier method. If $\rho(|x|) = |x|_2^2$, the problem becomes an $L_2$ problem.

2. Improving Computation Speed with Parallelization or Graphics Cards

The regularized optimization problem can be reduced to a semi-definite program that can be parallelized. We use a high-performance computer cluster to reduce reconstruction times to minutes or seconds, short enough for use in practice. The major computation that must be performed is computing Fourier transforms of large data sets. Recently, general purpose computing environments have been developed for graphics cards, providing tremendous speed-ups for computing Fourier transforms, vector-vector multiplications, and other linear algebra computations. We implement the optimization code for a graphics card, resulting in savings in computation time at a low cost.

3. Experiment

We implement the regularized reconstruction using the efficient $L_{1.1}$ and $L_0$ norm for susceptibility imaging of the brain phantom. An optimized regularization can be identified to provide a regression slope with known susceptibilities close to unity, good image quality, and rapid reconstruction time by comparing with current $L_1$ norm. We will implement the optimization code on a graphics cards (NVIDIA Tesla Deskside GPU computing system) in a Dell T7400 workstation to measure achievable reconstruction time.

D. Anatomical Prior Based Reconstruction of Susceptibility Images

The $L_p$ norm regularization does not account for anatomical information available from magnitude images. Because there is obvious correlation between susceptibility images and T2* weighted magnitude images, this correlation may be used to improve the regularization.

1. Anatomical Region Segmentation and Edge Regularization

The anatomical information from the magnitude image is utilized in the piecewise constant model in our preliminary study to convert the ill-posed inverse problem into an overdetermined problem for robust susceptibility estimation. Both intensity values and intensity gradients may be used to segment regions in the brain to form regions of similar susceptibilities. This would allow estimation of average susceptibility or total amount of magnetic markers in a region. However, detailed image segmentation using many regions may become tedious in practice.

A more reasonable assumption is that edges in the T2* weighted magnitude image are at the same location as those in the susceptibility image. Accordingly, the regularization term can be formulated as the $L_p$ distance between the susceptibility edge image and the T2* weighted image edge. As in $L_p$ regularization formulation described herein, p=0, 1, and 1.1 will be investigated for identifying an effective regularization. This would be a more realistic regularization than simply forcing edges to be sparse, and a fast convergence would be achieved using the iterative solver. Two possible ways to express the similarity are, $$\chi(r) = \text{argmin}_{\chi(r)} [\Sigma_r |w(r)(\delta_b(r) - d(r) \otimes \chi(r))|^2 \alpha \|(g[\chi(r)]/\chi_m)(I_m/g[I(r)])\|_p], \quad \text{(Equation 8-8a)}$$

$$\chi(r) = \text{argmin}_{\chi(r)} [\Sigma_r |w(r)(\delta_b(r) - d(r) \otimes \chi(r))|^2 + \alpha \|g[\chi(r)]/\chi_m - g[I(r)]/I_m\|_p], \quad \text{(Equation 8-8b)}$$

where $g[I(r)]$ is the magnitude of the gradient vector of the magnitude image I at location r; $\chi_m$ and $I_m$ are the maximum (or median) of $\chi(r)$ and $I(r)$ used for scaling. Here in Equation 8-8a, a filter is used to assign $1/g[I(r)]$ to a maximum when $g[I(r)] < a$ threshold. We will compare the accuracy, image quality and computation cost for formulations in Equations 8-8a and 8-8b. It is also possible to include both magnitude and gradient information in the regularization terms, for example, $$\chi(r) = \text{argmin}_{\chi(r)} [\Sigma_r |w(r)(\delta_b(r) - d(r) \otimes \chi(r))|^2 + \alpha \|(\mathcal{S}[\chi(r)])\|_p \beta \|(g[\chi(r)]/g[I(r)])\|_p], \quad \text{(Equation 8-9a)}$$

$$\chi(r) = \text{argmin}_{\chi(r)} [\Sigma_r |w(r)(\delta_b(r) - d(r) \otimes \chi(r))|^2 + \alpha \|(\mathcal{S}[\chi(r)])\|_p \beta \|g[\chi(r)]/\chi_m - g[I(r)]/I_m\|_p], \quad \text{(Equation 8-9b)}$$

where $\mathcal{S}[\ ]$ is a segmentation operator as defined from the magnitude T2* image I(r). The preliminary feasibility test with a crude anatomical regularization in FIG. 30 showed the promise of accuracy susceptibility estimation. We expect this anatomic regularization approach will lead to an accurate robust inverse solution for susceptibility mapping.

2. Experiment

The anatomical region segmentation, the anatomical edge regularizations and other regularization terms can be implemented for quantitative susceptibility imaging of the brain phantom. Image quality, susceptibility quantification accuracy and computation time can be compared to identify the optimal regularization method.

(a) In vivo Experiment to Identify an Optimized Inverse Solution-Human Studies

The susceptibility reconstruction methods described above can be tested on a group of patients suspected of cerebral microbleeds. T2* imaging using the multiple gradient echo sequence can be performed. T2*, SWI and brain iron maps will be compared for identification of microbleeds and for image quality. With microbleeds prevalence above 50% in these groups of patients (180), n=20 provide sufficient statistical power for Wilcoxon signed rank test for image quality analysis.

(b) Black Dots Quantification-Imaging Isolated Dipoles

The approaches considered above may require fine-tuning for strong iron deposits localized within a single voxel. The point dipole phase model has been used to locate magnetic microparticle by phase cross-correlation. We propose a subvoxel treatment of the MR signal equation for precise point source estimation.

(c) Single Dipole Fitting

We use a low-order polynomial to account for slowly varying background inhomogeneity. The intravoxel dephasing depends on the dipole location within the source voxel, in addition to the product of the magnetic moment and echo time. Let $\delta_b(r_n,r_s)$ be the signal phase at a voxel centered at $r_n$ due to a dipole $m_s$ at location $r_s$. The dipole $m_s$ may then be found by searching over all $m_s$, $r_s$:

$$m_s = \mathrm{argmin}_{(ms,rs)} \Sigma_n |w_n[\delta_b(r_n,r_s)\pi\text{-phase}[\int d\mathbf{r} \phi(r-r_n) \exp[i(\gamma\mu_0 m_s TE/4\pi)(3\cos^2\theta-1)/|r-r_s|^3]]]|^2 \quad \text{(Equation 8-10)}$$

where $\phi(r)$ is the voxel basis function in MRI discretization, and $\tau=\omega_0 TE$. The integration in Equation 8-10 and the search step in $r_s$ need to be computed at a resolution much smaller than the scale of dipole field caused phase variation cycle (perhaps at voxel/100 digitization steps or to be evaluated in k-space. Equation 8-10 assumes the phase map is reconstructed with acceptable accuracy. The dipole field falls off rapidly according to $r^{-3}$, so only a small spherical region close to the source voxel contains significant information. In fitting the measured field to a single dipole field, both noise and intravoxel dephasing can be properly accounted for in the weighting factor $w_n$. The algorithm in Equation 7-10 may allow accurate magnetic moment quantification that is insensitive to dephasing non-linearities and the dipole location.

(d) Experiment

The algorithm of single dipole fitting will be tested on a gel phantom imbedded with large iron oxide microparticles (10 um size with known amount of iron per particle) from Bangs Laboratories (Fishers, I N). Care is taken not to introduce any air bubbles during gel phantom preparation. The magnetic microparticle phantom is imaged using methods described above. Phase maps are processed using Equation 7-10 to estimate the iron contents in dark dots in the magnitude images. MRI estimation of iron in particles will be compared with the known iron contents in particles using linear regression.

For feasibility test on patient data, the single dipole algorithm can be tested first for feasibility on patient data, and can then be validated for accuracy by correlating with histology on data acquired in the following approach.

E. The Developed Brain Iron Mapping Using Histological Correlation.

We perform the histological correlation using brain cadaver.

1. Materials

The brains of patients (n=11, t-test) at autopsy whose death cause include intracerebral hemorrhage (ICH) are investigated. At postmortem, the brains will be removed in total and fixed in 10% formaldehyde solution.

2. MRI Study

MRI imaging is performed using the pulse sequence described above. Iron mapping processing can be performed using the multiple orientation conditioning method and the various regularization methods. Isotropic 1 mm resolution data of the whole brain can be acquired. T2* images, their corresponding SWI images and iron maps can be analyzed independently by experienced neuroradiologists to identify the presence, location and size of all bleeds and microbleeds. Microbleeds are defined as focal areas of very low signal intensity with size less than 5 mm on T2* and SWI images, or focal areas of high intensity with size than 5 mm on iron maps. Location categories include lobar (cortical gray matter and subcortical white matter), deep (basal ganglia, thalamus, and corpus callosum), or infratenorial (brainstem and cerebellum). From the iron concentration maps, the maximal concentrations and the total iron contents of microbleeds and regions in large bleeds are measured.

3. Histological Study

Histological sections are performed after MRI. The cutting of the fixed specimen is guided by volumetric MRI views to obtain 1 mm thick sections in the desired orientation. Sections containing bleeds or microbleeds identified from MRI serve to prepare either gross hemispheric or selected microscopic sections. Sections are be stained with hematoxylin-eosin, Masson trichrome, the Kluver Barrera technique for myelin, Congo red for amyloid, and with iron. Iron staining are performed using the standard Perls-DAB method. All reactions can be carried out on free floating sections to ameliorate tissue penetration of reactives. Blockade of endogenous peroxydase activity will first be done by immersion in a methanol/$H_2O_2$ solution. Slices will then be treated with equal parts of freshly made, aqueous 2% potassium ferrocyanide and 2% hydrochloric acid for 20 min. Iron staining will finally be intensified using diaminobenzidine (DAB) as chromogen. Incubation in DAB, which will be monitored under the microscope to avoid strong background staining, will be the same duration for all brain slices. After staining, slices will be mounted, dehydrated, and cover-slipped for microscopic examination. All slides will be digitized under calibrated and constant illumination conditions, and quantification of iron staining intensities will performed using optical density (OD) analysis (349), which determines levels of iron deposition on the basis of transmitted light in the stained tissue. Analyses of OD will be automatically performed in different regions of bleeds or microbleeds identified from MRI. The optical density of each pixel will be derived from its gray level and mean iron load will be defined as the mean OD from all pixels of the ROI. For absolute iron quantities, OD will be calibrated using the following biochemical quantification.

Tissues from regions with bleeds or microbleeds identified on MRI or histological staining will be collected for further biochemical quantification. The tissue samples will be freeze-dried and weighed to obtain the dry weight. The dried brain samples will be digested in 200 L of ultrapure nitric acid at 65° C. for 24 hr. Each sample will be diluted in triplicate 1:100 in 1% nitric acid and analyzed by standard graphite furnace protocol on a Perkin Elmer atomic absorption spectrophotometer. The standard curve will be generated from serial dilutions of a calibrated external standard. Internal and external quality controls will be utilized in each batch of samples. The coefficient of variation (COV) for within-sample replicates is expected to be less than 3%.

4. Data Analysis

Both MRI and histology provide measurements for maximal iron concentration and total iron from each microbleed or bleed. T-test and linear regression can be performed to compare these iron measurements from MRI and histology at both voxel and region levels. Additionally, t-test and linear regression can be performed on the bleed and microbleed size measurements from T2*, corresponding SWI, iron maps, as well as histology. Kappa test can be performed to measure reader agreements.

F. Applying the Developed Brain Iron Mapping in Imaging Cerebral Microbleeds The data acquisition sequence and reconstruction methods developed herein can be validated for brain iron imaging in patients with cerebral microbleeds (CMB), also known as microhemorrhages or lacunar hemorrhages. CMB are radiographically defined as hypointensive regions smaller than 5 mm in diameter on T2* weighted gradient echo images, and intravoxel dephasing due to deposits of hemosiderin are regarded as the cause for hypointensity. Because the intravoxel dephasing is affected by many imaging parameters including pulse sequence type, voxel size, field strength, and phase mask (used in SWI), this radiographic definition for CMB is imprecise and confusing and may have contributed to inconsistencies in CMB based investigations and does not allow accurate quantitative description. We propose characterizing CMB using quantitative brain iron mapping, as developed herein. The iron quantity is independent of imaging parameters and can serve as a consistent measure for CMB.

Cerebral microbleeds (CMB) are prevalent in hemorrhagic stroke due to cerebral amyloid angiopathy or hypertensive vasculopathy. CMB may be potential markers for hemorrhage-prone states and cognitive impairments. Recent studies suggest that CMB are a risk factor for warfarin-related intracerebral hemorrhage (ICH). Use of warfarin to anticoagulate patients is an effective prevention of thromboembolic stroke. However, warfarin can cause catastrophic ICH, a complication that has quintupled in incidence over the past decade as warfarin use has become more widespread. We use the brain iron imaging to quantitatively access this risk factor for warfarin related ICH. It is assumed that iron quantity of CMB is a stronger predictor for ICH than the presence of CMB on T2* images for warfarin treated patients.

Two groups of subjects are included in this study: 1) Patients with ICH (ICH+) while on outpatient treatment with warfarin and 2) Patients without ICH (ICH−) while on outpatient treatment with warfarin. Patient groups will be matched for clinical characteristics. A total of 108 patients (36 ICH+ and 72 ICH−) will be enrolled in this clinical study during a 3.5 year recruitment period.

1. Inclusion/Exclusion Criteria

Consecutive patients with warfarin associated ICH are received during a 3.5 year recruitment period. ICH negative controls will be recruited during the study interval and matched to the ICH+ group for gender and clinical characteristics. For negative controls, we will recruit all patients referred for cardiac MRI that are maintained on warfarin in the absence of known clinical ICH. Patients with ICH in association with head trauma, ischemic stroke, CNS neoplasm, vascular malformation, or systemic vasculitis will be excluded from study participation. The standard MRI exclusion criteria will be applied to all targeted patients.

2. Clinical Characterizations

Comprehensive clinical data will be collected at the time of study enrollment. This will include clinical history of risk factors for ICH (Age, gender, hypertension, coronary artery disease, diabetes, hypercholesterolemia, smoking, previous CVA), clinical deficit as measured by the NIH Stroke Scale, size and location of the qualifying ICH, as well as antithrombotic therapy (aspirin, thienopyridines). Hypertension will be defined as present by clinical history or if antihypertensive therapy is required within 2 weeks of the onset of ICH. Coronary artery disease will be defined as present by history of coronary artery disease, angina, or myocardial infarction. Diabetes will be defined as present if the patient's fasting glucose level is ≥7.0 mmol/L or if the patient has taken a hypoglycemic agent. A diagnosis of hypercholesterolemia will be based on a history of hypercholesterolemia with medication or fasting serum cholesterol level >6.2 mmol/L. A history of smoking will be defined as present if the subject is a current smoker or an ex-smoker who have quit smoking within 5 years of admission. Indications of warfarin will include atrial fibrillation, valvular heart disease, undetermined causes, and other-determined causes. The prothrombin time (PT)-international normalized ratio (INR) will be obtained from values recorded on presentation.

3. MRI Data Acquisition and Image Interpretation

All subjects will be imaged on a 3T MR scanner using the method developed herein. All ICH+ patients will be imaged within 30 days of the ICH. Multiple echo T2* 3D gradient echo imaging will be performed using approximately the following parameters: 50 ms/TR, multiple echoes with $45/msTE_{max}$, 30° flip angle, 256×192×32 matrix, 1 mm slice thickness. Images will be acquired at head neutral position and left right rotations whenever patients can comply. Standard T2-weighted fluid attenuated inversion recovery imaging will also be included. The T2* multiple echo imaging data will generate iron maps, standard T2* magnitude images and their phase masked SWI images for analysis.

Iron maps for final data analysis will be reconstructed using the optimized method developed and validated in years 4 and 5. Three experienced neuroradiologists will independently rate the presence, location, size and number of all CMB from T2* images and corresponding SWI images. In addition to radiographic impression for CMB, we investigate a precise definition of CMB as focal areas of very low signal intensity that is <60% of surrounding intensity, with size less than 5 mm with border defined such that border intensity is <90% surrounding intensity. CMB will be categorized according to cerebral locations including lobar (cortical gray matter and subcortical white matter), deep (basal ganglia, thalamus, and corpus callosum), or infratenorial (brainstem and cerebellum). Signal voids caused by sulcal vessels, symmetric calcifications in the deep gray matter, choroid plexus calcifications, pineal calcifications, and signal averaging from bone will be noted. CMB surrounding the symptomatic ICH lesion will also be noted. Iron maps will be similarly interpreted by the three radiologists for CMB presence, location, size, and number. We also investigate a precise definition of CMB iron maps as focal areas of bright signal intensity with size less than 5 mm such that border intensity is 2× surrounding background intensity. From the iron concentration maps, the total iron content (sum over the CMB region) of each microbleed will also be recorded.

4. Statistical Analysis

All statistical calculations will be performed with standard statistical software (SPSS, Chicago, Ill.). All numerical measurements (CMB size and number from T2*, SWI, and susceptibility maps, iron content from susceptibility maps) will be organized with summary statistics (mean, standard deviation and range). Kappa test will be performed to analyze reader agreements. The chi square test, the Wilcoxon sum rank test, and the t-test will be performed to assess differences in measurements between the two warfarin patient groups with and without ICH. The Pearson and Spearman correlation analysis will be performed between CMB measurements and the presence of warfarin-related ICH. All MRI measurements and clinical characterizations from all patients will be input into the logistic regression analysis to estimate the predictive risk factor for ulceration (regression coefficients).

Test hypothesis that CMB iron content is a stronger predictor for ICH than the presence of CMB on T2* images, we perform logistic regression three times 1) on CMB size and number measurements from T2* images, 2) on CMB size and number measurements from SWI images, and 3) on iron content from susceptibility maps. The best regression significance will correspond to the strongest ICH risk factor. We further compare with the logistic regression that includes all measurements.

5. Sample Size Justification

A sufficient number of patients is needed to provide adequate power for statistical analysis. The logistic regression analysis requires n=107 patients at power=0.9, significance level=0.05, prevalence of no ICH=0.66 (352, 353). This total number of patients provides strong power for Pearson's correlation test, which only requires a sample size of n=10 for statistical power 0.90 at significance level 0.05 for detecting expected correlation at r ~0.8 (304). Patients are segmented into 2 groups: with and without ICH. The unpaired t-test α=0.05 for 90% confidence in testing one noise-level difference among these groups requires a sample size of 22 (303). Accordingly we select 36 patients for ICH+ group and 72 patients for the ICH− group.

6. Data Management

We have established a relational database using Microsoft Access. Information entered into this database includes the patient's clinical number, brief clinical history; MR examination number, date, and pulse sequence; optical storage disk number and image database in our research PACS; and image analysis result. We will use this database as a template for the data management. Random and logical checking of the data can be performed to further assure data quality.

IX. Details of General Regularization

A. Linear Regularization

1. Susceptibility and Magnetic Field

In a gradient echo sequence, the magnetic field component B=ϕ/γTE along the main magnetic field $\vec{B}_0$ is measured on the MR signal phase ϕ, where γ is the gyromagnetic ratio and TE the echo time. It can be shown from Maxwell's magnetostatic equations that, for a given arbitrary susceptibility distribution $\chi(\vec{r})$, where $\vec{r}$ refers to the vector position, the frequency shift has to fulfill the following partial differential equation (Salomir et al., *Concept Magn Reson B*, 19B (1): 26-34 (2004); Marques et al., *Concept Magn Reson B*, 25B (1): 65-78 (2005); Koch et al., *Phys Med Biol*, 51 (24): 6381-6402 (2006)):

$$\Delta B = B_0 \left( \frac{\Delta \chi}{3} - \frac{\partial^2 \chi}{\partial z^2} \right), \quad \text{(Equation 1-1)}$$

where Δ denotes the Laplace operator and z the coordinates along $\vec{B}_0$. Solutions of the following form can obtained (Jackson in *Classical Electrodynamics* (Third edition) (John Wiley and Sons, Inc., 1999)):

$$\delta B(\vec{r}) = \delta(\vec{r}) B_0 \quad \text{(Equation 1-2)}$$
$$= B_0 \int_{\vec{r}' \neq \vec{r}} \chi(\vec{r}') \frac{3\cos^2(\theta_{rr'}) - 1}{4\pi |\vec{r}' - \vec{r}|^3} d^3 r'$$
$$= B_0 (\chi \otimes d)(\vec{r}),$$

where δ are the normalized field shifts, and $\theta_{rr'}$ the angle between $\vec{B}_0$ and $\vec{r}' - \vec{r}$. $\delta B(\vec{r})$ denotes the induced shift with respect to $B_0$. As can be seen from Equation 1-2, the shift is proportional to the convolution (denoted by ⊗) of the susceptibility distribution with the field component along $\vec{B}_0$ of a unit magnetic dipole $d(\vec{r}) = (3\cos^2(\theta) - 1)/4\pi |\vec{r}|^3$ where θ is the angle between $\vec{B}_0$ and $\vec{r}$. The non-local relationship in space becomes a point-wise multiplication in Fourier domain (Salomir et al., supra; Marques et al., supra; Koch et al., supra):

$$F(\delta) = F(\chi) \times \left( \frac{1}{3} - \frac{k_z^2}{k^2} \right) = F(\chi) \times F(d), \quad \text{(Equation 1-3)}$$

where F denotes the Fourier transform. This relationship corresponds to the usual transformation of the spatial derivation operators in Equation 1-1 to multiplications in Fourier domain. However, this relationship is not defined for k=0 and to adequately set boundary conditions, one can choose a solution that vanishes at infinity which is obtained by setting the Fourier transform of the field to 0 for k=0 (Salomir et al., supra; Marques et al., supra; Koch et al., supra).

According to one embodiment, a voxel at location $\vec{r}$ can be considered as a small magnetic dipole with a given strength $\chi(\vec{r})$. The resulting frequency at one specific voxel is the sum of the field shift induced by all voxels. This can be written in a matrix form:

$$\delta = CX, \quad \text{(Equation 1-4)}$$

for which δ refers to a column vector with the normalized field shift, X the matrix containing the susceptibilities and C is the convolution matrix obtained by discretizing the convolution kernel $d(\vec{r})$. As a magnetic dipole field is non-zero over a wide region, the matrix C is a dense matrix. However, multiplication with the matrix C can be simplified by going to the Fourier domain:

$$C = F^{-1} DF, \quad \text{(Equation 1-5)}$$

where F is the Fourier transform matrix, and D a diagonal matrix with the terms F(d) in Equation 1-3. This relationship provides a fast way to compute the field created by an arbitrary susceptibility distribution.

2. Problem Formulation

The calculation of the susceptibility from the measured field shift δB involves the inversion of Equation 1-4. However, the matrix C is not directly invertible because of zero elements at the magic angle ~55°. Even if care is taken in the discretization to avoid the points where $k^2 = 3k_z^2$ (6), the fact that C still has many small eigenvalues leads to an ill-conditioned problem with severe noise propagation.

According to a further embodiment, where the Gaussian nature of noise is considered in the MR signal, the maximum likelihood solution for the susceptibility map can be derived from the following quadratic minimization:

$$\min_X \|CX - \delta\|_2^2. \quad \text{(Equation 1-6)}$$

However, the ill-conditioning of this inverse problem means that the minimum in the above equation is not well defined. Furthermore, the measured field comes from a phase measurement and its associate noise variance is not uniform over space. It is usually considered Gaussian with zero mean and a variance inversely proportional to the signal magnitude.

In order to account for inhomogeneous noise variance, the following weighted least-squares minimization problem can be considered:

$$\min_X \|W(CX - \delta)\|_2^2, \quad \text{(Equation 1-7)}$$

where W is a weighting matrix which is diagonal in the case of uncorrelated Gaussian noise in MR signal. It contains the inverse of the standard deviation for each measurement point. Note that $W^{-2}$ is the measurement noise correlation matrix. This minimization problem is statistically the best combination given the measurements. However, weighted least-squares further reduce the conditioning of the matrix and the searchability of the minimum.

3. Linear Regularized Approach

According to an alternative embodiment, prior information can be used to identify a meaningful solution to the inverse problem. This information can be formulated using Bayesian statistics as an a priori probability for the likelihood estimation of the inverse solution. Expressing this a priori probability as an exponential energy function, the maximum likelihood solution for susceptibility amounts to adding a regularization term to the minimization problem in Equation 1-7. According to a further embodiment, a linear regularization such as the Tikhonov regularization is utilized as follows:

$$\min_x \|W(CX-\delta)\|_2^2 + \alpha\|LX\|_2^2, \quad \text{(Equation 1-8)}$$

where L is a linear operator and $\alpha$ an associated regularization parameter. The addition of the regularization term enforces solutions that are partially consistent with the acquired data and whose transformation under L have minimal norm. This form has the advantage of being quadratic and can be solved efficiently with adapted numerical methods.

Alternatively, the minimization problem is applied to impose spatial priors similar to boundary conditions. Specifically, the equation can be written as:

$$\min_x \|W(CX-\delta)\|_2^2 + \alpha^2\|W_0 X\|_2^2 + \beta^2\|W_1 GX\|_2^2, \quad \text{(Equation 1-9)}$$

The first term is the usual term that ensures fidelity to the acquired data in the least-squares sense.

In the second term, the matrix $W_0$ denotes a weighting function applied to the solution; similar to the weighting matrix in the first term, it is diagonal. If $W_0$ is a mask that is equal to one in a given region where the susceptibility is known a priori to be homogeneous, it enforces the uniform zero solution (sparse susceptibility source). In solving the partial differential equation as described here, this is similar to implicitly imposing Dirichlet-like boundary conditions. The relative influence of this term is controlled with the parameter $\alpha$. If $W_0$ is the identity matrix, this corresponds to standard Tikhonov regularization seeking a solution with a small norm $\|X\|_2$.

The last term similarly imposes Neumann-like boundary conditions, i.e., on the gradient of the solution. The matrix $$g = \begin{bmatrix} G_x \\ G_y \\ G_z \end{bmatrix}$$

denotes the gradient operator in the 3 directions and $\beta$ is the associated regularization parameter. Similar to the weighting matrix in the first term in Equation 1-9, $W_1 = [W_{1x} \ W_{1y} \ W_{1z}]$ in which each sub-matrix is a diagonal weighting matrix added to enforce the solution to be smooth in given regions and varying at specific locations. Typically, as described below, this weighting matrix will be derived from the MR signal magnitude to pick up a solution whose gradients match those of the MR magnitude image. If each sub-matrix in $W_1$ is the identity matrix, it corresponds to enforcing a uniform zero gradient solution (sparse gradient $\|GX\|_2$).

4. Inversion Implementation and Parameter Selection

All data were processed using Matlab (2007a, The Mathworks). In practice, the inversion problem can be very large. For example for a $64^3$ imaging matrix, the associated matrices have $64^6$ elements, a prohibitive size for any direct inversion. As the problem simplified to the minimum of a quadratic form, numerical methods may be employed to solve the problem iteratively. Equation 1-9 is expressed equivalently in the matrix form by writing the norm explicitly and by calculating its derivative with respect to the solution vector and setting it to zero to find the minimum of the quadratic form:

$$C^*W^*WC\chi + \alpha^2 W_0^* W_0 \chi + \beta^2 G^* W_1^* W_1 G\chi = C^*W^*W\delta, \quad \text{(Equation 1-10)}$$

In which $A^*$ denotes the Hermitian transpose of matrix A. If the left hand side term can be calculated efficiently, then the conjugate gradient (CG) algorithm provides a numerical method to invert the problem and find the solution of Equation 1-9, leading to a susceptibility map extracted from the phase information and subject to the proposed additional priors. In the implementation of the CG loop here, no matrix was formed explicitly. By noting that $C^*=C$, the initial calculation of $C^*W^*W\delta$ was performed by multiplying each measured shift $\delta$ by the square of the weighting matrix, and by applying the algorithm of Equation 1-5. For each iteration, $C^*W^*WC$ applied to the search direction was calculated similarly. Both regularized terms $W_0^*W_0$ and $G^*W_1 W_1 G$ applied to the search direction were calculated as fast vector multiplications. The gradient was calculated by convoluting with the mask $[-1/dx \ 1/dx]$, where dx denotes the pixel size in the X dimension, and similarly in other directions.

To determine a suitable range of parameters, inversion was performed for parameters starting at a large value $10^1$ and reducing by a multiplicative factor of $10^{-0.25}$. The squared norm of the residual $\|W(CX-\delta)\|_2^2$ was calculated for each regularized solution. The scanning of regularization parameters was ended when the squared norm of the residual reached a value equal to 10% of the expected noise variance ($\sim N \times (1/B_0 \gamma TE)^2$, where N is the total number of voxels). This range covers the whole spectrum of solutions: from an over-regularized solution (for the parameter equal to $10^1$) down to an under-regularized solution (parameters for which the residual is 10% of the expected noise variance). The parameter for which the squared norm of the residual matched the expected variance will be referred to as the matched-noise parameter. For each parameter, the stop criterion was that the norm of the residual in the CG loop was smaller than $10^{-3}$ times the norm of the projected data $C^*W^*W\delta$. The previous solution was used as a starting point with an initial solution at 0.

This quantitative susceptibility imaging method was evaluated in vitro on phantom data and in vivo on brain images to measure brain susceptibility in hemorrhagic patients as described in the Experiment section.

B. Nonlinear Regularization Approach

The reference numerals in this section reference to a list of complete citations of references set forth in a bibliography at the end of this section.

The ability to accurately estimate magnetic susceptibilities from MRI data has a number of potential applications. Many tissues possess susceptibilities that differ from their surrounds. For example, calcium salts possess negative susceptibility relative to water, so accurate estimation of the susceptibility in calcified bone could provide a measure of bone mineral density [1]. Being able to accurately measure bone tissue properties would be novel for MRI because calcified bone water has a very short transverse relaxation time (<1 ms) [2], appearing as a dark region in the image.

Considerable interest has developed in tracking labeled cells with MRI [3]-[5]. Iron labeled cells typically appear as dark regions because of strong T2* effects, and iron quantity is difficult to assess from such images. If the iron concentration can be accurately quantified from estimated susceptibility distributions, it could allow accurate assessment of the number of labeled cells in a region. This is potentially useful for stem cell therapies, where susceptibility quantification could be used to monitor cell placement and division [6].

A number of previous techniques have addressed quantification of magnetic susceptibility from MR images [7]-[17]. Several of these techniques require geometrical assumptions about the susceptibility distribution of interest [7]-[10], or have been limited in that they assume regions of uniform susceptibility situated in a background with uniform susceptibility [11], [12]. Another technique allowed arbitrary susceptibility distributions [13] but required that the voxels analyzed be selected before quantification. These techniques yield good results because they use powerful forms of prior knowledge. However, the information provided by these priors must be accurate, or incorrect results will be produced. In many imaging situations, these priors may not be applicable. Another technique has been developed to estimate the susceptibility of every voxel without prior information, but requires that the object be imaged in multiple orientations [14], [15]. Application of this technique in human imaging would be challenging because of the difficulty of rotating the subject in an MRI scanner.

Recent work has attempted to devise an inversion scheme to estimate the susceptibility of each voxel in an imaging volume from data acquired at a single orientation [16], [17]. We explore the problem in more detail, showing that inversion of the ill-conditioned system can be stabilized using standard Tikhonov regularization as well as nonlinear regularization based on the l1 norm. A primary problem with Tikhonov regularization for this problem is excessive streaking artifacts in background regions of uniform susceptibility. In cases in which the susceptibility distribution being estimated is sparse, the l1 based regularization technique yields better suppression of background noise and streaking artifacts.

1. Magnetic Susceptibility

The relationship between the magnetic field experienced by a water proton spin that generates MR signal and the material susceptibility is determined by the Maxwell equation of static magnetism with the Lorentz sphere correction [18], [19]. In the forward problem of estimating the field variation given a susceptibility distribution for which $\chi \ll 1$ as encountered in MRI B0 fields, the susceptibility distribution is convolved with the response of a dipole, as $$\Delta B_z(r) = \frac{1}{4\pi} \int \chi(r') \frac{3\cos^2\theta - 1}{|r' - r|^3} d^3 r' \qquad \text{(Equation 4-1)}$$

where is the spatial susceptibility distribution, r is the spatial coordinate vector, and $\theta$ is the angle between r'–r and the applied field [13]. $\Delta B_z$ is the relative field shift, given by $$\Delta B_z(r) = \frac{B_{meas}(r) - B_0}{B_0} \qquad \text{(Equation 4-2)}$$

where $B_{meas}$ is the measured magnetic field and $B_0$ is the applied field. In Fourier space, this operation becomes pointwise multiplication with a kernel [19], [20]

$$\Delta B_z(r) = \mathcal{F}^{-1}\left(\left(\frac{1}{3} - \frac{k_z^2}{k^2}\right)\mathcal{F}(\chi)\right) \qquad \text{(Equation 4-3)}$$

where $k^2 = k_x^2 + k_y^2 + k_z^2$

The value of this function at the k-space origin is undefined and was taken to be zero in the simulations performed here. Note that (Equation 4-1) does not incorporate the sphere of Lorentz correction. Fourier transformation of (Equation 4-1) does not converge as r'–r goes to zero so a Cauchy limit must be used in evaluation of the integral, which is equivalent to the sphere of Lorentz correction. In all of the computations here, (Equation 4-3) was used so the sphere of Lorentz is accounted for.

It has been suggested that the susceptibility distribution can be recovered using the inverse of the kernel [21], [22]

$$\chi(r) = \mathcal{F}^{-1}\left(\left(\frac{1}{3} - \frac{k_z^2}{k^2}\right)^{-1} \mathcal{F}(\Delta B_z)\right). \qquad \text{(Equation 4-4)}$$

However, this problem is ill-posed because of the zeros in the k-space filter (i.e. points where $k^2 = 3k_z^2$, the "magic angle"). Once this problem is discretized it is no longer ill-posed because the sample points can be chosen to avoid the zeros of the filter [22]. However, the resulting discrete problem will be ill-conditioned [23], resulting in severe noise amplification. The effects of this noise amplification on direct estimation of magnetic susceptibility from MRI data have been shown in [14].

2. Regularization

The discrete forward system can be written as $$C\chi = \psi \qquad \text{(Equation 4-5)}$$

where $\chi$ is the vector representation of the discretized susceptibility distribution, $\psi$ is the vector representation of the sampled field map, and C is the matrix representation of convolution with the dipole response.

The discrete problem (Equation 4-5) can be formulated in terms of a least squares problem $$\min_{\chi} \|C\chi - \psi\|_2^2 \qquad \text{(Equation 4-6)}$$

where $\|y\|_2 = \sqrt{y^T y}$. Reliable field information may not be available at all points in an image, but a weighting term can be added to compensate for nonuniform noise properties. Consider the diagonal matrix W which has elements equal to the inverse of the standard deviation of the estimated field map.

The least squares problem becomes $$\min_{\chi} \|W(C\chi - \psi)\|_2^2. \qquad \text{(Equation 4-7)}$$

3. Tikhonov Regularization

A standard approach to applying prior knowledge to invert ill-conditioned systems is regularization, such as Tikhonov regularization. Given the standard least squares problem as defined in (Equation 4-7), the Tikhonov regularized version is given by $$\min_{\chi} \|W(C\chi - \psi)\|_2^2 + \lambda \|\chi\|_2^2 \qquad \text{(Equation 4-8)}$$

where $\lambda$ is a tunable regularization parameter. The solution can be found by searching for the zero of the gradient of the normal equation, $$(C^T W^T W C + \lambda I)\chi = C^T W^T W \psi. \qquad \text{(Equation 4-9)}$$

This can be solved using standard linear systems techniques.

The solution to the minimization problem given by (Equation 4-8) is the vector $\chi$ which has the smallest l2 norm of vectors close to satisfying the system (Equation 4-7). The cones of zero values in the k-space dipole response [14] are comparable to undersampling k-space, and can produce streaking artifacts similar to undersampled non-Cartesian imaging. Parseval's theorem states that energy in Fourier space is equal to energy in image space, so the minimum l2 solution fills these underampled regions with zero values and can be thought of as akin to zero-filled image reconstruction.

4. l1 Regularization

The l1 norm tends to promote sparsity in the values of the voxels rather than minimum energy. It has been used for deconvolution of seismogram data to find sparse changes in density of the earth's crust [24] and for sparse decomposition and approximation of signals (often referred to as basis pursuit) [25]. The l1 norm is also used by compressed sensing techniques [26], [27], and this application supplies the motivation for use of the l1 norm for regularization of susceptibility inversion.

Here we consider regularization using the l1 norm of the susceptibility distribution by solving the problem $$\min_{\chi} \|W(C\chi - \psi)\|_2^2 + \lambda \|\chi\|_1. \qquad \text{(Equation 4-10)}$$

where $\_y l1 = \_i |y i|$. We hypothesize that this formulation will work well for estimating susceptibility distributions with a small number of voxels having large susceptibilities, e.g. imaging distributions of cells that have been labeled with iron oxide particles.

5. Determination of Regularization Parameters

One question in regularized inversion techniques is how to choose an appropriate regularization parameter $\lambda$. A choice with a simple statistical justification is to recognize that the term $\|W(C\chi - \psi)\|_2^2$ is closely related to the variance of the acquired data. Given knowledge of the noise variance of the estimated frequency map, a certain deviation from the acquired data is expected when the frequency map is computed from the estimated susceptibility distribution. Thus, (Equation 4-8) and (Equation 4-10) can be viewed as Lagrange multiplier solutions of the system $$\min_{\chi} \|\chi\|_p^p$$

$$\text{s.t. } \|W(C\chi - \psi)\|_2 = \frac{1}{\omega_{cf}} \sqrt{\sum_i W_{ii}^2 \sigma^2(\omega_i)} \qquad \text{(Equation 4-11)}$$

for the appropriate norm $p \in \{1, 2\}$, where $\omega_{cf}$ is the center frequency of the magnet. A closed form for the regularization parameter satisfying (Equation 4-11) is not known. However, reconstructions can be performed over a range of regularization parameters, and the parameter yielding the solution closest to satisfying (Equation 4-11) can be selected as the desired regularization parameter.

6. Field Map Computation (a) Frequency Fitting & Weight Determination

1) Multiple Echoes: To estimate the frequency map, the phase of each voxel across multiple TEs is first unwrapped by removing jumps larger than $\pm\pi$. The phases are then fit using weighted linear regression to yield the off-resonance frequency at each voxel. The variance of a phase image can be estimated from the variance of the complex MRI image ($\rho$) [28] as $$\sigma(\phi) = \frac{\sigma(\text{Re}\{\rho\})}{|\rho|} \qquad \text{(Equation 4-12)}$$

on a voxel by voxel basis, assuming $\sigma^2(\text{Re}\{\rho\}) = \sigma^2(\text{Im}\{\rho\})$. Weighting the linear regression by the phase noise variances, the resonance frequency $\omega$ of a voxel is given by $$\omega = \frac{(\Sigma|\rho_i|^2)(\Sigma|\rho_i|^2 t_i \phi_i) - (\Sigma|\rho_i|^2 t_i)(\Sigma|\rho_i|^2 \phi_i)}{(\Sigma|\rho_i|^2)(\Sigma|\rho_i|^2 t_i^2) - (\Sigma|\rho_i|^2 t_i)^2} \qquad \text{(Equation 4-13)}$$

where $\rho_i$ and $\phi_i$ are the magnitude and phase of the voxel at the ith time point, respectively, and $t_i$ is the time of the $i^{th}$ time point. The variance of the estimated frequency [29] is $$\sigma^2(\omega) = \frac{\Sigma \frac{1}{\sigma^2(\phi_i)}}{\left(\Sigma \frac{1}{\sigma^2(\phi_i)}\right)\left(\Sigma \frac{t_i^2}{\sigma^2(\phi_i)}\right) - \left(\Sigma \frac{t_i}{\sigma^2(\phi_i)}\right)^2} \qquad \text{(Equation 4-14)}$$

for each voxel in the fit frequency map.

2) Single Echo: In some cases it is not possible to acquire multiple echoes due to constraints on total acquisition time. In this situation, the phase is assumed to be 0 at the center of the RF pulse (i.e. at TE=0) and the equation for determining the frequency then becomes $$\omega = \frac{\phi}{TE}. \qquad \text{(Equation 4-15)}$$

The corresponding variance is given by $$\sigma^2(\omega) = \frac{\sigma^2(\phi)}{TE^2}. \qquad \text{(Equation 4-16)}$$

The primary difficulty in this situation is phase wrapping due to large off-resonance frequencies. One way to address wrapping is to employ a spatial unwrapping algorithm [28], [30]-[35]. The single echo images shown here were unwrapped using the phase unwrapping algorithm in [35].

(b) Background Field Removal

Main field inhomogeneity contributes to spatial frequency variations in MRI which must be removed to estimate susceptibility distributions. Two techniques were employed to remove main field inhomogeneity in different imaging situations.

1) Background Field Subtraction: One way to cope with background field inhomogeneity is to derive frequency maps relative to a reference phantom [36]. Given a frequency in the reference phantom $\omega_{ref}$ and in the susceptibility distribution of interest $\omega_{obj}$, the relative field shift is $$\psi_{rel} = \frac{\omega_{obj} - \omega_{ref}}{\omega_{cf}} \quad \text{(Equation 4-17)}$$

where $\psi_{rel}$ is the relative field shift and $\omega_{cf}$ is the center frequency of the magnet.

2) High Pass Filtering: When images from a reference phantom are not available, a high pass filter can remove background field inhomogeneity. A simple high pass filter, described by $$\psi_{rel}(x) = \frac{\omega_{obj}(x) - \frac{\sum_{y \in S_x} W^2(y)\omega_{obj}(y)}{\sum_{y \in S_x} W^2(y)}}{\omega_{cf}} \quad \text{(Equation 4-18)}$$

was implemented, where $S_x$ represents a spherical shell surrounding the voxel x, and $W^2(y)=1/|\rho|^2$. $\omega_{obj}(y)$ was taken to be zero outside of the imaged volume.

7. Solver Implementations

For reasonably sized images, the systems which must be inverted become prohibitively large, requiring hundreds of gigabytes of memory if formed explicitly [16]. However, the forward system can be repeatedly applied to a residual vector to provide updates to an estimated solution. This can be performed quickly because the forward system consists primarily of a convolution, requiring O(n log(n)) operations for an image with n voxels if performed using fast Fourier transforms. The images and convolution kernels must be padded to ensure that standard convolution is performed rather than circular convolution when using Fourier transforms [37]. In the present case, an M×N×P image was convolved with an 2M×2N×2P kernel, so that both the image and the dipole function were padded to 3M×3N×3P.

For the l2 based regularization, the popular conjugate gradients method can be used, as in [16]. For the l1 regularization scheme, the standard conjugate gradients algorithm cannot be used so we employ a log barrier interior point method [38], [39] whose details are described in the Appendix set forth herein after.

8. Experiments & Results (a) A. Numerical Phantom

A numerical phantom consisting of a 32×32×16 image with 2048 randomly selected voxels having susceptibilities drawn from a uniform random distribution between −16 ppm and 16 ppm was used to evaluate the feasibility of the techniques. The image intensities assigned to each voxel ($\rho_i$) with non-zero susceptibility and its 26-connected neighbors were 0.4, and the intensities of all other voxels were set to 1. The field map was calculated by numerical convolution with the dipole response. Zero mean Gaussian noise with a standard deviation of $0.02/\rho_i$ ppm was added to the field map before inversion.

Both regularization techniques were used to estimate susceptibilities from the noisy field map in FIG. 60. Neither technique produces the characteristic L shape (FIGS. 60A and 60B), making the L-curve method for determining the regularization parameter uninformative [40]. FIGS. 60C and 60D plot the slope of a line fit to the estimated vs. true susceptibilities as the regularization parameter is varied. FIG. 60E shows the true image, the noisy field map, and the images reconstructed by each inversion technique. Large regularization parameters produce a low slope and attenuate the susceptibility distribution, while small regularization parameters produce a slope near unity with higher background noise. The best regularization parameters were determined based on the noise variance of the field map. The images corresponding to these regularization parameters are outlined in black in FIG. 60E.

(b) Phantom Images

A conventional laser printer can generate susceptibility distributions with iron oxide because toner contains magnetite ($Fe_3O_4$) [41], [42]. A phantom with dots of {2, 4, 6, 9, 12, 16, 20, 25, 30} pixels at 300 dots per inch was printed using an HP LaserJet 4050 N laser printer. It was assumed the susceptibility of the paper was negligible and that the total quantity of iron varies linearly with the number of pixels in each dot. The paper was suspended in a water filled container and imaged in a 1.5T GE Excite MR scanner using an interleaved multi-echo gradient echo pulse sequence and a single channel extremity coil. Pulse sequence parameters were matrix size=96 96 24, voxel size 1 mm isotropic, flip angle=30°, receiver bandwidth=62.5 KHz, 16 echos, TE1=1.8 ms, ΔTE=0.5 ms, TR=50 ms. The magnetic field was oriented along the readout direction. For susceptibility estimation, a 48 48 16 voxel region in the center of the phantom containing the printed dots was selected. The field inhomogeneity map was filtered using a kernel with a diameter of 11 voxels. Results for the printed dots phantom are shown in FIG. 61. While the estimated susceptibility distributions are not localized to single voxels, the total magnetization estimated for each dot is expected to match the iron content of the dot. Thus, the integral of susceptibility over a region surrounding each dot is plotted against dot size in FIG. 61A. The regularization parameters used for display and analysis were determined from the noise variance criteria (l2: $\lambda=10^{-5.7}$, l1: $\lambda=10^{-7.9}$). Both techniques result in approximately linear results, with the l1 regularization producing a higher slope. This is expected based on the results of the numerical phantoms.

To quantify the performance of the proposed techniques, phantom scans were performed using varying amounts of gadopentetate dimeglumine. Gd has a known susceptibility [43], [44], so the relative susceptibility change produced by varying the concentration of Gd in a phantom can be estimated. A phantom was constructed using a Petri dish with seven segments of soda straw approximately 8 mm in length glued vertically in the dish. The Petri dish and straws were first filled with water and imaged using a five inch surface coil to provide a reference image. The water was then removed from each straw and replaced by {1%, 2%, 3%, 4%, 5%, 6%, 7%} dilutions of a 0.5 M Gd solution (Magnevist, Berlex). The scan was repeated with identical shimming, positioning, and pulse sequence parameters. Pulse sequence parameters were matrix size=128 128 16, voxel size 0.75 0.75 1 mm, flip angle=30°, receiver bandwidth=62.5 KHz, 5 echos, TE1=1.6 ms, ΔTE=0.5 ms, TR=50 ms. The magnetic field was oriented along the phase encode direction.

Figure 62A:
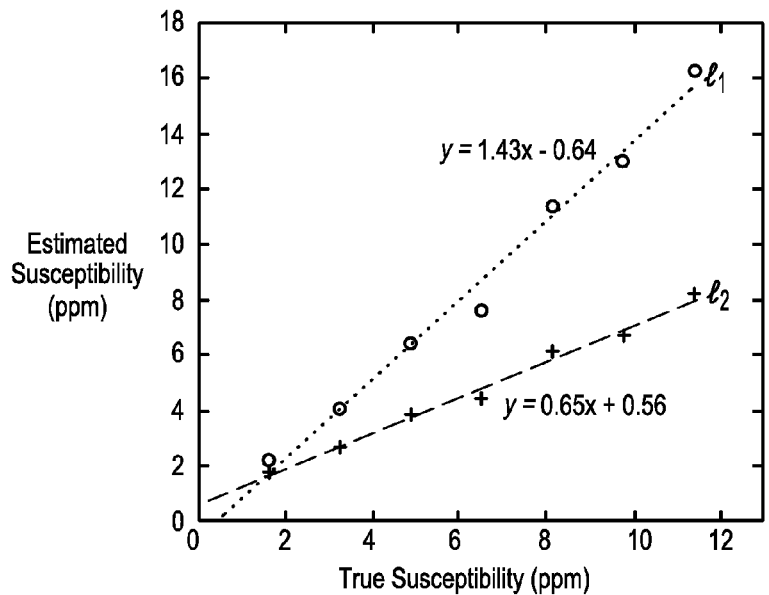
Figure 62B:
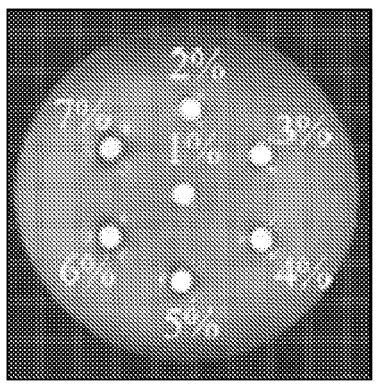
Figure 62C:
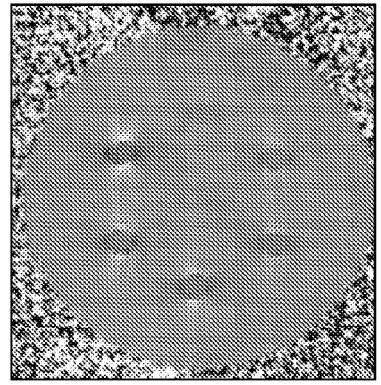
Figure 62D:
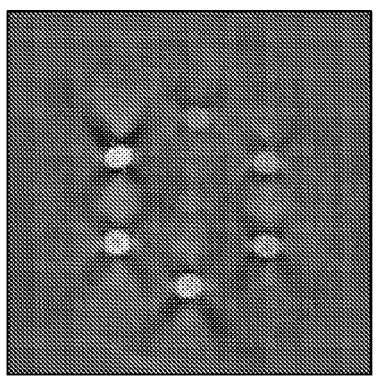
Figure 62E:
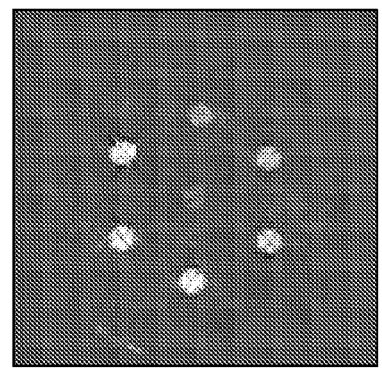
Figure 64A:
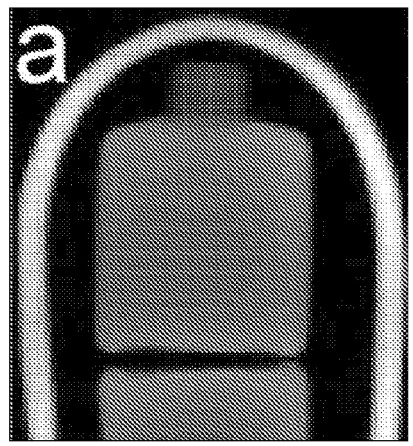
Figure 64B:
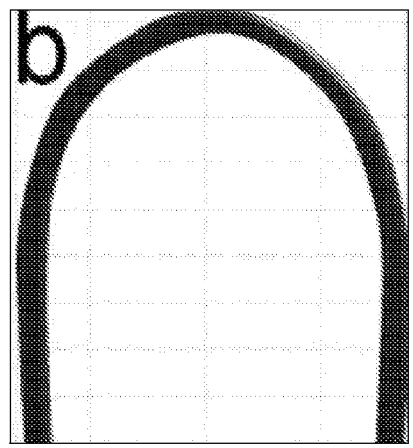
Figure 64C:
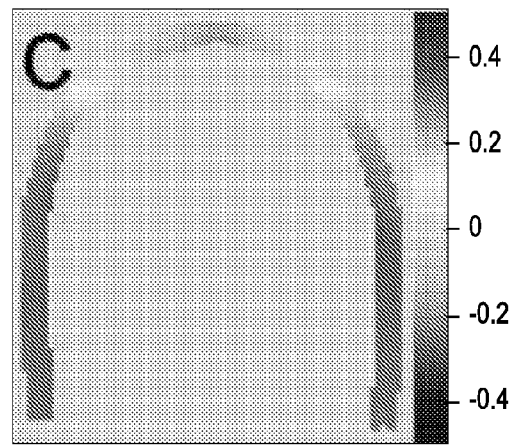
Figure 64D:
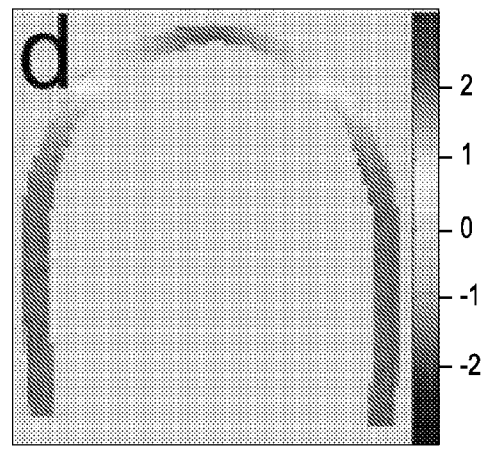

Using the first 3 echos to estimate the field inhomongeneity map, the l2 norm produces an estimated susceptibility distribution with noticeable streaking artifacts (FIG. 62D), while the streaking artifacts in the l1 reconstruction are greatly diminished (FIG. 62E). The estimated susceptibility in each tube was averaged over a region of interest within the tube spanning multiple slices. The l2 distribution produces a fit with a slope of 0.65, while the l1 norm produces a slope of 1.43 (FIG. 62A). To assess the effect of varying SNR on the estimated susceptibility distributions, reconstruction was also performed using all 5 echoes to estimate field inhomogeneity maps. Using 5 echoes, the reconstructed images are visually similar to those from the 3 echo reconstruction. The slope of the l2 reconstruction varied by 42% from the 3 echo reconstruction (0.92), while the slope of the l1 reconstruction varied by less than 1% (1.44).

Streaking artifacts were quantified by computing the mean-squared error (MSE) over a region covering the petri dish except for a border of approximately 2 voxels around each tube and 3 voxels at the boundary of the dish. For the 3 echo reconstruction, the MSE was 0.57 ppm$^2$ for the l2 regularized reconstruction and 0.13 ppm$^2$ for the l1 regularized reconstruction. The l1 regularization produces considerably reduced background streaking artifacts compared to the l2 regularization.

(c) Rat Brain Studies

To demonstrate the feasibility of the techniques in a biological sample, an excised rat brain containing superparamagnetic iron oxide particles was imaged. Neural progenitor cells (NPCs) prepared from human fetal brain tissue were incubated in a solution containing a suspension of ferumoxide-protamine sulfate complexes [45]. Three hours of middle cerebral artery occlusion were induced in male wistar rats using a method of intraluminal vascular occlusion. Approximately 1 10$^6$ NPCs were injected into the ipsilateral carotid artery of a rat at 48 hours after stroke. Animals were sacrificed 5 days after stroke. Ex vivo 3D imaging was performed one day after sacrificing the animal [45]. Imaging was performed using a Bruker 7T small animal scanner using a saddle RF coil for transmission and a surface coil for reception. The acquisition was a single echo 3D gradient echo sequence with parameters matrix size=256 256 128, voxel size=93.75 μm isotropic, flip angle=30°, TE=10 ms, TR=50 ms. Phase unwrapping and filtering were performed as described in [35].

Susceptibility distributions estimated for the rat brain are shown in FIG. 24. FIG. 24(a) shows a magnitude map, with reduced signal intensity due to T2* effects indicating the locations of iron oxide particles. FIG. 24B shows the relative field map. A limited region (48 48 32 voxels) of the brain where strong T2* effects were observed was selected for analysis using the susceptibility inversion technique (FIGS. 24C and 24D). Again, the regularization parameter used in the displayed susceptibility maps was estimated based on the noise variance of the field map.

After MRI measurements were performed, the brain was sliced into 100 um thick slices, and stained for iron using Prussian blue staining [46]. This staining reacts with iron to produce a blue color. The stained sections in FIG. 24D obtained from the same rat 5 days after stroke show clusters of Prussian blue positive cells indicating superparamagnetic particle labeled cells in the ischemic boundary. The locations of the iron labeled cells identified by Prussian blue staining visually correspond well with the region of increased susceptibility in the phase map and estimated susceptibility distributions.

The l1 regularization continues to produce images with fewer background voxels having significant susceptibility values than the l2 regularization. Reconstruction with a range of regularization parameters indicated that both regularization techniques benefit from a regularization parameter larger than that determined by the noise variance criteria. This is likely because the field map contains variations that are structured but not produced by the injected iron oxide particles. These result in voxels that do not contain large quantities of iron oxide particles having non-zero susceptibilities. Increasing the regularization parameter tends to suppress these voxels while preserving the values of the iron oxide containing voxels.

9. Discussion

Two regularization techniques were investigated to estimate sparse magnetic susceptibility distributions from MRI data. The techniques were validated in numerical and physical phantoms, and initial feasibility was shown in an animal study. In the numerical simulations, the l1 regularization produced good reconstructions of the susceptibility distribution while the l2 regularization significantly underestimated the susceptibility values. Using a phantom with known susceptibility, neither technique produced susceptibility maps with estimated susceptibility matching true susceptibility across varying noise levels, but the l1 regularization better suppressed streaking artifacts at the magic angle compared to the conventional l2 based regularization. Both regularization terms produced satisfactory susceptibility images in an excised rat brain. In all cases, the l1 regularization provided better suppression of background noise. Several sources of error are present in the system implemented. Phase wrapping may occur near regions of strong susceptibility variation so that large off-resonance frequencies are not accurately represented. In many cases, phase wrapping occurs in regions with signal voids which receive low weight in the inversion process. However, the incorrect frequencies will still have some adverse effect on the estimated susceptibilities.

Another source of error comes from sampling effects. The model employed assumes the susceptibility of each voxel is concentrated on a delta function centered in that voxel, and the phase of each voxel is the phase sampled on a delta function centered in that voxel. However, the susceptibility may not be centered in the voxel or may be distributed throughout the voxel, and the sampling function is only approximated by a delta function. Furthermore, the phase value in each voxel does not represent the phase at the center of that voxel. Instead, the signal is integrated over the sampling function [19], and the phase is the phase of this integrated signal. These assumptions were made to render the problem computationally tractable.

Variations in precession frequency cause signal to be shifted from its true location along the readout direction [8]. It was assumed the field shifts are small, resulting in minimal spatial distortion.

However, this distortion is present and may adversely impact the estimation of susceptibilities. The l1 regularization tends to overestimate the susceptibilities in the Gd doped tube phantom. Underestimation is expected in the l2 case because the magnitudes of the susceptibility values are directly penalized, but this overestimation in the case of the l1 norm is unexpected. Overestimation may result from the l1 norm attempting to explain the field variation using as few non-zero components as possible. Although the technique must be calibrated for the imaging situation if the absolute susceptibilities are of interest, near linearity is achieved so relative susceptibility values are meaningful.

Several improvements are necessary to make these techniques applicable to biological imaging situations. Although phase filtering can remove much of the phase variation that is not due to the susceptibility distribution of interest, some variation will remain at the boundaries between air and tissue. Generalization of the l1 regularization to total variation regularization may help address this issue by allowing the background to have a non-zero susceptibility. Total variation has been used in image denoising [47], and promotes sparsity of edges rather than sparsity of the estimated distribution, which may be a more realistic assumption. Chemical shift effects give rise to resonance frequency variations not due to magnetic susceptibility. Fat/water separation techniques can yield a field map independent of chemical shift, which could be used for susceptibility estimation [30], [48]. Finally, a more quantitative method to determine the regularization parameter should be developed. In addition to the L-curve and expected residual criteria, other methods to estimate the regularization parameter such as generalized cross-validation [49] exist, and should be examined in the context of susceptibility inversion. An improved method to determine the regularization parameter may lead to a slope closer to unity between the estimated and true susceptibility values.

10. Conclusion l1 and l2 noun based regularization techniques were developed for magnetic susceptibility estimation from MRI field maps, and were evaluated using numerical simulations, phantom images, and data from an animal study. A criteria for selecting the regularization parameter based on noise variance was evaluated and shown to produce visually satisfactory results. The l1 regularization provided better suppression of streaking artifacts and background noise than the l2 regularization, producing visually better image quality. These initial results show the feasibility of magnetic susceptibility estimation without the use of strong prior knowledge, and demonstrate the advantages of nonlinear sparsity promoting regularization strategies.

11. Appendix

Log Barrier Method for l1 Regularization

The l1 solver technique presented here follows closely from the derivation in [39] and is included here for completeness.

The l1 norm regularization problem is nonlinear and does not have a well defined gradient around zero. The difficulty with the gradient can be remedied by formulating an equivalent constrained problem $$\min_{\chi,u} \|W(C\chi - \psi)\|_2^2 + \lambda \sum u_i \quad \text{(Equation 4-19)}$$
$$\text{s.t.} \quad \chi_i - u_i \leq 0, i = 1 \ldots m$$
$$-\chi_i - u_i \leq 0, i = 1 \ldots m$$

where m is the number of voxels in the image. This constrained problem can then be reformulated as an unconstrained problem using a logarithmic barrier $$\min_{\chi,u} \|W(C\chi - \psi)\|_2^2 + \lambda \sum u_i - \quad \text{(Equation 4-20)}$$
$$\frac{1}{\tau} \sum \log(u_i - \chi_i) - \frac{1}{\tau} \sum \log(u_i + \chi_i)$$

The function $-1\,\tau\,\log(x)$ is referred to as the log barrier, and the parameter $\tau$ governs how well the log barrier approximates a true barrier [38]. Larger values of $\tau$ yield a better approximation to the constraint, but are more difficult to minimize because the function becomes less smooth.

The systems given by (Equation 4-19) and (Equation 4-20) are convex, so that the minimum can be found to finding the point where the gradient is zero. The approach used here is iterative search using Newton's Method [38], [39]. This requires both the gradient and the Hessian of the system being solved. Concatenating the vectors $\chi$ and u, and defining $$G(\chi, u) = \quad \text{(Equation 4-20)}$$
$$\|W(C\chi - \psi)\|_2^2 + \lambda \sum \log(u_i - \chi_i) - \frac{1}{\tau} \sum \log(u_i + \chi_i),$$

the gradient of is given by $$\nabla G(\chi, u) = \begin{bmatrix} 2C^T W^T r - \frac{1}{\tau} f_{u_1}^{-1} + \frac{1}{\tau} f_{u_2}^{-1} \\ \lambda + \frac{1}{\tau} f_{u_1}^{-1} + \frac{1}{\tau} f_{u_2}^{-1} \end{bmatrix} \quad \text{(Equation 4-21)}$$

and the Hessian is given by $$\nabla^2 G(\chi, u) = \begin{bmatrix} 2C^T W^T WC + \frac{1}{\tau} \sum_{11} & \frac{1}{\tau} \sum_{12} \\ \frac{1}{\tau} \sum_{12} & \frac{1}{\tau} \sum_{11} \end{bmatrix} \quad \text{(Equation 4-22)}$$

where $f_{u1} = \chi - u$, $f_{u2} = -\chi - u$, $\Sigma_{11} = \text{diag}(f_{u1})^{-2} + \text{diag}(f_{u2})^{-2}$, $\Sigma_{12} = -\text{diag}(f_{u1})^{-2} + \text{diag}(f_{u2})^{-2}$, and $r = W(C\chi - \psi)$. Here diag(x) is the diagonal matrix with diagonal elements composed of the elements from x, and $x^{-1}$ is taken to be the component-wise inverse of the elements of x. The Newton system is then $$\begin{bmatrix} 2\tau C^T W^T WC + \sum_{11} & \sum_{12} \\ \sum_{12} & \sum_{11} \end{bmatrix} \begin{bmatrix} \Delta\chi \\ \Delta u \end{bmatrix} = -\begin{bmatrix} 2\tau C^T W^T r - f_{u_1}^{-1} + f_{u_2}^{-1} \\ \tau\lambda + f_{u_1}^{-1} + f_{u_2}^{-1} \end{bmatrix} \quad \text{(Equation 4-23)}$$

$$= \begin{bmatrix} w_1 \\ w_2 \end{bmatrix}$$

giving the step direction $[\Delta\chi^T \Delta u^T]^T$. The system is symmetric positive definite, so it can be solved using conjugate gradients. To improve the speed of the conjugate gradient solver, the variables $\Delta u$ can be eliminated using the Schur complement [38] of the Hessian, giving the reduced system $$\left(2\tau C^T W^T W C + \sum_{11} - \sum_{12}^2 \sum_{11}^{-1}\right) \Delta\chi = w_1 - \sum_{12} \sum_{11}^{-1} w_2. \quad \text{(Equation 4-24)}$$

The variables $\Delta u$ can then be recovered from $\Delta\chi$ by $$\Delta u = \sum_{11} w_2 - \sum_{11}^{-1} \sum_{12} \Delta\chi. \quad \text{(Equation 4-25)}$$

These $\Delta\chi$ and $\Delta u$ vectors are then used as an update to the initial $\chi$ and u vectors.

The log barrier algorithm employed is summarized in FIG. 63. The input parameters to the main function ll sol are an initial feasible point $(\chi^{(0)}, u^{(0)})$, an initial $\tau$, the step size by which $\tau$ is decreased in each iteration $\mu$, an error bound on the optimality of the solution, the regularization parameter $\lambda$, line search parameters $\alpha\epsilon(0, 0.5)$ and $\beta\epsilon(0, 1)$, and the number of log barrier iterations $N_{barrier}$ to run. Any initial guess suffices for $\chi(0)$. Here, 100 iterations of the conjugate gradients algorithm with no regularization are used to calculate an initial estimate of $\chi^{(0)}$. The vector $u^{(0)}$ is chosen so that each component is slightly larger than the magnitude of the corresponding component of $\chi^{(0)}$. In this implementation, the value of $\tau^{(0)}$ is chosen so that the duality gap after the first barrier iteration $m/\tau^{(0)}$ is approximately equal to $\|\chi^{(0)}\|_1$, as in [39]. $N_{barrier}$ is the number of log barrier iterations necessary to achieve the desired accuracy, and can be calculated from [38]

$$N_{barrier} = \left\lceil \frac{\log(2m) - \log(\epsilon) - \log(\tau^{(0)})}{\log(\mu)} \right\rceil. \quad \text{(Equation 4-26)}$$

The algorithm begins with an initial coarse approximation to the ideal barrier function using $\tau^{(0)}$. From the initial point, a Newton step (function Newt) is calculated using the conjugate gradients solver. The Newton step indicates a search direction, but does not indicate the exact distance to step in that direction. Computing the exact minimum in that direction is not computationally feasible, so an approximate backtracking line search is employed (function LineSearch) [38]. Here the parameters $\alpha=0.01$ and $\beta=0.5$ were chosen as in [39]. Prior to the backtracking line search, a simple search is performed to ensure that the step remains within the feasible region of the system (FIG. 63, Step 26). The appropriate length step is then taken, and Newton's method is performed from the updated point until the Newton decrement is less than the desired accuracy (FIG. 63, Step 19). The Newton decrement $$(\nabla G(\chi, u)^T \nabla^2 G(\chi, u)^{-1} \nabla G(\chi, u))^{\frac{1}{2}} \quad \text{(Equation 4-27)}$$

provides an estimate of the duality gap [38]. In this implementation, $\mu=10$. Typically the number of outer iterations required for the log barrier method is 8-10 for a matrix size of 128 128 16 and $\epsilon=10^{-3}$.

BIBLIOGRAPHY

[1] H. W. Chung, S. N. Hwang, H. N. Yeung, and F. W. Wehrli, "Mapping of the magnetic-field distribution in cancellous bone," *J Magn Reson B*, vol. 113, no. 2, pp. 172-176, 1996.

[2] A. Techawiboonwong, H. K. Song, and F. W. Wehrli, "In vivo MRI of submillisecond T(2) species with two-dimensional and three-dimensional radial sequences and applications to the measurement of cortical bone water," *NMR Biomed*, vol. 21, no. 1, pp. 59-70, 2008.

[3] J. K. Hsiao, M. F. Tai, H. H. Chu, S. T. Chen, H. Li, D. M. Lai, S. T. Hsieh, J. L. Wang, and H. M. Liu, "Magnetic nanoparticle labeling of mesenchymal stem cells without transfection agent: cellular behavior and capability of detection with clinical 1.5 T magnetic resonance at the single cell level," *Magn Reson Med*, vol. 58, no. 4, pp. 717-724, 2007.

[4] J. A. Frank, B. R. Miller, A. S. Arbab, H. A. Zywicke, E. K. Jordan, B. K. Lewis, J. L. H. Bryant, and J. W. Bulte, "Clinically applicable labeling of mammalian and stem cells by combining superparamagnetic iron oxides and transfection agents," *Radiology*, vol. 228, no. 2, pp. 480-487, 2003.

[5] E. M. Shapiro, S. Skrtic, K. Sharer, J. M. Hill, C. E. Dunbar, and A. P. Koretsky, "MRI detection of single particles for cellular imaging," *Proc Natl Acad Sci*, vol. 101, no. 30, pp. 10 901-10 906, 2004. DRAFT Feb. 21, 2009 NONLINEAR ESTIMATION OF MAGNETIC SUSCEPTIBILITY DISTRIBUTIONS. 19

[6] D. L. Kraitchman, W. D. Gilson, and C. H. Lorenz, "Stem cell therapy: MRI guidance and monitoring," *J Magn Reson Imaging*, vol. 27, no. 2, pp. 299-310, 2008.

[7] R. M. Weisskoff and S. Kiihne, "MRI susceptometry: image-based measurement of absolute susceptibility of MR contrast agents and human blood," *Magn Reson Med*, vol. 24, no. 2, pp. 375-383, 1992.

[8] O. Beuf, A. Briguet, M. Lissac, and R. Davis, "Magnetic resonance imaging for the determination of magnetic susceptibility of materials," *J Magn Reson B*, vol. 112, no. 2, pp. 111-118, 1996.

[9] Z. J. Wang, S. Li, and J. C. Haselgrove, "Magnetic resonance imaging measurement of volume magnetic susceptibility using a boundary condition," *J Magn Reson*, vol. 140, no. 2, pp. 477-481, 1999.

[10] Y. N. Cheng, C. Hsieh, J. Neelavalli, Q. Li, M. S. Dawood, and E. M. Haacke, "A complex sum method of quantifying susceptibilities in cylindrical objects: the first step toward quantitative diagnosis of small objects in MRI," *Magn Reson Imaging*, vol. 25, pp. 1171-1180, 2007.

[11] L. Li, "Magnetic susceptibility quantification for arbitrarily shaped objects in inhomogeneous fields," *Magn Reson Med*, vol. 46, no. 5, pp. 907-916, 2001.

[12] L. Li and Z. J. Wang, "Magnetic susceptibility quantitation with MRI by solving boundary value problems," *Med Phys*, vol. 30, no. 3, pp. 449-453, 2003.

[13] L. Li and J. S. Leigh, "Quantifying arbitrary magnetic susceptibility distributions with MR," *Magn Reson Med*, vol. 51, no. 5, pp. 1077-82, 2004.

[14] T. Liu, P. Spincemaille, L. de Rochefort, B. Kressler, and Y. Wang, "Calculation of susceptibility through multiple orientation sampling (COSMOS): a method for conditioning the inverse problem from measured magnetic field map to susceptibility source image in MRI," *Magn Reson Med*, vol. 61, no. 1, pp. 196-204, 2009.

[15] A. Schäfer, S. Wharton, and R. Bowtell, "Calculation of susceptibility maps from phase image data," in *Proc Intl Soc Magn Reson Med*, Toronto, May 2008, p. 641.

[16] J. Morgan and P. Irarrazaval, "Efficient solving for arbitrary susceptibility distributions using residual difference fields," in *Proc Intl Soc Magn Reson Med*, Berlin, May 2007, p. 35.

[17] K. Shmueli, P. van Gelderen, T. Li, and J. Duyn, "High resolution human brain susceptibility maps calculated from 7 Tesla MRI phase data," in *Proc Intl Soc Magn Reson Med*, Toronto, May 2008, p. 642.

[18] J. D. Jackson, *Classical Electrodynamics*. New York: Wiley, 1999.

[19] E. M. Haacke, R. W. Brown, M. R. Thompson, and R. Venkatesan, *Magnetic Resonance Imaging: Physical Principles and Sequence Design*. New York: Wiley-Liss, 1999.

[20] R. Salomir, B. D. de Senneville, and C. T. W. Moonen, "A fast calculation method for magnetic field inhomogeneity due to an arbitrary distribution of bulk susceptibility," *Concepts Magn Reson B*, vol. 19B, no. 1, pp. 26-34, 2003.

[21] J. P. Marques and R. Bowtell, "Application of a Fourier-based method for rapid calculation of field inhomogeneity due to spatial variation of magnetic susceptibility," *Concepts Magn Reson B*, vol. 25B, no. 1, pp. 65-78, 2005.

[22] E. M. Haacke, N.Y. Cheng, M. J. House, Q. Liu, J. Neelavalli, R. J. Ogg, A. Khan, M. Ayaz, W. Kirsch, and A. Obenaus, "Imaging iron stores in the brain using magnetic resonance imaging," *Magn Reson Imaging*, vol. 23, no. 1, pp. 1-25, 2005.

[23] M. Hanke and P. Hansen, "Regularization methods for large-scale problems," *Surv Math Ind*, vol. 3, pp. 253-315, 1993.

[24] H. L. Taylor, S. C. Banks, and J. F. McCoy, "Deconvolution with the l1 norm," *Geophysics*, vol. 44, no. 1, pp. 39-52, 1979.

[25] J. A. Tropp, "Just relax: convex programming methods for identifying sparse signals in noise," *IEEE Trans Inf Theory*, vol. 52, no. 3, pp. 1030-1051, 2006. Feb. 21, 2009 DRAFT 20 IEEE TRANSACTIONS ON MEDICAL IMAGING, VOL. 0, NO. 0, JANUARY 0000

[26] E. J. Cand'es and J. Romberg, "Robust uncertainty principles: exact signal reconstruction from highly incomplete frequency information," *IEEE Trans Inf Theory*, vol. 52, no. 2, pp. 489-509, 2006.

[27] M. Lustig, D. Donoho, and J. M. Pauly, "Sparse MRI: The application of compressed sensing for rapid MR imaging," *Magn Reson Med*, vol. 58, no. 6, pp. 1182-1195, 2007.

[28] T. E. Conturo and G. D. Smith, "Signal-to-noise in phase angle reconstruction: dynamic range extension using phase reference offsets," *Magn Reson Med*, vol. 15, no. 3, pp. 420-437, 1990.

[29] T. K. Moon and W. C. Stirling, *Mathematical Methods and Algorithms for Signal Processing*. Upper Saddle River, N.J.: Prentice Hall, 2000.

[30] G. H. Glover and E. Schneider, "Three-point Dixon technique for true water/fat decomposition with B0 inhomogeneity correction," *Magn Reson Med*, vol. 18, no. 2, pp. 371-383, 1991.

[31] Q. Chen, E. Schneider, B. Aghazadeh, M. S. Weinhous, J. Humm, and D. Ballon, "An automated iterative algorithm for water and fat decomposition in three-point Dixon magnetic resonance imaging," *Med Phys*, vol. 26, no. 11, pp. 2341-2347, 1999.

[32] J. Szumowski, W. R. Coshow, F. Li, and S. F. Quinn, "Phase unwrapping in the three-point Dixon method for fat suppression MR imaging," *Radiology*, vol. 192, no. 2, pp. 555-561, 1994.

[33] S. Moon-Ho Song, S. Napel, N. Pelc, and G. Glover, "Phase unwrapping of MR phase images using Poisson equation," *IEEE Trans Image Proc*, vol. 4, no. 5, pp. 667-676, 1995.

[34] S. Chavez, Q. S. Xiang, and L. An, "Understanding phase maps in MRI: a new cutline phase unwrapping method," *IEEE Trans Med Imaging*, vol. 21, no. 8, pp. 966-977, 2002.

[35] H. Bagher-Ebadian, Q. Jiang, and J. R. Ewing, "A modified Fourier-based phase unwrapping algorithm with an application to MRI venography," *J Magn Reson Imaging*, vol. 27, no. 3, pp. 649-652, 2008.

[36] C. Barmet, N. De Zanche, L. S. Sasportas, and K. P. Pruessmann, "A model-free method for high-precision MR susceptometry," in *Proc Intl Soc Magn Reson Med*, Berlin, May 2007, p. 36.

[37] A. V. Oppenheim, R. W. Schafer, and J. R. Buck, "The discrete Fourier transform," in *Discrete-Time Signal Processing*. Upper Saddle River, N.J.: Prentice Hall, 1999, ch. 8.

[38] S. Boyd and L. Vandenberghe, *Convex Optimization*. Cambridge: Cambridge University Press, 2004.

[39] E. Cand'es and J. Romberg, l1-*MAGIC: Recovery of Sparse Signals via Convex Programming*, Caltech, Calif., October 2005. [Online]. Available: http://www.acm.caltech.edu/l1magic/downloads/l1magic.pdf

[40] P. C. Hansen, "The L-curve and its use in the numerical treatment of inverse problems," in *Computational Inverse Problems in Electrocardiology*, ser. Advances in Computational Bioengineering, P. Johnston, Ed., vol. 4. WIT Press, 2000.

[41] A. Jesmanowicz, V. Roopchansingh, R. W. Cox, P. Starewicz, W. F. B. Punchard, and J. S. Hyde, "Local ferroshims using office copier toner," in *Proc Intl Soc Magn Reson Med*, Glasgow, May 2001, p. 617.

[42] J. P. Hornak, "Labels printed with magnetic toner," *Magn Reson Imaging*, vol. 25, no. 10, pp. 1459-1460, 2007.

[43] D. R. Lide, "Magnetic susceptibility of the elements and inorganic compounds," in *CRC Handbook of Chemistry and Physics*, 88*th Edition (Internet Version* 2008). Boca Raton, Fla.: CRC Press/Taylor and Francis, 2008.

[44] R. C. O'Handley, *Modern Magnetic Materials: Principles and Applications*. New York: Wiley, 2000.

[45] A. S. Arbab, G. T. Yocum, H. Kalish, E. K. Jordan, S. A. Anderson, A. Y. Khakoo, E. J. Read, and J. A. Frank, "Efficient magnetic cell labeling with protamine sulfate complexed to ferumoxides for cellular MRI," *Blood*, vol. 104, no. 4, pp. 1217-23, 2004.

[46] Q. Jiang, Z. G. Zhang, G. L. Ding, L. Zhang, J. R. Ewing, L. Wang, R. Zhang, L. Li, M. Lu, H. Meng, A. S. Arbab, J. Hu, Q. J. Li, D. S. P. Nejad, H. Athiraman, and M. Chopp, "Investigation of neural progenitor cell induced angiogenesis after embolic stroke in rat using MRI," *Neuroimage*, vol. 28, no. 3, pp. 698-707, 2005.

[47] L. I. Rudin, S. Osher, and E. Fatemi, "Nonlinear total variation based noise removal algorithms," *Physica D*, vol. 60, pp. 259-268, 1992.

[48] S. B. Reeder, Z. Wen, H. Yu, A. R. Pineda, G. E. Gold, M. Markl, and N.J. Pelc, "Multicoil Dixon chemical species separation with an iterative least-squares estimation method," *Magn Reson Med*, vol. 51, no. 1, pp. 35-45, 2004.

[49] M. Bertero and P. Boccacci, *Introduction to Inverse Problems in Imaging*. Bristol, UK: Institute of Physics Publishing, 1998.

X. Image Based Regularization

According to one embodiment, the local magnetic field is further modified by electronic screening effects characterized by the chemical shift $\sigma$. The full magnetic field model for the normalized shifts $\delta = \delta B_{z,local}/B_0$ $$\delta = \chi \otimes d - \sigma \quad \text{(Equation 2-4)}$$

Accounting for noise effects, the shift at a given point p is $$\delta_p = \chi \otimes d - \sigma + \eta_p, \quad \text{(Equation 2-5)}$$

where $\eta_p$ represents independent Gaussian noise with zero mean.

As described above, the problem of inverting the field to quantify susceptibility is ill conditioned as the convolution kernel frequency response is 0 for 3 $k_z^2 = k^2$, leading to an infinite number of solutions and severe noise propagation. Furthermore, chemical shift, measurement error, and missing data points (Equation 2-5) lead to an even more underdetermined problem. Inversion may thus be solved using regularization.

According to the embodiment, instead of seeking a complete solution for the unknown magnetic properties of each voxel in the image, the number of unknowns can be reduced by introducing image-based information such as voxel-based constraints. For example, the magnitude image can be used to segment regions of uniform susceptibility and chemical shift based on uniform MR signal properties. Let a geometrical model define l regions; each region j has geometry q, susceptibility $\chi_j$, and chemical shift $\sigma_j$. The unit response of the region is given by the convolution of the region with the response of a unit dipole $D_j = G_j \otimes d$, which can be computed using a k-space based method (Salomir, R., *Concept Magn Reson B*, 2003; 19B:26-34; Koch, K M., *Phys Med Biol*, 2006; 51:6381-6402.), or by transformation into a surface integral (de Munck, J C., *IEEE Trans Med Imaging*, 1996; 15:620-627). At each point p, the following linear relation is fulfilled:

$$\delta_p = \sum_{j=1}^{l} \chi_j D_{j,p} - \sigma_j I_{j,p} + \eta_p, \quad \text{(Equation 2-6)}$$

where $\delta_p$ is the measured shift, $D_{j,p}$ is the response field of region j at point p, and $1_{j,p}$ is the Kronecker delta (1 if the observation point p is inside the region, otherwise zero). (Equation 2-6) can be rewritten in matrix form:

$$D\chi = 1\sigma = \delta + \eta, \quad \text{(Equation 2-7)}$$

where D is an n l matrix with coefficients $D_{j,p}$ (n observation points), 1 is an n l matrix with 1s if p is inside Gj, and $\chi$, $\sigma$, $\delta$ and $\eta$ are column vectors.

Reorganizing (Equation 2-7) gives:

$$F\begin{bmatrix} \chi \\ -\sigma \end{bmatrix} = \sigma + \eta, \quad \text{(Equation 2-8)}$$

where F=[D I] defines the field model. Assuming that the problem is now invertible, a standard inversion scheme is given by the weighted linear least square solution to account for inhomogeneous noise variance for the observation points (Bjork A., *SIAM Society for Industrial and Applied Mathematics*, 1996; p165-186):

$$\begin{bmatrix} \chi_{WLS} \\ -\sigma_{WLS} \end{bmatrix} = (F^T W F)^{-1} F^T W \delta \quad \text{(Equation 2-9)}$$

where W is the n n noise covariance matrix, diagonal as is the case for uncorrelated noise, with coefficients being the inverse of the noise variance for each point. The diagonal elements of the inverse matrix $(F^T W F)^{-1}$ provide an estimate of the noise propagation on the fitted magnetic property values and characterize the conditioning of the problem.

XI. COSMOS

A direct point-wise division is challenging to use in practice. The dipole response function $(1/3 - k_z^2/k^2)$ has zeroes on two conic surfaces at the magic angle ($\approx 54.7°$ from the main magnetic field). Directly inverting $\Delta_B(\vec{k})$ to get $X(\vec{k})$ involves calculating $(1/3 - k_z^2/k^2)^{-1}$ in the Fourier domain, which is not defined at those zeroes. If the imaging problem is appropriately discretized, the sampling points can be chosen to avoid the zeroes. However, the discrete problem is still ill-conditioned as the dipole response in Fourier space may still be arbitrarily close to zero, resulting in severe noise amplification.

According to one embodiment, this inverse problem is stabilized by rotating the object with respect to the main magnetic field and resampling the data. In the object's frame of reference, whose Fourier domain coordinate system is affixed with the object itself, Equation 6 is therefore rewritten as $$\Delta_B(\vec{k}) = \left(\frac{1}{3} - \frac{k_{zp}^2}{k^2}\right) \cdot X(\vec{k}), \quad \text{(Equation 3-4)}$$

where $k_{zp}$ is the projection of the object coordinate vector k onto the direction of the main magnetic field (FIG. 57). Assume that, for simplicity of the derivations that follow, we limit ourselves to rotations of the object around the x-axis only. Then for a $\theta$ degree rotation, $k_{zp} = k_z \cos \theta + k_y \sin \theta$. Accordingly, if the object is sampled from N different angles, the multiple measurements can be used to determine the susceptibility value at a given location in Fourier space $X(\vec{k})$:

$$\begin{bmatrix} \left(\frac{1}{3} - \frac{(k_z \cos\theta_1 + k_y \sin\theta_1)^2}{k^2}\right) \\ \left(\frac{1}{3} - \frac{(k_z \cos\theta_2 + k_y \sin\theta_2)^2}{k^2}\right) \\ \ldots \\ \left(\frac{1}{3} - \frac{(k_z \cos\theta_N + k_y \sin\theta_N)^2}{k^2}\right) \end{bmatrix} \cdot X(\vec{k}) = \begin{bmatrix} \Delta_{B1} \\ \Delta_{B2} \\ \ldots \\ \Delta_{BN} \end{bmatrix}. \quad \text{(Equation 3-5)}$$

A Fourier domain point-wise direct inversion is applicable as long as there exists a non-zero element among $(1/3 - k_{axisn}^2/k^2)$, n=1, 2 ... N. A set of angles $\theta_1, \ldots, \theta_N$ exist to fulfill this criterion for every point in Fourier domain when N is greater than or equal to 3. A proof of this statement is provided in the appendix. There is also an intuitive explanation for the proof as illustrated in FIG. 57C. The zeroes in the Fourier domain kernel make the inversion unstable, and preferably they should be eliminated. Sampling from two orientations is insufficient because the solid angle of each cone is greater than 90° ($\approx 2 \times 54.7°$), leading to inevitable interceptions among the 4 zero-cone surfaces associated with any two-angle sampling. The intercept is a collection of lines through the Fourier domain origin. Sampling from a third angle may sample the Fourier domain points in those locations with a rotated dipole kernel away from zero. One special point that needs further attention is the Fourier domain origin because the kernel $(1/3-k_{zp}^2/k^2)$ is not defined at this point. However, the origin only defines a constant offset in the image and will not affect relative susceptibility differences, therefore in the inversion the Fourier domain origin is set to zero. The remaining issue is to determine the optimal sampling orientations.

Equation 3-5 may be used to solve independently for all points in the Fourier domain. However, if we want to minimize the upper bound of total error in X over the entire Fourier domain, all the points should be grouped together. Thus Equation 3-5 is reformulated into $$C\vec{X} = \vec{\Delta}_B, \quad \text{(Equation 3-6)}$$

where $\vec{X}$ is the vector representation of the all the $X(\vec{k})$, $\vec{\Delta}_B$ is the vector representation of all the $\Delta_B$ in Equation 3-5, and C is a block diagonal matrix representing point-wise multiplication, in which each diagonal block is the corresponding left hand side vector in Equation 3-5.

In analyzing error propagation in discrete inverse problems, a useful property to consider is the condition number. For a non-square but column full ranked matrix C, the condition number is defined as $\kappa(C) = \sigma_{max}/\sigma_{min}$, the ratio of the largest and smallest singular value of the matrix C. In the presence of noise, the actual measurement is given by $\vec{\Delta}_{Bmeans} = \vec{\Delta}_B + e\vec{\Delta}_B$, where $e\vec{\Delta}_B$ is a vector representation of the error in the measured data. When pseudo inverting the system, the hope is that $\vec{X}_{inv} = \vec{X} + e\vec{X} = C\dagger(\vec{\Delta}_B + e\vec{\Delta}_B)$ is close to the true $\vec{X}$, where $e\vec{X}$ is the error in the reconstructed $\vec{X}$ that propagates from the measurement error, and $C\dagger = (C^H C)^{-1} C^H$ is the Moore-Penrose pseudoinverse of C. To analyze error propagation, $e\vec{X} = C\dagger e\vec{\Delta}_B$ must be bounded. The normalized error in the estimated $\vec{X}$ can be bounded as $$\frac{\|e\vec{X}\|_2}{\|\vec{X}\|_2} \leq \quad \text{(Equation 3-7)}$$

$$\frac{\|e\vec{\Delta}_B\|_2}{\|\vec{\Delta}_B\|_2} \cdot \left\{ \frac{2 \cdot \kappa(C)}{\cos\beta} + \tan\beta \cdot \kappa^2(C) \right\} + O\left[\left(\frac{\|e\vec{\Delta}_B\|_2}{\|\vec{\Delta}_B\|_2}\right)^2\right]$$

where sin $$\beta = \frac{\|C\vec{X} - \vec{\Delta}_B\|_2}{\|\vec{\Delta}_B\|_2}. \quad (18)$$

From this equation, it is shown that the condition number directly determines the upper bound of relative error propagation, so it needs to be minimized for best performance.

Since the matrix C is already a block diagonal matrix whose blocks are column vectors, $C^H C$ is a diagonal matrix whose diagonal elements are $$\Lambda_{k_x,k_y,k_z} = \sum_{i=1}^{N}\left[\frac{1}{3} - \frac{(k_z\cos\theta_i + k_y\sin\theta_i)^2}{k^2}\right]^2.$$

Therefore, the singular values of C are $$\sigma_{k_x,k_y,k_z} = \sqrt{\Lambda_{k_x,k_y,k_z}} = \sqrt{\sum_{i=1}^{N}\left[\frac{1}{3} - \frac{(k_z\cos\theta_i + k_y\sin\theta_i)^2}{k^2}\right]^2}. \quad (19)$$

Then the condition number for a particular set of sampling orientations $\{\theta_n\}$, $n=1, 2, \ldots, N$ is $$\kappa_{\theta_1,\theta_2,\ldots,\theta_N} = \frac{\max\limits_{k_x,k_y,k_z}\sqrt{\sum_{i=1}^{N}\left[\frac{1}{3} - \frac{(k_z\cos\theta_i + k_y\sin\theta_i)^2}{k^2}\right]^2}}{\min\limits_{k_x,k_y,k_z}\sqrt{\sum_{i=1}^{N}\left[\frac{1}{3} - \frac{(k_z\cos\theta_i + k_y\sin\theta_i)^2}{k^2}\right]^2}}. \quad \text{(Equation 3-8)}$$

The optimal sampling orientations are $$\{\theta_n^*\} = \operatorname*{argmin}_{\{\theta_n^*\}, n=1,2,\ldots,N} \kappa_{\theta_1,\theta_2,\ldots,\theta_N}, n = 1, 2, \ldots, N.$$

The shift $\delta_B(\vec{r})$ is calculated from MR phase images. The standard deviation of phase noise in a voxel is approximately inversely proportional to the signal intensity at that voxel (Conturo, T E., *Magn Reson Med*, 1990; 15:42-437). To account for this varying phase noise, the error between the measured data and the model needs to be minimized in a weighted least square manner. The goal is to find a susceptibility distribution $\vec{X}^*$ that satisfies $$\vec{X}^* = \operatorname*{argmin}_{\vec{X}} \|W * FT^{-1}(C\vec{X} - \vec{\Delta}_B)\|_2, \quad \text{(Equation 3-9)}$$

where symbol * denotes matrices point-wise multiplication, W is a weighting matrix that determines the penalty for deviation at a given measured point. The signal intensity map in image space can be conveniently used for constructing the weighting matrix.

A direct solution of Equation 3-9 involves inverting a large matrix. For example, for an image with 100*100*100 unknown values and 3 acquisitions, the matrix is $3 \times 10^6$ by $10^6$, so direct inversion is computationally prohibitive. On the other hand, calculating the forward problem does not require explicitly forming such a large matrix, and can be greatly facilitated using the Fast Fourier Transform, allowing an iterative solution. Because the system is usually well-conditioned after over sampling using different orientations, the iterative method converges rapidly to a reasonable solution.

The details of the method and system for obtaining signals in different orientations are described herein with reference to FIG. 9. As shown in FIG. 9A, the plurality of signal sets are collected by simply rotating the object 906 in an x-y plane of the imaging system. Specifically, an image object 906 is first positioned in orientation 902 with respect to the imaging device 22. After all the signals are collected from orientation 902, the object 906 is rotated by an angle θ1 to orientation 901. Alternatively, after the first set of signals is collected, the object 906 is rotated by an angle θ2 to orientation 903. As depicted in FIG. 9A, the object is rotation in the x-y plane. According to a further embodiment, the object 906 may be placed and affixed to a table 40 associated with the imaging device 22. The object can then be rotated by repositioning the table 40 through the control CPU 24 controlling an electrical motor system 54. Alternatively, instead of rotating the object 906, the orientations 901-903 can be achieved by adjusting the imaging device 22 through the control CPU 24 that controls another electrical motor system 56.

Figure 9B:
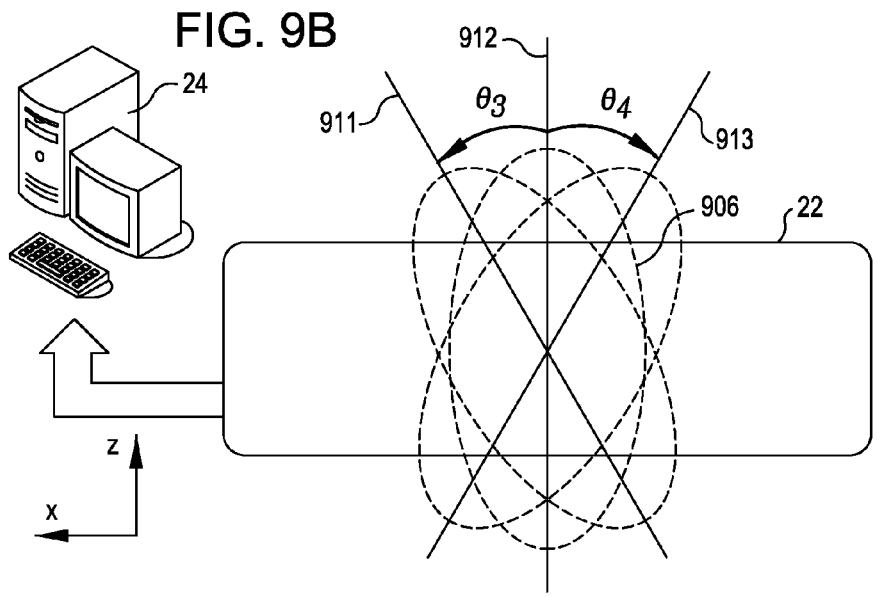
FIG. 9(B) depicts a system for providing magnetic source magnetic resonance imaging using data collected from two or more orientations according to another embodiment.

Alternatively, in FIG. 9B the image object 906 can be repositioned in an x-z plane of the MRI system 22. Similar to the embodiment shown in FIG. 9A, the object 906 may be rotated from orientation 912 by an angle θ3 to an orientation 911 or by an angle θ4 to another orientation 913. Alternatively, these orientations may be achieved by rotating the imaging device 22. The rotation of the object 906 or the imaging device 22 may be controlled through the MRI control system 24 that controls an electrical motor system.

According to still another alternative embodiment, the rotation of the object or the MRI device may be performed within a y-z plane of the imaging system. In general, the rotation may be performed in an arbitrary plane of the imaging system.

The orientation for collecting the imaging singles can be adjusted by translating the object in addition to the rotations. For example, in order to reposition the object from one orientation to another orientation, the object may be first translated and then rotated, or it may be first rotated and then translated.

XII. Experiment #1—Bayesian Regularization

A. Phantom Experiments

A cylindrical phantom containing a well characterized susceptibility distribution was designed. Gadolinium solutions (Gd-DTPA, Magnevist, Berlex Laboratories, Wayne, N.J.) were prepared at 0.5, 1, 1.5, 2, 2.5 and 3% of the raw solution leading to susceptibilities of 0.81, 1.63, 2.45, 3.26, 4.08, 4.89 ppm at room temperature using the Curie law (Kahn, in *Molecular Magnetism*, (Wiley-VCH Publications, 1993)). A volume of 30 mL of each solution was placed in long latex balloons with an 8 mm diameter and a 30 cm length. Filling them created an approximately 30-mm spherical bulge at the center of the cylinder. The balloons were embedded in a cylindrical container filled with water (12.5 mm diameter and 30 cm in height).

Experiments were performed using a 1.5T MRI system (HDx, GE Healthcare, Waukesha, Wis.). The phantom was placed vertically on the patient table and the RF body coil was used. A standard 3D spoiled gradient echo pulse sequence was modified to allow interleaved, multi-echo sampling. The readout direction was set up-down along the cylinder axis. No slice selection was applied; a hard RF pulse was used instead (flip angle 30°). The field-of-view (FOV) was 128 mm with an isotropic 2 mm resolution. Full echo readouts were acquired with a pixel bandwidth of 1 kHz and the 5 following echo times were sampled: TE=1.24, 2.24, 3.24, 4.25, 5.24 ms. Repetition time TR was 30 ms.

After standard fast Fourier transform of the raw k-space data, normalized field shifts were extracted by fitting the phase of each voxel to $\phi(TE)=\phi_0+\delta\gamma B_0 TE$ with a weighted linear least-squares algorithm assuming a weight proportional to the signal magnitude. As the echo spacing was chosen small enough, no phase unwrapping algorithm was necessary. The map of the standard deviation on the shifts was computed based on the 5 acquired echoes magnitude images. Its inverse was normalized to the noise standard deviation estimated within an air region and will be referred to as Y.

B. In Vivo Brain Hemorrhage Experiment

In vivo data were analyzed retrospectively for three patients (1 male and 2 females) suspected of brain hemorrhages who had undergone a brain exam using a 1.5T MRI system (Signa, GE Healthcare, Waukesha, Wis.). Institutional IRBs were obtained for this retrospective image analysis. Imaging sequences included routine T1 and T2 weighted scans and a susceptibility weighted imaging (SWI) scan. All patients were diagnosed with cerebral cavernous hemangioma. The magnitude and phase images from the SWI scan were processed using the proposed algorithm. The SWI scan consisted of a 3D flow compensated spoiled gradient-echo scan with TE=38-40 ms, TR=50-51 ms, slice thickness=2 mm (flip angle=20°), Ns=28 to 54 axial slices through the brain. The readout size was 512 with a pixel bandwidth of 122.07 Hz for a FOV of 24 cm. Partial k-space (75%) was acquired with 384 phase encoding steps. The magnitude images were normalized to the noise standard deviation estimated within a noise region and will be referred to as Y. The phase images were unwrapped using ZPiM (Dias et al., *IEEE Trans Image Process*, 11 (4): 408-422 (2002). The background field was estimated and removed by fitting the field data to a third order polynomial within the brain region. The data was cropped to a 384×384×Ns matrix and down-sampled by a factor 2 in the imaging plane to speed up convergence of the algorithm.

C. Weights Calculation

A mask M of the region of interest was obtained by segmentation. The segmentation algorithm included applying a threshold to the image Y at ~3 to 5 times the noise level to identify regions with MR signal, followed by selecting the largest connected component, and dilating the selected region to include only the phantom/brain.

The weighting matrix W in Equation 1-10 was obtained by taking the images Y, and by setting all points outside of the mask M to 0 to exclude the corresponding noisy measurements. The weighting matrix $W_0$, was set as the complement of the mask M. To calculate the weight matrices in $W_1$, such as $W_{1x}$, the gradient norm $|G_x Y|$ of the magnitude image was calculated. All pixels with a gradient norm in the range of the noise level (below 1/dx) were set to 1/dx. The final $W_{1x}$ diagonal terms were set to the inverse of the thresholded gradient norm. Intuitively, the region with homogeneous magnitude Y and low gradients will be smoothed, and regions with strong gradients will be allowed to have edges.

The improvement resulting from the introduction of the weights in the regularization terms was obtained by comparing to the solutions obtained with uniform weights ($W_0=1$, $W_1=1$) both qualitatively (presence of artifacts), and quantitatively by measuring the mean susceptibility in a region-of-interest within each Gadolinium sample (FIG. 51) and determining the slope of the linear fit of the measured versus the theoretical susceptibilities. In total, 5 different methods were evaluated in which different combinations of priors were imposed as detailed in Table 1-1.

TABLE 1-1

Evaluated regularization method number, weighting types and corresponding implementation.

| # | Weighting type | Implementation |
|---|---|---|
| 1 | Uniform norm | $W_0 = 1$, $\alpha$ varies, $\beta = 0$ |
| 2 | Uniform gradient norm | $\alpha = 0$, $W_1 = 1$, $\beta$ varies |
| 3 | Boundaries at 0 Uniform gradient norm | $W_0$ = outside, $\alpha = 100$, $W_1 = 1$, $\beta$ varies |
| 4 | Non uniform gradient norm | $\alpha = 0$, $W_1$ = edges, $\beta$ varies |
| 5 | Boundaries at 0 Non uniform gradient norm | $W_0$ = outside, $\alpha = 100$, $W_1$ = edges, $\beta$ varies |

D. Results

1. In Vitro Results

Figure 51A:
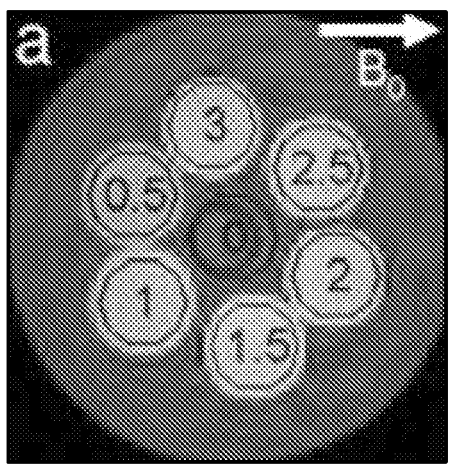
FIG. 51 (a)-(d) show a phantom experiment on the Gadolinium solutions. Dilution of the raw preparation is indicated within the ROIs in percent: (a) shows that the MR signal magnitude image corresponds to the weighting matrix W; (b) shows the field map that was reconstructed from the phase; (c) shows the weighting matrix $W_0$ being used to impose zero susceptibility in a specific region; (d) illustrates the weighting matrix $W_\ell x$ extracted from the gradient of the MR amplitude image and is given as an example of a weighting matrix imposing edges similar to those of the MR magnitude image.
Figure 51B:
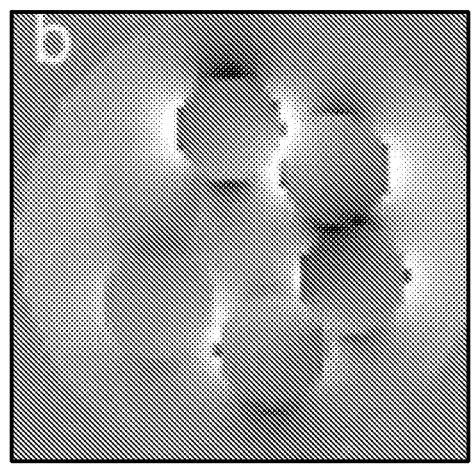
Figure 51C:
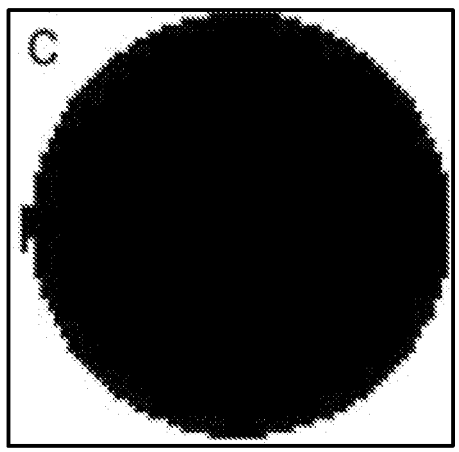
Figure 51D:
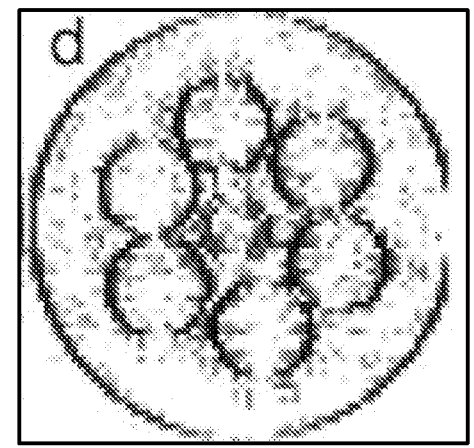

Relatively homogeneous T1 contrast was obtained on the Gadolinium samples (FIG. 51A) whereas the field measured from the MR signal phase increases as a function of concentration leading to dipolar patterns around the samples (FIG. 51B). As a result of the convolution described in Equation 1-2, no direct relationship exists between the phase value in one voxel and the susceptibility (or, equivalently, Gd concentration). A rapid segmentation of the air region allowed the definition of the weighting matrix $W_0$ (FIG. 51C) used to impose a zero valued solution for air, and the gradients of the image were used to impose boundaries with a stronger weighting where image magnitude does not vary (FIG. 51D).

As expected, the norm of the residual decreased with a decrease of the regularization parameter (FIG. 44) as the regularized field gets closer to the measured field. The expected noise level displayed in FIG. 44 allowed the selection of the matched-noise solution. The susceptibility slope, which should ideally be one, plotted as a function of the regularization parameter is a good indication of the regularization parameter and of the influence of the chosen weighting strategy. When uniform norm weighting (method 1) is performed, the solution is attenuated (slope ~0.7) for small regularization parameters and attenuation increases with the parameter value. For the matched-noise solution, the slope is ~0.6. Similarly, with uniform gradient norm weighting (method 2), the attenuation is even worse for small regularization parameters (slope, ~0.45), and increases slightly before being highly attenuated for large parameters. For the matched-noise solution, the slope is ~0.5. On the contrary, if zeros are additionally imposed for the air region (method 3), a much better quantification is obtained (slope=1) for small parameters, but large parameters induce attenuation. In this case, the matched-noise solution performed quantitatively very well with a slope ~1. With the non uniform gradient norm weighting (method 4), attenuation is ~0.8 for small parameters and quantification gets better as the parameter increases. The matched noise solution performs relatively well (slope ~0.9). If zeros are additionally imposed for the air region (method 5), quantification is correct on the entire range of tested parameters with a matched-noise slope ~1. To summarize, the methods that impose non-uniform priors (3, 4 and 5) satisfactorily quantify susceptibilities with increased performance as the amount of priors increases.

Figure 52:
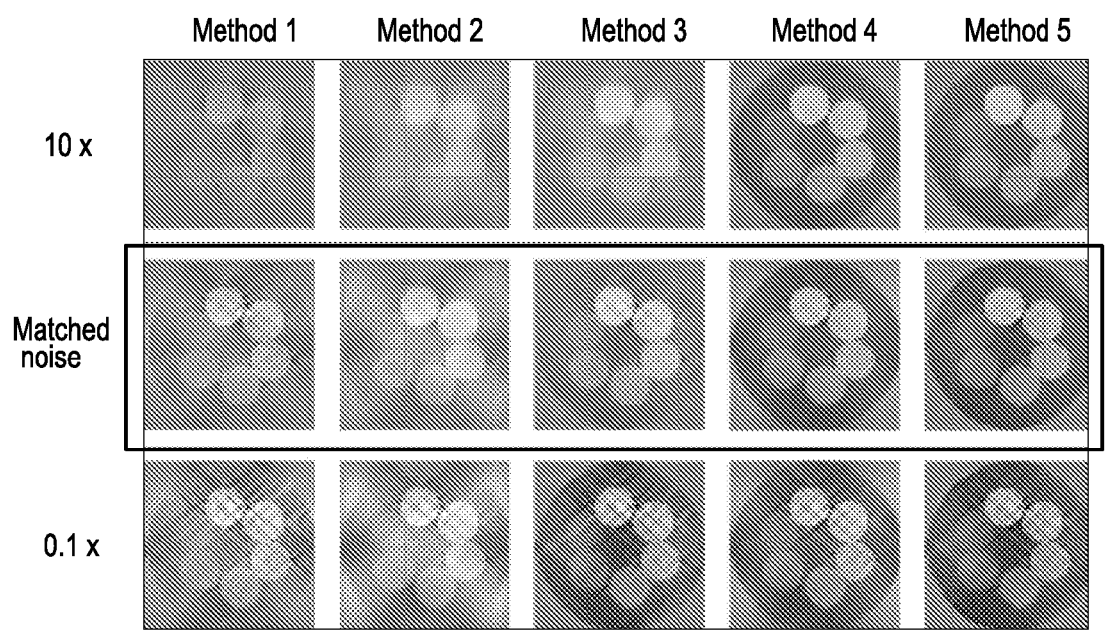
FIG. 52 shows solutions obtained for the 5 regularization methods as described in Table 1 and FIG. 44. The middle row was obtained with the matched-noise parameter. To illustrate the influence of the regularization in each case, over- and under-regularized solutions are plotted for parameters 10 times greater and 10 times lower than the matched-noise parameter.
Figure 53A:
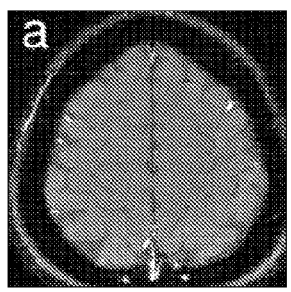
FIG. 53 shows a comparison of detected features between magnitude images (a, d, and g), SWI images (b, e, and h) and susceptibility maps (c, f, and i). The gray/white matter contrast appears on the susceptibility map (c) where the central sulcus can be easily identified, whereas it cannot be seen on standard magnitude images (a) or SWI (b). The ventricles are paramagnetic as indicated on the susceptibility map (f). They appear as darker regions on the SWI (e). Diamagnetic material (suggesting calcifications of the choroid plexus) is detected within the lateral ventricles (i) whereas signal voids appear in magnitude and SWI images (g and h).
Figure 53B:
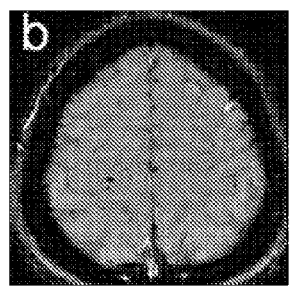
Figure 53C:
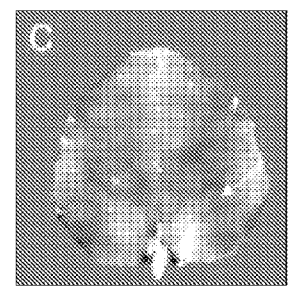
Figure 53D:
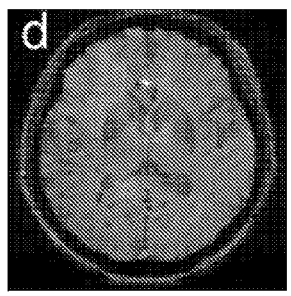
Figure 53E:
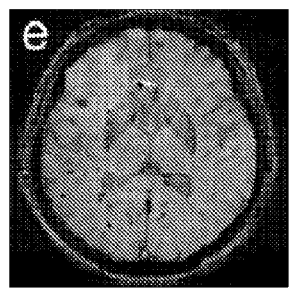
Figure 53F:
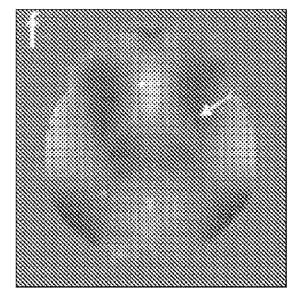
Figure 53G:
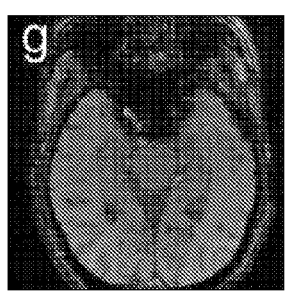
Figure 53H:
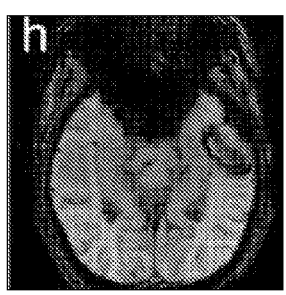
Figure 53I:
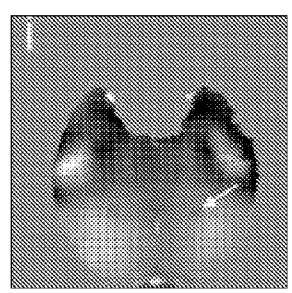

For all regularization methods, under-regularized solutions display streaking artifacts (FIG. 52), which disappears as the regularization parameter increases. The matched-noise parameters for each regularization method allow a good depiction of the samples for every method with significant artifact reduction. The two last methods imposing non uniform gradient norm perform even better in reducing artifacts for larger parameters (over-regularized solutions) with a nice depiction of the Gadolinium samples and a complete cancellation of the streaking artifacts, without significant effects on the quantification.

2. In Vivo Susceptibility Maps

An example of the patient study is illustrated in FIGS. 30, 45, and 53. The strong signal void on the T2* magnitude image indicates a hemorrhage within a cavernous malformation (FIG. 30A). A strong magnetic field inhomogeneity spreads into space indicating a strong magnetic susceptibility variation (FIG. 30B). The associated field shifts are positive both inferior and superior to the malformation and negative on the adjacent voxels within the axial slice containing the malformation. This dipole-like structure is clearly visible in reformatted coronal images (FIG. 45B). On the field map, structured details are visible throughout the brain and tend to follow the distinction between white and gray matter. As a result of the head shape some field variations are not fully compensated for by the field map pre-processing and are visible in the presented slice at anterior and posterior locations. SWI maps increase the size of the signal voids by using field inhomogeneities (FIG. 30C) which has the effect of blurring the region of the malformation, and allow an increased visualization. Susceptibility maps (FIG. 45D) obtained by imposing non uniform gradient norm weighting (method 4) show minor low frequency variations within the brain resulting from the remaining uncorrected "background" field effect from the head shape. As expected for hemoglobin present in hemorrhage under the form of deoxyhemoglobin and methemoglobin, a strong paramagnetic susceptibility (displayed in white) is observed at various locations within the brain. In particular, it collocates with the signal void in the magnitude image with values of 1.29±0.17 ppm. It is also visible in superior brain regions where SWI displays increased contrast voids indicating a pathway for blood (FIG. 45). Gray/white matter susceptibility difference appears throughout the brain (FIG. 53C). Gray matter was more paramagnetic than white matter by approximately 0.08 ppm. In the superior sagittal sinus, paramagnetic susceptibility was observed as expected for venous blood. Ventricles appeared more paramagnetic than the surrounding tissue (FIG. 53I). In addition, a diamagnetic structure can be identified in one patient in the posterior horn of the lateral ventricle (FIG. 53I).

XIII. Experiment #2—Magnitude Regularization

A. Methods

1. Data Acquisition

Experiments were performed using 1.5 Tesla (T) and 3T MRI systems (GE Signa, Milwaukee, Wis.). A standard two-dimensional (2D) spoiled gradient echo pulse sequence was modified to allow interleaved, multiecho sampling. Each k-space line was repeated $n_{enc}$=5 times with an initial echo time of (TE)=1.7 ms and echo increment of $\Delta TE$=1 ms. Full echo readout was used to reduce nonhermitian artifacts in fractional echo acquisitions. The following parameters were used in vitro: flip angle 30°, repetition time (TR) 7.7 ms for all echoes, field of view (FOV) 400 mm, 128 128 acquisition matrix, slice thickness 5 mm, 14-20 slices, and pixel bandwidth 977 Hz. The Field-Of-ppm FOppm of the sequence, that is, the shift of the magnetic field corresponding to a phase of $2\pi$, expressed in ppm, was defined as FOppm=$2\pi 10^6$/($\gamma B_0 \Delta TE$). For the experiments described here, FOppm was 15.7 ppm at 1.5 T and 7.8 ppm at 3 T, which covered the expected range of tissue susceptibility and field shifts. For the in vivo experiments, only the following parameters were modified: FOV 130 mm, TE 2.1 ms for the first echo, TR 8.7 ms.

The phantoms used for the in vitro experiments at 1.5 T are shown in FIGS. 54 and 55, which illustrate bottle locations, shape and orientation with respect to $B_0$. The standard head coil was used for signal transmission and reception. First, a reference acquisition was performed on a phantom comprised of 18 bottles (38-mm diameter and 70-mm height) filled with 78±1 mL distilled water. The bottles were fixed in rigid foam such that they could be interchanged at the same position (±0.5 mm). Then, three identical acquisitions (experiment 1, 2, and 3 corresponding to FIG. 55A-C) were performed after interchanging the water bottles with those containing air, vegetable oil, or contrast agents. Additionally, in vivo experiments were performed at 3 T with a quadrature birdcage coil designed for knee imaging. The volunteer (28-year-old male) was in the prone position with the right arm extended superior to the head. The right forearm was positioned in the coil, with the forearm oriented perpendicular to $B_0$ (anterior-posterior direction) as shown in FIG. 26.

B. Data Reconstruction and Field Mapping

All data was processed offline using Matlab (2007a, The Mathworks). From the multiecho data, the field shift was extracted on a voxel-by-voxel basis using the following model for phase temporal evolution $\phi(t)=\phi_0+\gamma\Delta Bt$. Here $\phi_0$ accounts for initial phase, $\gamma$ is the gyromagnetic ratio, and $\Delta B$ the field inhomogeneities. A weighted linear least-square algorithm was applied. The estimated phase noise $\Delta\phi_{p,TE}=\Delta S/S_{p,TE}$ was used to weight each echo phase, where $S_{p,TE}$ denotes the signal amplitude at each echo and voxel, and where the noise $\Delta S=(\sigma_{Re}+\sigma_{Im})/2$ was defined as the average of the standard deviation of the real $\sigma_{Re}$ and imaginary parts $\sigma_{Im}$ of the signal in a sufficiently large region of background air with no signal. An error on the estimated $\Delta B$ was readily derived from the linear fit. Error in the noise regions, as identified by the segmentation procedure described in the following section, was set to infinity, or equivalently, the corresponding diagonal elements in the weighting matrix (Equation. 2-9) were set to 0. Finally, gradient warping was corrected in 3D using spherical harmonics coefficients provided by the scanner manufacturer. For in vivo imaging, no reference scan was acquired. The background field inhomogeneity due to magnetic sources outside the FOV was modeled by a polynomial, thereby introducing a numerical shimming term to the field model:

$$D\chi - I\sigma + \kappa\epsilon = \delta \quad \text{(Equation 2-10)}$$

where K denotes the shimming matrix and s a vector containing its parameters. For a first order polynomial, the shimming matrix K=[1XYZ], includes a constant term with 1 s and spatially linear terms X, Y, and Z that denote column vectors containing the point coordinates. The following formula was used to estimate field measurement precision:

$$\Delta ppp = \frac{FOppm}{2\pi}\frac{\Delta S}{S}\frac{\sqrt{2}}{n_{enc}-1} \quad \text{(Equation 2-11)}$$

where $n_{enc}$ is the number of echoes, and FOppm/2_ was used for conversion from phase shifts to field shifts. Note that (Equation 2-11) provides an accurate estimate if only the first and last echoes are used in the fit, and assumes the same phase error $\Delta S/S$ for both echoes. By calculating the phase difference between echoes with a spacing $(n_{enc}-1)\Delta TE$, noise propagation resulted in the additional factor of $\sqrt{2}$. This formula overestimates the error obtained if all echoes are considered but is a convenient means to show the trend that field measurement precision is inversely proportional to signal intensity and maximum echo spacing between first and last echoes.

C. Data Segmentation

A 3D soft segmentation algorithm was implemented in Matlab to define regions of constant susceptibility for the piece-wise constant model. The segmentation process made use of contrast changes between neighboring regions to define boundaries and then performed a series of connected component analysis and mesh generation using standard software functions. For the phantoms described, all regions of interest were separated by air. The following segmentation was performed on the first echo image: (i) The noise region was identified by thresholding the intensity image to create a binary volume with 1s in voxels with signal less than 5 times the noise level. Twenty-six-connected components were labeled (26 connectivity reduces the number of labeled pieces compared with 6 or 18 connectivity). The largest labeled region, containing mostly noise voxels and low signal voxels at its boundaries was eroded by 2 voxels and was finally used to estimate the noise variance. (ii) The 3D gradient was calculated by convolution of the signal amplitude with (−1 0 1) in x, y, and z directions. The objects inside regions (full voxels) were identified as those with gradient magnitude less than half the signal. The defined mask outside the noise region was labeled by running a connected component analysis (26-connectivity). (iii) For the remaining edge points partial content was determined by the ratio of their signal amplitude to the mean signal amplitude of full-voxels in the nearest labeled region in the vicinity (within four voxels). (iv) A 3D triangular surface mesh was then constructed based on the marching cube algorithm as well known in the art with a contour level of 0.5.

For the in vivo data, a similar algorithm was used to define the following regions: soft tissue (the arm), cortical bone and bone marrow. As no signal was observed within the cortical bone, thresholding easily separated soft tissue from the marrow, and an intermediate region was defined as the cortical bone. Partial volume was then defined with the same algorithm comparing signals from the two nearest regions.

D. Results

Figure 54A:
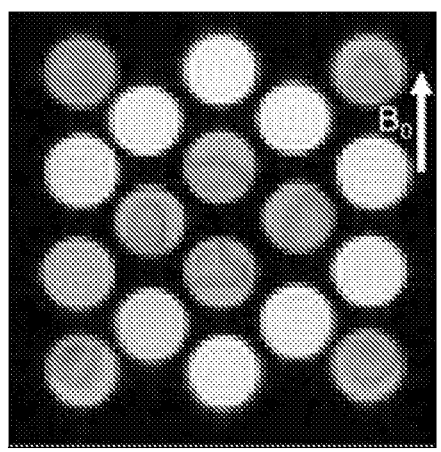
FIG. 54 shows the setup consisting of 18 bottles on a rigid support for the in vitro experiments including (a) the coronal view of the setup (cross-sectional cut through the bottles) where the SNR was ~60 for water; (b) the 3D visualization and surface mesh of a solution within one bottle illustrating its arbitrary geometry; and (c) the measured field shifts in ppm, restricted to the mask, demonstrating the field shift between experiment II.1 (Gd) and the reference experiment, where only significant values are plotted.
Figure 54B:
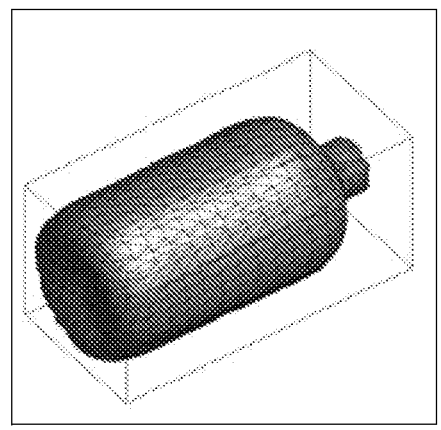
Figure 54C:
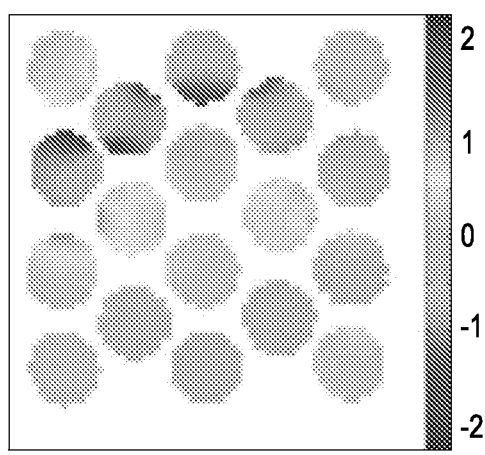
Figure 56A:
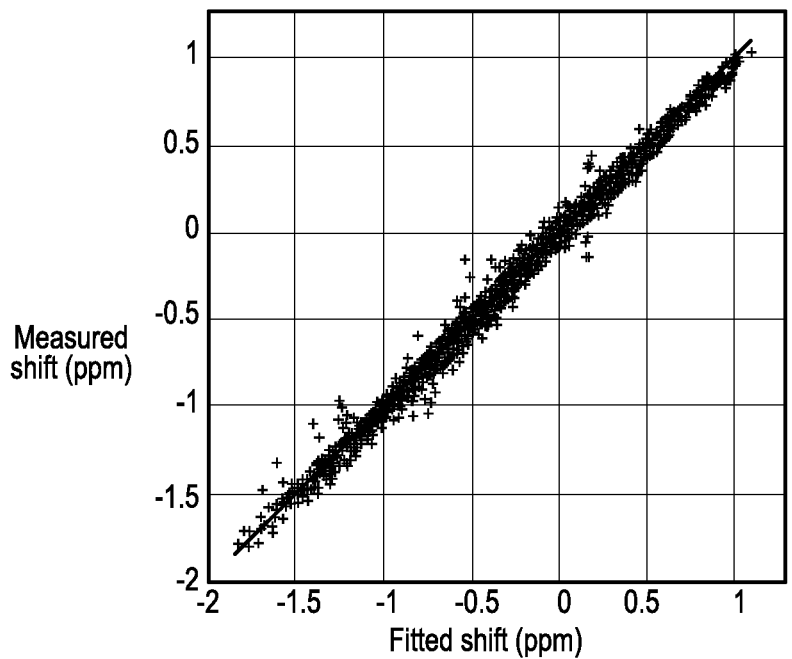
FIG. 56(a) shows the measured field shifts versus fitted field shifts, indicating excellent agreement (R2 0.997)

In vitro experimental results are illustrated in FIGS. 54-56. The magnitude image is exemplified in FIG. 54A, and the corresponding surface mesh of a segmented bottle in FIG. 54B. The soft segmentation algorithm gave a bottle volume of 75.3±0.9 mL, which was slightly less than the expected volume of 78±1 mL. An example of a measured field shift map is shown in FIG. 54C. The field shift pattern in FIG. 54C shows the total field from all bottles, indicating no apparent relationship with that of a single bottle. Outside the single bottle, observed field shifts matched those expected from a roughly cylindrical truncated object: shifts were approximately zero along the ~45 degree lines (with respect to $B_0$); otherwise, shifts outside the bottle were greater near the boundary and decreased rapidly with distance.

The susceptibility and chemical shift measurements from in vitro experiments are summarized in FIG. 55 and Table 2-1 below.

TABLE 2-1

In Vitro QSI Measurements of Susceptibility (Referenced to Water) and Chemical Shifts for Air, Vegetable Oil, and Contrast Agents (Gadolinium and Feromoxides) Molar Susceptibility (L/mol) Compared to Literature Values (at 293° K)*

| | Susceptibility in ref. $H_2O$ (ppm) | | Chem Shift ref. $H_2O$ (ppm) | |
|---|---|---|---|---|
| Compound | Literature | QSI measure | Literature | QSI measure |
| Air | 9.41[a] | 9.45 ± 0.02 | — | — |
| Vegetable Oil | 0.75[b] | 0.65 ± 0.02 | -3.5[c] | -3.46 ± 0.001 |
| $Gd^{3+}$ L/mol | 326[d] | 325.9 ± 2.2 | — | — |
| Feridex L/mol | 3615[e] | 3733 ± 82 | — | — |

*Results were obtained with the surface integral method. Similar results were also obtained with k-space calculation technique.
[a]Value converted to SI units, absolute air susceptibility at 293 K is approximately 0.37 ppm, or 9.41 ppm in reference to water.
[b]Value estimated for Oleic acid, major component of vegetable oil.
[c]Value corresponding approximately to the main peaks corresponding to CH2.
[d]Value calculated from the Curie law.
[e]Value interpolated at 1.5 T from magnetization of Ferumoxides.

Figure 56B:
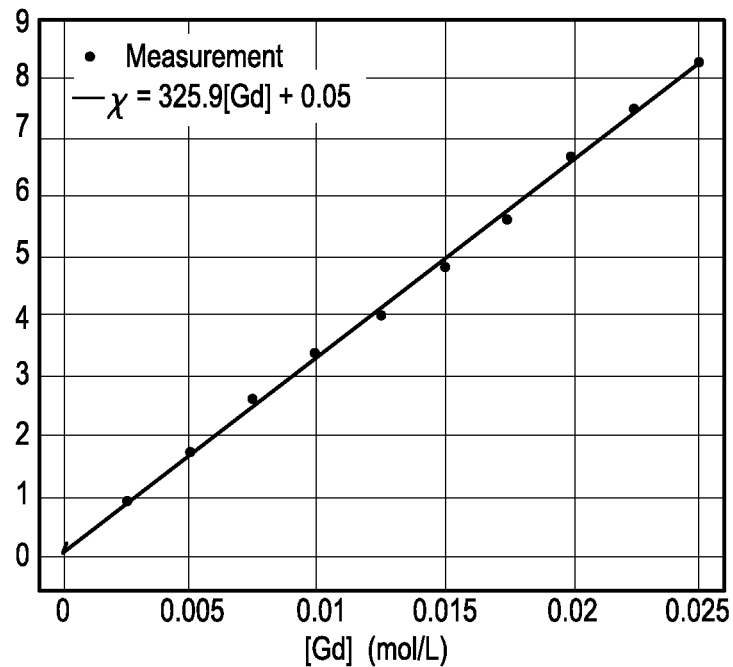
FIG. 56 (b) shows the measured susceptibility values in ppm as a function of Gd concentration, resulting in molar susceptibility of 325.9±2.2 ppm L/mol (R2 0.999)

Good agreements between QSI measurements and known values were obtained. SNR in the water bottles (FIG. 54), yielded a field mapping precision of ~0.015 ppm, close to the precision of the fitted susceptibility values. Agreement is further illustrated in the linear regression between the measured and fitted magnetic field shifts (FIG. 56A), where the fitted shifts were obtained by replacing the fitted susceptibility and chemical shifts with the field model in Equation –2-8 with n=0. Moreover, susceptibility measured in the Gd-doped solutions was proportional to Gd concentration, with Gd molar susceptibility given by the slope (FIG. 56B).

In vivo results (FIG. 26) are summarized in Table 2-2 below.

TABLE 22

In Vitro Susceptibility and Chemical Shift (in ppm) in a Forearm*

| | Soft tissue | Bone | Marrow | |
|---|---|---|---|---|
| | χTissue | χBone-Tissue | χMarrow-Tissue | σBone-Tissue |
| QSI measurement | -9.115 ± 0.13 | -2.20 ± 0.07 | 0.81 ± 0.25 | -3.47 ± 0.05 |
| Literature, in vitro | -9.04[1] | -2.5 ± -1.9[2] | 0.65 ± 0.75[3] | -3.5[4] |

*A first order shimming polynomial was used. Tissue values are absolute, while those for bone and marrow are given with respect to tissue. Literature values for water, bone, and oil (in vitro experiments and Table 2-1).

MRI of the forearm (FIG. 26A) shows no signal inside the cortical bone due to its short T2* and low proton density as expected, which allowed adequate segmentation as illustrated by the 3D renderings (FIG. 26B). The bone marrow and subcutaneous fat had a similar phase shift while the bone generated some phase variation in surrounding muscle (FIG. 26C). Linear shimming (Equation 2-10) was used and the entire imaged bone was treated as a uniform tissue (differentiating bone sections did not change the results). Distorted dipolar field shifts were observed in the tissue surrounding the bones in the simulated single bone field. Good agreement between the measured shifts and the fitted shifts derived from segmented tissues were observed (FIG. 26D), as well as between measured susceptibility and chemical shift values of muscle, bone, and marrow (Table 2-2). Similar precision for bone (Table 2-2) and field mapping (0.05 ppm) were obtained, but the error on marrow susceptibility was higher; its geometry is similar and coaxial to that of the bone leading to similar field patterns and greater noise propagation.

XIV. Experiment #3—Cosmos

According to one embodiment, an analytical solution of $\{\theta^*_n\}$, n=1, 2, ..., N can be obtain straightforwardly. Alternatively, a numerical simulation can be conducted to search for the optimal angles. Accordingly, N was set to be the minimum required 3 in both simulation and experiments. In keeping with the description above, rotation is performed in the y-z plane for the sake of description. Nonetheless, the rotation can be performed on any plane within the three-dimensional space. Without loss of generality and because of symmetry, the first angle $\theta_1$ was set to be 0°. The second angle $\theta_2$ increased from 0° to 180° with a 1° increment and $\theta_3$ increased from $\theta_2$ to 180° with a 1° increment as well. The Fourier domain kernel was generated by Equation 3-6 and the condition number was calculated according to Equation 3-8. Each dimension of $k_x$, $k_y$, $k_z$ ranged from –16 to 15 with a step increment of 1. $\log(\kappa_{\theta_2,\theta_3})$ was plotted to identify the smallest condition number and optimal sampling orientations.

A matrix space of 128*128*64 voxels was used. The middle 10 slices (z=28~37) had susceptibility distributions in the shape of the Shepp-Logan phantom(21), whose highest value is one and smallest non-zero value is 0.2. The susceptibility of all other slices was set to zero. The direction of $B_0$ was constrained to the y-z plane. Sampling from only one angle, and sampling using the optimal set of angles found in the previous section were simulated using Equation 4 to generate the field maps $\delta_B(\vec{r})$. Then, zero mean Gaussian white noise with a standard deviation of 0.01 was added to the simulated field maps.

A. EXAMPLES

1. Phantom Preparation

Three experiments were conducted to validate this technique. The first experiment was susceptibility quantification of different concentrations of gadolinium (Magnevist, Berlex Laboratories, Wayne, N.J.). A water phantom containing 5 vials with concentrations of gadolinium (Gd) ranging from 1% to 5% with 1% increment was constructed. The corresponding susceptibilities were expected to be linearly spaced from 1.63 ppm to 8.15 ppm. The second experiment was in vitro susceptibility mapping of bone. A section of bone was excised from the center part of a swine's thigh. The length of the bone was approximately 6.5 cm and the diameter was 2.7 cm. Bone marrow was removed prior to the scan. The entire bone was embedded in a 1.5% agarose gel phantom. The third experiment was in vitro iron quantification in animal tissue. In this experiment, 10% concentrations of Feridex (Advanced Magnetics Inc., Cambridge, Mass.) solutions were injected into chicken breast muscle with volumes of 1 uL, 2 uL, 3 uL and 4 uL using a micro syringe. The iron-oxide density of 10% Feridex is 1.12 ug/uL. The entire muscle was immersed in a water container.

2. Data Acquisition

All experiments were conducted on a 1.5T clinical MRI scanner (General Electric Excite HD, GE Healthcare, Waukesha, Wis.) using a 3 nch or a 5 inch surface coil for signal reception. The phantoms were rotated with respect to the magnetic field. After the first orientation was sampled, the phantom was rotated twice in the coronal plane using the optimal angles identified in the first section, and for each orientation the data acquisition was repeated. In order to obtain the best quantitative results, phantoms without the target objects but otherwise identical were also scanned. These reference scans were used to measure the field inhomogeneity induced by the phantom-air interface and $B_0$ inhomogeneity. A dedicated 3D gradient echo sequence was designed to sample at different TEs in an interleaved manner. Fields of view were $10.8 \times 10.8 \times 8.6$ cm$^3$/$10.0 \times 10.4 \times 12.8$ cm$^3$/$7.0 \times 7.0 \times 3.8$ cm$^3$ for Gd-water phantom, bone and tissue imaging, respectively. Resolutions were 1 mm$^3$/1 mm$^3$/0.5 mm$^3$. Bandwidth and TR were 62.50 kHz/62.50 kHz/31.25 kHz and 30 ms/40 ms/30 ms. The flip angle was 30° for all three experiments. Four TEs were used for each scan to achieve a balance between the precision of the field map estimation and the total scan time: 1.7, 2.2, 4.2, 14.2 ms/1.7, 2.2, 4.2, 14.2 ms/3.0, 3.8, 5.4, 10.2 ms.

3. Data Processing

Phase information was extracted from images. Because the first and the last TE are around 10 ms apart, the phase of a voxel will wrap around if the field off-resonance frequency on that voxel is greater than 50 Hz. Thus the phase needs to be unwrapped. By fitting the phase evolution, the field off-resonance frequency was estimated and converted to parts per million (ppm) by the following equation $$\delta_{ppm} = \frac{\delta f}{\gamma B_0} \times 10^6,$$

where $\gamma$ is the gyromagnetic ratio and $\delta f$ is the off-resonance frequency. Afterwards, a manual image registration was performed to place the phantoms in a consistent location across rotations. Hence, all subsequent calculations were done in the same frame of reference. Reference scans were subsequently subtracted from the field maps to obtain $\delta_B(\vec{r})$. A mask was created by removing voxels whose intensities were less than 10% of the maximum intensity. The weighting matrix W was taken as the intensity map point-wise multiplied by the mask. An algorithm for sparse linear equations and sparse least squares (LSQR) as well know in the art was used to solve this minimization problem.

The maximum number of iterations in the experiment was set to 30. Other number of iterations can also be used. Alternatively, no pre-determined number is set for the iteration and the reconstruction process can be terminated based on a residual error. Specifically, a pre-determined threshold is set and the reconstruction process is terminated when the residual error is lower than the pre-determined threshold.

Susceptibility values were measured on the reconstructed images. In a central slice of the Gd-water image, each vial and the surrounding water area were selected as Regions of Interest (ROIs). Susceptibility was measured as the mean values in these ROIs. Estimated susceptibilities versus expected susceptibilities were also plotted. For bone reconstruction, a threshold equal to −1 was placed on the reconstructed susceptibility images to delineate the geometry of the bone for measuring the mean and standard deviation of bone susceptibility. On the reconstructed susceptibility image of animal tissue, a simple threshold was used to segment Feridex regions. The mean susceptibility value of the background (chicken muscle) was subtracted from the Feridex regions. Susceptibility was converted to iron-oxide density by the conversion factor $$\frac{\chi_{Feridex}}{\rho} = \frac{\mu_0 M_{Fe}(B_0)}{B_0} = 64.7 \; ppm \; uL/ug,$$

where $\mu_0$ is the vacuum permeability. $M_{Fe}(B_0)$ denotes the magnetization of the compound at $B_0$ expressed in electromagnetic units per gram, which was reported to be 77.3emu·g$^{-1}$ (Jung, C W., *Magn Reson Imagining*, 1995; 13:661-674). The iron-oxide mass of each injection was integrated over each iron-oxide (Feridex) region.

4. Results (a) Optimal Sampling Orientations

The results of the simulation to determine the optimal orientations are shown in FIG. 17. The smallest condition number is 2.031 and the corresponding optimal sampling orientations are 0°, 60°, 120°. This is consistent with the intuition that uniformly distributed orientations perform best because sampling directions should be cylindrically symmetric to the anterior-posterior direction.

(b) Numerical Phantom

Results obtained from a simulation using numerical phantom are shown in FIG. 58. Inverting the dipole field using only one orientation yielded results that cannot be interpreted (FIG. 58C). In contrast, inverting from 3 orientations returned satisfactory results (FIG. 58D). The distracting streaking artifact at the magic angle (54.7°) that is often associated with susceptibility reconstruction was not observed (Haacke, E M., *Magn Rason Imaging*, 2005; 23:1-25, Morgan, J., *Proceedings of the 15th Annual Meeting of ISMRM*, Berlin, Germany, 2007 (Abstract 35). The error between the reconstructed and true susceptibility has a mean value of 4.6272e-3, which is negligible compared to the value of the true susceptibilities.

(c) Experimental Results

The 3D images for the three experiments were successfully reconstructed with 30 iterations and each took less than 10 minutes on a Pentium 4 personal computer with 3 GB of memory using MATLAB (MathWorks, Natick, Mass.).

(i) Gadolinium Susceptibility quantification

Figure 59A:
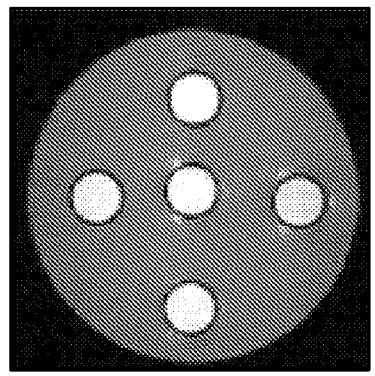
FIG. 59 (a)-(d) show the Gd-water phantom experiment, including (a) the magnitude of the gradient echo image of the Gd-Water phantom. Note that different concentrations of Gd have similar intensities, (b) the $\delta_B(\vec{r})$ of Gd-water phantom, where the strong noise is seen on both the background air region, and the glass wall (indicated by arrows), (c) the reconstructed susceptibility map from three orientations, and (d) the graph displaying estimated susceptibility versus expected susceptibility.
Figure 59B:
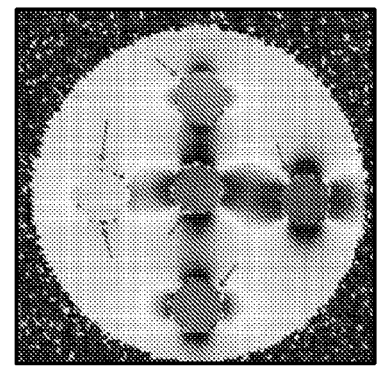
Figure 59C:
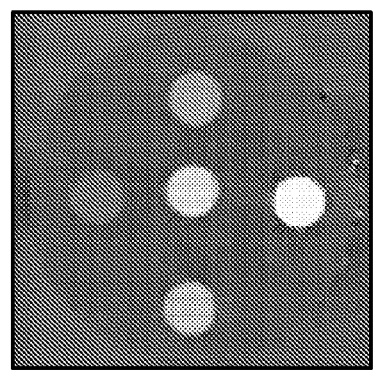
Figure 59D:
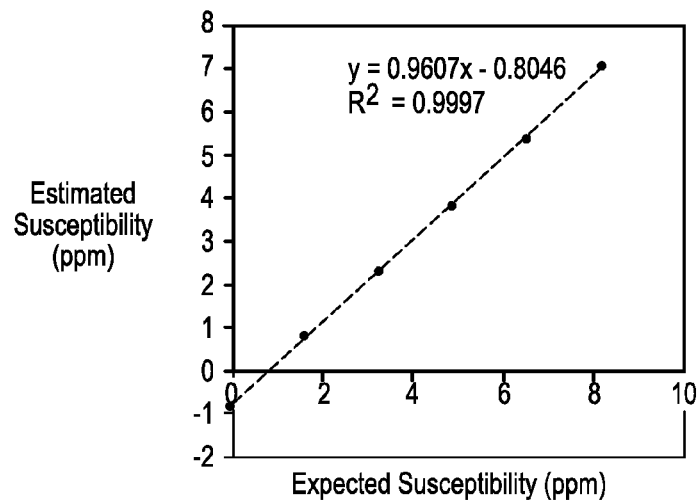
Figure 60A:
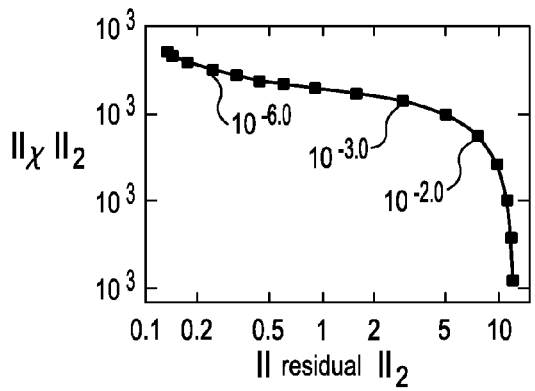
FIG. 60 shows plots and images for the numerical phantom experiments, where (a) and (b) show the L-curves for the l2 and l1 regularized inversions; (c) and (d) shows the slope vs.
Figure 60B:
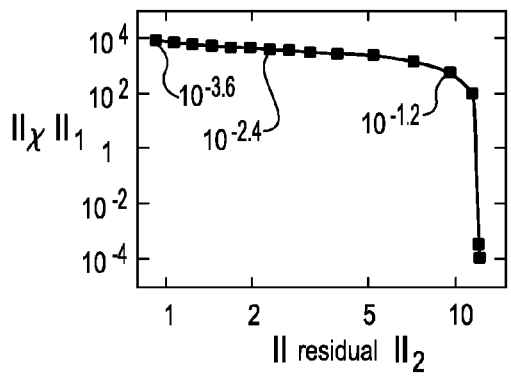
Figure 60C:
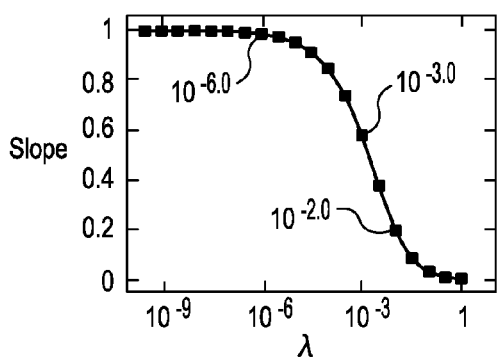
Figure 60D:
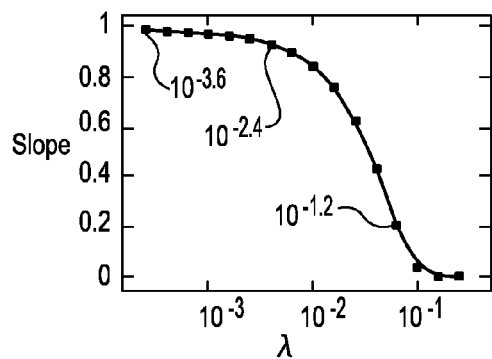
Figure 60E:
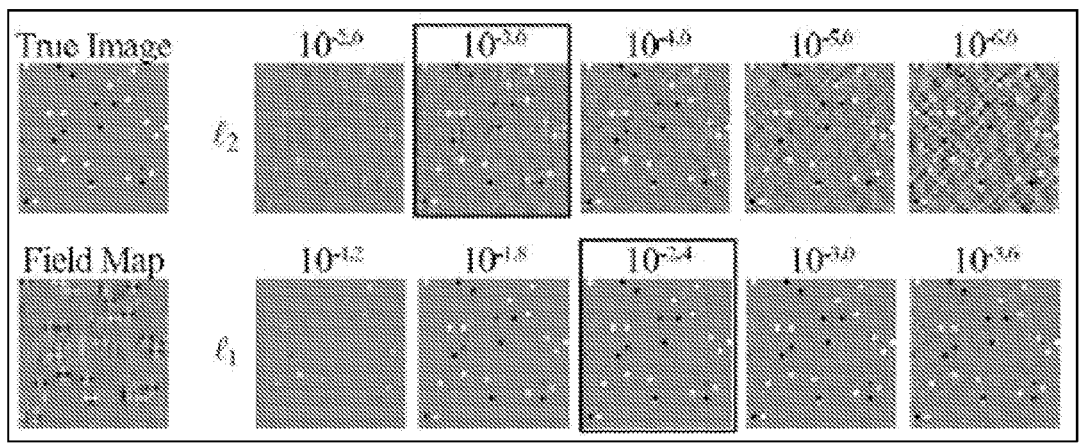

The measured $\delta_B(\vec{r})$ in FIG. 59b shows a conspicuous dipole pattern surrounding the vials with different gadolinium concentrations. COSMOS provided satisfactory images (FIG. 59C). Different Gd concentrations were clearly resolved and no streaking artifacts were observed. The relation between estimated and expected susceptibility is plotted in FIG. 59D. The result fits well with the linear model ($R^2$=0.9997), and provides a fair estimation of susceptibility (slope is 0.96, close to unity).

(ii) In vitro Bone Imaging

FIG. 18A shows a gradient echo image obtained from the bone phantom and FIG. 18C is the corresponding susceptibility reconstruction. Compact bone susceptibility was found to be −2.44±0.89 ppm relative to water. This susceptibility value is in fair agreement with previous in vitro work ($\delta\chi_{bone-water}$=−2.39 ppm).

(iii) In vitro Iron Quantification in Animal Tissue

A representative slice is shown in FIG. 19C. The bright regions corresponding to the 2 uL, 3 uL and 4 uL iron-oxide injections are visible on this image (1 uL region not shown in this slice). Measured iron mass are 1.23 ug, 2.09 ug, 3.32 ug and 4.34 ug. The relation between estimated and expected total magnetic moment is plotted in FIG. 19D. Again, this result fits the linear model well ($R^2$=0.9959), and indicates that the technique provides a good estimation of iron-oxide mass (slope is 0.94). The small non-zero y-intercept may be explained by noise, error during injection, or temperature changes during the scan.

XV. In Vivo Quantification of Contrast Agent Concentration Using the Induced Magnetic Field for Time-Resolved Arterial Input Function Measurement with MRI The footnote references in the text of this section refer to a list of complete citations of references set forth in a bibliography at the end of this section.

A. Introduction

Quantifying tracer concentration is essential for pharmacokinetic modeling to assess organ and tissue function [1]. Dynamic contrast-enhanced (DCE) techniques for MR angiography [2] or perfusion imaging [3-5] traditionally rely on blood signal intensity enhancement due to contrast agent (CA) induced T1 shortening. T1 mapping with inversion-recovery techniques can be applied to calculate CA concentration, but long acquisition times are required [6]. Faster techniques have been developed which model the non-linear signal intensity behavior in the applied sequence [7]. Three-dimensional fast gradient echo sequences are commonly used for which the steady-state signal intensity can be related to concentration under multiple simplifying assumptions such as neglecting transverse relaxation for low doses [3-5,8]. For quantification, a scan is usually performed to obtain tissue pre-contrast relaxation parameters, sensitivity maps and to calibrate the flip angle [3]. However, inflow effects may modify the steady-state signal intensity making absolute CA quantification difficult when faster sequences (such as 2D) are employed [3,9]. CA relaxivity may also change depending on macromolecular content making the extraction of concentration from the signal intensity curve more complex [10]. In addition, $T_2^*$ apparent relaxation adds to the complexity of linking signal intensity to concentration [11].

The arterial input function (AIF) is critical for quantitative functional assessment [5]. The AIF measured from signal magnitude suffers from non-linearity at typical peak concentration levels and is subject to the aforementioned sources of error. However, paramagnetic and superparamagnetic CAs can modify blood susceptibility and shift its resonant frequency [8]. To avoid difficulties in CA concentration quantification from the signal magnitude, we utilize this frequency shift information, which is intrinsically contained in the signal phase [12,13]. Phase mapping, as in phase-contrast (PC) velocity quantification, is advantageous as it is known to be relatively independent of parameters such as flip angle, coil sensitivity or inflow effects [14]. Nevertheless, the field shifts induced by CA are not spatially uniform and depend on vessel or organ geometry and its orientation with respect to the external field [15]. In most in vitro and in vivo applications, simplified geometrical models are usually assumed [12,13,15,16]. For example, an infinite cylinder model is commonly used to describe the geometry of major blood vessels [15,17]. These models have been extensively validated in vitro [12,16,17], and have been applied to estimate liver iron content from the shifts in portal and hepatic veins [18], to measure global brain oxygen extraction [19], and to differentiate veins and arteries in the peripheral vasculature [20]. A small animal study encouragingly reported approximate linearity between frequency shifts and CA concentration, but did not quantify concentration [21]. Phase-difference mapping has also been used to assess CA concentration in the mouse brain in vivo [17]. However, this study relied on the infinite cylinder model which may limit its applicability to properly aligned vessels. Furthermore, optimization of parameters such as CA dosage and image signal-to-noise ratio (SNR) may be required for precise AIF quantification [22], while unbiased quantification also requires that CA distribution in the vasculature and vascular geometry be known [23].

With MRI, the geometry of major blood vessels can be defined from the signal intensity maps and the simultaneously acquired signal phase can be used for CA quantification. Based on these principles, we describe a general technique to process CA-induced phase data to extract the concentration of CA over time as a step forward from previous works that did not fully address the issue of determining the conversion between phase shifts and concentration [17,22]. The method can be applied to vessels or organs of arbitrary shape and to MR data acquired using a variety of pulse sequences and scan parameters, and utilizes geometrical and phase information from multiple voxels to quantify CA concentration. Proof of concept is shown by quantifying the AIF with high temporal resolution using a fast gradient-echo sequence to during the first-pass of a Gd (Gadolinium)-bolus injection without the need for a time consuming 3D scan. A geometrical model of the aortic arch is constructed from magnitude images to model the observed field shifts and is used to dynamically quantify Gd concentration. This absolute quantification technique is shown to be linear in the entire range of concentration used in vivo and insensitive to signal intensity variations.

B. Theory

1. Magnetic Field Variations Induced by CAs

A paramagnetic or superparamagnetic CA modifies blood magnetic susceptibility in proportion to its concentration: $\Delta\chi(\vec{r}) = \chi_m[CA](\vec{r})$, where $\vec{r}$ is the position vector, $[CA](\vec{r})$ the CA spatial distribution and $\chi_m$ the molar susceptibility of the injected compound [24]. Neglecting diffusion effects for voxel sizes much larger than the diffusion length $\sqrt{2DTE}$ (typically 1 to 10 μm), where D is the free diffusion coefficient and TE the echo time, the phase blurring is negligible and can be assumed to be proportional to the local magnetic field. Let $B_{ref} = \phi_{ref}/\gamma TE$ be the pre-contrast field component measured on the MR signal phase $\phi_{ref}$ at TE before injection, where γ is the gyromagnetic ratio. After contrast injection the field $B = \phi/\gamma TE$ is modified and can be modeled as a spatial convolution [25-27]:

$$\Delta B_{z,local}(\vec{r}) = B - B_{ref} = B_0(\Delta\chi \otimes d)(\vec{r}), \quad \text{(Equation 5-1)}$$

where $d = (3\cos^2(\theta) - 1)/4\pi|r|^3$ is the field component along $B_0$ induced by a unit magnetic dipole in spherical coordinates (with r the radial position and θ the angle with $B_0$). This relationship is briefly derived in Appendix A and shows that the effects on the field are purely linear with concentration. Nevertheless, the shifts are not spatially uniform as a result of the convolution with a dipole field.

For a given object i (such as an organ or vessel of interest) defined by its geometry $G_i$ (defined as the mask that is 1 inside the object, and 0 outside), with uniform susceptibility $\Delta\chi_i$, (Equation 5-1) (see also Appendix A) indicates that the contribution to the field shifts of this object is given by:

$$\Delta B_i(\vec{r}) = \Delta\chi_i B_0(G_i \otimes d)(\vec{r}) = \chi_i B_0 F_i(\vec{r}), \quad \text{(Equation 5-2)}$$

where the shape factor $F_i = G_i \otimes d$ varies in space and can be calculated from the Maxwell equations [25,26]. Equation 5-2 shows that the field shift depends on the shape of the vessel or organ that contains CA and can have effects inside as well as outside the object. Given a geometrical model of each object that contains CA (e.g. arteries, veins, organs), (Equation 5-1) allows the measured field shift to be written as a linear combination of the effects induced by individual objects:

$$\Delta B(\vec{r}) = \sum_i \Delta B_i(\vec{r}) = B_0 \sum_i \Delta \chi_i F_i(\vec{r}),$$ (Equation 5-3)

To quantify the change in susceptibility and concentration, the shape factors $F_i$, or equivalently, the geometry of each object, must be known. Simplified models such as the infinite cylinder may be assumed in certain cases. More complex shapes such as the aortic arch can also be estimated from MR signal intensity images.

Assuming the shape factors can be estimated, the CA concentration within each object can be estimated using a linear least-squares inversion [28,29]:

$$[CA]_i = (F'F)^{-1} F_i' \Delta B / \chi_m B_0,$$ (Equation 5-4)

where $[CA]_i$ denotes the CA concentration inside object i, F is a matrix containing the shape factors, and $\Delta B$ denotes a vector containing the measured field at selected locations. We refer to this approach as quantitative susceptibility imaging (QSI). Additionally, the co-variance matrix of the estimated concentrations $\sigma_{CA}^2$ can be determined from the noise variance of the residual field [29]: $\sigma_B^2 = \text{var}(F\Delta B_0 - \Delta B)$ and by considering the noise propagation effect of a linear system:

$$\sigma_{CA}^2 = (F'F)^{-1} \sigma_B^2 / \chi_m B_0,$$ (Equation 5-5)

C. Relaxation Effects on Signal Intensity Induced by CAs

For comparison with the QSI technique, signal intensity behavior is briefly reviewed for the spoiled gradient-echo sequence (for more details see Schabel et al. [3]). In the fast exchange regime [8], which is typically used to analyze signal intensity curves, the post-contrast relaxation rates are assumed to scale linearly with concentration: $R_1 = R_{1,0} + r_1 [CA]$, $R_2^* = R_{2,0}^* + r_2^* [CA]$, where $R_{1,0}$ and $R_{2,0}^*$ are the pre-contrast longitudinal and transverse relaxation rates and $r_1$ and $r_2^*$ are the longitudinal and transverse relaxivities, respectively. Neglecting time-of-flight effects, the relative signal enhancement between the steady-state signal intensity of the reference pre-contrast scan S and that of the post-contrast scan S can be defined as [3,15]:

$$E = \frac{S}{S_0} - 1 = \frac{(E_1 - 1)(E_{1,0}\cos(\alpha) - 1) E_2}{(E_{1,0} - 1)(E_1 \cos(\alpha) - 1) E_{2,0}} - 1,$$ (Equation 5-6)

where $E_i = \exp(-TR\, R_i)$ for $i=1/1,0$ and $E_i = \exp(-TE\, R_i^*)$ for $i=2/2,0$, TR is the sequence repetition time, and $\alpha$ is the flip angle.

If transverse relaxation is neglected, concentration can be approximated on a pixel-by-pixel basis as:

$$[CA] \approx \frac{1}{r_1}\left(\frac{-1}{TR}\log\left[\frac{E(E_{1,0}-1) + E_{1,0}(1-\cos(\alpha))}{1 + \cos(\alpha)(E(E_{1,0}-1)-1)}\right] - R_{1,0}\right),$$ (Equation 5-7)

where log denotes the natural logarithm. For low doses a linear approximation can be used:

$$[CA] \approx \frac{R_{1,0}}{r_1} E,$$ (Equation 5-8)

Both signal intensity and phase analysis for a fast 2D spoiled gradient-echo sequence are evaluated here during the first pass of a CA injection.

D. Materials and Methods

All imaging experiments were performed using a 1.5T commercial scanner (GE Healthcare, Waukesha, Wis.). An 8-channel cardiac phase-array coil was used for signal reception.

1. In Vitro Experiments

A 16-mm diameter flexible vinyl tube was fixed to a flat surface with a curvature radius of 75 mm to mimic the aortic arch (FIG. 64). Tap water was pumped into the tube at a flow rate of 77.5±2 ml/s as determined from two exit volume measurements over a 60 s interval.

Time resolved 2D spoiled gradient-echo images were acquired every 0.6 s (using a simulated heart rate of 100 beats per minute) in the coronal plane during a Gd-DTPA bolus injection (Magnevist, Berlex Laboratories, Wayne, N.J.). The bolus was injected with a power injector (Medrad, Pittsburgh, Pa.) for 20 s followed by a 20 s water flush. Six experiments were repeated with an injection rate varying from 0.5 to 3 ml/s (by 0.5 ml/s increment). Imaging parameters were: field-of-view (FOV)=30 cm, phase FOV factor=0.7, matrix size 128×90, slice-thickness=8 mm, bandwidth (BW)=390 Hz/pixel, TR/TE=4.7/2.1 ms (full-echo), flip angle (FA)=30°, 120 time frames. The sequence also recorded the start acquisition time for each time frame so that potential loss of trigger during the long breath-hold could be compensated for during post-processing. This acquisition will be referred to as the QSI scan.

Additionally, longitudinal and transverse relaxation rates of tap water were measured using a 2D inversion recovery spin-echo sequence with imaging parameters FOV=15 cm, slice-thickness=1 cm, BW=244 Hz/pixel, TR/TE=15 s/10 ms, matrix size 256×128, inversion time (TI)=50 ms, 2 s, 4 s, and infinity (inversion pulse disabled) and a 2D gradient echo sequence with identical imaging parameters, except for TR/TE=207 ms/3.4, 53.4, 103.4, 153.4, 203.4 ms, respectively. Mean signal intensities were measured within a region of interest and were then fitted to a three-parameter ($M_0 - M_{inv}\exp(-TI\, R_{1,0})$) and a two-parameter ($M_0\exp(-TE\, R_{2,0})$) exponential model to estimate pre-contrast longitudinal and transverse relaxation rates, respectively, using non-linear least squares. In these models, $M_0$ and $M_{inv}$ account for initial and inverted magnetizations.

2. In Vivo Experiments

The human study was approved by our local Institutional Review Board, and written informed consent was obtained from each subject prior to imaging. Experiments were performed on 9 healthy volunteers and 5 patients suspected of cardiovascular disease (7 males, 7 females, mean age=50±18 years, age range 18-75 years). Vector electrocardiographic (ECG) gating was used for cardiac synchronization.

The protocol consisted of three breath-hold scans. First, a cine phase-contrast (PC) scan was performed in a plane perpendicular to the ascending aorta during a ~20 s breathhold with the following imaging parameters: FOV=28 cm, phase FOV=0.8, slice thickness=8 mm, BW=244 Hz/pixel, TR/TE=8/3.3 ms, matrix size 256×204, flip angle=25°, 28 reconstructed cardiac phases, velocity encoding=150 cm/s. Next, the QSI scan of the aortic arch was performed to acquire one diastolic image per heartbeat in a plane through the aortic arch during the first-pass of a Gd-DTPA bolus injection (Magnevist, Berlex Laboratories, Wayne, N.J.). Single doses (0.1 mmol/kg) were injected with the power injector at a flow rate varying from 2 to 3 ml/s, followed by a 20-ml to 30-ml saline flush. Typical imaging parameters were: FOV=30-40 cm, phase FOV 0.5-0.7, matrix size=128×64-90, slice thickness=8 mm, BW=390 Hz/pixel, TR/TE=4.5-5/2-3 ms (full-echo), FA=30°, 32 to 48 time frames. Acquisition time for each frame was 300-448 ms. Injection and image acquisition were started simultaneously. Finally, a cine PC scan was repeated after the QSI scan. In 5 subjects, the QSI protocol was repeated after approximately 5 min to assess intra-individual reproducibility of the method. As clearance is relatively slow, it can safely be neglected during the acquisition time (<1 min). Additively, after 5 min, the first CA bolus is sufficiently homogeneous within blood so as not to affect the phase-difference based QSI method.

(a) Field Map Calculation and CA Concentration Quantification

For each coil element, the raw k-space data was Fourier transformed into image space. To optimally combine signals from all coils, relative complex sensitivity maps were estimated from the sum of complex signals over all acquired time frames. For each frame, phase corrected signals from individual coils were combined using weighted linear least squares [30] where weightings were inversely proportional to the signal intensity of relative sensitivity maps[31]. A pre-contrast field map was estimated as the mean field value of the last 10 acquired frames (in vitro experiment), or of the first 3 pre-contrast frames (in vivo experiment) to avoid contamination of the field map by recirculation. Subtracting the pre-contrast field obtained prior to CA injection from every frame is necessary for an accurate assessment of effects induced exclusively by the CA.

To estimate the shape factor, a simplified 3D geometrical model of the curved tube or aortic arch was constructed semi-automatically from the 2D signal intensity map summed over all acquired frames. The curved tube or aorta was manually outlined on the 2D image by selecting few points on the tube or aorta boundary. The contour was then interpolated using spline fitting. Two-dimensional Delaunay triangulation was performed on the spline points. Two-dimensional triangulation was converted into a closed 3D triangular surface mesh by creating connected circles over each 2D triangle edge. Knowing the shape and its orientation with respect to $B_0$, the shape factor F (Equation 5-2) was calculated for each pixel within the imaged slice and inside the tube/aortic arch model using a Maxwell boundary element method on the surface mesh [25,26] (see Appendix B). To extract concentration for each time frame, (Equation 4) was used assuming $\chi_m$=326 ppm/M at 298 K (in vitro) and 308 ppm/M at 310 K (in vivo) for $Gd^{3+}$[24,32]. The residual sum-of-square was calculated as an estimate of the field measurement noise variance and then used to estimate the 95% confidence interval on the concentration by noise propagation [29] (Equation 5-5). For comparison with previous approaches[17,22], the infinite cylinder model was applied with shape factor $$F = \frac{1}{2}(\cos^2(\theta) - 1/3),$$

where θ represents the orientation of the cylinder with respect to $B_0$. This approach is conceptually similar: the orientation of the aorta must be evaluated which is equivalent to estimating the geometry. For a fair comparison, instead of using single voxel measurements as in previous works, information from multiple points within the aorta was combined. The mean shift within the straight part of the descending aorta was calculated and converted to concentration assuming F=1/3 for all points (the cylinder model parallel to $B_0$ [17]).

Similarly, signal enhancement (Equation 5-6) was calculated using the baseline intensity map from the same frames used for pre-contrast field estimation. The mean signal enhancement within the curved tube or aorta was calculated and contrast concentration was estimated using both non-linear (Equation 5-7) and linear (Equation 5-8) approximations. The following fitting parameters were used: $R_{1,0}/R_{2,0}^*$=0.45/0.83 $s^{-1}$ for tap water (measured previously), $R_{10}/R_{20}^*$=0.69/3.45 $s^{-1}$ for blood and $r_1/r_2^*$=4.3/5.2 $mM^{-1} s^{-1}$ for Gadolinium[3].

(b) Cardiac Flow Rate Quantification

In contrast to in vitro experiments where the dilution is controlled and thus dilution concentration known, direct CA concentration measurement independently from MRI techniques (e.g. from blood extraction) in dynamic in the aorta is practically difficult. For in vivo validation of the concentration curve with high temporal resolution (1 measurement per heartbeat), the indirect method via flow rate quantification based on indicator dilution principles was used [33]. If neither loss of indicator nor recirculation occurs, flow rate can be accurately measured by integrating the dilution curve (Stewart-Hamilton principle). Consequently, the first pass has to be sufficiently separated from subsequent passes. Usually, for a short bolus, a dispersion model is used to increase precision of the integration. Here, the dilution curve was fitted to a dispersion model (LDRW distribution, see for example [34,35]) using non-linear least-squares, which allows timing and dispersion parameters to be extracted from the first pass of the AIF:

$$[Gd](t) = \frac{M_{Gd}}{f}\sqrt{\frac{\lambda}{2\pi\mu(t-t_0)}}\exp\left(-\frac{\lambda}{2\mu}\frac{(t-t_0-\mu)^2}{(t-t_0)}\right),\quad\text{(Equation 5-9)}$$

where $M_{Gd}$ is the total amount of injected Gd, f is the flow rate, λ is a dispersion parameter determining how much the curve is skewed, $t_0$ is the time dispersion starts and μ is equivalent to the mean transit time. This standard model assumes a Gaussian indicator distribution around a moving average position with a linearly increasing standard deviation as a function of time. This evolution has been found to adequately model indicator-dilution curves for short boluses [35]. Note that for the in vitro experiment, flow rate was determined simply by integrating the dilution curve over the entire scan time.

The QSI analysis procedure took ~2 minutes per case, which included manual segmentation of the aorta, geometrical model construction and fitting procedures. This was repeated 6 times using the same data set on one subject to determine the reproducibility of the algorithm for cardiac flow quantification. For comparison, mean cardiac flow rate was also obtained in vivo from standard processing of the PC data [36,37]. The aorta was manually outlined on the velocity images and flow rate was calculated by integration over both space and time. Drawing the contours of the moving aorta for all 28 cardiac phases took ~5 min per case. Bland-Altman analysis [38] was then performed to assess the agreement between the two PC scans (before and after injection) to estimate PC reproducibility, between the first PC scan and the QSI scan, and between the two QSI scans (in subjects were more than one was performed).

E. Results

1. In Vitro Experiments

Figure 65A:
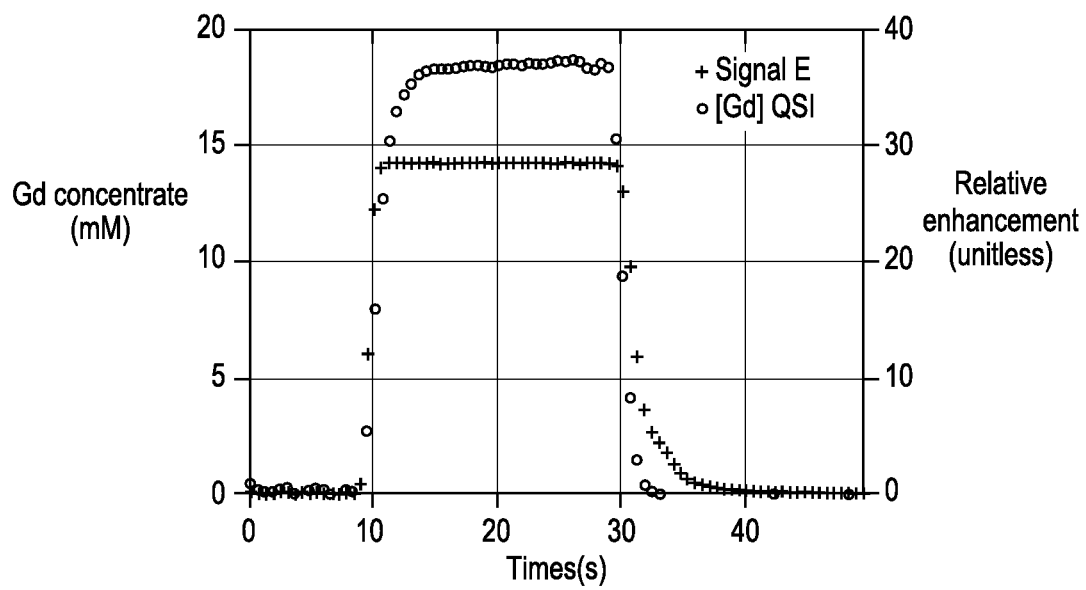
Figure 65B:
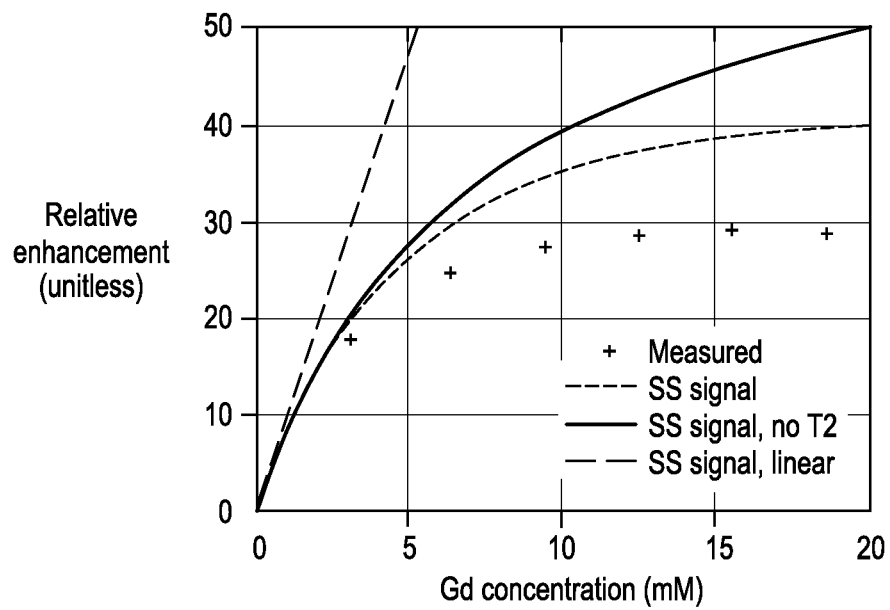

The geometrical model construction, shape factor calculation and measurement for the QSI in vitro experiments are shown in FIG. 64. The field in each location of the curved tube exhibited an angular dependence similar to that of an infinite straight cylinder with the same orientation as that of the curved tube in that location. Good qualitative agreement can be seen between the calculated shape factor and the measured field shifts. After an initial increase in the concentration, the concentration and the associated signal enhancement reached a stable plateau (FIG. 65A). FIG. 65B shows the measured signal enhancement plateau value as a function of imposed concentration for the different experiments. For comparison, the theoretical steady-state signal intensity for the nominal flip angle (30°) in the different models (linear and non-linear with and without transverse relaxation) is also shown. For low concentrations, all models perform similarly. Note that only the model accounting for transverse relaxation displays saturation and closer similarity to the observed signal enhancement over the range of concentrations in these experiments.

Figure 65C:
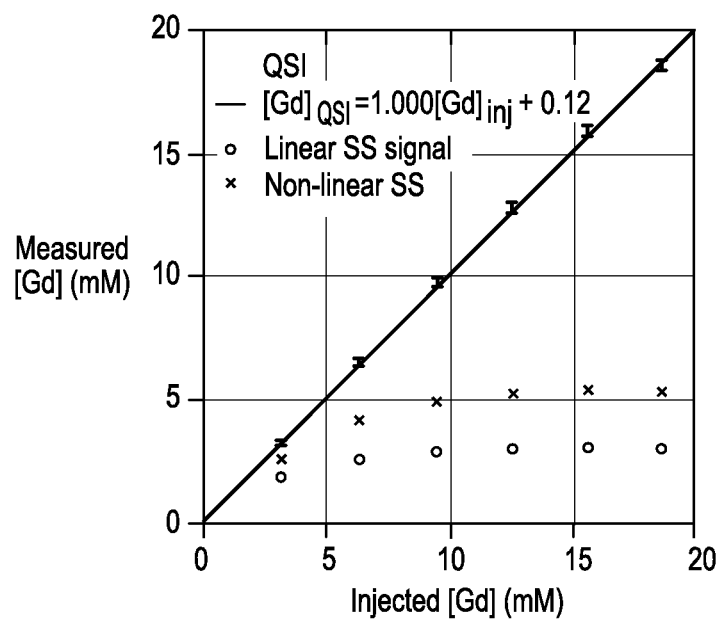

Extracted Gd concentrations determined from QSI and signal enhancement techniques are shown in FIG. 65C on which the QSI technique provided results in excellent agreement with the measurements over the entire concentration range ($[Gd]_{QSI}$=1.00 $[Gd]_{inj}$+0.12). Furthermore, flow rate calculated from the Stewart-Hamilton principle (78.4±1.3 ml/s, mean±standard deviation among the 6 experiments after subtraction of the injection rate) agreed with the calibration (77.5±2 ml/s). Similar results were obtained with the simplified shape model of an infinite cylinder parallel to $B_0$ ($[Gd]_{cyl}$=097 $[Gd]_{inj}$–0.11), indicating that the model adequately approximates the shape factor in the input branches of the phantom. In contrast, Gd concentration extracted using signal enhancement techniques was in poor agreement with the known injection values as expected for such high concentrations. The linear model was biased for small concentrations and reached a plateau for concentrations over 5 mM. The non-linear model reached closer estimates of Gd concentration in the low concentration range (<5 mM) but was inaccurate for greater concentrations.

2. In Vivo Experiments

Figure 66A:
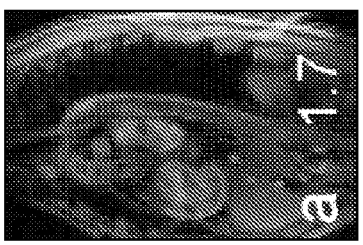
Figure 66B:
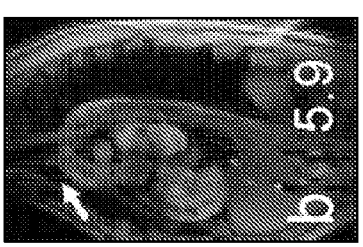
Figure 66C:
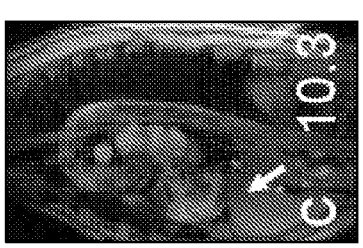
Figure 66D:
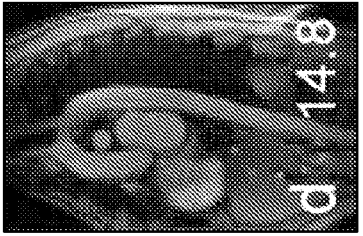
Figure 66E:
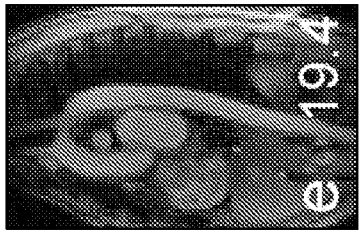
Figure 66F:
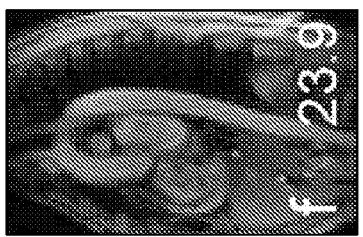
Figure 66G:
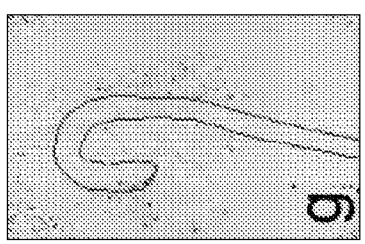
Figure 66H:
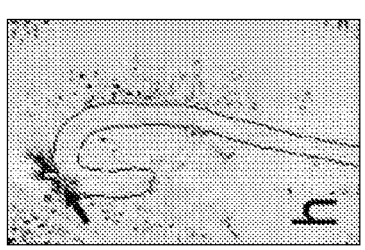
Figure 66I:
Figure 66J:
Figure 66K:
Figure 66L:

FIG. 66A-F shows representative time-resolved magnitude images of the heart and the aortic arch obtained during first pass Gd injection. Prior to contrast arrival in the arch, T2* effects from the high Gd concentration in the neighboring superior vena cava reduced signal intensity (solid arrows in FIG. 66B,C) while a distinct dipolar field pattern can be observed in the corresponding field maps (solid arrows in FIG. 66H,I). Subsequently, T1 signal enhancement was observed in the right atrium and ventricle, followed by the pulmonary system, the left atrium and ventricle, and finally the aortic arch (FIG. 66D-F). Interestingly, during this period, the induced field variations were primarily concentrated in the aorta (FIG. 66J-L), supporting the single object model assumed here.

FIG. 27A-B illustrates a contoured aortic arch using spline interpolation and corresponding 3D geometrical model. Note the strong similarity between the shape factor and the measured field (FIG. 27C,D) during CA presence in the aorta following dilution through the pulmonary system, illustrating the effect of the convolution with the dipole field. The aorta shape factor ranged from approximately 0.32 to −0.10, depending on orientation with respect to $B_0$. This field map approximately corresponds to the time frame depicted in FIG. 66E.

A typical dilution curve obtained in vivo with QSI (FIG. 67) allows depiction of the first and second passes. Compared to the QSI curve, the associated signal intensity enhancement curve shows saturation during the first pass but similar trend during the second pass. For the presented case, the signal enhancement curve was ~6 times smaller than the theoretical signal enhancement curve. This scaling factor was highly variable (0.10±0.04 among all 14 subjects) as may be expected when time-of-flight effects are considered [9]. The signal enhancement saturation effect was seen in all 14 subjects at concentrations >~5 mM. The cylinder model derived concentration curve gave the same unsaturated AIF with similar shape as that obtained using the QSI technique, but with slightly smaller concentration values (FIG. 67).

Reproducibility of the QSI analysis was found to be better than 2% demonstrating that the use of magnitude images enabled robust model construction and shape factor estimation. A precise concentration measurement was obtained after the bolus reached the lungs with an estimated precision on concentration close to 0.1 mmol/L (from Equation 5-5, 95% confidence interval ±0.2 mmol/L). The flow rate measurement using (Equation 5-4) was found to be robust for estimating the area under the dilution curve, as modifying the interval considered for first pass, as indicated in [35], did not significantly change the results. Time constants obtained for the 14 subjects (mean±standard deviation) were $t_0$=8.8±3.2 s and $\mu$=11.1±3.0 s. The arrival time ($t_m$=17.2±3.5 s) was defined as the time from halfway through the bolus injection to the estimated mean transit time $\mu$ as depicted in FIG. 67. Finally, the dispersion parameter was $\lambda$=9.6±5.2.

The Bland-Altman plot (FIG. 68) exhibited no significant bias or trend between QSI and PC flow measurements, and an agreement close to 10% of the mean flow rate. The limit of agreement between QSI and PC measurement was −18.3 to 20.9 ml/beat of PC measurement over the range of approximately 60 to 140 ml/beat. PC repeatability was ~12% and QSI repeatability was ~5%. This absence of bias indicates an accurate measurement of concentration in vivo. Comparison of the cylinder model results with those from PC (FIG. 68A) indicated an overestimation of flow rate by ~20% and consequently concentration. The Bland-Altman comparison (graph not shown) indicated a similar trend with an agreement of 19.0±18.8 ml/beat showing significant bias between techniques.

3. Discussion

Accurate quantification of paramagnetic contrast agent concentration is required for assessing organ function through perfusion in healthy and pathological tissue. However, MRI signal enhancement is complicated by the non-linear relationship with concentration and the dependence on multiple parameters such as flip angle, coil sensitivity, inflow effects and relaxation rates. Our preliminary data show that paramagnetic contrast agent concentration can be measured rapidly in vivo with a fast 2D gradient-echo sequence using the induced magnetic field shifts. Phase-based methods were linear and precise. The presented QSI technique uses the magnitude image to estimate the shape factor and the phase to determine the concentration using a linear least-square inversion of the induced field. This technique provided accurate Gd concentration measurement within the aorta during the first pass of a Gd bolus injection, from which the AIF and cardiac output could be derived for all 14 subjects. Signal intensity enhancement analysis failed to provide absolute measurement in the concentration range obtained in vivo during first pass. As a phase-based measurement technique, QSI accuracy is expected to be relatively insensitive to the parameters that influence signal intensity such as flip angle, coil sensitivity, inflow effects and relaxation rates. Compared to previous techniques based on phase [17,22], the introduction of more precise geometrical information enables improved precision in CA concentration and flow rate measurements.

The QSI technique has a high degree of precision and is not limited in the range of Gadolinium concentration as indicated qualitatively by the smooth temporal evolution of the dilution curves, and quantitatively by the 95%-confidence intervals. Concentration measurement given by QSI was precise to ~0.1 mM in the range of 0-20 mM commonly obtained in vivo. This precision is dependent on image SNR, as it is equivalent to field shift measurement precision. As shown in previous work [22], phase-based methods require acquisition parameter optimization for AIF measurement. Here, the QSI method extends voxel-based measurement [17,22] by combining geometrical information and phase information from multiple voxels for more accurate and precise concentration measurement. Considering measurement noise averaging, concentration precision is also approximately proportional to the square root of the number of points used for inversion, and thus on the apparent surface of the aorta in the imaging plane. Acquisition parameter optimization such as increasing TE would increase the measurement precision. Nevertheless, as usual in phase measurement, wrapping should be avoided. This limits TE to approximately $2\pi/\gamma B_0 \chi_m [CA]_{max}$, which was close to 2.5 ms showing that parameters were optimized in the current protocol. Precision may also be affected by the choice of the imaging plane and the curved tube approximation of the aortic arch. Here an oblique sagittal imaging plane was carefully chosen to bisect the aorta such that its shape was well-represented. QSI was also found to be rather robust against manual segmentation of the aorta (~2% variation). The simplified curved tube model appeared to be adequate in matching the calculated shifts with the measured field patterns. The infinite cylinder model used in previous works adequately modeled the shifts in vitro, and provided good linearity in vivo with a 23% overestimation. Although the infinite cylinder model may adequately estimate the shape factor in certain cases, our results show that 3D modeling improves shape factor estimation. Using high resolution 3D scans currently performed in clinical practice and more sophisticated segmentation algorithms, more elaborate geometrical models may be constructed to better describe anatomic variations and provide further improvements.

To implement the QSI technique into a DCE-MRI protocol, geometrical data can be acquired separately or within the same scan. The method needs post-processing for geometrical features definition, followed by a simple linear fit of phase data. As contrast does not interfere with phase data, more specific location closer to organ of interest can be done (carotid for brain, descending aorta for kidney, ... ). This can be done with 2D, or interleaved 2D multislice at specific location of interest to obtained faster temporal resolution that could be beneficial in DCE-MRI.

In DCE-MRI, a pre-contrast image is necessary for quantification. Similarly, for QSI a pre-contrast field is needed. The pre-contrast field that had been previously reported as being a possible major limitation for accurate susceptibility quantification [39] was not an issue here. A simple and commonly used pre-contrast reference scan was acquired at exactly the same location allowing extraction of the CA-induced field effects only. As usual in difference methods, motion may affect the accuracy of the field mapping. Here, low resolution images were acquired during breath-holding to minimize respiratory motion and gated to cardiac diastole to reduce cardiac motion. Furthermore, for gated scans, the assumption that flow is reproducible between cardiac cycles allows any additive motion-induced phase to be removed making the difference phase insensitive to flow.

Signal enhancement failed to provide accurate concentration in our setup. In vitro, the steady-state model reasonably accounted for Gd-induced signal enhancement indicating low Gd concentration may be accurately quantified in this manner. However, a small correction should be added to account for both the slice profile [40] and some inflow effects [9]. The curved tube was co-planar with the slice and the assumptions that flowing water is subject to a flip angle slightly less than that prescribed as well as limited inflow effects are reasonable. On the contrary, blood inflow and outflow effects are much more complex in vivo. As indicated by the small and highly variable scaling factor (0.10±0.04), blood was likely subject to time-of-flight effects which are extremely difficult to estimate a priori. Signal intensity enhancement analysis would underestimate concentration measurement as determined by QSI analysis by a factor of ~10 and would be inaccurate for saturation concentrations obtained in vivo during the first passes (>~5 mM). Efficient correction techniques taking into account inflow effects have been proposed for through plane flow [9], but they might be challenging to implement for in plane flow as evaluated here. This confirms that signal enhancement-derived concentration measurements are prone to error when using a 2D acquisition. For robust signal enhancement analysis, the signal must be at steady-state in the entire volume and consequently a 3D acquisition or inflow modeling is required, limiting the range of sequences or imaging planes usable for DCE-MRI. A practical consequence of the insensitivity of QSI to inflow effects is that a single slice can be acquired without restriction on its position and that a higher temporal resolution can be obtained to estimate the rapidly changing concentration in the first passes.

QSI relies on a geometrical and functional model that accounts for the observed shifts. During the first pass, CA mixes well within the cardiac chambers and the pulmonic vasculature and rapidly flows through the aorta with fairly uniform concentration. The single shape factor used in this study can model the observed field shifts in the aorta with good approximation, indicating that contributions from neighboring organs may be neglected. For example, the CA in the small vessels surrounding the aorta has little effect and CA in the heart is likely to cause only a marginal field shift in a major portion of the aortic arch due to distance. It is worth noting that the single shape model obviously did not correctly model the field shifts immediately before CA arrival in the right heart as highly concentrated CA flows through the superior vena cava. However, this phenomenon did not affect the accuracy of AIF quantification in the aorta because the bolus injection was short enough to sufficiently separate these time frames. The Stewart-Hamilton principle requires the concentration-time curve after dilution. If a known amount of CA flows through the heart, any location downstream would be suitable for measuring concentration, even if blood flow is divided (e.g. here in the coronary and carotid arteries). Consequently, other locations to measure field shifts may be suitable, besides the aorta as demonstrated here. Measuring concentration elsewhere may additionally allow quantification of transit time and dispersion through vasculature.

The flow rate derived from the concentration measurements validated the proposed QSI technique in vivo. The agreement between QSI and PC was found to be approximately 10%, which is similar to PC repeatability and typical for cardiac output quantification techniques [37]. QSI repeatability was slightly better than PC (~5%), but this difference was not significant due to the limited number of subjects. In this study, cardiac flow rate was measured with QSI with a single injected dose. In delayed-enhancement viability studies[41], where CA is administered to the patient and no imaging is performed until about 10 min after injection, the developed single breath-hold QSI imaging sequence could be incorporated to obtain cardiac output information traditionally obtained with PC and cine SSFP sequences [42]. Furthermore, timing parameters and analysis of the dispersion curve may provide useful clinical information for perfusion studies, as emphasized in dynamic studies [5,8].

CA enhancement of blood and tissue signals is generally evaluated qualitatively because of the complex relationship between changes in the MR signal and changes in CA concentration due to T1 and T2* relaxation, inflow effects and system calibration. Assessing accurate AIF measurement with MRI has always been a great challenge in many functional studies forperfusion measurement of the kidney [4,43], liver [18,44], lung [45], brain [5,46] and heart [21,47]. Induced signal changes are complex because they combine T1 signal enhancement as well as T2 and T2* decays. Although simple models and phantom experiments in uniform media link relaxation rates to concentration, the signal changes also depend on scan parameters [47] and are not linear in the general case [5,21,44,45,48,49]. The problem is further complicated when partial voxels [5,49] including multiple compartments [4] are encountered in the kidney, liver, or small vessels in the heart or brain, which may contain a very high CA concentration and change of relaxivity with macromolecular content [10]. In a fairly homogeneous organ, signal changes can be linear when low-doses [4,43,45] and adapted acquisition parameters are used which assume valid simplified models that either neglect T1 or T2* effects. Some studies reported a linear relationship of $R_2^*$ with concentration [21,43,44,48], while others reported a quadratic [49] relationship. The large number of studies on this topic suggests that each approach has its range of validity for a given organ of interest, injection protocol, and set of acquisition parameters. The QSI approach presented here is based on geometrical and functional models and a fit to the magnetic field shifts, which is conceptually different in principle than previous T1 or T2* based CA concentration measurement techniques. By using the signal phase instead of intensity, QSI is intrinsically insensitive to signal intensity variation and relaxivity change and leads to improved robustness. This approach also offers the opportunity for more quantitative analysis of CA signal enhancement, as shown here by the in vivo comparison of signal enhancement and CA concentration measured with QSI. For perfusion measurements following contrast injection [4] in which similar geometrical segmentation is performed to analyze the signal amplitude, the QSI method may be useful in quantifying AIF in large vessels and CA in organs for pharmacokinetic modeling and functional characterization. Furthermore, this approach could be applied similarly with different CA with arbitrary relaxivities. A straight forward application of this technique could be done using bolus-injectable ultra-small superparamagnetic iron oxides [50] for which molar susceptibility is more efficient (~3600 ppm/M at 1.5 T [51]) and doses are ~2.5 to 10 times lower [50].

4. Conclusion

Contrast agent concentration can be quantified using the linear susceptibility effects that modify the field measured on the signal phase. However, for accurate and precise quantification, a geometrical description of the object or organ is needed as well as an adequate functional model that accounts for the observed shifts. The geometrical description of the organ or vessels allows a more detailed shape-factor description for accurate conversion of phase shifts to concentration and combination of multiple phase shift measurements for more precise concentration determination. During first pass of a short CA bolus injection, field shifts can be isolated by subtracting a pre-contrast reference scan. The shifts in the aortic arch were modeled fairly well with a single approximate shape which allowed estimation of CA concentration and the AIF. Cardiac flow rate could then be quantified in vivo leading to a practical tool that can be inserted into a perfusion cardiac protocol without increasing examination time. Relying on phase, the technique is insensitive to the multiple factors that affect signal intensity. Combined with more sophisticated models, it may be possible to adapt the QSI methods to other sites for perfusion quantification.

5. Appendix A—Magnetostatic Approximation of Maxwell Equations

From the magnetostatic macroscopic Maxwell equations, it follows that for a material placed in a main magnetic field $\vec{B}_0 = B_0 \vec{z}$ [27]:

$$\vec{\nabla} \cdot \vec{B} = 0, \quad \text{(Equation 5-A-(1))}$$

$$\vec{\nabla} \times \vec{B} = \mu_0 \vec{\nabla} \times \vec{M}, \quad \text{(Equation 5-A-(2))}$$

where $\vec{B}$ is the magnetic field and $\vec{M}$ the material magnetization. Using the vector relationship for any vector field $\vec{A}$:

$$\vec{\nabla} \times (\vec{\nabla} \times \vec{A}) = -\nabla^2 \vec{A} + \vec{\nabla}(\vec{\nabla} \cdot \vec{A}), \quad \text{(Equation 5-A-(3))}$$

and applying it to Equation 5-A-(2):

$$-\nabla^2 \vec{B} = \mu_0 [-\nabla^2 \vec{M} + \vec{\nabla}(\vec{\nabla} \cdot \vec{M})]. \quad \text{(Equation 5-A-(4))}$$

Looking for harmonic solutions of the form $\vec{B} = 1/(2\pi)^3 \int \vec{b} \exp(i\vec{k} \cdot \vec{r}) d^3k$, we have:

$$k^2 \vec{b} = \mu_0 [k^2 \vec{m} - \vec{k}(\vec{k} \cdot \vec{m})], \quad \text{(Equation 5-A-(5))}$$

where $\vec{k}$ is the Fourier domain position, $\vec{b}$ the Fourier transform of the local shifts, and $\vec{m}$ of the magnetization. In MRI, only the local field influences proton precession and molecular demagnetization must be taken into account [52]. This is the Lorentz-sphere correction which amounts to removing $2/3\vec{M}$ from the macroscopic field, or $2/3\vec{m}$ in the Fourier domain. This leads to the measurable shift:

$$\vec{b}_{local} = \mu_0 \left( \frac{1}{3} \vec{m} - \frac{\vec{k}}{k^2} \vec{k} \cdot \vec{m} \right). \quad \text{(Equation 5-A-(6))}$$

Evaluating the Fourier integral of the previous expression [53], it comes:

$$\Delta \vec{B}_{local}(r) = \vec{B}_{local} - \vec{B}_0 = \quad \text{(Equation 5-A-(7))}$$
$$\frac{\mu_0}{4\pi} \int_{\vec{r}' \neq \vec{r}} \left( 3 \frac{\vec{M}(\vec{r}') \cdot (\vec{r}' - \vec{r})}{(\vec{r}' - \vec{r})^2} (\vec{r}' - \vec{r}) - \vec{M}(\vec{r}') \right) \frac{1}{|\vec{r}' - \vec{r}|^3} d^3 r'.$$

Since the magnetization is mainly aligned with the main magnetic field $\vec{B}_0 = B_0 \vec{z}$, components orthogonal to it can be neglected resulting in the following simplification for the component along z measured with MR:

$$\Delta B_{z,local}(\vec{r}) = \frac{\mu_0}{4\pi} \int_{r' \neq r} M_z(\vec{r'}) \frac{3 \cdot \cos^2(\theta_{rr'}) - 1}{|\vec{r'} - \vec{r}|^3} d^3 r'. \quad \text{(Equation 5-A-(8))}$$

where $\theta_{rr'}$ denotes the angle between $\vec{r'} - \vec{r}$ and $\vec{z}$. In most MRI experiments, the magnetization is much smaller than the polarizing field $\chi \square 1$, such that, $\mu_0 M_z = \chi B_0$ can be assumed leading to the linear problem given as a convolution of the susceptibility distribution with a dipole field:

$$\Delta B_{z,local}(\vec{r}) = B_0 \int_{r' \neq r} \chi(\vec{r'}) \frac{3 \cdot \cos^2(\theta_{rr'}) - 1}{4\pi|\vec{r'} - \vec{r}|^3} d^3 r'. \quad \text{(Equation 5-A-(9))}$$

For an object defined by its geometry G (spatial mask of unity inside the object and zero everywhere else), with uniform susceptibility $\chi$, the contribution to the field shifts can be simplified as:

$$\Delta B_{z,local}(\vec{r}) = \chi B_0 \int_{\substack{r' \neq r \\ r' \in G}} \frac{3 \cdot \cos^2(\theta_{rr'}) - 1}{4\pi|\vec{r'} - \vec{r}|^3} d^3 r'. \quad \text{(Equation 5-A-(10))}$$

We refer to the integral in this expression that corresponds to the convolution of a dipole field with the shape of the object to as the shape factor F [54].

6. Appendix B—Field Calculation Based on a Surface Integral

Equation 5-A-7 can be transformed as follows [27,53]:

$$\Delta \vec{B}_{local}(\vec{r}) = \quad \text{(Equation 5-B-(1))}$$
$$\mu_0 \frac{\vec{M}(\vec{r})}{3} - \frac{\mu_0}{4\pi} \vec{\nabla} \left( \int_{r \neq 0} \vec{\nabla'} \cdot \frac{\vec{M}(\vec{r'})}{|\vec{r'} - \vec{r}|} - \frac{\vec{\nabla'} \cdot \vec{M}(\vec{r'})}{|\vec{r'} - \vec{r}|} d^3 r' \right),$$

which, in case of a constant distribution contained within the closed surface $S_i$ of a compact object $G_i$ and oriented along the main magnetic field, and 0 elsewhere, can evaluated as:

$$\Delta \vec{B}_{local}(\vec{r}) = \mu_0 M \left( \frac{\vec{z}}{3} - \frac{1}{4\pi} \vec{\nabla} \left( \oint_{S_i} \frac{\vec{z} \cdot d\vec{a'}}{|\vec{r'} - \vec{r}|} \right) \right). \quad \text{(Equation 5-B-(2))}$$

The field shifts for the component along the main magnetic field can then be calculated. For a given object i described by a triangular surface mesh (K triangles forming a closed surface), the unit field deformation along $\vec{z}$ is given by [26,55]:

$$F(\vec{r}) = \frac{1}{4\pi} \left[ \frac{1}{3} \Omega(\vec{r}) + \sum_{k=1}^{k=K} \vec{z} \cdot \vec{n_k} \left( \frac{\Omega_k(\vec{r}) \vec{n_k} +}{\vec{\Theta_k}(\vec{r}) \times \vec{n_k}} \right) \cdot \vec{z} \right] \quad \text{(Equation 5-B-(3))}$$

where $\vec{n_k}$ is the normal to triangle k, $\Omega_k(\vec{r})$ the solid angle of triangle k subtended at point $\vec{r}$ (the surface area of the projection of the triangle over a sphere of unit radius centered at point $\vec{r}$), $\Omega(\vec{r}) = \sum_{k=1}^{k=K} \Omega_k(\vec{r})$ the solid angle of the closed surface subtended at point $\vec{r}$ (its value is $4\pi$ if the point is inside the surface and 0 if outside).

If $\vec{x}_i$, i=1, 2, 3 are the coordinates of the triangle k vertices, the normal can be calculated via:

$$\vec{n} = \frac{\vec{x_1} \times \vec{x_2} + \vec{x_2} \times \vec{x_3} + \vec{x_3} \times \vec{x_1}}{|\vec{x_1} \times \vec{x_2} + \vec{x_2} \times \vec{x_3} + \vec{x_3} \times \vec{x_1}|}. \quad \text{(Equation 5-B-(4))}$$

With $\vec{y}_i = \vec{x}_i - \vec{r}$, i=1, 2, 3, the solid angle of the triangle k subtended at point $\vec{r}$ is given by:

$$\Omega_k(\vec{r}) = 2 \arctan \left( \frac{\vec{y_1} \cdot \vec{y_2} \times \vec{y_3}}{|\vec{y_1}||\vec{y_2}||\vec{y_3}| + |\vec{y_1}|\vec{y_2} \cdot \vec{y_3} + |\vec{y_2}|\vec{y_3} \cdot \vec{y_1} + |\vec{y_3}|\vec{y_1} \cdot \vec{y_2}} \right) \quad \text{(Equation 5-B-(5))}$$

Finally, the vector $\vec{\Theta}_k(\vec{r})$ is given by:

$$\vec{\Theta}_k(\vec{r}) = \sum_{i=1}^{i=3} (\gamma_{i-1} - \gamma_i) \vec{y_i}, \quad \text{(Equation 5-B-(6))}$$

with:

$$\gamma_i = \frac{-1}{|\vec{y_{i+1}} - \vec{y_i}|} \ln \left( \frac{|\vec{y_i}||\vec{y_{i+1}} - \vec{y_i}| + \vec{y_i} \cdot (\vec{y_{i+1}} - \vec{y_i})}{|\vec{y_{i+1}}||\vec{y_{i+1}} - \vec{y_i}| + \vec{y_{i+1}} \cdot (\vec{y_{i+1}} - \vec{y_i})} \right), \quad \text{(Equation 5-B-(7))}$$

where subscripts are given modulo 3 to simplify the expressions.

These expressions were given in [26] and are modified to include the Lorentz-sphere correction. This method is an explicit expression of the field shift in the case $\chi \square 1$. In this method, the computation time is proportional to the number of triangles and to the number of points where the field needs to be calculated. The computation time can thus be reduced if the surface mesh is optimized as the accuracy does not depend on the mesh size, and triangles that are parallel to the main magnetic field can be removed as they do not contribute to the sum ($\vec{z} \cdot \vec{n_k} = 0$).

BIBLIOGRAPHY

1 B. Meibohm and H. Derendorf, Int J Clin Pharmacol Ther 35 (10), 401 (1997); A. J. Atkinson, Jr. and R. L. Lalonde, Clin Pharmacol Ther 82 (1), 3 (2007).
2 M. R. Prince, T. M. Grist, and Debatin J. F., 3D Contrast MR Angiography. (Springer, Berlin, 2003).
3 M. C. Schabel and D. L. Parker, Phys Med Biol 53 (9), 2345 (2008).
4 V. S. Lee, H. Rusinek, L. Bokacheva et al., Am J Physiol Renal Physiol 292 (5), F1548 (2007).
5 G. Duhamel, G. Schlaug, and D. C. Alsop, Magn Reson Med 55 (3), 514 (2006).

6 G. H. Jahng, L. Stables, A. Ebel et al., Med Phys 32 (6), 1524 (2005).
7 D. M. Higgins, J. P. Ridgway, A. Radjenovic et al., Med Phys 32 (6), 1738 (2005); S. C. Deoni, B. K. Rutt, and T. M. Peters, Magn Reson Med 49 (3), 515 (2003).
8 T. E. Conturo, E. Akbudak, M. S. Kotys et al., J Magn Reson Imaging 22 (6), 697 (2005).
9 M. K. Ivancevic, I. Zimine, X. Montet et al., Magn Reson Med 50 (5), 885 (2003).
10 G. J. Stanisz and R. M. Henkelman, Magn Reson Med 44 (5), 665 (2000).
11 J. F. Schenck, Med Phys 23 (6), 815 (1996); D. Wang and Z. Yang, Med Phys 35 (3), 908 (2008).
12 E. Akbudak, R. E. Norberg, and T. E. Conturo, Magn Reson Med 38 (6), 990 (1997); M. J. van Osch, E. J. Vonken, M. A. Viergever et al., Magn Reson Med 49 (6), 1067 (2003); R. W. Holt, P. J. Diaz, J. L. Duerk et al., Jmri-Journal of Magnetic Resonance Imaging 4 (6), 809 (1994).
13 R. M. Weisskoff and S. Kiihne, Magn Reson Med 24 (2), 375 (1992).
14 P. R. Moran, Magn Reson Imaging 1, 197 (1983).
15 E. M. Haacke, R. D. Brown, M. R. Thompson et al., *Magnetic resonance imaging, physical principles and sequence design*. (Wiley-liss, 1999).
16 R. R. Edelman, P. Storey, E. Dunkle et al., Magn Reson Med 57 (3), 475 (2007).
17 E. J. Ribot, E. Thiaudiere, R. Roulland et al., Contrast Media Mol Imaging 3 (2), 53 (2008).
18 Z. Chu, A. R. Cohen, R. Muthupillai et al., Magn Reson Med 52 (6), 1318 (2004).
19 M. A. Fernandez-Seara, A. Techawiboonwong, J. A. Detre et al., Magn Reson Med 55 (5), 967 (2006).
20 Y. Wang, Y. Yu, D. Li et al., J Magn Reson Imaging 12 (5), 661 (2000).
21 G. O. Cron, J. C. Wallace, W. D. Stevens et al., Magn Reson Imaging 23 (5), 619 (2005).
22 M. S. Kotys, E. Akbudak, J. Markham et al., J Magn Reson Imaging 25 (3), 598 (2007).
23 E. M. Haacke, N. Y. Cheng, M. J. House et al., Magn Reson Imaging 23 (1), 1 (2005).
24 M. S. Albert, W. Huang, J. H. Lee et al., Magn Reson Med 29 (5), 700 (1993).
25 R. Salomir, B. D. De Senneville, and C. T. W. Moonen, Concepts in Magnetic Resonance Part B-Magnetic Resonance Engineering 19B (1), 26 (2003).
26 J. C. de Munck, R. Bhagwandien, S. H. Muller et al., Ieee Transactions on Medical Imaging 15 (5), 620 (1996).
27 J. D. Jackson, *Classical electrodynamics, third edition*. (John Wiley and Sons, inc., 1999).
28 A. Bjork, (SIAM, Society for Industrial and Applied Mathematics, Philadelphia, 1996), pp. 165.
29 J. H. Zar, *Biostatistical analysis, 3rd edition*. (Prentice-Hall, 1996).
30 K. P. Pruessmann, M. Weiger, M. B. Scheidegger et al., Magn Reson Med 42 (5), 952 (1999).
31 T. E. Conturo and G. D. Smith, Magn Reson Med 15 (3), 420 (1990).
32 O. Kahn, *Molecular magnetism*. (VCH, 1993).
33 P. Meier and K. L. Zierler, J Appl Physiol 6 (12), 731 (1954).
34 C. W. Sheppard and M. B. Uffer, J Theor Biol 22 (1), 188 (1969).
35 R. K. Millard, Am J Physiol 272 (4 Pt 2), H2004 (1997).
36 J. Lotz, C. Meier, A. Leppert et al., Radiographics 22 (3), 651 (2002); P. Chai and R. Mohiaddin, J Cardiovasc Magn Reson 7 (4), 705 (2005).
37 W. G. Hundley, H. F. Li, L. D. Hillis et al., Am J Cardiol 75 (17), 1250 (1995).
38 J. M. Bland and D. G. Altman, Lancet 1 (8476), 307 (1986).
39 L. Li and J. S. Leigh, Magnetic Resonance in Medicine 51 (5), 1077 (2004).
40 J. Wang, W. Mao, M. Qiu et al., Magn Reson Med 56 (2), 463 (2006).
41 R. M. Setser, J. K. Kim, Y. C. Chung et al., Radiology 239 (3), 856 (2006).
42 C. E. Barbier, L. Johansson, L. Lind et al., Acta Radiol 48 (3), 285 (2007).
43 N. Hackstein, J. Heckrodt, and W. S. Rau, J Magn Reson Imaging 18 (6), 714 (2003).
44 J. L. Dimicoli, J. Patry, J. Poupon et al., NMR Biomed 16 (5), 276 (2003).
45 F. Risse, W. Semmler, H. U. Kauczor et al., J Magn Reson Imaging 24 (6), 1284 (2006).
46 V. G. Kiselev, J Magn Reson Imaging 22 (6), 693 (2005).
47 D. Kim, Magn Reson Med 59 (1), 202 (2008).
48 F. Calamante, E. J. Vonken, and M. J. van Osch, Magn Reson Med 58 (3), 544 (2007).
49 M. J. van Osch, J. van der Grond, and C. J. Bakker, J Magn Reson Imaging 22 (6), 704 (2005).
50 J. Bremerich, D. Bilecen, and P. Reimer, Eur Radiol 17 (12), 3017 (2007).
51 C. W. Jung and P. Jacobs, Magn Reson Imaging 13 (5), 661 (1995).
52 C. J. Durrant, M. P. Hertzberg, and P. W. Kuchel, Concepts in Magnetic Resonance Part A 18A (1), 72 (2003).
53 V. B. Berestetskii, E. M. Lifshitz, and L. P. Pitaevskii, in *Course of theoretical physics*, edited by Lifshitz Landau (Elsevier, 1982), Vol. 4, pp. 340.
54 R. E. Hoffman, J Magn Reson 178 (2), 237 (2006).
55 J. C. de Munck, Ieee Transactions on Biomedical Engineering 39 (9), 986 (1992).

XVI. Kalman Filtering

The reference numerals in the text of this section relate to a list of complete citations of references shown in a bibliography at the end of this section.

An important approach to suppressing motion artifacts in MRI is the navigator method (1), which measures physiological motion directly from MR signal (navigator) and gates image data acquisition to synchronize with the physiological motion. For example, the diaphragm navigator, which images a column of tissue through the right diaphragm (2), has been successfully used for respiratory motion artifact suppression in high resolution coronary MRA (3-5). Navigators that more directly measure cardiac motion have been developed in recent years for cardiac MRI. The cardiac fat navigator (6) tracks the motion of the heart by using a spatial-spectral excitation of the epicardial fat. The concept of self-gating based on the variation of the k-space center signal has been introduced as a "wireless" alternative to ECG gating (7,8) and has, more recently, been performed for respiratory gating using either a small subset of imaging projections (9) or an additional sampling of the center of k-space within each TR (10,11). These new navigators may have more complex signal behavior than the diaphragm navigator that tracks a sharp diaphragm edge. For the newer navigators, processing may be required to filter out noise and separate cardiac and respiratory components for cardiac MRI applications.

For k-space center based self-gating, the k-space center signal has a complex dependence on the slice position, orientation, thickness, and field-of-view, and on local and global physiological motion within the excited image volume. Filtering of this k-space center signal is required to extract the right motion parameter for motion gating. Most current cardiac MRI methods that use cardiac and/or respiratory self-gating are retrospective techniques that require repeating the acquisition multiple times followed by sorting the entire overscanned data set off-line. Self-gating signals are processed using frequency filters, which are inherently slow and unsuitable for real time processing because of their group delay (12). Further more, over-scanning does not guarantee that no large position jumps will occur in the central k-space lines. Real time or prospective gating can eliminate these jumps at k-space center completely and is more effective in motion suppression than retrospective gating (13). Accordingly, real time navigator gating and correspondingly fast real-time processing methods of navigator data are desirable.

For real-time navigation applications, issues related to the computational cost of extracting motion from raw data and the system latency associated with data transfer have been discussed for direct extraction of motion parameters from the navigator (14-16). Real time filtering of navigator data in MRI has not been reported to the best of our knowledge. We report herein on our investigation of real time Kalman filtering for reduction of noise and for separation of cardiac and respiratory components in motion waveforms obtained from fat navigator echoes and center-of-k-space data. The focus here is on cardiac MRI applications that provide motion information at a rate that is high when compared to both the respiratory and the cardiac frequency, such as CINE sequences with center-of-k-space sampling, where motion sampling is continuous. The Kalman filter assumes the existence of an underlying dynamical structure for the data and has been applied in many fields, including aerospace engineering, navigation, robotics, and optimal control theory (17-19). We will use two initial implementations whose preliminary results from simulations, from in vivo data processed off-line, and from an in vivo real-time self-gated CINE sequence show the feasibility of filtering motion waveforms in real-time using Kalman filters.

A. Theory

The noise contaminating motion parameters extracted directly from navigator echoes typically has a Gaussian distribution. The motion waveforms in most situations are approximately known from prior navigator data points, other measurements and a priori knowledge of normal physiological motion. It is desirable to optimally estimate the current value of the position (motion state) using both navigator measurements and knowledge of motion waveform. This optimization is a Bayesian statistics problem, and its result for state estimation is termed as the Kalman filter (20-23). Here we summarize the basic concept of Kalman filter in the context of its application to MR navigator processing.

Let $(z_k)_{k=1...N}$ be the noisy m-dimensional measurements. Each of these data samples $z_k$ is considered the result of a noisy measurement of an n-dimensional vector $x_k$ that contains all information about the system at time k:

$$z_k = H_k x_k + v_k \text{ with } v_k \sim N(0, R_k). \quad \text{(Equation 6-1)}$$

$H_k$ is an m×n matrix, called the measurement matrix, and $v_k$ is an m-dimensional Gaussian random vector, characterizing the measurement noise. It has zero mean and m×m covariance matrix $R_k = E[(v_k - E[v_k])(v_k - E[v_k])^T] = E[v_k v_k^T]$. It is furthermore assumed that the evolution of the underlying dynamic system state from time k−1 to k is modeled by a simple linear transformation with a noise term accounting for model error:

$$x_k = A_k x_{k-1} + w_k \text{ with } w_k \sim N(0, Q_k). \quad \text{(Equation 6-2)}$$

$A_k$ is an n×n state transition matrix modeling system evolution and $w_k$ is an n-dimensional Gaussian random vector characterizing the discrepancy between state transition model and actual system evolution. It has zero mean and n×n covariance matrix $Q_k$. All random vectors are assumed to be independent:

$$E[v_k v_l^T] = 0, E[w_k w_l^T] = 0, E[v_m w_n^T] = 0, E[x_m w_n^T] = 0,$$
$$\text{and } E[x_m v_n^T] = 0 \quad \text{(Equation 6-3)}$$

for all m, n and all k, l such that k≠l. For a navigator application, the measurement covariance matrix $R_k$ can be viewed as the noise in the measurement at time k, decreasing with the SNR of MR signal. Similarly, the model covariance matrix $Q_k$ decreases with the accuracy of temporal modeling of MR signal time course.

A simple example is the constant velocity state space model (CV), which will be used later in this paper. This model describes a simple one-dimensional motion by specifying its position $X_k$ and velocity $V_k$. The terms "position" and "velocity" are used here, and in the following, to represent navigator signal and its rate of change. The state space model is given by:

CV Model (Equation 6-4)

$$\begin{cases} x_k = \begin{pmatrix} X_k \\ V_k \end{pmatrix} = \begin{pmatrix} 1 & \Delta t \\ 0 & 1 \end{pmatrix} x_{k-1} + w_k \\ z_k = (1 \quad 0) x_k + v_k \end{cases} \text{ with } \begin{cases} w_k \sim N(0, Q_k) \\ v_k \sim N(0, R_k). \end{cases}$$

The former equation is nothing but the equation of motion for a constant velocity ($\Delta t$ is assumed to be small), while the latter simply states that only the position $X_k$ is measured. A second example is the periodic motion state space model (PM), describing a periodic motion with frequency ω:

PM(ω) Model (Equation 6-5)

$$\begin{cases} x_k = \begin{pmatrix} X_k \\ V_k \end{pmatrix} = \begin{pmatrix} 1 & \Delta t \\ -\omega^2 \Delta t & 1 \end{pmatrix} x_{k-1} + w_k \\ z_k = (1 \quad 0) x_k + v_k \end{cases} \text{ with }$$

$$\begin{cases} w_k \sim N(0, Q_k) \\ v_k \sim N(0, R_k). \end{cases}$$

See Appendix A for more details on these models.

In Kalman filtering, the state vectors $X_k$ are adaptively recursively estimated from measured data based on the assumed system model and the statistics of model error and measurement noise. These estimates are denoted by $\hat{x}_k^+$. Additionally, covariance matrices are defined as $\hat{P}_k^+ = E[(x_k - \hat{x}_k^+)(x_k - \hat{x}_k^+)^T]$ and are a measure of the uncertainty on the estimates $\hat{x}_k^+$. It is assumed that there is an initial estimate $\hat{x}_1^+$ and $\hat{P}_1^+$ for the first data point. For each subsequent data measurement $z_k$, the Kalman filter performs the following two steps:

Model Prediction

Using only the estimate at time k−1 and the state space model, it predicts the following values for the state vector and covariance matrix $$\hat{x}_k^- = A_k \hat{x}_{k-1}^+$$

$$\hat{P}_k^- = A_k \hat{P}_{k-1}^+ A_k^T + Q_k. \quad \text{(Equation 6-6)}$$

Optimal combination of model prediction with measurement data

Using the current measurement $z_k$ and measurement model, it corrects the prediction:

$$\hat{x}_k^+ = \hat{x}_k^- + K_k(z_k - H_k\hat{x}_k^-),$$

$$\hat{P}_k^+ = (I - K_k H_k)\hat{P}_k^-, \quad \text{(Equation 6-7)}$$

where $K_k$ is the Kalman gain, defined as $$K_k = \hat{P}_k^- H_k^T (H_k \hat{P}_k^- H_k^T + R_k)^{-1}. \quad \text{(Equation 6-8)}$$

Exact definitions and derivations can be found in Appendix B. The filtered value can then be found by applying the measurement matrix $H_k$ to the state estimate in (Equation 6-7). The fact that the filtered value for time point k is immediately available (neglecting computational cost) after its measurement makes the Kalman filter suitable for real-time applications.

To apply the Kalman filter in a meaningful way, the system model should approximately describe the time evolution of the measured data, and the choices of Q and R should correspondingly reflect the system model error and measurement noise. For example, a sufficiently large covariance $Q_k$ for the noise $w_k$ in the constant velocity model (CV) will allow a reasonable description of a slowly varying velocity. For a very large $R_k$, the Kalman gain in (Equation 6-8) becomes very small, such that the corrected value $\hat{x}_k^+$ in (Equation 6-7) differs little from the predicted value $\hat{x}_k^-$, producing a filter output given by the state evolution equation and ignoring measurement input. A zero $R_k$ leads, through (Equation 6-8) and (Equation 6-7), to $H_k K_k = I$ and $H_k x_k^+ = z_k$, generating a filter output identical to the input with no filtering. The $Q_k$ and $R_k$ may be estimated empirically using Monte Carlo simulation. In this paper, $Q_k$ and $R_k$ were taken to be constant (independent of k) and optimized values were obtained by analyzing the performance of the specific Kalman filter as a function of $R_k$ and $Q_k$ on representative (training) data. The actual procedures are described in the next section. Lastly, the initial estimates $\hat{x}_1^+$ and $\hat{P}_1^+$ for the first data point are generally less important. A Kalman filter typically displays a transient phase toward a steady state. For fixed measurement and process noise covariance matrices, both the Kalman filter gain $K_k$ and estimate covariance $\hat{P}_k^+$ converge to steady state values (22).

Two state space models were used here. The first is the constant velocity model (CM) given by (Equation 6-4). The second model is used to describe a waveform consisting of a "fast" periodic motion superimposed on a "slower" one. The double periodic motion state space model with frequencies $\omega_{f,k}$ and $\omega_{s,k}$ is:

DPM($\omega_{f,k}, \omega_{s,k}$) Model:

$$\begin{cases} x_k = \begin{pmatrix} X_{f,k} \\ V_{f,k} \\ X_{s,k} \\ V_{s,k} \\ C_k \end{pmatrix} = \begin{pmatrix} 1 & \Delta t & 0 & 0 & 0 \\ -\omega_{f,k}^2 \Delta t & 1 & 0 & 0 & 0 \\ 0 & 0 & 1 & \Delta t & 0 \\ 0 & 0 & -\omega_{s,k}^2 \Delta t & 1 & 0 \\ 0 & 0 & 0 & 0 & 1 \end{pmatrix} x_{k-1} + w_k \\ z_k = (1 \ 0 \ 1 \ 0 \ 1) x_k + v_k \end{cases} \quad \text{(Equation 6-9)}$$

$$\text{with } \begin{cases} w_k \sim N(0, Q_k) \\ v_k \sim N(0, R_k). \end{cases}$$

This model decomposes the data into a fast periodic motion (frequency $\omega_{f,k}$), a slow periodic motion (frequency $\omega_{s,k}$) and a constant position ($C_k$) accounting for periodic motion not centered on zero. For our application, the faster component will be identified with cardiac motion and the respiratory waveform will be the sum of the other two components. Since the Kalman filter measurement models the actual process of adding all three components together, an "alternative measurement" that subtracts out the estimated current cardiac motion is used instead:

$$\hat{z}_k = (0 \ 0 \ 1 \ 0 \ 1) \hat{x}_k^+ \quad \text{(Equation 6-10)}$$

B. Materials and Methods

1. Simulation

A ten second sinusoidal waveform with frequency 0.2 Hz—simulating a respiratory rate of 12 breaths per minute—was generated numerically at a sampling frequency of 200 Hz, after which Gaussian noise was added. The data was filtered with a Kalman filter using the constant velocity state space model introduced above. The measurement noise covariance R was initially estimated by taking half of the variance of the difference between successive samples in the noisy waveform. The model covariance matrix Q was taken to be a diagonal matrix with identical elements $Q_{11}=Q_{22}$. This matrix element was chosen such that root mean square error (RMSE) between the filtered data and the original sinusoidal waveform was minimized. The root mean square error between two waveforms x and y (of length N) was defined as $\sqrt{1/N \Sigma_i (x_i - y_i)^2}$. All calculations were repeated ten times for a given noise standard deviation and average RMSE was calculated. The entire procedure was then performed for a range of standard deviations of the noise (R=0.001, 0.01, ..., 1000). The influence of the choice of measurement noise covariance was investigated by repeating the optimization over Q for a range of values of R different from the initial choice.

The above ten second sinusoidal waveform with added Gaussian noise was filtered using the periodic motion Kalman filter. Here, the measurement noise covariance was kept the same, and an optimal value for the state noise covariance was again found by minimizing the RMSE between filtered data and the original waveform. In this case, the frequency needed for the periodic motion Kalman filter is known exactly, since the data was numerically simulated. In order to study the performance of this filter when the model does not match the waveform, five additional waveforms were generated. In the first, this sinusoid was replaced by a "modified sinusoid" given by the function $t \mapsto 2 \sin^4(\pi ft) - 1$, with f=0.2 Hz, which generates "flatter" valleys and "sharper" peaks similar to breathing patterns in some subjects. In the second, the frequency of the sinusoid was linearly increased over time from 0.2 Hz to 0.3 Hz ("chirp" sinusoid). In the third, the sinusoid changed its frequency abruptly from 0.2 Hz to 0.3 Hz in the middle of the waveform. In the fourth, the amplitude of the sinusoid was abruptly reduced by half, while in the last one the amplitude was linearly decreased to 20% of its original value. For all these waveforms, Kalman filtering was applied using an unchanged state space model (frequency 0.2 Hz throughout the entire waveform).

A ten second numerical waveform was generated as a superposition of a 1.2 Hz sinusoid with amplitude 0.2 and a 0.2 Hz sinusoid with amplitude 1.0—simulating a heart rate of 72 beats per minutes and respiratory rate of 12 breaths per minute. For Kalman filtering, the double periodic motion model was used, using the same frequencies. The model covariance matrix Q was again taken to be a diagonal matrix with diagonal elements [1, 1, 0.01, 0.01, 0.0001]. Here, the RMSE with respect to the noiseless waveform was minimized by obtaining the optimal value for the measurement covariance R. Again in this case, the frequencies needed for the double periodic motion Kalman filter are known exactly. In order to study the performance of this filter when the model does not match the waveform, five additional waveforms whose slower components were identical to the five added waveforms used in the single periodic motion analysis were generated. These waveforms were filtered using the double periodic motion Kalman filter with fixed state frequencies $\omega_{f,k}=1.2$ Hz and $\omega_{s,k}=0.2$ Hz throughout the entire waveform for each case.

These simulations—both for the single and double periodic motion models—were repeated for a range of sampling frequencies (25 Hz to 200 Hz, corresponding to sampling times between 40 ms and 5 ms), but with otherwise identical parameters. Kalman filtering performance was measured by the RMSE between the original respiratory waveform and the filter output.

2. Experiments I (a) MRI Scans

Cardiac MRI scans were performed on a five healthy volunteers using a GE Excite scanner (General Electric, Waukesha, Wis.), using an eight-element cardiac coil. Cardiac fat navigator echoes, which excite epicardial fat in order to track heart movement (6), were acquired continuously over 60 s. Each cardiac fat navigator consisted of three binomially weighted pencil beam excitations to achieve an excitation that was both spectrally and spatially selective (24-26). The cylindrical excitation volume (diameter 9 cm) was chosen to encompass the entire heart. Excitation was followed by 13 cm readout in the superior-inferior direction. Total excitation and acquisition time for the cardiac navigator was 15 ms. A respiratory bellows was used to simultaneously record a respiratory position. The instantaneous heart rate (as derived by the scanner using vector ECG gating) and respiratory frequency (derived from the respiratory bellows) were saved every 25 ms for each scan as well. The scan was repeated with a regular diaphragm navigator echo (3-5,27) interleaved with the cardiac fat navigator echoes. The diaphragm navigator consisted of a single pencil beam excitation with radius 3 cm through the right hemi-diaphragm (2) followed by a 13 cm readout in the superior-inferior direction (total time 14 ms). The scan was performed a third time, but with cardiac fat navigator echoes interleaved with a standard single balanced steady state free precession (SSFP) readout (TR 6 ms, flip 60°, 62 kHz rBW). The SSFP sequence excited an 8 mm heart short axis plane in the middle of the ventricle. At the end of each SSFP TR, when all magnetization was completely refocused, an extra readout was performed to record center-of-k-space signal once per TR (10,28).

(i) Motion Extraction

For the diaphragm navigator, a standard least squares minimization algorithm tracking a window around the liver-air interface was used to calculate diaphragm displacement waveforms (14). For the cardiac fat navigator waveform, no such clear anatomical interface is available. Instead, several motion patterns can be discerned. Therefore, the same least squares algorithm was performed over multiple windows at different pixel positions spread evenly across the profile. From the center-of-k-space readouts, one complex data sample was retained, and three separate waveforms—real parts, imaginary parts and absolute values—were constructed for further analysis. The extraction of these waveforms—fat navigator as well as center-of-k-space—was repeated for each coil.

(ii) Data Filtering

For each of the fat navigator derived motion waveforms, filtering was performed using the constant velocity Kalman filter. The single periodic motion model could have been used here as well, but initial testing revealed that the constant velocity Kalman filter was already successful in smoothing these motion waveforms. Moreover, it is simpler in setup, since it does not require the instantaneous respiratory rate at each sampling point. For each of the center-of-k-space waveforms, the double periodic motion Kalman filter was used instead. This was done because the heartbeat induced signal variations lasted for a larger number of samples given the higher sampling rate with which the center of k-space could be acquired (once per TR). The double periodic motion model led to a better Kalman filter performance in this case. The state model frequencies were set to the instantaneous heart rate $\omega_{f,k}$ and respiratory rate $\omega_{s,k}$ as they were given by the scanner at each time step k. The selection of optimal model and measurement covariance was done in the same manner as in the simulated single sinusoid and the double sinusoid respectively using the first half of the data, which was considered to be "training data". In this case the reference waveform, with respect to which the RMSE was calculated, was taken to be the result of the low pass filtering (cutoff frequency 1 Hz) of the training data. This was repeated for all coils, all real, imaginary parts and absolute values (center-of-k-space) and all least square windows across the profile (fat navigator). The waveform that had the highest squared linear correlation ($r^2$) with the respiratory bellows waveform or, in case it was available, the simultaneously acquired diaphragm displacement waveform was selected.

3. Experiments II (a) MRI Scans

An initial implementation of a free breathing SSFP cine sequence using the center-of-k-space signal for prospective data acquisition gating was developed. This sequence was run on five additional healthy volunteers. Scanning parameters were TR/TE=3.5 ms/1.6 ms, acquisition matrix 128×128, readout bandwidth ±62 kHz, flip angle 50°, eight-channel cardiac coil, eight views per segment, 30 cardiac phases, vector ECG gating and respiratory bellows for monitoring of breathing motion. A gating program running on the internal real-time operating system of the scanner collected the extra center-of-k-space acquisition in every TR, extracted motion (see below), and controlled the data acquisition by the pulse sequence. The center-of-k-space signals were used for respiratory self-gating only. Data acquisition was controlled using a modified Phase ordering with Automatic Window Selection (or PAWS) gating algorithm (29) to optimize the respiratory gating window selection only. Phase encoding ordering within the gating window was not performed in order to meet the smooth view ordering constraints, necessary to reduce SSFP ringing artifacts (30). View sharing between neighboring cardiac phases was done for outer phase encodings only (outside the middle half of k-space) to increase scanning efficiency. A scaling factor necessary to convert the k-space signal to an apparent displacement was determined using a separate calibration scan in which diaphragm navigators and single TR SSFP acquisitions were interleaved (navigator parameters were identical to those of the previous section, scan duration 30 s). This calibration scan also determined, for the center of k-space signal, which coil and part of the complex signal (real/imaginary part, or magnitude) provided the best correlation with the diaphragm motion. Kalman filtering was performed on this apparent displacement using the double periodic motion model. The "fast" and "slow" frequencies were updated continuously throughout the scan using the heart rate (vector ECG gating) and respiratory rate (bellows wrapped around the abdomen) provided by the scanner. A second calibration scan (30 s), in which only SSFP TRs were played out, was used to select the optimal values for Kalman filter parameters Q and R, similar to the data analysis in the previous section. The acquisition of each segment (consisting of eight views per segment) was prospectively gated separately by the software (see FIG. 69). The displacement as measured from the center-of-k-space sample in the last TR of segment n was used to gate the acquisition of segment n+2, corresponding to a lag of 28 ms. Two bins, each corresponding to 2 mm of apparent motion, were used for reconstruction, resulting in a gating window of 4 mm. A single short axis mid-ventricular slice was acquired with a slice thickness of 8 mm and field of view 30 cm. The scan was repeated twice without respiratory self-gating but with otherwise identical imaging parameters: one scan with and one scan without breath-holding, for reference.

(b) Image Analysis

The respiratory self-gated cine images, the breath-hold images and the free-breathing non-respiratory-gated images were blinded. One end-systolic and one end-diastolic phase was selected and both were scored according to image quality (0=non-diagnostic, 1=poor, 2=fair, 3=good, and 4=excellent). A two-tailed paired t-test was used to compare the average score among the three acquisition methods. A p-value of lower than 0.05 was considered significant.

C. Results

1. Simulation

Figure 71A:
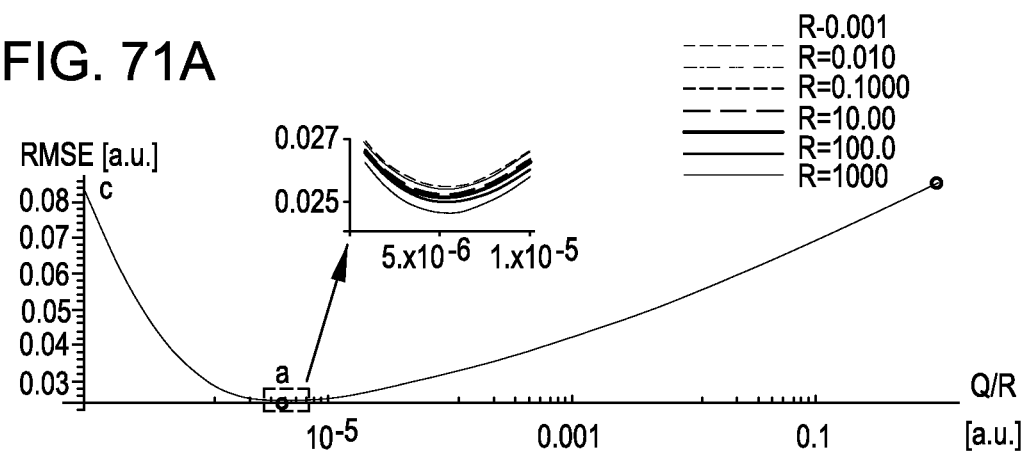
Figure 71B:
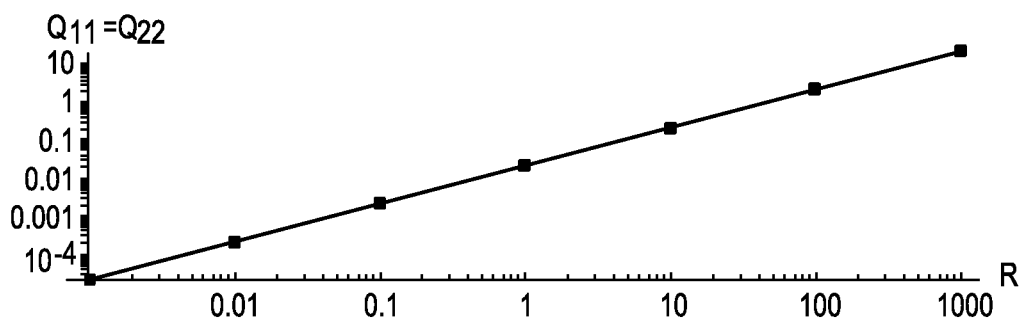
Figure 71C:
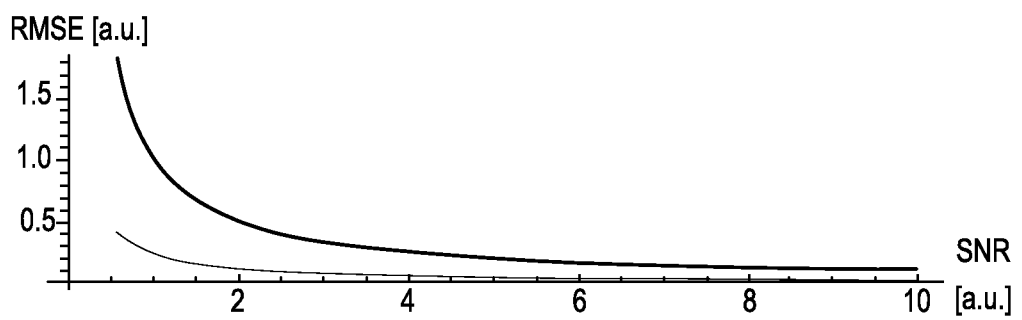

FIG. 70 shows the results of Kalman filtering using the constant velocity model. For a noise standard deviation $\sigma=0.1$, the RMSE between the filter output and original noiseless sinusoid was 0.027 for the Kalman filtering (FIG. 70A). FIG. 71A shows the process of finding the optimal values for the covariance matrices in the state space and measurement model of the Kalman filter. The measurement noise covariance R was $\approx 0.009$ (compared with the Gaussian variation $\sigma^2=0.01$). The Kalman filter is performed for various values of model noise covariance matrix Q. In fact, this matrix is taken to be diagonal with identical elements, such that there is one free variable left. For each filter output, the root mean square error with respect to the original sinusoid is calculated. At the minimal RMSE, a balance between noise removal and smoothing is found (FIG. 70A and point a on FIG. 71A). This value for Q was used in the computations above. When Q is too large, the filter output closely follows the noisy input (FIG. 70B and point b on FIG. 71A). For small Q, the filter smoothes more and trusts the measurement less in comparison (FIG. 70C and point c on FIG. 71C). In addition, this minimization process is repeated for a range of measurement noise covariance values R (FIG. 71A). The curves are very similar, implying that minimum RMSE depends roughly only on this ratio, a fact that can be appreciated from FIG. 71B as well, which plots the optimal $Q_{11}$ as a function of R. The RMSE in this simulation as a function of the SNR (defined as $1/\sigma$) is shown in FIG. 71C the unfiltered noisy waveform and the Kalman filtered waveform. In this case, Kalman filtering decreases the RMSE approximately threefold when compared to the unfiltered waveform.

FIG. 72 and FIG. 73 show the results of Kalman filtering using the periodic motion model. For a noise standard deviation $\sigma=0.1$, the RMSE between the filter output and the original noiseless sinusoid was very small 0.004 when the model frequency matched the sinusoid frequency exactly (FIG. 71A). Because of this exact match the model noise covariance can be made small. This is no longer the case when the underlying periodic waveform is no longer perfectly described by the model. The Kalman filter reduces the RMSE to 0.029 for a modified sinusoid (FIG. 71B), 0.034 for a linear chirp (FIG. 71C), 0.026 for a sudden jump in frequency away from the model frequency (FIG. 73A), 0.20 for a sudden jump in amplitude (FIG. 73B) and 0.19 (FIG. 73C) for a linear decrease in amplitude.

FIG. 74A shows the result for the double periodic motion with added Gaussian noise (standard deviation $\sigma=0.1$). Because in this experiment the high frequency component (1.2 Hz) has much larger amplitude than other frequencies higher than the respiratory frequency, it is necessary for a finite impulse response filter to have a large filter order such that this frequency can be placed in the stop band. Here an $800^{th}$ order FIR filter with pass band [0.25 Hz, 0.75 Hz] was used to achieve a RMSE of 0.034 with respect to the original 0.2 Hz sinusoid. Consequently, the group delay was as high as 400 samples or 2 s. The Kalman filter was able to retrieve the low frequency component with a RMSE of 0.035 with respect to original noiseless sinusoid, involving no delay of response (except during the initial transient phase). It should be noted that RMSE here, and in all subsequent examples, was calculated using only the second half of the waveform, to avoid the transient phase of the Kalman filtering process. Additionally, RMSE for the low pass filter output was calculated by shifting back over the group delay in order to compare filtering performance regardless of time lag issues. In the figure, however, no such delay is applied to contrast the temporal output of both filters. The initial estimated state vector and covariance matrix were kept fixed for all waveforms. When these estimates are not appropriate the Kalman filter takes less than two seconds before the covariance matrix estimates and the Kalman gain matrices converge to their steady state values. The remaining plots in FIG. 74 and FIG. 75 show the performance of the double periodic motion Kalman filter in case the underlying model no longer accurately describes the waveform at all times. In FIG. 74b, the low frequency component is a modified 0.2 Hz sinusoid and it is filtered out with a RMSE of 0.044, suppressing both high frequency periodic motion and Gaussian noise. In FIG. 74c, the low frequency component increases gradually over time and it is found with a slightly higher RMSE of 0.05 by the Kalman filter. In FIG. 75a, when the frequency of this component changes abruptly from 0.2 Hz to 0.3 Hz (at t=5 s), the Kalman filter output has a RMSE of 0.048 with respect to the original noiseless low frequency component. Kalman filtering of the waveform where amplitudes changed over time resulted in RMSEs of 0.04 for the sudden reduction in amplitude (FIG. 75b) and of 0.038 for the gradual decrease in amplitude (FIG. 75c). All RSMEs involving Kalman filter output in FIG. 74 and FIG. 75 were calculated without shifting.

FIG. 76 compares the RMSE of the Kalman filter output with that of the original (noisy) simulated respiratory motion waveform as a function of the sampling frequency for all waveform types and for both the single and double periodic motion Kalman filter. The Kalman filter recovers the slow periodic component approximately over a wide range of sampling frequencies, with higher sampling rates providing the best performance.

2. Experiments

FIG. 77A shows the performance of the constant velocity Kalman filter on a fat navigator displacement waveform acquired in one of the healthy subjects. Noise is visually removed from the data. The squared linear correlation with the simultaneously acquired diaphragm navigator waveform was 0.96. The corresponding squared linear correlation of the unfiltered waveform was 0.91. Over all five subjects, the squared linear correlation after filtering was 0.92±0.05.

The double periodic motion Kalman filtering of center-of-k-space data (the real part for this particular case) is shown in FIG. 77B. The ECG triggers recorded by the scanner during the acquisition shown at the top of the graph correlate well with the high frequency component retrieved by the Kalman filtering process. Noise and spikes induced by cardiac motion are visibly removed from the original data, resulting in a smoother waveform that has a 0.92 squared linear correlation with the diaphragm displacement waveform derived from the interleaved navigator echoes, while that of the unfiltered waveform was 0.48. The significant increase in correlation with the diaphragm navigator shows that the Kalman filter output represents the respiratory component in the k-space center signal. Over all subjects, the squared linear correlation after filtering was 0.91±0.08.

FIG. 78 shows a comparison of the self-gated sequence with a free breathing and a breath hold acquisition in one volunteer. Shown is one diastolic and one systolic cardiac phase. Total acquisition time for this volunteer was 74 heartbeats, corresponding to a scan efficiency of 23%. Computation time for each Kalman filtering step performed by the data acquisition gating software on the scanner averaged to 0.049 ms, with a minimum of 0.046 ms and maximum of 0.076 ms. Over all volunteers, average systolic image quality was 3.6±0.5 compared to 4±0 for breath-hold scans (p=0.17) and 1.4±1.1 for non-gated scans (p=0.004). Average diastolic image quality was 3.8±0.4 compared to 4±0 for breath-hold scans (p=0.37) and 1.4±0.5 for non-gated scans (p=0.0006).

D. Discussion and Conclusion

The preliminary results herein demonstrate the feasibility of Kalman filtering to remove noise and to separate respiratory and cardiac components in real-time from the MRI data itself and to use this information to prospectively gate the data acquisition for the suppression of motion artifacts. A constant velocity Kalman filter was able to filter out noise in fat navigator echo displacement waveforms that were obtained with a least square matching algorithm. A double periodic motion Kalman filter was able to distinguish between the cardiac and the respiratory component in center-of-k-space data obtained from a continuous SSFP short axis heart scan. Kalman filter is an adaptive recursive filtering algorithm for estimating the true state of the system immediately from noisy measurement. This adaptive filtering without delay makes it very suitable for real-time MRI applications such as prospective respiratory gating. A preliminary implementation of a prospectively self-gated CINE SSFP sequence demonstrated the feasibility of this real-time data filtering in healthy volunteers for motion artifact suppression.

In previous retrospective gating approaches, the entire waveform is available for post-processing analysis. Based on the linear time invariant (LTI) framework, various low pass filters, high pass filters and band pass filters can be designed for specific cutoff frequencies and other desired properties. These filters have inherent "group delay" between input and response (12), typically operates in batch estimation mode, and consequently are not suitable for real time filtering. Particularly, the low cut off frequency required to distinguish between cardiac and respiratory rate necessitates high order filters, leading to large computational delays. An alternative to the LTI framework is the adaptive filter, which can be designed to have minimal delay. One type of adaptive filters is the recursive least squares filter, which can be used to filter ECG signal but requires knowledge of desired output (31). Another type of adaptive filter is the Kalman filter which models the signal as a linear dynamical system and optimally estimates the current state of the system from both the previous time step estimate as well as the current incomplete noisy measurement. In contrast to filter techniques that are based on LTI framework and operate in batch estimation modes, no history of observations or estimates is required for Kalman filter, making it an ideal real time filtering technique. While frequency response may be of primary concern to traditional digital filter designs, the primary concern of Kalman filter design is the system model error Q and the measurement noise R. Frequency response characteristics may be incorporated into the state model to decompose the state vector into desired frequency components. The system modeling requires prior knowledge of system dynamics. In our examples, this prior information was the temporal smoothness of navigator data and the known frequencies of cardiac and respiratory components.

The performance of Kalman filtering is dependent on the choice of state space and measurement model. The constant velocity model is a basic example of Kalman filtering, e.g. for tracking in computer vision (23). It describes a smoothly changing motion and succeeds in finding the general trend of the motion. The double periodic motion model builds upon another basic example: the periodic motion with a known frequency. It proved to be useful to distinguish between two superimposed periodic motions with different known frequencies. An essential part in building the appropriate state space and measurement model is the selection of the noise covariance matrices $R_k$ and $Q_k$. The model noise covariance matrix $Q_k$ was assumed to be a diagonal matrix. In the constant velocity model, it was kept constant. The Kalman filter was then applied on a training data set for various values of $R_k$ (in this case a single number), and the one yielding a minimal root mean square error with a known or assumed reference waveform was selected. This combination of covariance matrices was then used unchanged for the actual data filtering. Under certain technical conditions, such as controllability (19,22), the Kalman gain and the state vector covariance matrix estimate both converge to steady state values, assuring a proper and bounded response of the Kalman filter to the measured data input.

An initial implementation of a prospectively respiratory self-gated CINE SSFP sequence showed the feasibility of real time Kalman filtering of center-of-k-space data to detect motion and suppress motion artifacts accordingly. To minimize SSFP ringing artifacts, jumps in phase encoding were limited. This is in turn, prolonged scan time as the last remaining views took a disproportional amount of time to finish. In the current implementation, a balance was struck between the smooth view ordering constraint for SSFP imaging and total scan time, such that some typical SSFP artifacts may appear. Optimizations such as parallel imaging were not used here, but may improve scanning efficiency. It should be noted that the techniques here are especially suited for applications that acquire data continuously (as opposed to single navigator gated ECG triggered segmented acquisitions). They provide motion information with a sampling rate that is high compared to the breathing frequency. Additionally, for successful separation of the respiratory and cardiac components, the sampling rate needs to be much higher than the cardiac frequency. Indeed, the simulations in this paper suggest that higher sampling rates lead to better Kalman filtering performance.

This work herein considered only three relatively simple state space models for Kalman filtering. All measurement, evolution and covariance matrices were independent of time. Only for the double periodic motion model on the human volunteer data was the evolution matrix updated by changing the "fast" and "slow" frequencies according to the instantaneous heart and respiratory rate derived by the scanner physiological monitor during the acquisition. This work can be extended to adapt the covariance matrices to the incoming data. Although in this approach, the Kalman filter is able to process data immediately after its acquisition, the appropriate state model and covariance matrices need to be selected using an analysis of training data in its entirety. This training data can be acquired using a prescan at the beginning of the scan. The double periodic motion Kalman filter relies on the knowledge of the instantaneous heart and respiratory rate at every time step in the scan. In our approach, these were taken from the ECG and the respiratory bellows signal from the scanner. Although respiratory and heart rates are calculated by the scanner with a delay (of at least one period), the simulations, where the double periodic model frequencies remained unchanged, suggest that Kalman filtering performance remains robust for the entire remainder of the waveform despite these sudden changes. The requirement to have ECG gating and respiratory bellows present may be lifted by performing an additional filtering process analyzing either the original data or the output from the Kalman filter. This additional process can involve a (different) Kalman filter as well. Our analysis was focused on feasibility of the Kalman filtering approach.

In conclusion, the Kalman filtering approach provides an effective way of filtering out noise and separating cardiac and respiratory components of continuous navigator waveforms simultaneously with the data acquisition, providing an on-line prospective data processing alternative to off-line retrospective analysis for synchronization with physiological motion. This was demonstrated both using simulations and in vivo data as well as in a prospectively self-gated CINE SSFP acquisition in healthy volunteers.

E. Appendix a

In this appendix, we detail the origins of the different Kalman filter models. Assume X(t) describes a 1D motion. For a small time step $\Delta t$, we have $$X(t + \Delta t) = X(t) + \Delta t \frac{dX}{dt}(t) + O(\Delta t^2), \quad \text{(Equation 6-11)}$$

$$V(t + \Delta t) = V(t) + \Delta t \frac{dV}{dt}(t) + O(\Delta t^2), \quad \text{(Equation 6-12)}$$

where $O(\Delta t^2)$ denotes the higher order terms in $\Delta t$. When velocity is considered constant, i.e. $V(t+\Delta t)=V(t)$, these formulas lead to the state space model in (Equation 6-4). Assuming a periodic motion described by the 1D wave equation:

$$\frac{d^2 X}{dt^2}(t) = -\omega^2 X(t), \quad \text{(Equation 6-13)}$$

and ignoring higher orders in $\Delta t$, (Equations 6-11 and 6-12) become $$X(t+\Delta t)=X(t)+\Delta t V(t) \text{ and } V(t+\Delta t)=-\omega^2 \Delta t X(t)+V(t), \quad \text{(Equation 6-14)}$$

giving the periodic motion model in (Equation 6-5). The double periodic motion model takes two independent periodic motions with different frequencies, which are added when the state vector is measured. In general, equation of motion typically expressed in terms of second order differential equation can be reformulated as a system of first order differential equations, the time integral of which gives the state vector evolution (Equation 6-8).

F. Appendix B

The Kalman filter estimates the state space vectors $x_k$ using conditional expectations based on the original noisy data $(z_k)_{k=1 \ldots N}$. Denote by $\hat{x}_k^-$ the conditional expectation of $x_k$ given all measurements up to time k−1, i.e. $\hat{x}_k^-=E(x_k|z_1, \ldots z_{k-1})$. Similarly, $\hat{x}_k^+=E(x_k|z_1, \ldots, z_k)$ is the most likely value of $x_k$ taking into account all measurements up to time k. At every step, the Kalman filter also calculates the covariance matrices for these estimates. They can be interpreted as the uncertainty on the estimated state vectors. They are denoted by $\hat{P}_k^\pm=E[(x_k-\hat{x}_k^\pm)(x_k-\hat{x}_k^\pm)^T]$. The Kalman filter assumes there is an initial estimate $\hat{x}_1^+$ and $\hat{P}_1^+$ for the first data point. The recursive procedure in the Kalman filter performs the following two steps for each time point k.

Given the estimates and $\hat{x}_{k-1}^+$ and $\hat{P}_{k-1}^+$ of the previous time point k−1, the state at time k can be initially predicted using the state space evolution (Equation 6-2):

$$\hat{x}_k^-=A_k\hat{x}_{k-1}^+. \quad \text{(Equation 6-15)}$$

(1)

The covariance of this estimate is $$\hat{P}_k^- = E[(x_k - \hat{x}_k^-)(x_k - \hat{x}_k^-)^T] \quad \text{(Equation 6-16)}$$
$$= E\left[(A_k x_{k-1} + w_k - A_k \hat{x}_{k-1}^+)(A_k x_{k-1} + w_k - A_k \hat{x}_{k-1}^+)^T\right]$$
$$= A_k \hat{P}_{k-1}^+ A_k^T + Q_k$$

In this step, the measurement $z_k$ is used to improve these estimates using the measurement model in (Equation 6-1). Denote the residual and its covariance matrix by $$y_k \stackrel{def}{=} z_k - H_k \hat{x}_k^- \quad \text{(Equation 6-17)}$$

$$S_k \stackrel{def}{=} E(y_k y_k^T) = H_k \hat{P}_k^- H_k^T + R_k$$

The final estimate of the state vector $x_k$, is defined as a linear combination of the prediction in and the residual in (Equation 6-17)

$$\hat{x}_k^+=\hat{x}_k^-+K_k y_k$$

$$\hat{P}_k^+=E[(x_k-\hat{x}_k^+)(x_k-\hat{x}_k^+)^T] \quad \text{(Equation 6-18)}$$

The weighting between the model (represented by $\hat{x}_k^-$) and the measurement (represented by the residual $y_k$ is determined by the so-called filter gain $K_k$. In Kalman filtering, this gain is adapted at each step such that it minimizes the following mean square error:

$$K_k = \underset{K_k}{\operatorname{argmin}} E(|x_k - \hat{x}_k^+|^2). \quad \text{(Equation 6-19)}$$

The expectation is evaluated with respect to two independent random variables state estimation $\hat{x}_k^-$ and measurement $z_k$. As both random variables are Gaussian, the mean square error estimation is also the maximum likelihood estimation, in which sense $\hat{x}_k^+$ is the optimal estimate of the state vector. The rigorous Bayesian statistical justification can be found in the classical textbook by Maybeck (22).

To derive an explicit expression for the Kalman gain from the definition in (Equations 6-19, 6-1, 6-3, and 6-17) can be utilized to evaluate the expectation value:

$$|x_k - \hat{x}_k^+|^2 = (x_k - \hat{x}_k^+)^T(x_k - \hat{x}_k^+) \quad \text{(Equation 6-20)}$$
$$= (x_k - \hat{x}_k^-)^T(x_k - \hat{x}_k^-) - y_k^T K_k^T(x_k - \hat{x}_k^-) -$$
$$(x_k - \hat{x}_k^-)^T K_k y_k + y_k^T K_k^T K_k y_k$$

$$\frac{\partial |x_k - \hat{x}_k^+|^2}{\partial (K_k)_{ij}} = \quad \text{(Equation 6-21)}$$
$$-2y_j(x_k - \hat{x}_k^-)_i + -2y_j\left(\sum_p (K_k)_{ip} y_p\right) \text{ with } y =$$
$$H_k(x_k - \hat{x}_k^-) + v_k$$

$$\frac{\partial E(|x_k - \hat{x}_k^+|^2)}{\partial (K_k)_{ij}} = -2(H_k \hat{P}_k^-)_{ji} + 2(K_k S_k)_{ij} \quad \text{(Equation 6-22)}$$

Settings these derivatives to zero for all i,j leads to an explicit expression for the optimal Kalman gain:

$$K_k = \hat{P}_k^- H_k^T S_k^{-1}, \quad \text{(Equation 6-23)}$$

after which (Equation 6-18) simplifies to $$\hat{x}_k^+ = \hat{x}_k^- - K_k y_k$$

$$\hat{P}_k^+ = (I - K_k H_k)\hat{P}_k^- \quad \text{(Equation 6-24)}$$

Equations 6-15, 6-16, and 6-24 describe the complete Kalman filtering step. The Kalman filtering of the data set $(z_k)_{k=1 \ldots N}$ is then given by $(\hat{z}_k = H_k \hat{x}_k^+)_{k=1 \ldots N}$.

BIBLIOGRAPHY

1. Ehman R L, Felmlee J P. Adaptive technique for high-definition MR imaging of moving structures. Radiology 1989; 173(1):255-263.
2. Pauly J, Nishimura, D, Macovski, A. A k-space analysis of small-tip-angle excitation. J Magn Reson 1989; 81:43-56.
3. Oshinski J N, Hofland L, Mukundan S, Jr., Dixon W T, Parks W J, Pettigrew R I. Two-dimensional coronary MR angiography without breath holding. Radiology 1996; 201(3):737-743.
4. Li D, Kaushikkar S, Haacke E M, Woodard P K, Dhawale P J, Kroeker R M, Laub G, Kuginuki Y, Gutierrez F R. Coronary arteries: three-dimensional MR imaging with retrospective respiratory gating. Radiology 1996; 201(3):857-863.
5. Wang Y, Rossman P J, Grimm R C, Riederer S J, Ehman R L. Navigator-echo-based real-time respiratory gating and triggering for reduction of respiration effects in three-dimensional coronary MR angiography. Radiology 1996; 198(1):55-60.
6. Nguyen T D, Nuval A, Mulukutla S, Wang Y. Direct monitoring of coronary artery motion with cardiac fat navigator echoes. Magn Reson Med 2003; 50(2):235-241.
7. Spraggins T A. Wireless retrospective gating: application to cine cardiac imaging. Magn Reson Imaging 1990; 8(6):675-681.
8. Larson A C, White R D, Laub G, McVeigh E R, Li D, Simonetti O P. Self-gated cardiac cine MRI. Magn Reson Med 2004; 51(1):93-102.
9. Larson A C, Kellman P, Arai A, Hirsch G A, McVeigh E, Li D, Simonetti O P. Preliminary investigation of respiratory self-gating for free-breathing segmented cine MRI. Magn Reson Med 2005; 53(1):159-168.
10. Brau A C, Brittain J H. Generalized self-navigated motion detection technique: Preliminary investigation in abdominal imaging. Magn Reson Med 2006; 55(2):263-270.
11. Hiba B, Richard N, Janier M, Croisille P. Cardiac and respiratory double self-gated cine MRI in the mouse at 7 T. Magn Reson Med 2006; 55(3):506-513.
12. Proakis J G, Manolakis D G. Digital signal processing: principles, algorithms, and applications. Englewood Cliffs, N.J. Prentice Hall; 1996. xv, 968, [948] p.p.
13. Du Y P, McVeigh E R, Bluemke D A, Silber H A, Foo T K. A comparison of prospective and retrospective respiratory navigator gating in 3D MR coronary angiography. Int J Cardiovasc Imaging 2001; 17(4):287-296.
14. Wang Y, Grimm R C, Felmlee J P, Riederer S J, Ehman R L. Algorithms for extracting motion information from navigator echoes. Magn Reson Med 1996; 36(1):117-123.
15. Nguyen T D, Wang Y, Watts R, Mitchell I. k-Space weighted least-squares algorithm for accurate and fast motion extraction from magnetic resonance navigator echoes. Magn Reson Med 2001; 46(5):1037-1040.
16. Spuentrup E, Manning W J, Botnar R M, Kissinger K V, Stuber M. Impact of navigator timing on free-breathing submillimeter 3D coronary magnetic resonance angiography. Magn Reson Med 2002; 47(1):196-201.
17. Smith G L, Schmidt S F, McGee L A. Application of statistical filter theory to the optimal estimation of position and velocity on board a circumlunar vehicle. Moffet Field, Calif.: NASA Ames Research Center; 1962. 27 p.
18. IEEE Transactions on Automatic Control, Special Issue On Applications of Kalman Filtering. Volume 28, nr 3; 1983.
19. Kailath T. View of 3 Decades of Linear Filtering Theory. Ieee T Inform Theory 1974; 20(2):146-181.
20. Kalman R E. A New Approach to Linear Filtering and Prediction Problems. Transactions of the ASME Journal of Basic Engineering 1960; 82(Series D):35-45.
21. Box G E P, Jenkins G M, Reinsel G C. Time series analysis: forecasting and control. Englewood Cliffs, N.J.: Prentice Hall; 1994. xiii, 598 p.p.
22. Maybeck P S. Stochastic models, estimation and control. New York: Academic Press; 1979.
23. Forsyth D, Ponce J. Computer vision: a modern approach. Upper Saddle River, N.J.; London: Prentice Hall; 2003. xxv, 693 p.p.
24. Meyer C H, Pauly J M, Macovski A, Nishimura D G. Simultaneous spatial and spectral selective excitation. Magn Reson Med 1990; 15(2):287-304.
25. Schick F, Forster J, Machann J, Huppert P, Claussen C D. Highly selective water and fat imaging applying multislice sequences without sensitivity to B1 field inhomogeneities. Magn Reson Med 1997; 38(2):269-274.
26. Zur Y. Design of improved spectral-spatial pulses for routine clinical use. Magn Reson Med 2000; 43(3):410-420.
27. Danias P G, McConnell M V, Khasgiwala V C, Chuang M L, Edelman R R, Manning W J. Prospective navigator correction of image position for coronary MR angiography. Radiology 1997; 203(3):733-736.
28. Crowe M E, Larson A C, Zhang Q, Carr J, White R D, Li D, Simonetti O P. Automated rectilinear self-gated cardiac cine imaging. Magn Reson Med 2004; 52(4):782-788.
29. Jhooti P, Gatehouse P D, Keegan J, Bunce N H, Taylor A M, Firmin D N. Phase ordering with automatic window selection (PAWS): a novel motion-resistant technique for 3D coronary imaging. Magn Reson Med 2000; 43(3):470-480.
30. Bieri O, Markl M, Scheffler K. Analysis and compensation of eddy currents in balanced SSFP. Magn Reson Med 2005; 54(1):129-137.
31. Abi-Abdallah D, Drochon A, Robin V, Fokapu O. Cardiac and respiratory MRI gating using combined wavelet sub-band decomposition and adaptive filtering. Ann Biomed Eng 2007; 35(5):733-743.

All references, including publications, patent applications, and patents, cited herein are hereby incorporated by reference to the same extent as if each reference were individually and specifically indicated to be incorporated by reference and were set forth in its entirety herein.

The use of the teems "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for generating an image representing a magnetic susceptibility distribution for an object using magnetic resonance imaging (MRI), the method comprising:
   determining, by a processing device, phase information corresponding to magnetic signals emitted by the object after the object is excited by a magnetic field;
   determining, by the processing device, additional information corresponding to the object independent from the phase information, wherein the additional information is one of: (a) magnitude information corresponding to the emitted magnetic signals and (b) prior information regarding the object; and
   generating, by the processing device, the image representing the magnetic susceptibility distribution for the object based on the determined phase information and the determined additional information, wherein the generating comprises:
      performing a direct inversion of a convolution operation using a system matrix, the determined phase information, and the additional information, wherein the additional information is used to improve the system matrix.

2. The method of claim 1, wherein performing the direct inversion comprises applying a regularization approach using an L1 norm to promote image sparsity and solving a minimization problem.

3. The method of claim 1, wherein performing the direct inversion comprises applying a regularization approach using an L2 norm and solving a minimization problem.

4. A non-transitory processor-readable medium having processor-executable instructions stored thereon for generating an image representing a magnetic susceptibility distribution for an object using magnetic resonance imaging (MRI), the processor-executable instructions, when executed by a processor, causing the following steps to be performed:
   determining phase information corresponding to magnetic signals emitted by the object after the object is excited by a magnetic field;
   determining additional information corresponding to the object independent from the phase information, wherein the additional information is one of: (a) magnitude information corresponding to the emitted magnetic signals and (b) prior information regarding the object; and
   generating the image representing the magnetic susceptibility distribution for the object based on the determined phase information and the determined additional information, wherein the generating comprises:
      performing a direct inversion of a convolution operation using a system matrix, the determined phase information, and the additional information, wherein the additional information is used to improve the system matrix.

5. The non-transitory computer-readable medium of claim 4, wherein performing the direct inversion comprises applying a regularization approach using an L1 norm to promote image sparsity and solving a minimization problem.

6. The method of claim 4, wherein performing the direct inversion comprises applying a regularization approach using an L2 norm and solving a minimization problem.

7. A method for generating an image representing a magnetic susceptibility distribution for an object using magnetic resonance imaging (MRI), the method comprising:
   determining, by a processing device, phase information corresponding to magnetic signals emitted by the object after the object is excited by a magnetic field;
   determining, by the processing device, additional information corresponding to the object independent from the phase information, wherein the additional information is one of: (a) magnitude information corresponding to the emitted magnetic signals and (b) prior information regarding the object;
   generating, by the processing device, the image representing the magnetic susceptibility distribution for the object based on the determined phase information and the determined additional information, wherein the generating comprises:
      performing an iterative inversion of a convolution operation using a system matrix, the determined phase information, the additional information, and an initial estimation of the object, including comparison of convolution results with the determined phase information and updating the initial estimation of the object based on the comparison and the additional information.

8. A non-transitory processor-readable medium having processor-executable instructions stored thereon for generating an image representing a magnetic susceptibility distribution for an object using magnetic resonance imaging (MRI), the processor-executable instructions, when executed by a processor, causing the following steps to he performed:

determining phase information corresponding to magnetic signals emitted by the object after the object is excited by a magnetic field;

determining additional information corresponding to the object independent from the phase information, wherein the additional information is one of: (a) magnitude information corresponding to the emitted magnetic signals and (b) prior information regarding the object;

generating the image representing the magnetic susceptibility distribution for the object based on the determined phase information and the determined additional information, wherein the generating comprises:

performing an iterative inversion of a convolution operation using a system matrix, the determined phase information, the additional information, and an initial estimation of the object, including comparison of convolution results with the determined phase information and updating the initial estimation of the object based on the comparison and the additional information.

* * * * *